US012628556B2

(12) United States Patent
Kim et al.

(10) Patent No.: US 12,628,556 B2
(45) Date of Patent: May 12, 2026

(54) PLURALITY OF HOST MATERIALS AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Bitnari Kim, Gyeonggi-do (KR); Su-Hyun Lee, Gyeonggi-do (KR); Hong-Se Oh, Gyeonggi-do (KR); So-Young Jung, Gyeonggi-do (KR); Sang-Hee Cho, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 584 days.

(21) Appl. No.: 17/274,758

(22) PCT Filed: Aug. 7, 2019

(86) PCT No.: PCT/KR2019/009860
§ 371 (c)(1),
(2) Date: Mar. 9, 2021

(87) PCT Pub. No.: WO2020/054977
PCT Pub. Date: Mar. 19, 2020

(65) Prior Publication Data

US 2022/0052271 A1 Feb. 17, 2022

(30) Foreign Application Priority Data

Sep. 10, 2018 (KR) ........................ 10-2018-0107679
Jul. 9, 2019 (KR) ........................ 10-2019-0082470

(51) Int. Cl.
*H10K 85/60* (2023.01)
*H10K 101/00* (2023.01)

(52) U.S. Cl.
CPC ....... *H10K 85/6572* (2023.02); *H10K 85/622* (2023.02); *H10K 85/626* (2023.02); *H10K 85/633* (2023.02); *H10K 85/636* (2023.02); *H10K 85/654* (2023.02); *H10K 85/6574* (2023.02); *H10K 85/6576* (2023.02); *H10K 2101/90* (2023.02)

(58) Field of Classification Search
CPC .. H10K 85/631; H10K 85/633; H10K 85/636; H10K 85/6572
See application file for complete search history.

(56) References Cited

U.S. PATENT DOCUMENTS

| | | | | |
|---|---|---|---|---|
| 2006/0134460 | A1* | 6/2006 | Kondakova | C09K 11/06 313/506 |
| 2012/0199820 | A1 | 8/2012 | Ito et al. | |
| 2012/0235123 | A1 | 9/2012 | Jun et al. | |
| 2015/0102301 | A1 | 4/2015 | Cho et al. | |
| 2016/0351822 | A1 | 12/2016 | Lee et al. | |
| 2018/0053898 | A1* | 2/2018 | Kim | H10K 85/631 |
| 2018/0182973 | A1* | 6/2018 | Kim | H10K 85/654 |
| 2018/0301635 | A1 | 10/2018 | Lee et al. | |
| 2019/0074448 | A1 | 3/2019 | Lim et al. | |
| 2019/0288222 | A1* | 9/2019 | Moon | C07D 401/14 |
| 2019/0355913 | A1 | 11/2019 | Oh et al. | |
| 2020/0212310 | A1 | 7/2020 | Kim et al. | |
| 2020/0235307 | A1 | 7/2020 | Cho et al. | |

FOREIGN PATENT DOCUMENTS

| | | | | |
|---|---|---|---|---|
| JP | 2017197478 | A | 11/2017 | |
| KR | 20100131745 | A * | 12/2010 | C09K 11/06 |
| KR | 20100131754 | A | 12/2010 | |
| KR | 20120046779 | A † | 5/2012 | |
| KR | 20170048159 | A † | 5/2017 | |
| KR | 20180019803 | A † | 2/2018 | |
| KR | 20180066818 | A † | 6/2018 | |

OTHER PUBLICATIONS

Machine-generated English-language translation of KR-20100131745-A.*
Search Report from JPO for Japanese application No. 2021-513235; Application Date: Mar. 9, 2021.
Search Report from Taiwan Patent Office for Taiwan Patent Application No. 108128888; Application Date: Aug. 14, 2019.

* cited by examiner
† cited by third party

*Primary Examiner* — Vu A Nguyen
(74) *Attorney, Agent, or Firm* — G. Creston Campbell

(57) ABSTRACT

The present disclosure relates to a plurality of host materials and an organic electroluminescent device comprising the same. By comprising the host materials according to the present disclosure, an organic electroluminescent device having low driving voltage and/or a high efficiency and/or long lifespan can be provided.

6 Claims, No Drawings

PLURALITY OF HOST MATERIALS AND ORGANIC ELECTROLUMINESCENT DEVICE COMPRISING THE SAME

TECHNICAL FIELD

The present disclosure relates to a plurality of host materials and an organic electroluminescent device comprising the same.

BACKGROUND ART

The first organic electroluminescent device was developed by Eastman Kodak in 1987, by using small aromatic diamine molecules and aluminum complexes as materials for forming a light-emitting layer [Appl. Phys. Lett. 51, 913, 1987].

An organic electroluminescent device (OLED) changes electric energy into light by applying electricity to an organic electroluminescent material, and commonly comprises an anode, a cathode, and an organic layer formed between the two electrodes.

The most important factor determining luminous efficiency in an organic electroluminescent device is light-emitting materials. A light-emitting material is classified into a host material and a dopant material in a functional aspect and can be used as a combination of a host and a dopant to improve color purity, luminous efficiency, and stability. Generally, a device having EL (electroluminescent) excellent characteristics has a structure comprising a light-emitting layer formed by doping a dopant to a host. When using such a dopant/host material system as a light-emitting material, their selection is important since host materials greatly influence the efficiency and lifespan of the electroluminescent device.

Recently, an urgent task is the development of an organic electroluminescent device having high efficiency and long lifespan. In particular, the development of highly excellent light-emitting material over conventional materials is urgently required, considering the electroluminescent properties necessary for medium and large-sized OLED panels.

KR 2015-0117173 A and KR 2015-0042603 A disclose a composition used for an organic electroluminescent device comprising a plurality of host compounds and an organic electroluminescent device; however, it is still necessary to be improved in terms of driving voltage, luminous efficiency, and lifespan.

DISCLOSURE OF INVENTION

Technical Problem

The object of the present disclosure is firstly, to provide a plurality of host materials which is able to produce an organic electroluminescent device having low driving voltage and/or high luminous efficiency, and/or long lifespan, and secondly, to provide an organic electroluminescent device comprising the host materials.

Solution to Problem

As a result of intensive studies to solve the technical problem above, the present inventors found that the aforementioned objective can be achieved by a plurality of host materials comprising at least one first host compound represented by the following formula 1 and at least one second host compound represented by the following formula 2, so that the present invention was completed.

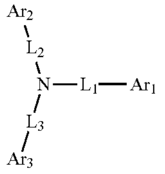

(1)

In formula 1, $L_1$ to $L_3$ each independently represent a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene; and $Ar_1$ to $Ar_3$ each independently represent hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino;

with the proviso that the compound wherein all of $L_1$ to $L_3$ are a single bond and all of $Ar_1$ to $Ar_3$ are hydrogen is excluded;

$$HAr-(L-Ar)_{a'} \tag{2}$$

In formula 2,

HAr represents a substituted or unsubstituted nitrogen-containing (3- to 10-membered)heteroaryl;

L represents a single bond, a substituted or unsubstituted (C6-C30)arylene, or a substituted or unsubstituted (3- to 30-membered)heteroarylene;

Ar represents a substituted or unsubstituted (C6-C30)aryl or a substituted or unsubstituted (3- to 30-membered) heteroaryl; and a' represents an integer of 1 to 3, when a' is 2 or more, each of (L-Ar) may be the same or different.

Advantageous Effects of Invention

By using a plurality of host materials according to the present disclosure, an organic electroluminescent device having low driving voltage and/or high luminous efficiency and/or long lifespan can be prepared.

MODE FOR THE INVENTION

Hereinafter, the present disclosure will be described in detail. However, the following description is intended to explain the invention, and is not meant in any way to restrict the scope of the invention.

The present disclosure relates to a plurality of host materials comprising at least one first host compound represented by the above formula 1 and at least one second host compound represented by the above formula 2, and an organic electroluminescent device comprising the host materials.

Herein, "organic electroluminescent material" means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (containing host and dopant materials), an electron buffer material, a hole blocking material, an electron transport material, or an electron injection material, etc.

Herein, "a plurality of host materials" means a host material comprising a combination of at least two compounds, which may be comprised in any light-emitting layer constituting an organic electroluminescent device. It may mean both a material before being comprised in an organic electroluminescent device (e.g., before vapor deposition) and a material after being comprised in an organic electroluminescent device (e.g., after vapor deposition). In one embodiment, a plurality of host materials of the present disclosure may be a combination of at least two host materials, and selectively, conventional materials comprised in organic electroluminescent materials may be additionally comprised. The at least two compounds comprised in the plurality of host materials of the present disclosure may be comprised together in one light-emitting layer, or may each be comprised in separate light-emitting layers by a method known in the field. For example, the at least two compounds may be mixture-evaporated or co-evaporated, or may be individually evaporated.

Herein, "(C1-C30)alkyl(ene)" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tert-butyl, etc. "(C3-C30)cycloalkyl(ene)" is a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. "(C6-C30)aryl(ene)" is a monocyclic or fused ring radical derived from an aromatic hydrocarbon having 6 to 30 ring backbone carbon atoms, in which the number of the ring backbone carbon atoms is preferably 6 to 20, more preferably 6 to 15, may be partially saturated, and may comprise a spiro structure. Examples of the aryl specifically include phenyl, biphenyl, terphenyl, quaterphenyl, naphthyl, binaphthyl, phenylnaphthyl, naphthylphenyl, fluorenyl, phenylfluorenyl, dimethylfluorenyl, diphenylfluorenyl, benzofluorenyl, diphenylbenzofluorenyl, dibenzofluorenyl, phenanthrenyl, benzophenanthrenyl, phenylphenanthrenyl, anthracenyl, benzanthracenyl, indenyl, triphenylenyl, pyrenyl, tetracenyl, perylenyl, chrysenyl, benzochrysenyl, naphthacenyl, fluoranthenyl, benzofluoranthenyl, tolyl, xylyl, mesityl, cumenyl, spiro[fluorene-fluorene]yl, spiro[fluorene-benzofluorene]yl, azulenyl, etc. More specifically, the aryl may be o-tolyl, m-tolyl, p-tolyl, 2,3-xylyl, 3,4-xylyl, 2,5-xylyl, mesityl, o-cumenyl, m-cumenyl, p-cumenyl, p-t-butylphenyl, p-(2-phenylpropyl)phenyl, 4'-methylbiphenyl, 4"-t-butyl-p-terphenyl-4-yl, o-biphenyl, m-biphenyl, p-biphenyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 1-naphthyl, 2-naphthyl, 1-fluorenyl, 2-fluorenyl, 3-fluorenyl, 4-fluorenyl, 9-fluorenyl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 1-anthryl, 2-anthryl, 9-anthryl, 1-phenanthryl, 2-phenanthryl, 3-phenanthryl, 4-phenanthryl, 9-phenanthryl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 3-fluoranthenyl, 4-fluoranthenyl, 8-fluoranthenyl, 9-fluoranthenyl, benzofluoranthenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-diphenyl-6-benzo[b]fluorenyl, 11,11-diphenyl-7-benzo[b]fluorenyl, 11,11-diphenyl-8-benzo[b]fluorenyl, 11,11-diphenyl-9-benzo[b]fluorenyl, etc. "(3- to 30-membered)heteroaryl(ene)" is an aryl having 3 to 30 ring backbone atoms, in which the number of ring backbone atoms is preferably 5 to 25, including at least one, preferably 1 to 4 heteroatoms selected from the group consisting of B, N, O, S, Si, R and Ge. The above heteroatom may be linked with at least one substituent selected from the group consisting of hydrogen, deuterium, halogen, cyano, a substituted or unsubstituted (C1-C30)alkyl, a substituted or unsubstituted (C6-C30)aryl, a substituted or unsubstituted (5- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, and a substituted or unsubstituted (C1-C30)alkyl(C6-30)arylamino. Also, the above heteroaryl may be one formed by linking at least one heteroaryl or aryl group to a heteroaryl group via a single bond(s); and may comprise a spiro structure. Examples of the heteroaryl specifically may include a monocyclic ring-type heteroaryl including furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl including benzofuranyl, benzothiophenyl, isobenzofuranyl, dibenzofuranyl, dibenzothiophenyl, benzoimidazolyl, benzothiazolyl, benzoisothiazolyl, benzoisoxazolyl, benzoxazolyl, imidazopyridinyl, isoindolyl, indolyl, benzoindolyl, indazolyl, benzothiadiazolyl, quinolyl, isoquinolyl, cinnolinyl, quinazolinyl, quinoxalinyl, carbazolyl, azacarbazolyl, benzocarbazolyl, dibenzocarbazolyl, phenoxazinyl, phenanthridinyl, benzodioxolyl, indolizidinyl, acrylidinyl, silafluorenyl, germafluorenyl, etc. More specifically, the heteroaryl may be 1-pyrrolyl, 2-pyrrolyl, 3-pyrrolyl, 2-pyridinyl, 3-pyridinyl, 4-pyridinyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolizidinyl, 2-indolizidinyl, 3-indolizidinyl, 5-indolizidinyl, 6-indolizidinyl, 7-indolizidinyl, 8-indolizidinyl, 2-imidazopyridinyl, 3-imidazopyridinyl, 5-imidazopyridinyl, 6-imidazopyridinyl, 7-imidazopyridinyl, 8-imidazopyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazole-1-yl, azacarbazole-2-yl, azacarbazole-3-yl, azacarbazole-4-yl, azacarbazole-5-yl, azacarbazole-6-yl, azacarbazole-7-yl, azacarbazole-8-yl, azacarbazole-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acrylidinyl, 2-acrylidinyl, 3-acrylidinyl, 4-acrylidinyl, 9-acrylidinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, 4-t-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, etc. Herein, "Halogen" includes F, Cl, Br, and I.

In addition, "ortho (o)," "meta (m)," and "para (p)" are meant to signify the substitution position of all substituents. Ortho position is a compound with substituents, which are adjacent to each other, e.g., at the 1 and 2 positions on benzene. Meta position is the next substitution position of the immediately adjacent substitution position, e.g., a compound with substituents at the 1 and 3 positions on benzene. Para position is the next substitution position of the meta position, e.g., a compound with substituents at the 1 and 4 positions on benzene.

Herein, "a substituted or unsubstituted ring formed in linking to an adjacent substituent" means a substituted or unsubstituted (3- to 30-membered) mono- or polycyclic, alicyclic, aromatic ring, or a combination thereof, formed by linking or fusing two or more adjacent substituents; preferably, may be a substituted or unsubstituted (3- to 26-membered) mono- or polycyclic, alicyclic, aromatic ring, or a combination thereof. In addition, at least one of the carbon atoms in the formed ring may be replaced with at least one heteroatom selected from the group consisting of B, N, O, S, Si, and P, preferably, N, O, and S. According to one embodiment of the present disclosure, the number of ring backbone atoms is (5- to 20-membered), and according to another embodiment the present disclosure, the number of ring backbone atoms is (5- to 15-membered).

In addition, "substituted" in the expression "substituted or unsubstituted" means that a hydrogen atom in a certain functional group is replaced with another atom or functional group, i.e., a substituent. The substituents of the substituted (C1-C30)alkyl(ene), the substituted (C6-C30)aryl(ene), the substituted (3- to 30-membered)heteroaryl(ene), the substituted (C3-C30)cycloalkyl(ene), the substituted (C1-C30) alkoxy, the substituted tri(C1-C30)alkylsilyl, the substituted di(C1-C30)alkyl(C6-C30)arylsilyl, the substituted (C1-C30) alkyldi(C6-C30)arylsilyl, the substituted tri(C6-C30)arylsilyl, the substituted mono- or di-(C1-C30)alkylamino, the substituted mono- or di-(C6-C30)arylamino, or the substituted (C1-C30)alkyl(C6-C30)arylamino, in $L_1$ to $L_3$, $Ar_1$ to $Ar_3$, HAr, L, and Ar of formulae 1 and 2, each independently are at least one selected from the group consisting of deuterium, halogen, cyano, carboxyl, nitro, hydroxyl, (C1-C30)alkyl, halo(C1-C30)alkyl, (C2-C30)alkenyl, (C2-C30) alkynyl, (C1-C30)alkoxy, (C1-C30)alkylthio, (C3-C30)cycloalkyl, (C3-C30)cycloalkenyl, (3- to 7-membered) heterocycloalkyl, (C6-C30)aryloxy, (C6-C30)arylthio, (C6-C30)aryl-substituted or unsubstituted (5- to 30-membered) heteroaryl, (5- to 30-membered)heteroaryl-substituted or unsubstituted (C6-C30)aryl, tri(C1-C30)alkylsilyl, tri(C6-C30)arylsilyl, di(C1-C30)alkyl(C6-C30)arylsilyl, (C1-C30) alkyldi(C6-C30)arylsilyl, amino, mono- or di-(C1-C30)alkylamino, (C1-C30)alkyl-substituted or unsubstituted mono- or di-(C6-C30)arylamino, (C1-C30)alkyl(C6-C30) arylamino, (C1-C30)alkylcarbonyl, (C1-C30)alkoxycarbonyl, (C6-C30)arylcarbonyl, di(C6-C30)arylboronyl, di(C1-C30)alkylboronyl, (C1-C30)alkyl(C6-C30)arylboronyl, (C6-C30)ar(C1-C30)alkyl, and (C1-C30)alkyl(C6-C30) aryl, e.g., the substituents may be methyl, phenyl, biphenyl, naphthyl, fluorenyl, or pyridinyl, etc.

Hereinafter, the host material according to one embodiment will be described.

Host materials according to one embodiment comprise at least one first host compound represented by the above formula 1 and at least one second host compound represented by the above formula 2; and the host materials may be contained in the light-emitting layer of an organic electroluminescent device according to one embodiment.

The first host compound as the host material according to one embodiment may be represented by the following formula 1.

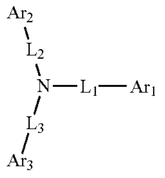

(1)

In formula 1, $L_1$ to $L_3$ each independently represent a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene; and $Ar_1$ to $Ar_3$ each independently represent hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino;

with the proviso that the compound wherein all of $L_1$ to $L_3$ are a single bond and all of $Ar_1$ to $Ar_3$ are hydrogen is excluded.

In one embodiment, $L_1$ to $L_3$ each independently may be a single bond, a substituted or unsubstituted (C6-C30) arylene, or a substituted or unsubstituted (3- to 30-membered)heteroarylene, preferably, a single bond, a substituted or unsubstituted (C6-C25)arylene, or a substituted or unsubstituted (5- to 25-membered)heteroarylene, more preferably, a single bond or a substituted or unsubstituted (C6-C18) arylene. For example, $L_1$ to $L_3$ each independently may be a single bond, a substituted or unsubstituted phenylene, a substituted or unsubstituted o-biphenylene, a substituted or unsubstituted m-biphenylene, a substituted or unsubstituted p-biphenylene, a substituted or unsubstituted naphthylene, or a substituted or unsubstituted fluorenylene.

In one embodiment, $Ar_1$ to $Ar_3$ each independently may be hydrogen, deuterium, a substituted or unsubstituted (C6-C30)aryl, or a substituted or unsubstituted (3- to 30-membered)heteroaryl, preferably, a substituted or unsubstituted (C6-C25)aryl or a substituted or unsubstituted (5- to 30-membered)heteroaryl, more preferably, a substituted or unsubstituted (C6-C20)aryl or a substituted or unsubstituted (5- to 25-membered)heteroaryl. For example, $Ar_1$ to $Ar_3$ each independently may be a substituted or unsubstituted phenyl, a substituted or unsubstituted o-biphenyl, a substituted or unsubstituted m-biphenyl, a substituted or unsubstituted p-biphenyl, a substituted or unsubstituted m-terphenyl, a substituted or unsubstituted naphthyl, a substituted or unsubstituted fluorenyl, a substituted or unsubstituted benzofluorenyl, a substituted or unsubstituted phenanthrenyl, a substituted or unsubstituted dibenzothiophenyl, a substituted or unsubstituted dibenzofuranyl, a substituted or unsubstituted carbazolyl, a substituted or unsubstituted benzocarbazolyl, a substituted or unsubstituted dibenzocarbazolyl, a substituted or unsubstituted indenocarbazolyl, a substituted or unsubstituted benzothienocarbazolyl, a substituted or unsubstituted benzofurocarbazolyl, or a substituted or unsubstituted indolocarbazolyl.

The compound represented by the formula 1 may be represented by any one of the following formulae 1-1 to 1-6.

(1-1)

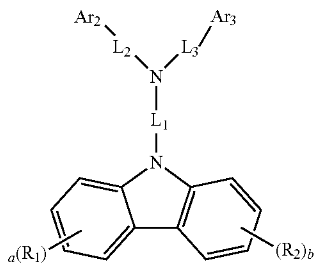

(1-2)

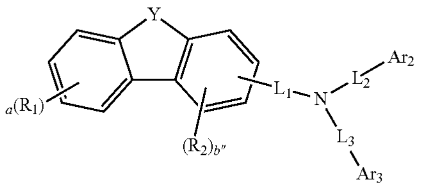

-continued (1-3)

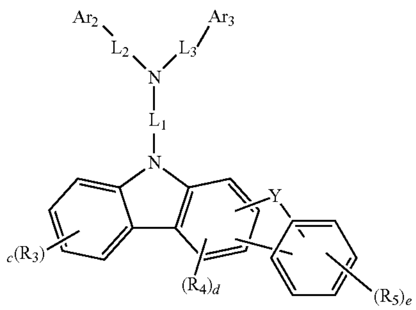

(1-4)

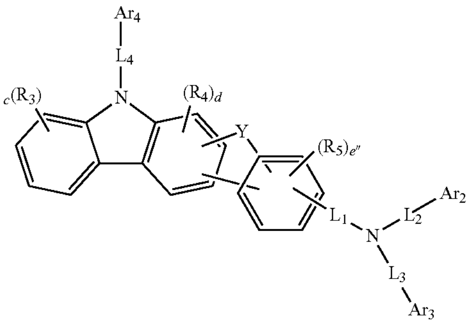

(1-5)

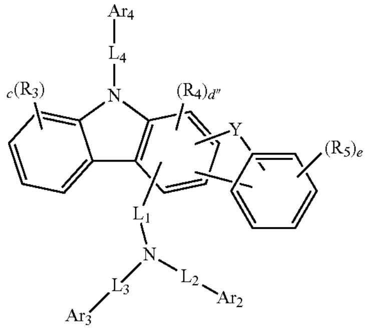

(1-6)

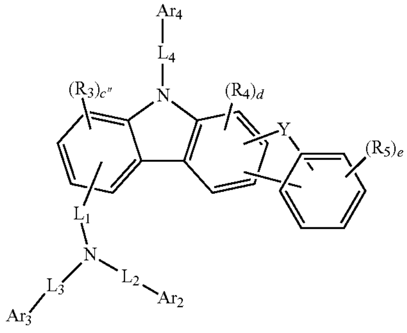

In formulae 1-1 to 1-6,

Y represents $CR_6R_7$, $NR_8$, O, or S;

$R_1$ to $R_6$ each independently represent hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; or may be linked to adjacent substituents to form a ring;

$L_4$ represents a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene;

$Ar_4$ represents hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, or a substituted or unsubstituted (C3-C30)cycloalkyl;

a, b, c, and e each independently represent an integer of 1 to 4, b", c", and e" each independently represent an integer of 1 to 3, d represents an integer of 1 or 2, d" represents an integer of 1, when a to e, b", c", and e" are 2 or more, each of $R_1$ to $R_5$ may be the same or different; and $Ar_2$, $Ar_3$, and $L_1$ to $L_3$ are as defined in formula 1.

In one embodiment, Y may be $NR_8$, O, or S.

In one embodiment, $R_1$ to $R_5$ each independently may be hydrogen, deuterium, halogen, cyano, or may be linked to adjacent substituents to form a ring, preferably, hydrogen, deuterium, or may be linked to adjacent substituents to form a substituted or unsubstituted (3- to 18-membered) mono- or polycyclic ring, more preferably, hydrogen or may be linked to adjacent substituents to form an unsubstituted (3- to 10-membered) mono- or polycyclic aromatic ring. For example, adjacent $R_1$ or adjacent $R_2$ may be linked to each other to form a benzene ring.

In one embodiment, $R_6$ to $R_8$ each independently may be hydrogen, deuterium, halogen, cyano, or a substituted or unsubstituted (C6-C30)aryl, preferably, a substituted or unsubstituted (C6-C25)aryl, more preferably, a substituted or unsubstituted (C6-C18)aryl. For example, $R_6$ to $R_8$ each independently may be a substituted or unsubstituted phenyl or a substituted or unsubstituted biphenyl.

In one embodiment, $L_4$ may be a single bond or a substituted or unsubstituted (C6-C30)arylene, preferably, a single bond or a substituted or unsubstituted (C6-C25) arylene, more preferably, a single bond or a substituted or unsubstituted (C6-C18)arylene. For example, $L_4$ may be a single bond or a substituted or unsubstituted phenylene.

In one embodiment, $Ar_4$ may be hydrogen, deuterium, or a substituted or unsubstituted (C6-C30)aryl, preferably, a substituted or unsubstituted (C6-C25)aryl, more preferably, a substituted or unsubstituted (C6-C18)aryl. For example, $Ar_4$ may be a substituted or unsubstituted phenyl, a substituted or unsubstituted o-biphenyl, a substituted or unsubstituted m-biphenyl, or a substituted or unsubstituted p-biphenyl.

According to one embodiment, the first host compound represented by formula 1 may be illustrated by the following compounds, but is not limited thereto.

C-1-1

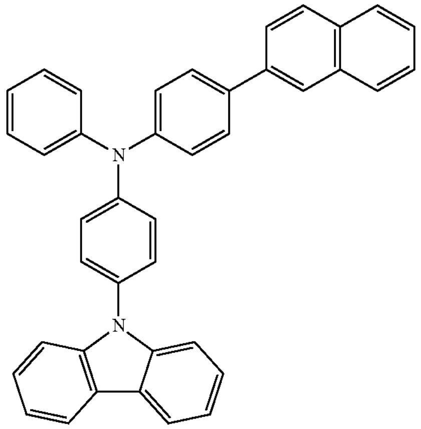

C-1-2

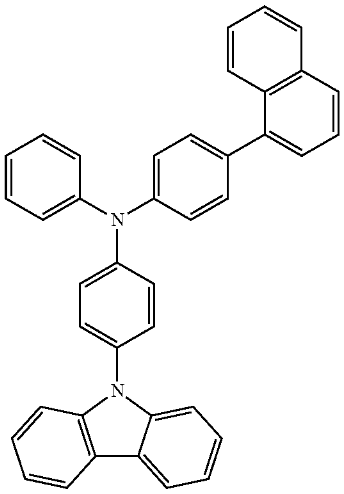

C-1-3

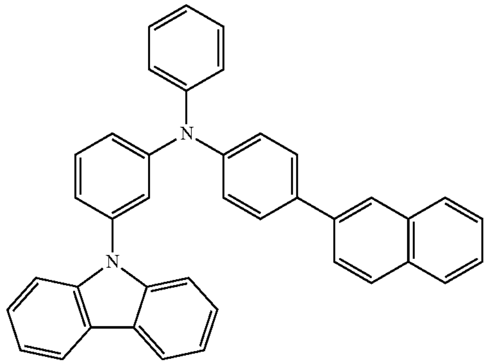

-continued
C-1-4
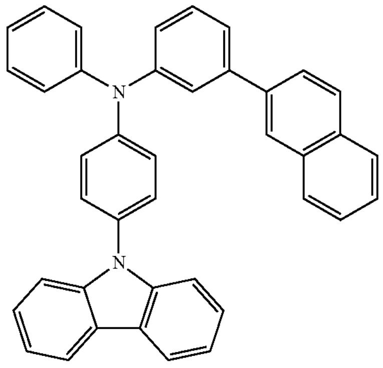
C-1-5
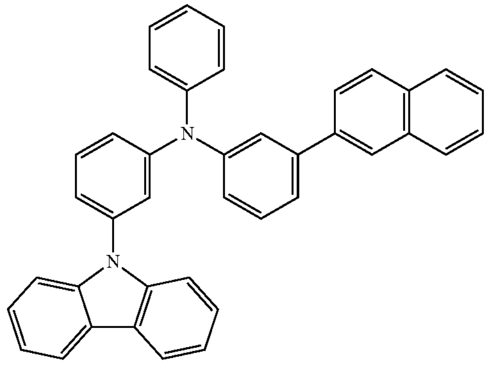
C-1-6
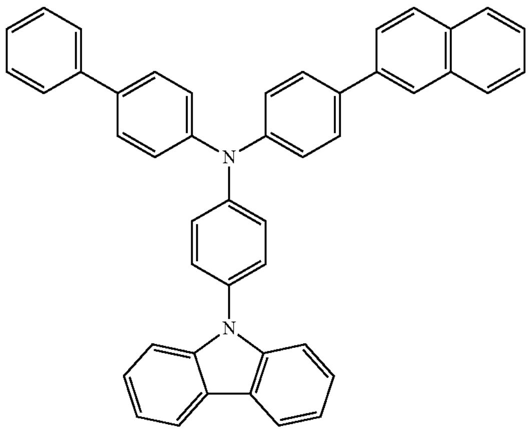
-continued
C-1-7
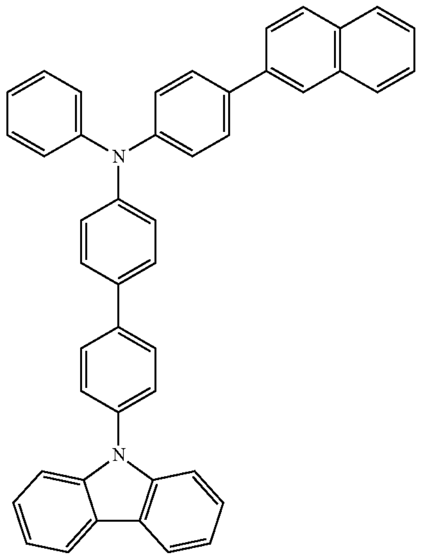
C-1-8
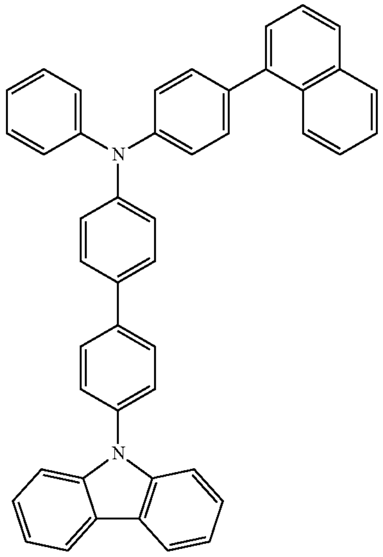
C-1-9
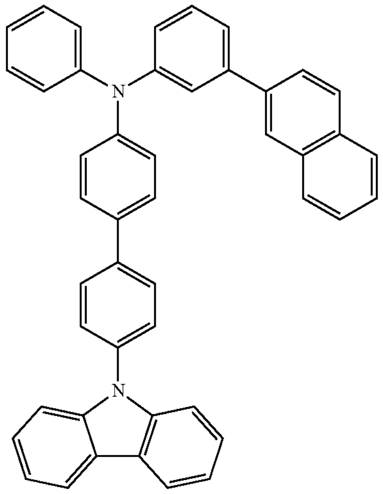

-continued
C-1-10
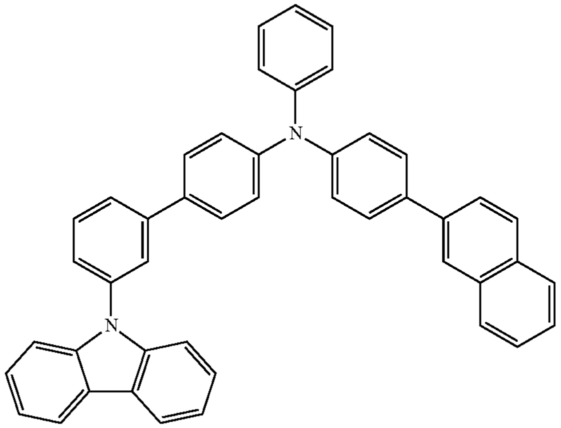
C-1-11
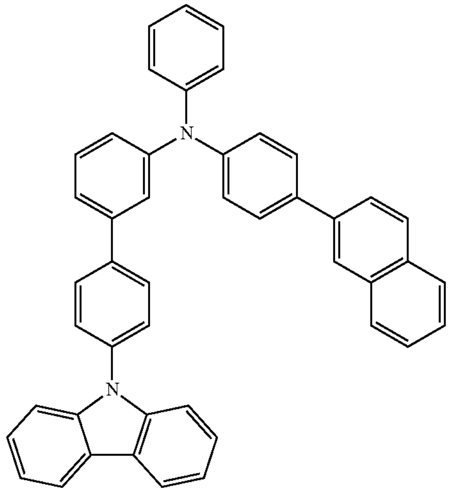
C-1-12
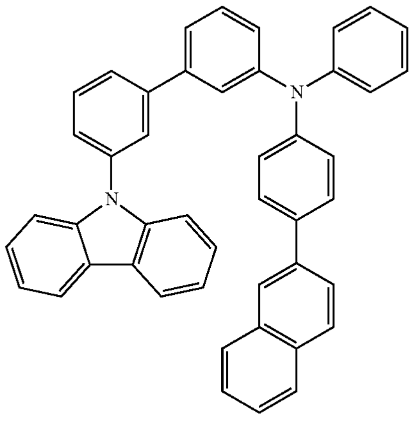
-continued
C-1-13
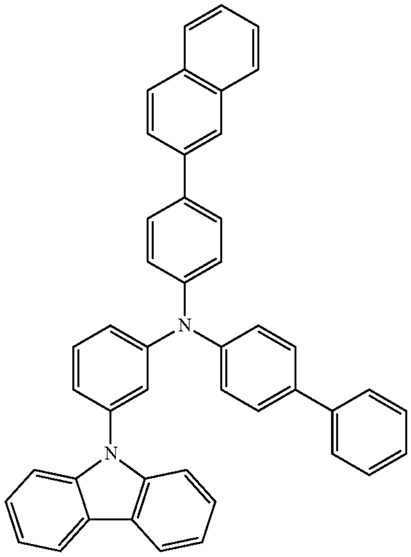
C-1-14
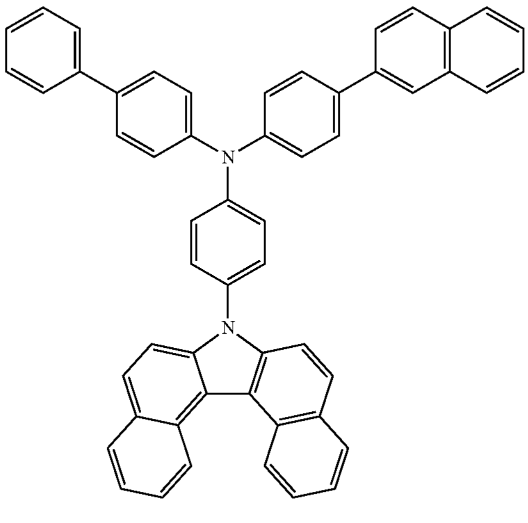

-continued
C-1-15
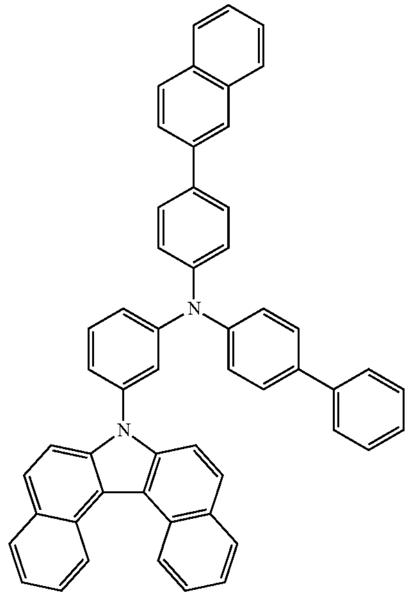
C-1-16
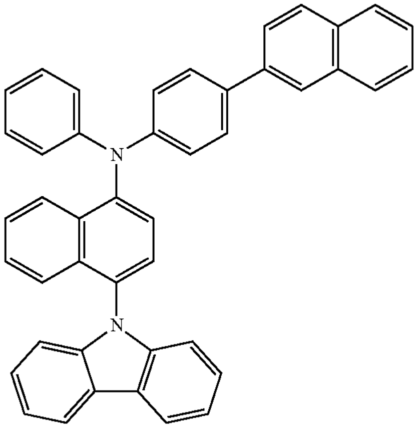
C-1-17
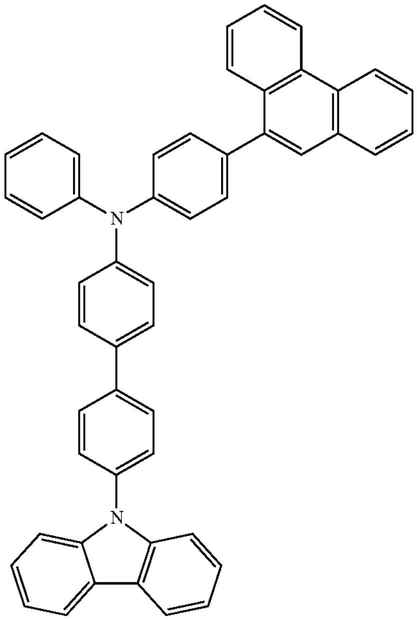
-continued
C-1-18
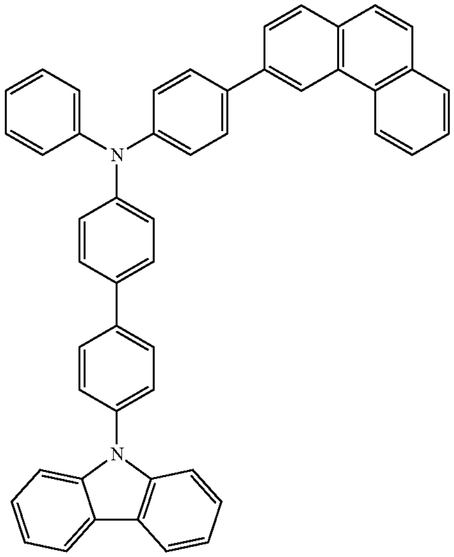
C-1-19
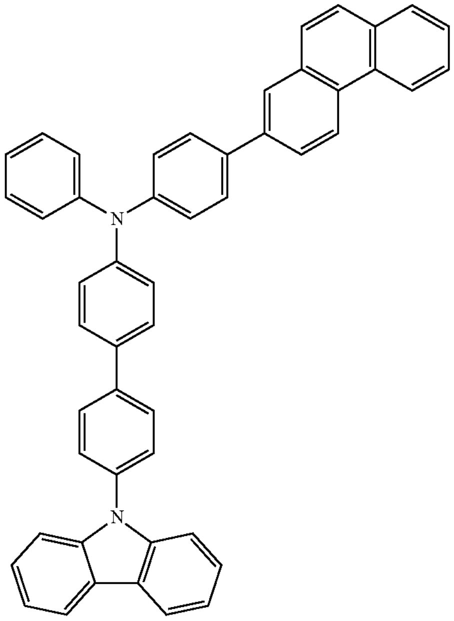
C-1-20
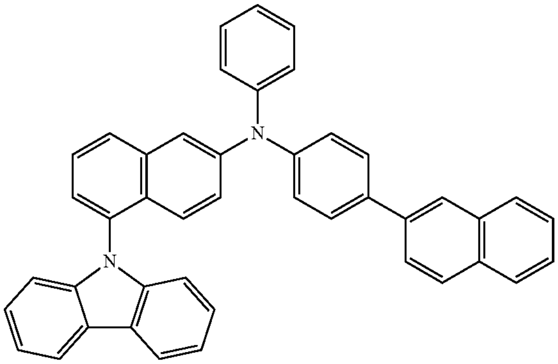

-continued
C-1-21
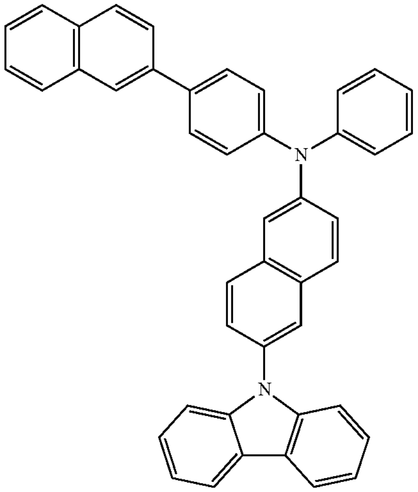
C-1-22
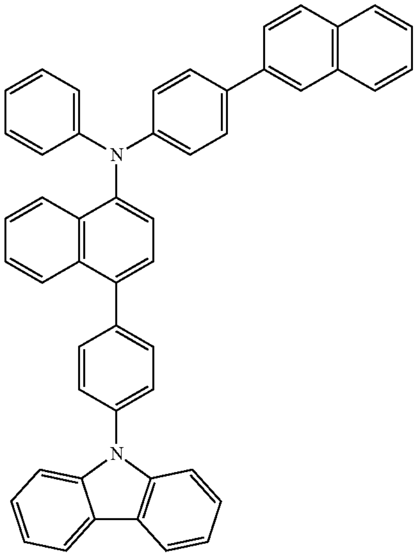
C-1-23
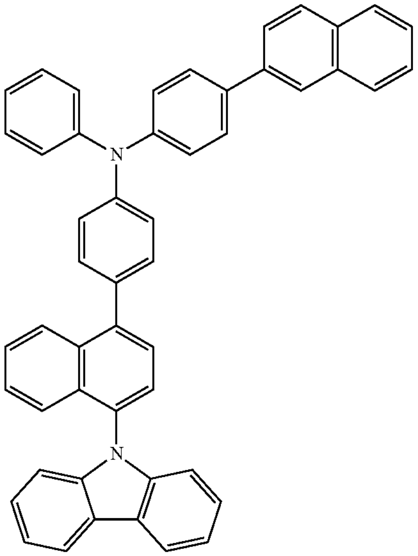
-continued
C-1-24
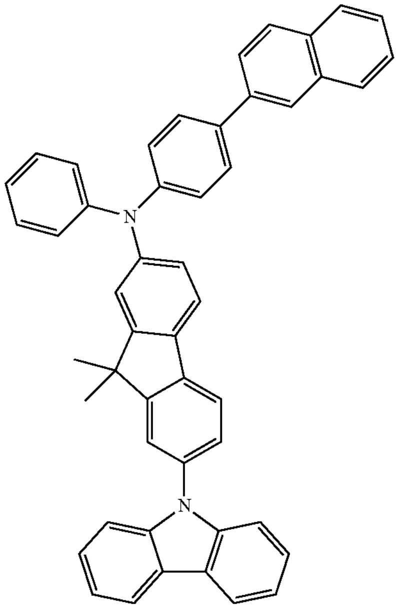
C-1-25
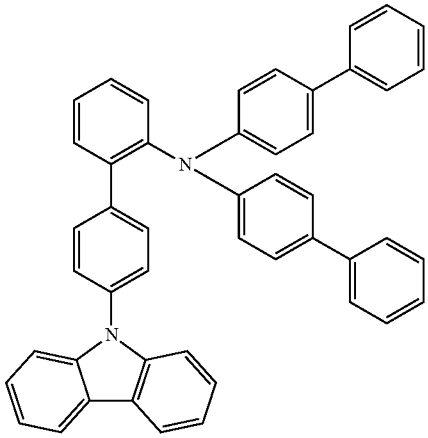
C-1-26
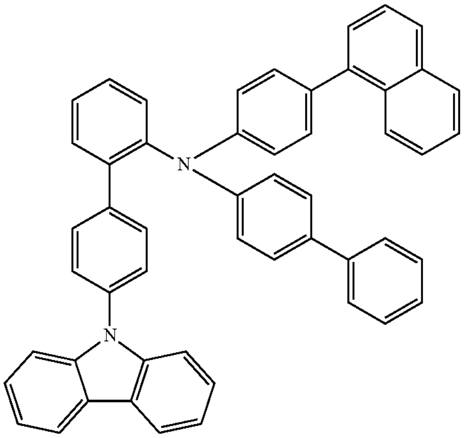

-continued
C-1-27
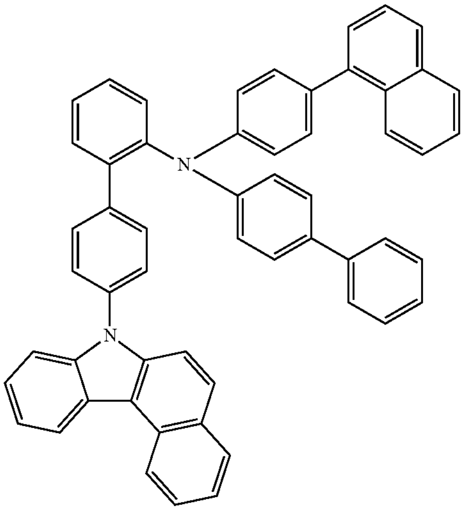
C-1-28
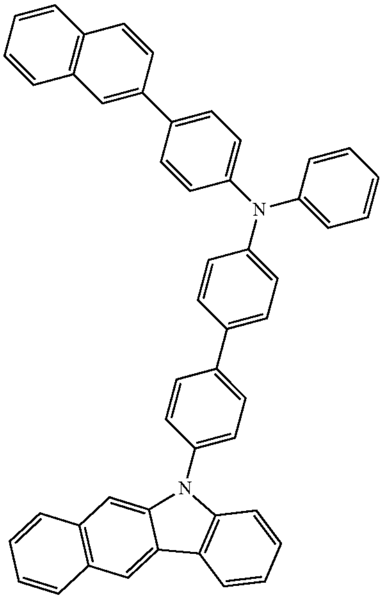
C-1-29
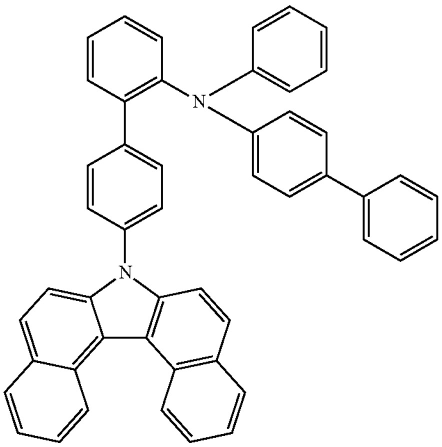
-continued
C-1-30
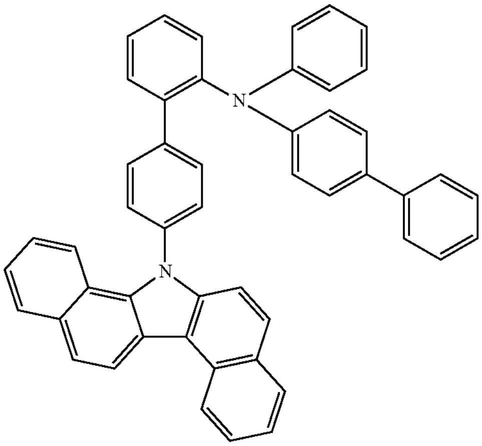
C-1-31
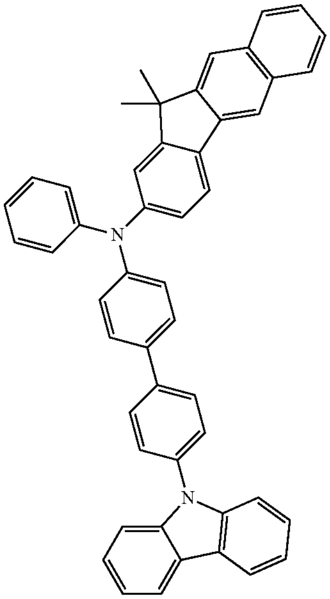
C-1-32
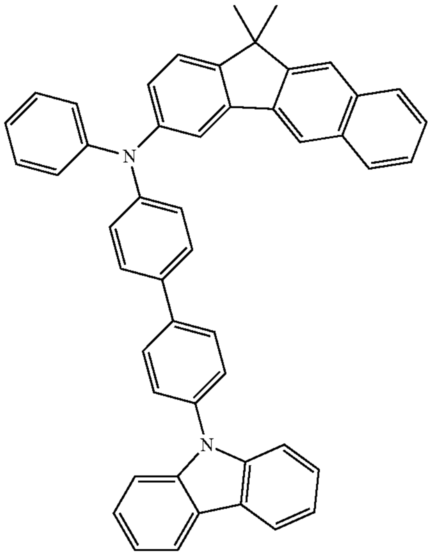

C-1-33
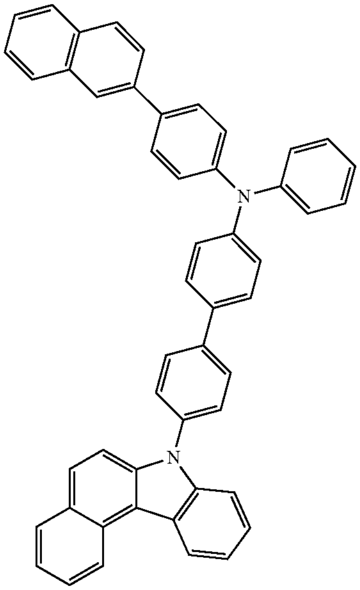
C-1-34
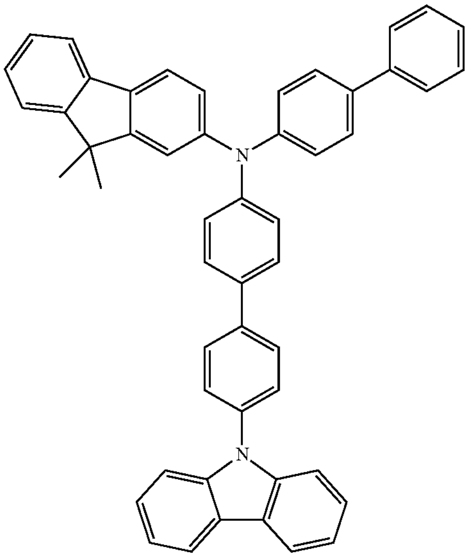
C-1-35
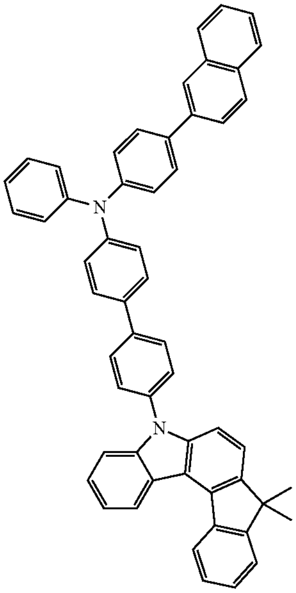
C-1-36
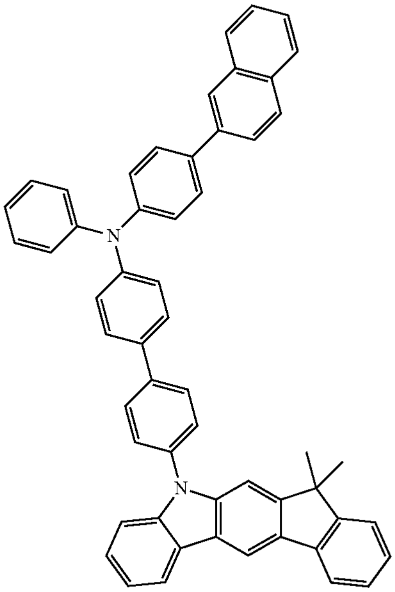

-continued
C-1-37
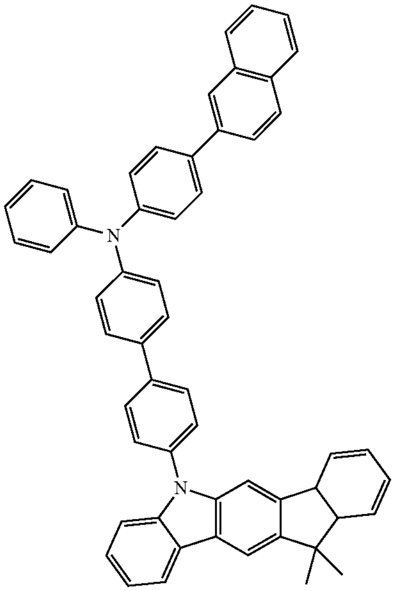
C-1-38
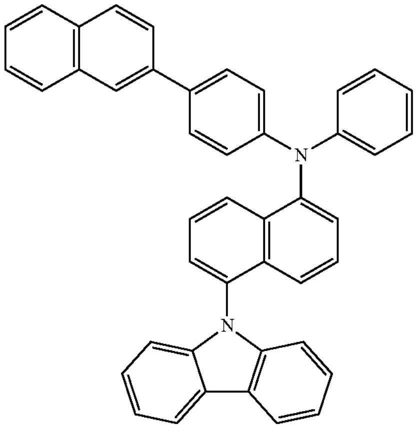
C-1-39
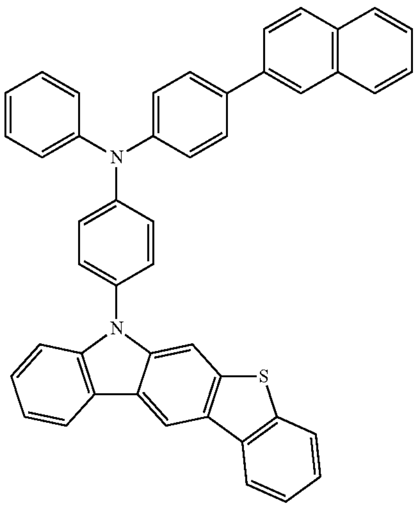
-continued
C-1-40
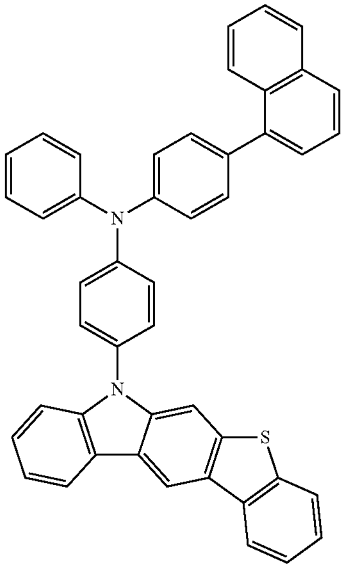
C-1-41
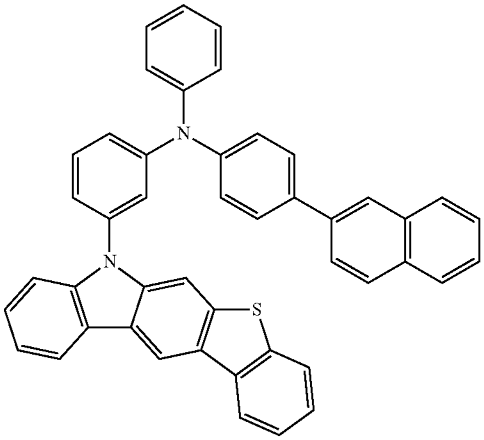
C-1-42
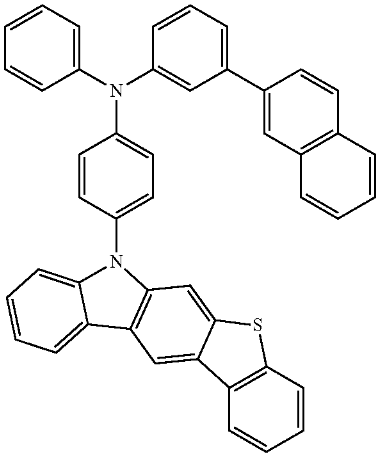

-continued
C-1-43
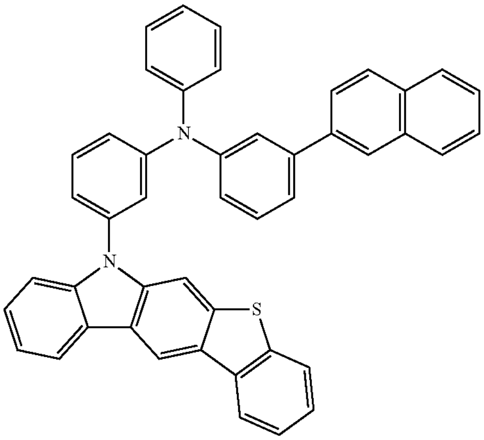
C-1-44
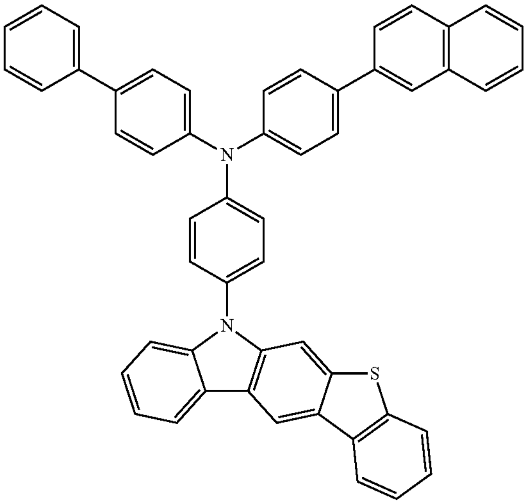
C-1-45
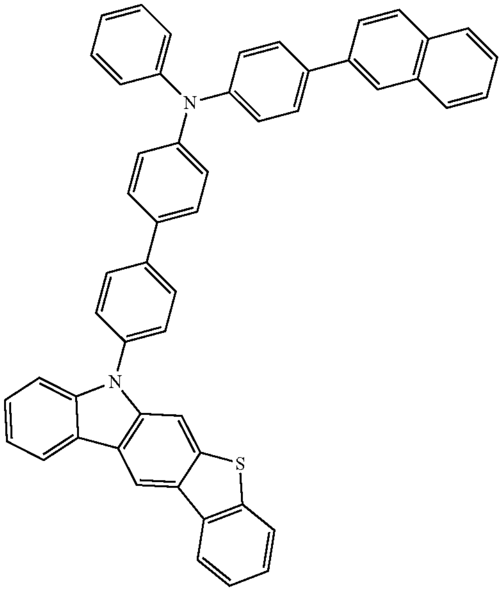
-continued
C-1-46
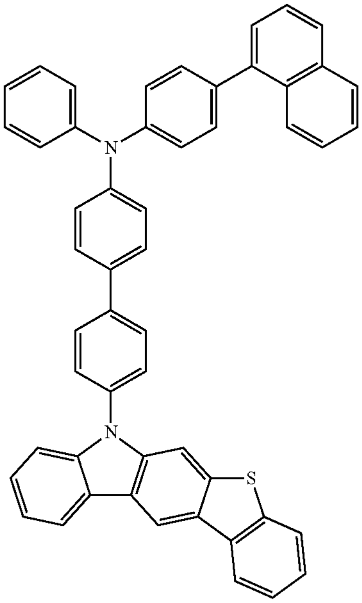
C-1-47
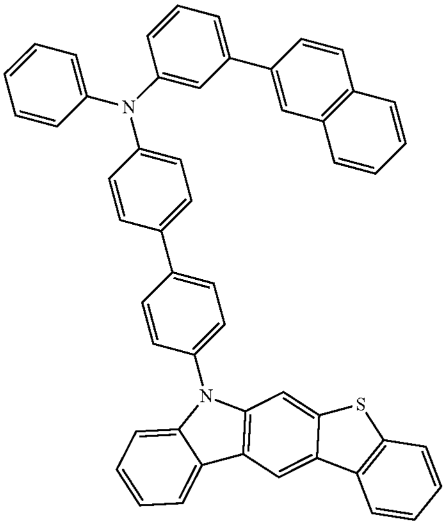
C-1-48
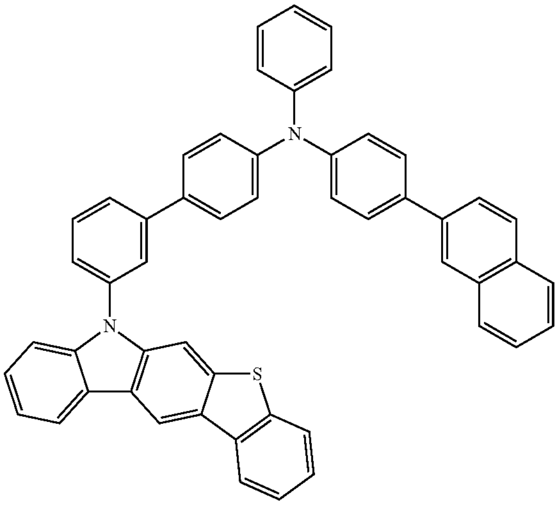

-continued
C-1-49
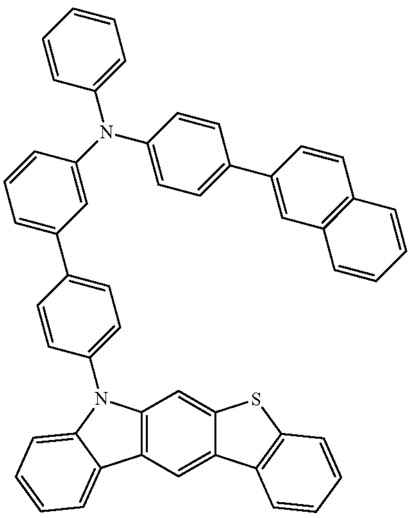
C-1-50
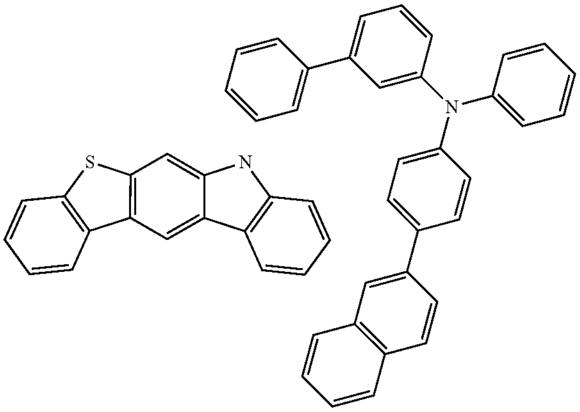
C-1-51
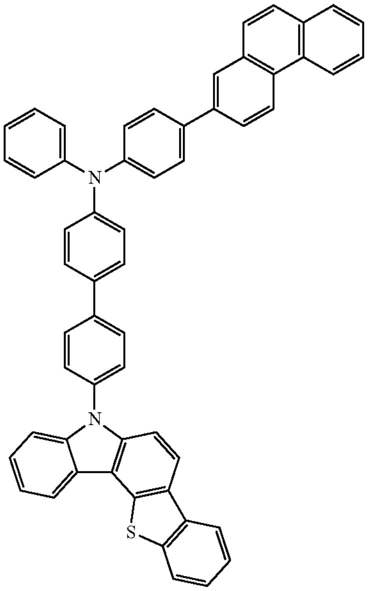
-continued
C-1-52
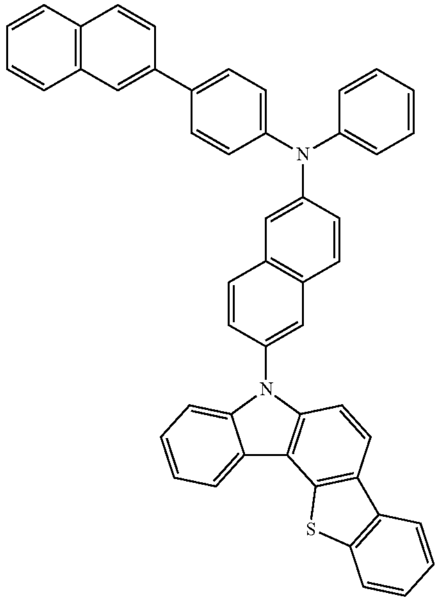
C-1-53
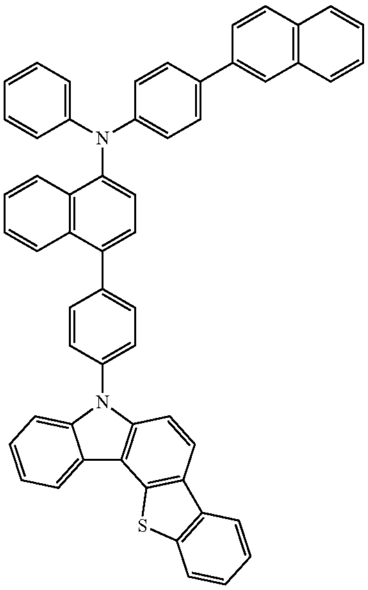

-continued
C-1-54
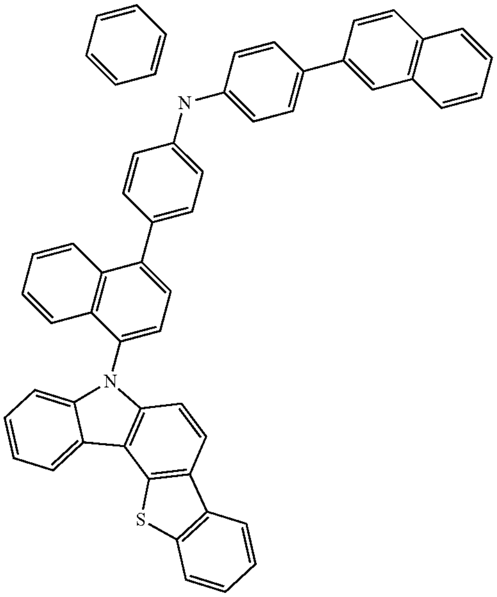
C-1-55
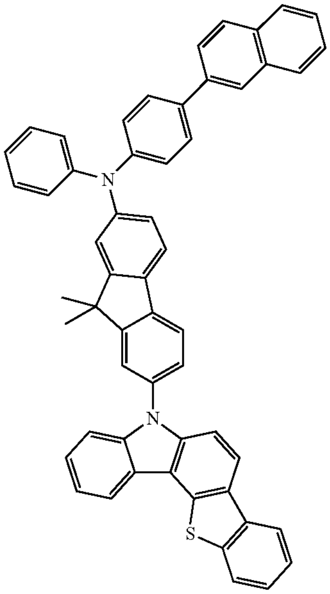
-continued
C-1-56
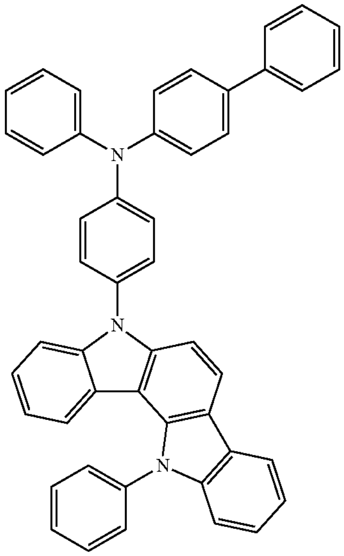
C-1-57
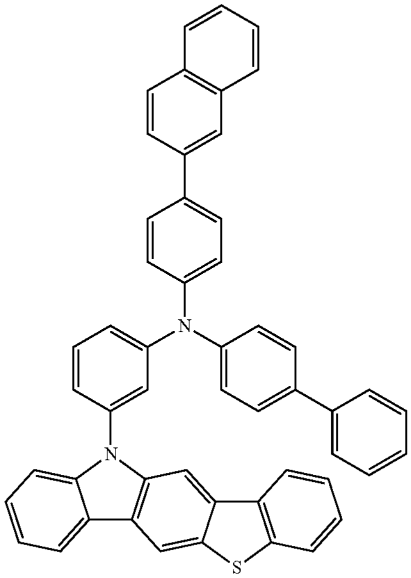

-continued
C-1-58
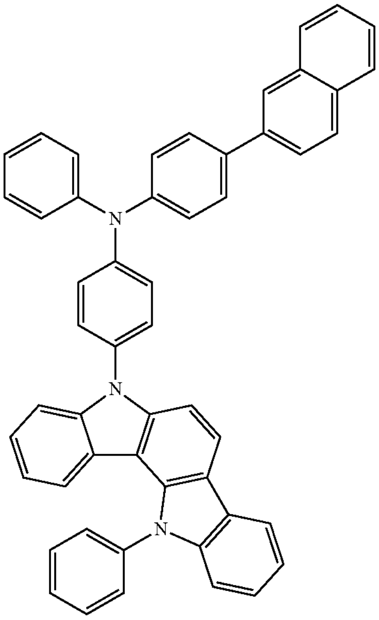
C-1-59
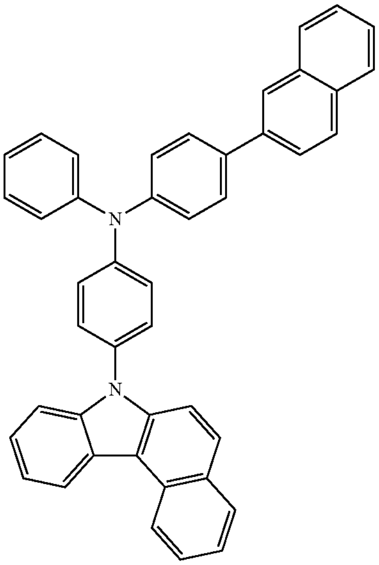
C-1-60
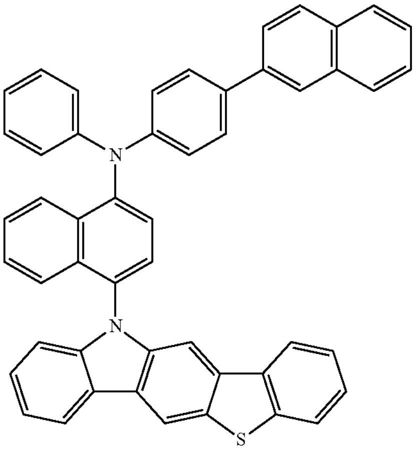
-continued
C-1-61
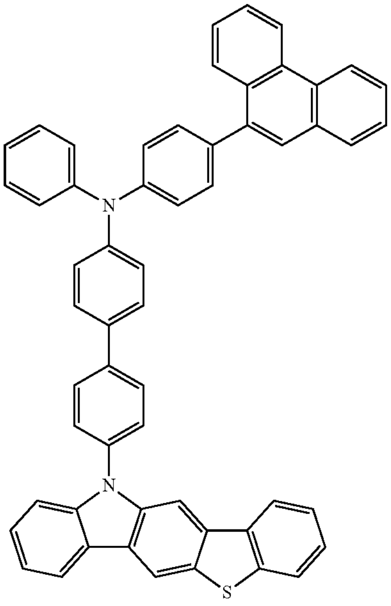
C-1-62
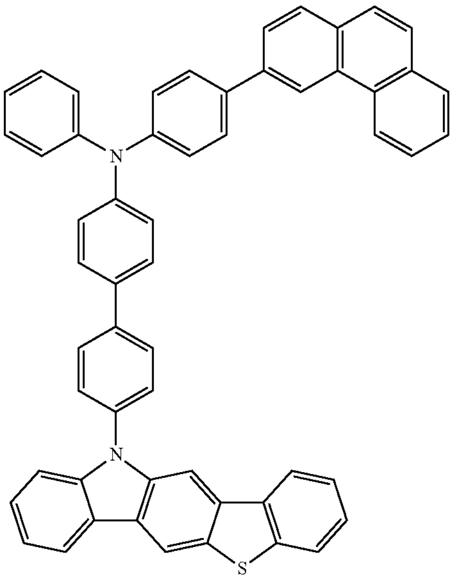
C-1-63
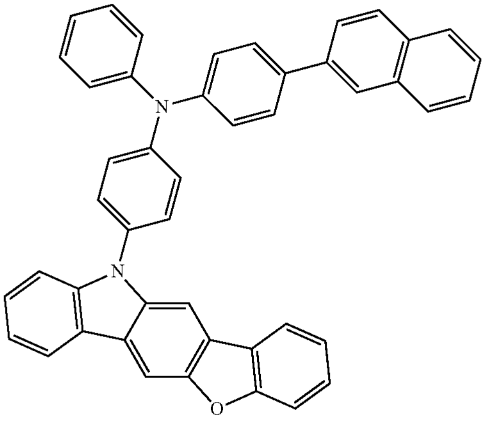

-continued
C-1-64
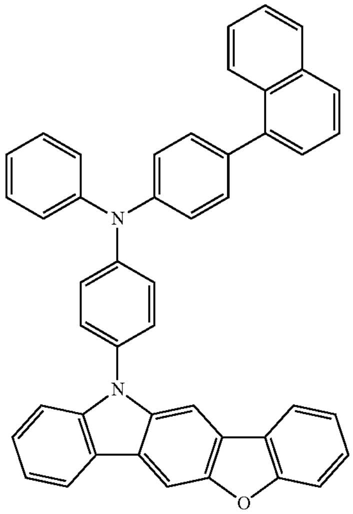
C-1-65
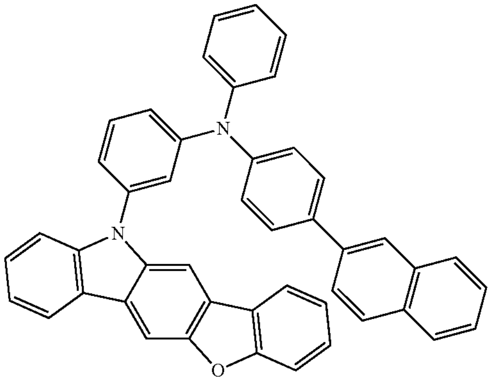
C-1-66
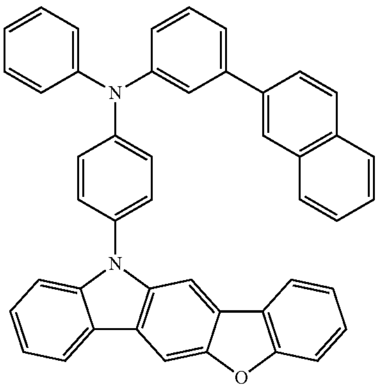
-continued
C-1-67
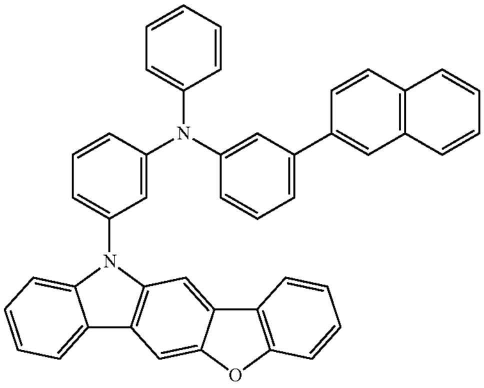
C-1-68
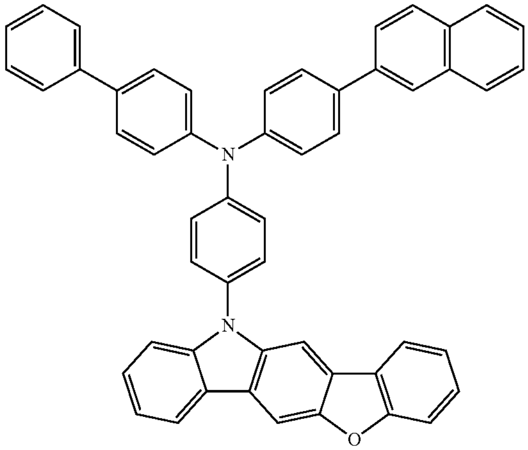
C-1-69
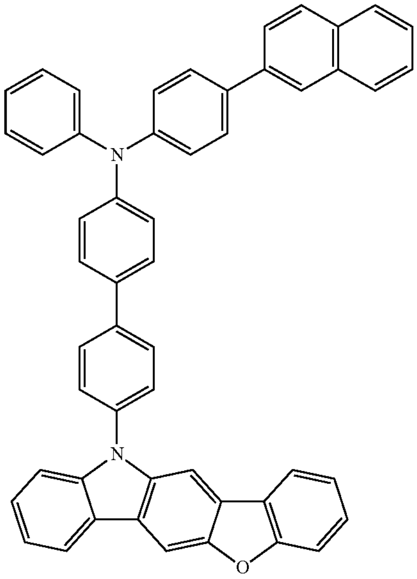

-continued
C-1-70
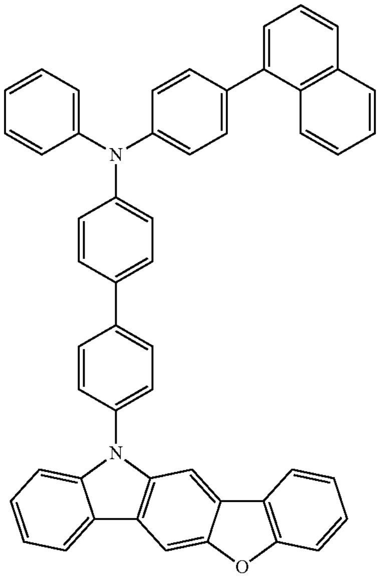
C-1-71
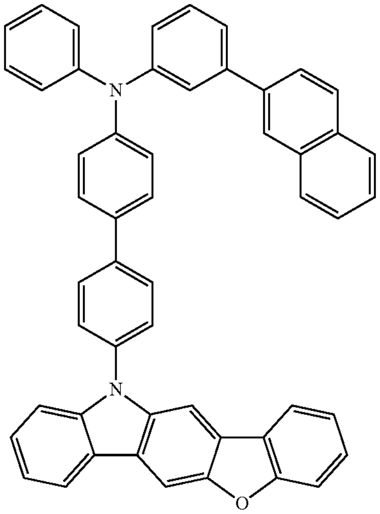
C-1-72
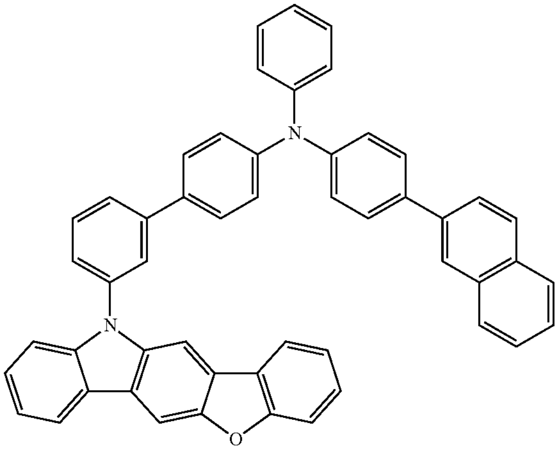
-continued
C-1-73
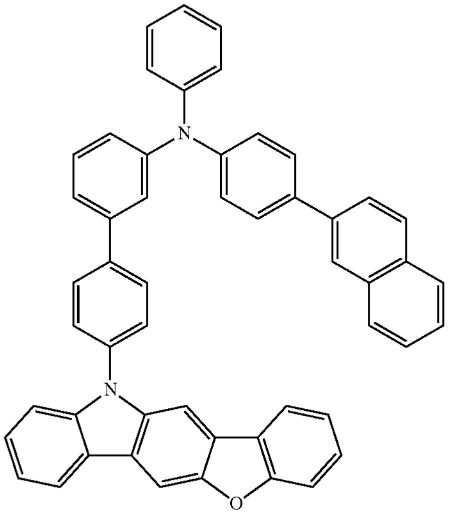
C-1-74
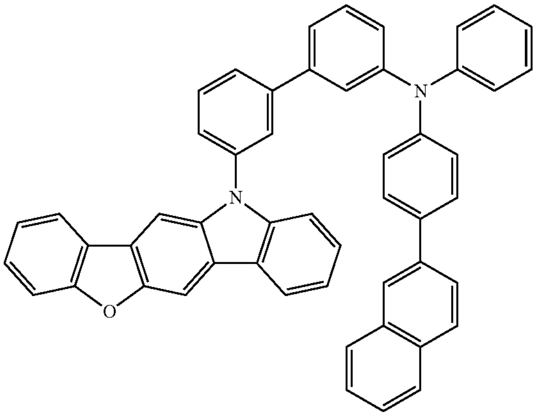
C-1-75
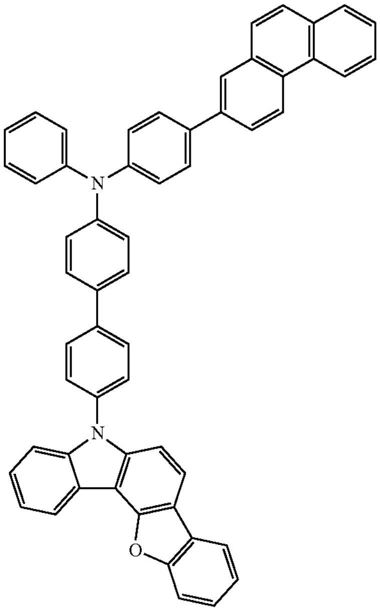

-continued
C-1-76
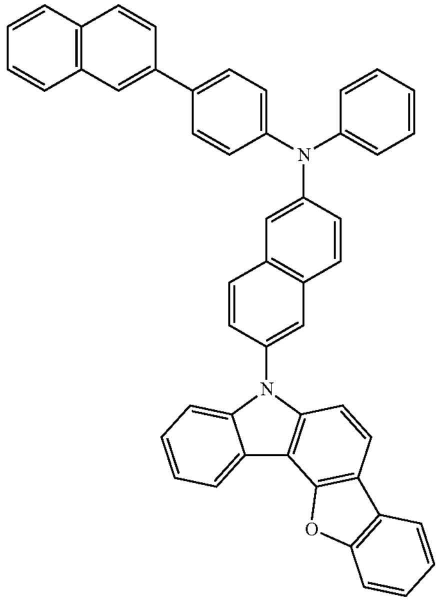
C-1-77
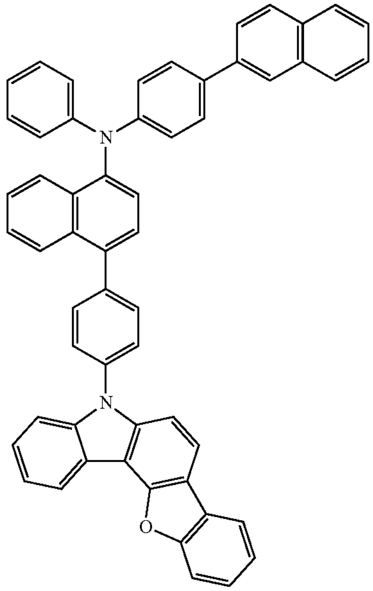
-continued
C-1-78
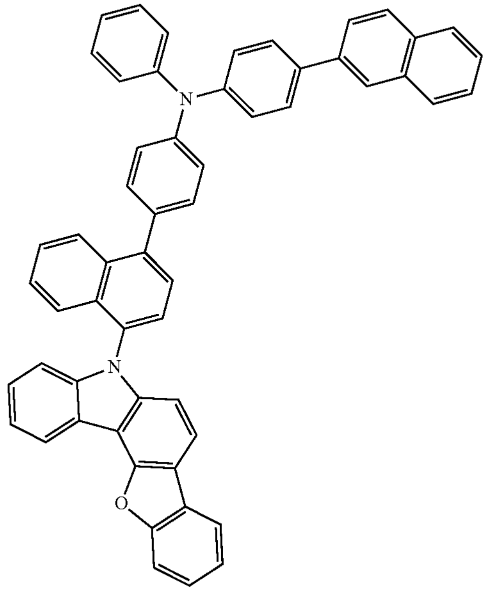
C-1-79
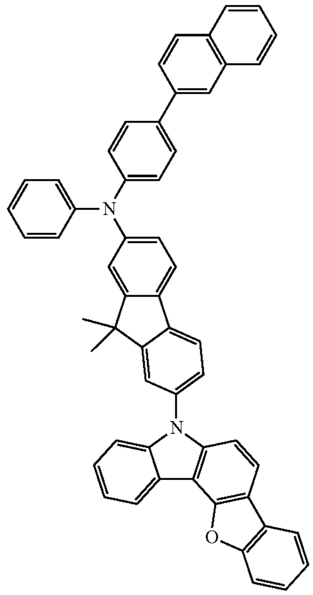

-continued
C-1-80
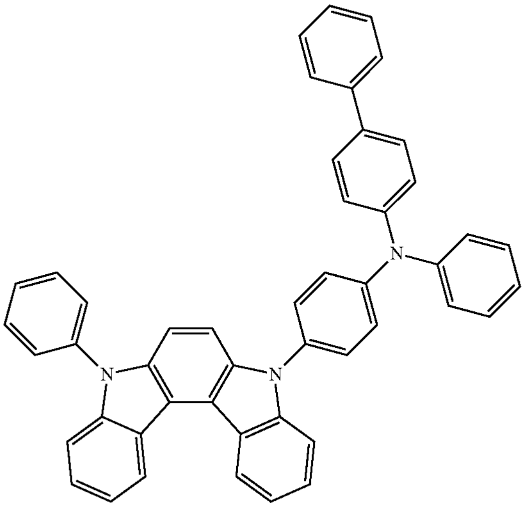
C-1-81
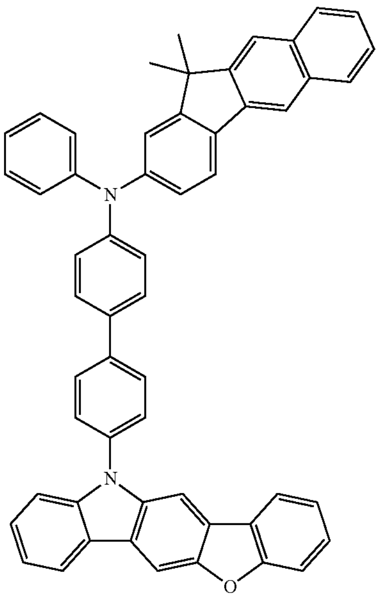
-continued
C-1-82
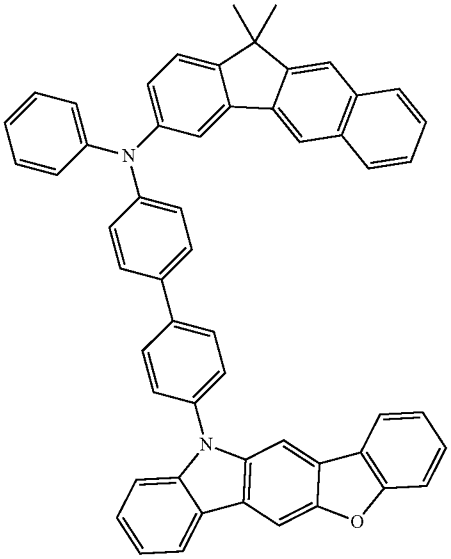
C-1-83
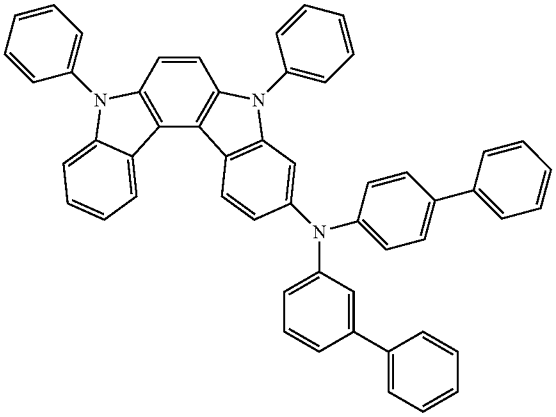
C-1-84
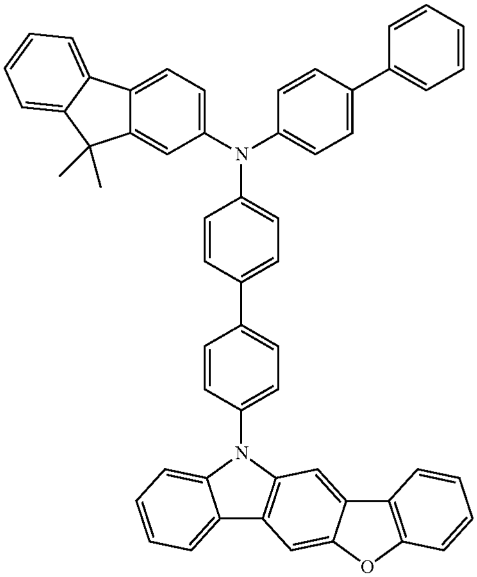

-continued
C-1-85
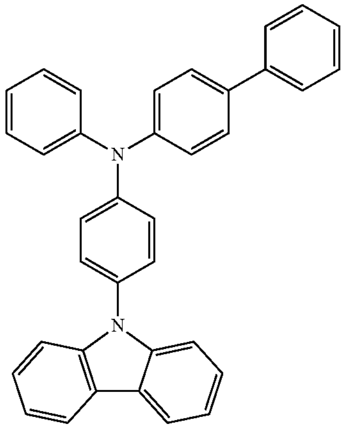
C-1-86
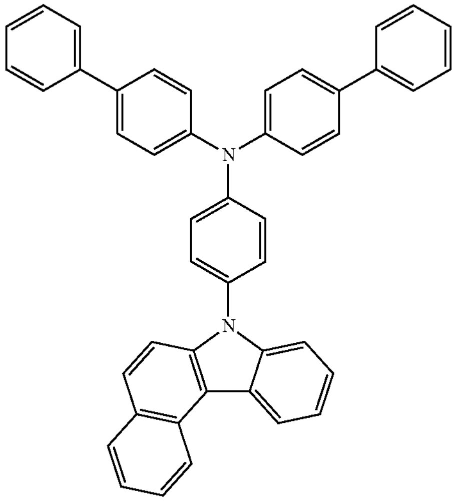
C-1-87
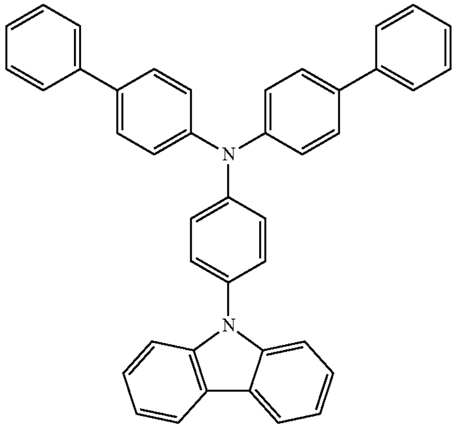
-continued
C-1-88
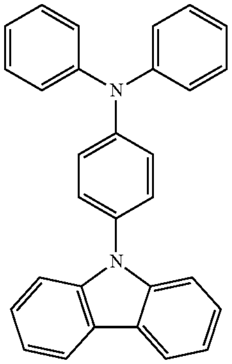
C-1-89
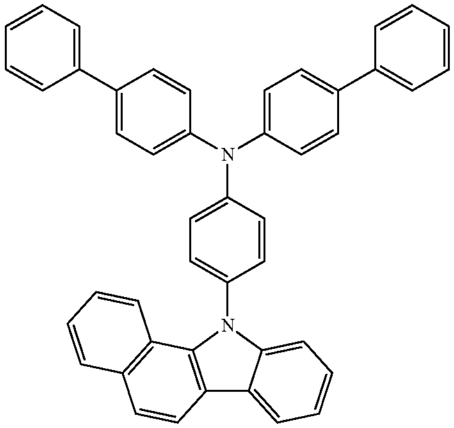
C-1-90
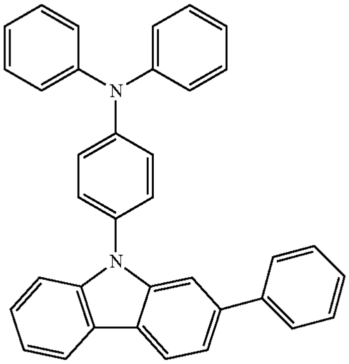
C-1-91
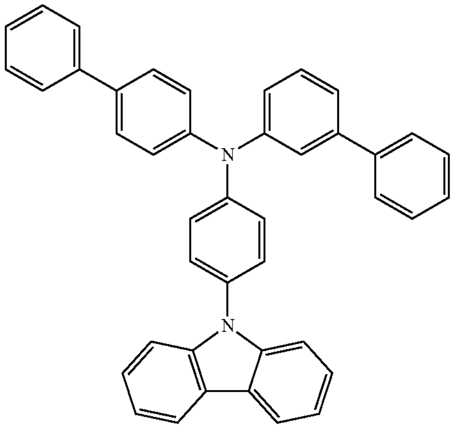

-continued
C-1-92
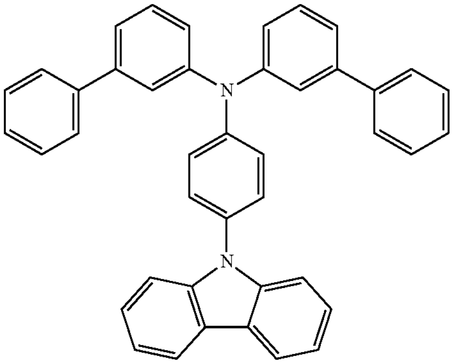
C-1-93
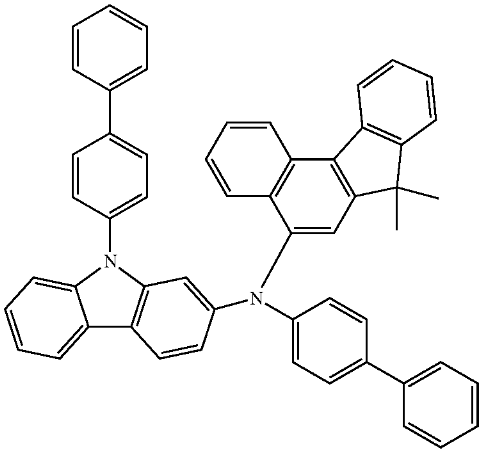
C-1-94
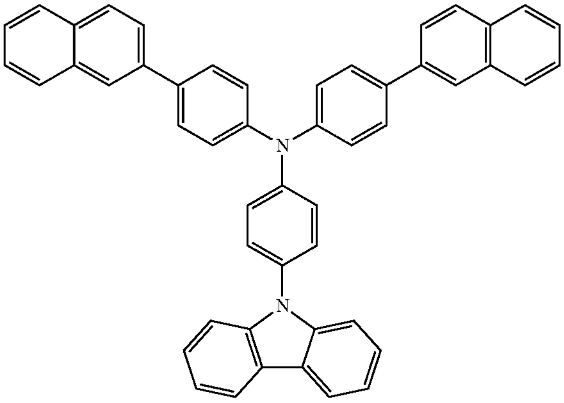
-continued
C-1-95
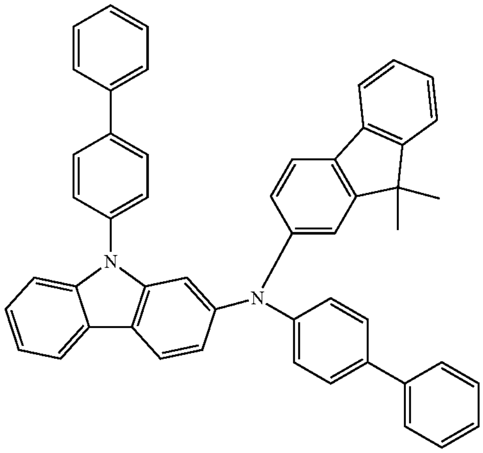
C-1-96
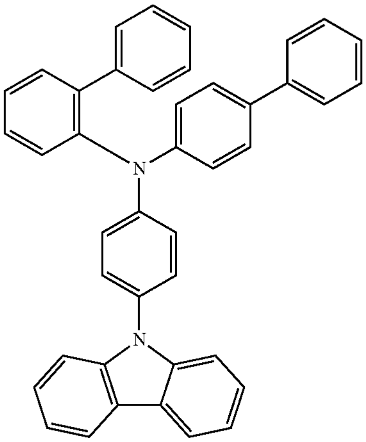
C-1-97
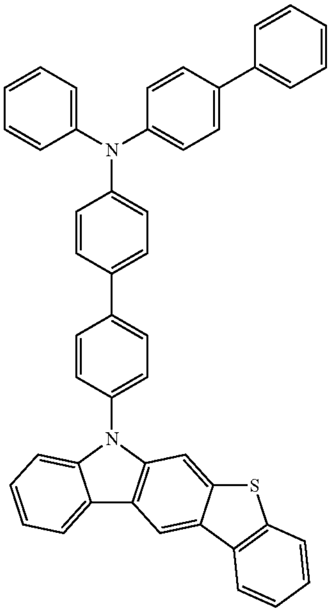

-continued
C-1-98
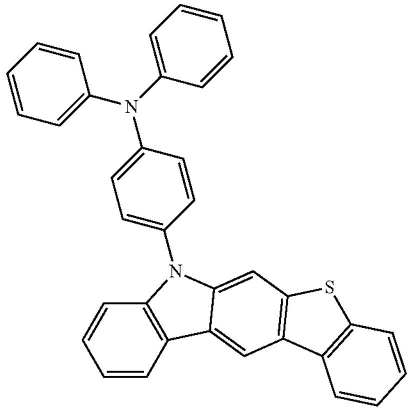
C-1-99
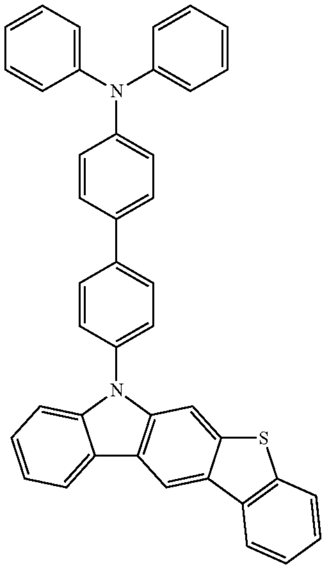
C-1-100
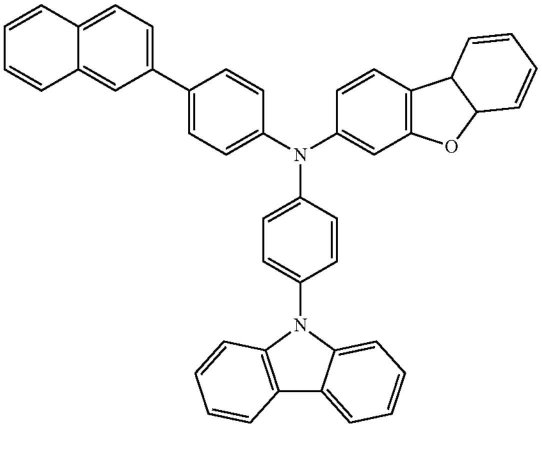
-continued
C-1-101
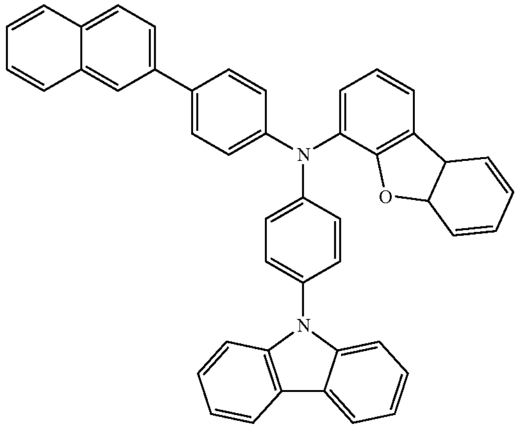
C-1-102
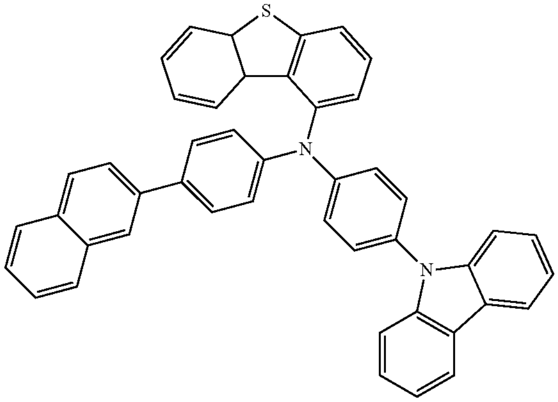
C-1-103
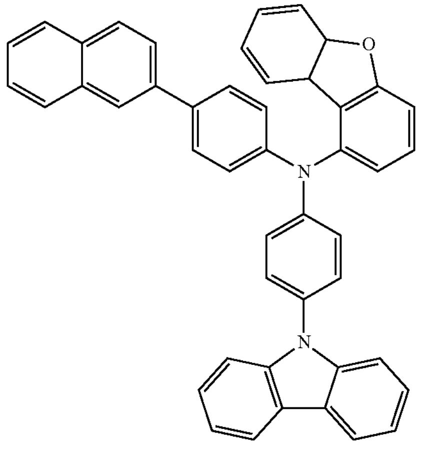

-continued
C-1-104
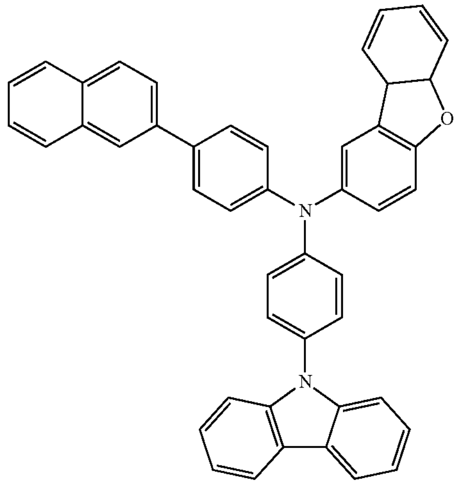
C-1-105
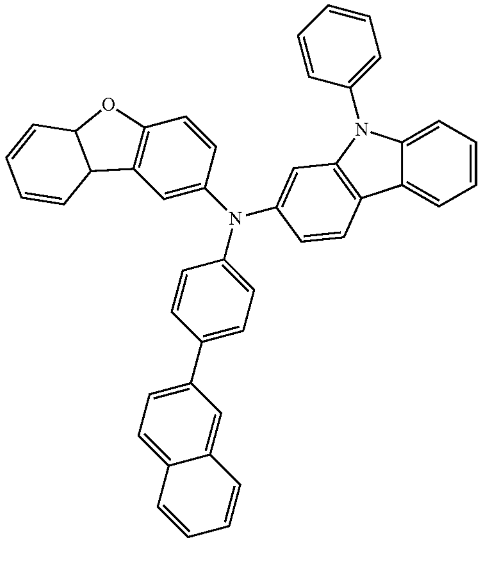
C-1-106
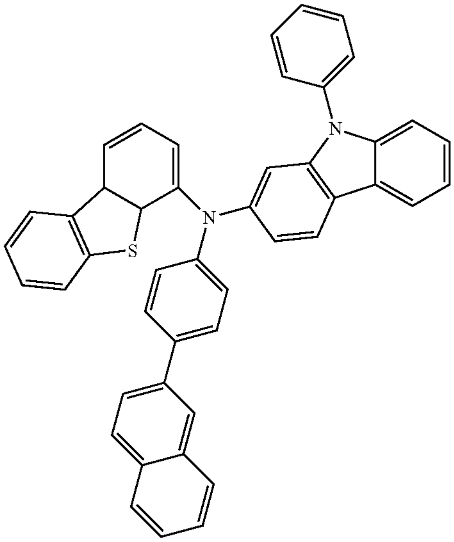
-continued
C-1-107
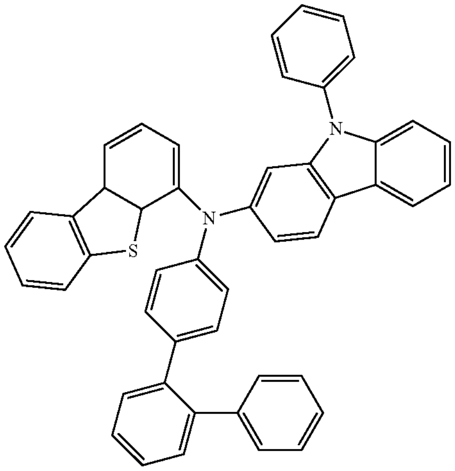
C-1-108
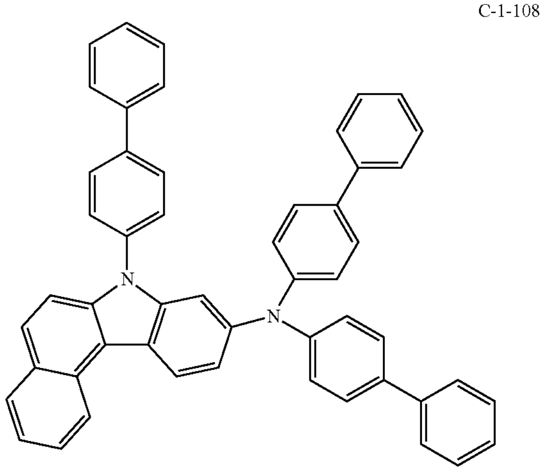
C-1-109
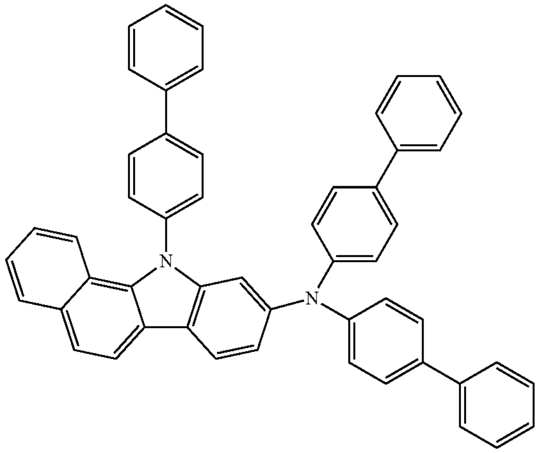

-continued
C-1-110
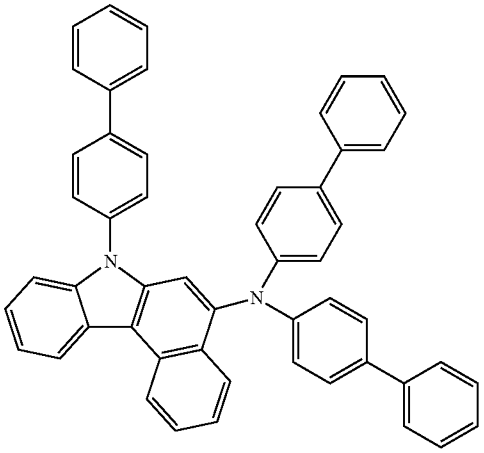
C-1-111
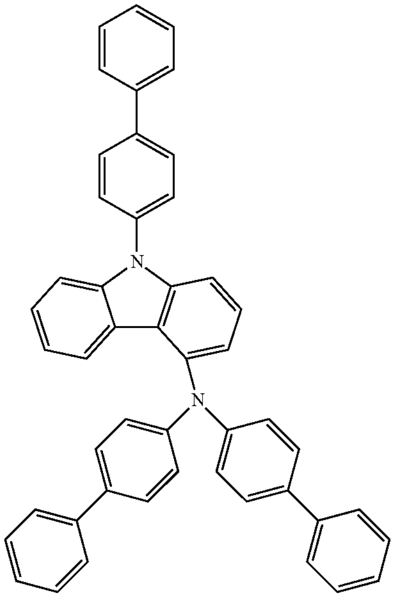
C-1-112
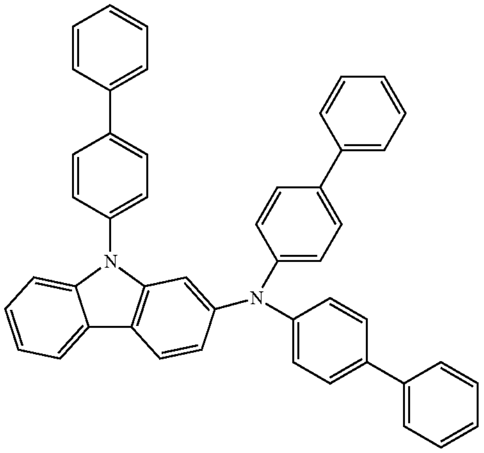
-continued
C-1-113
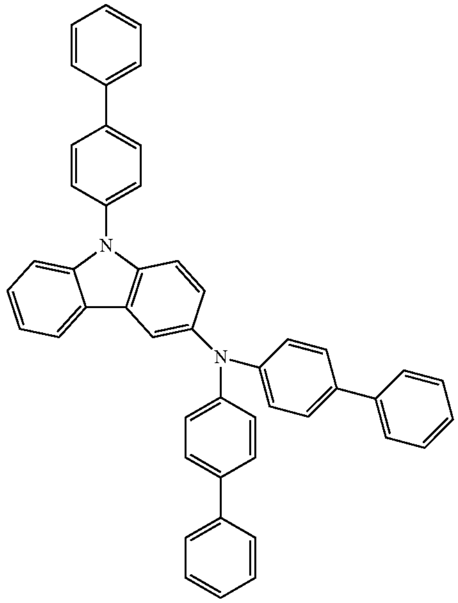
C-1-114
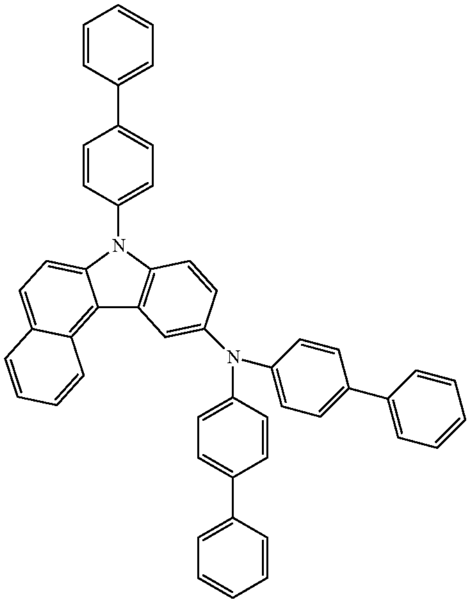

-continued
C-1-115
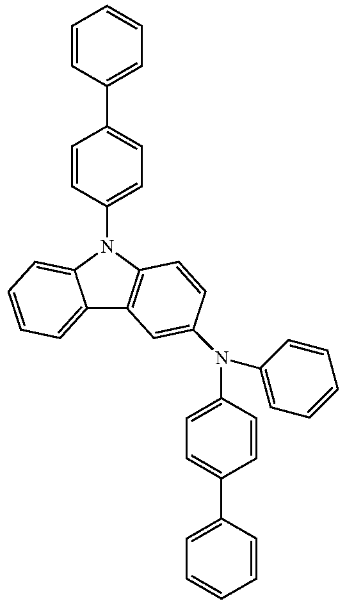
C-1-116
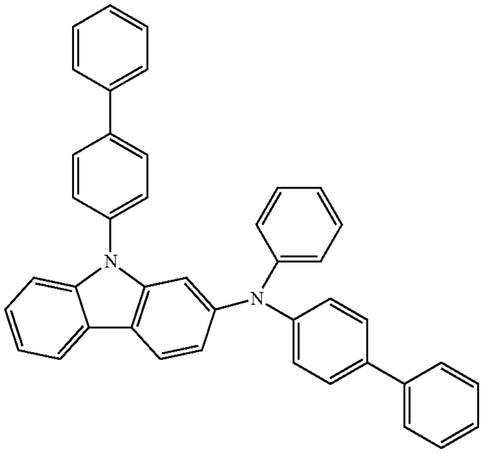
C-1-117
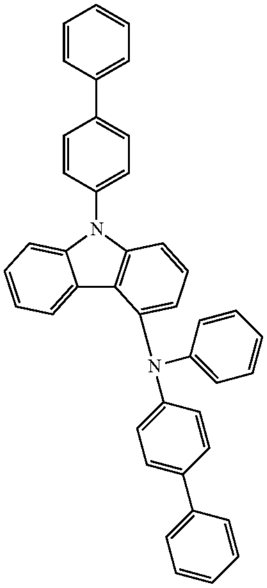
-continued
C-1-118
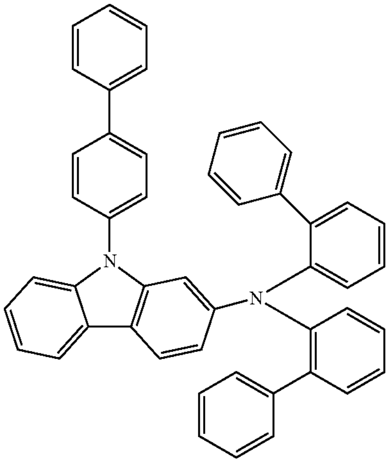
C-1-119
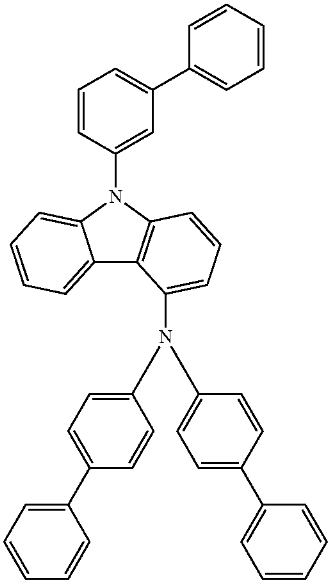
C-1-120
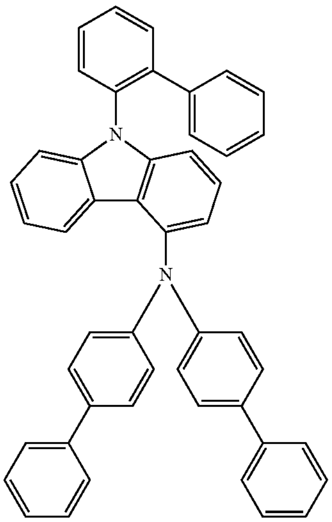

-continued
C-1-121
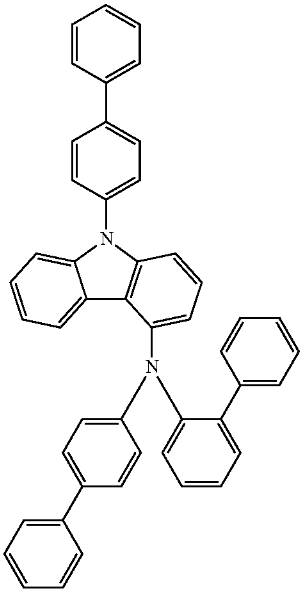
C-1-122
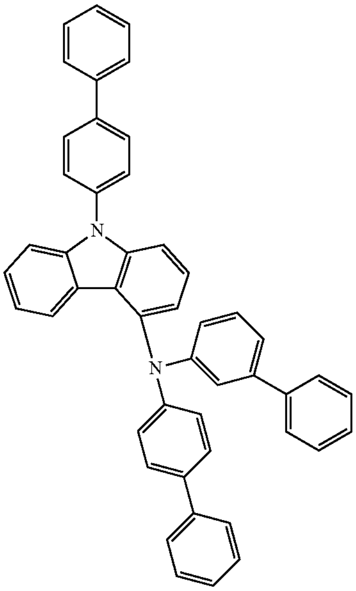
C-1-123
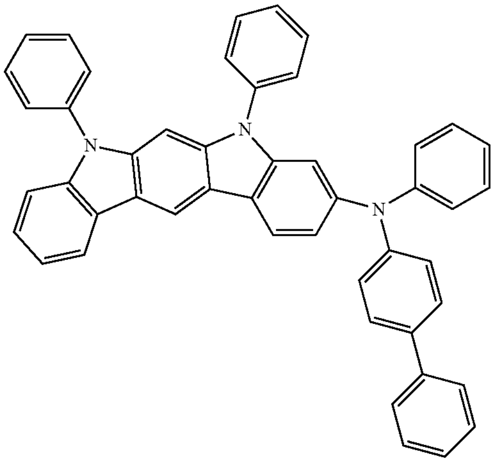
-continued
C-1-124
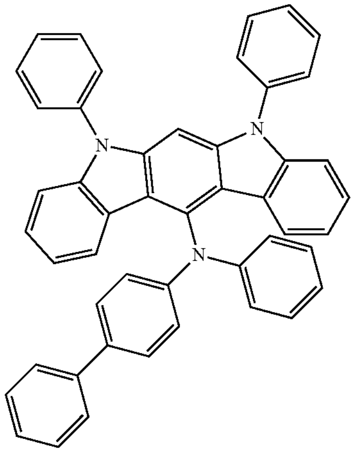
C-1-125
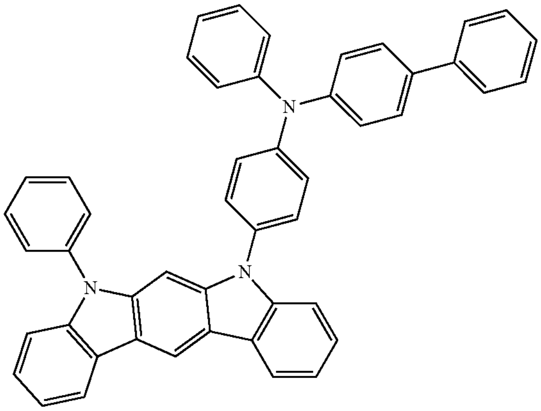
C-1-126
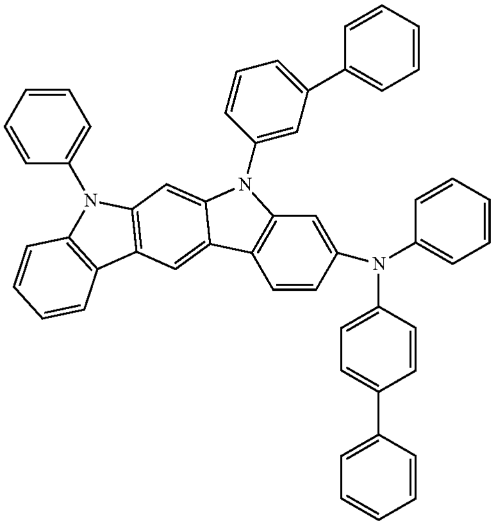

-continued
C-1-127
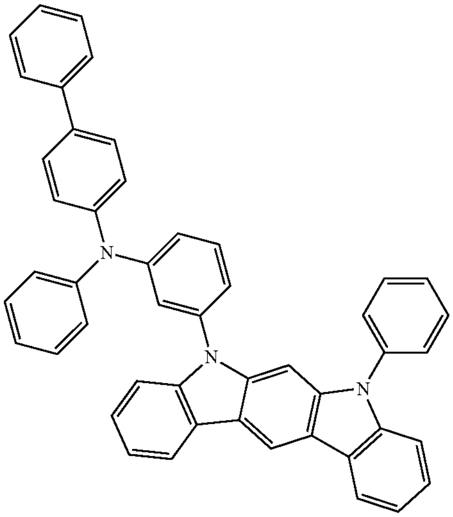
C-1-128
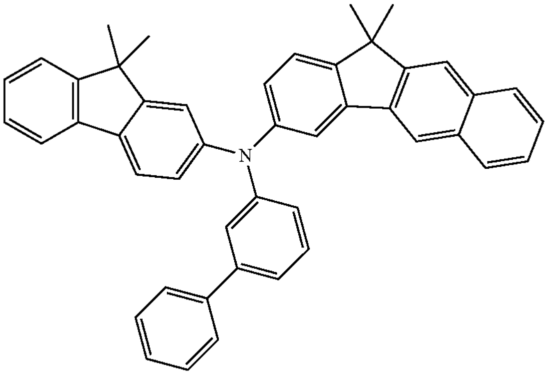
C-1-129
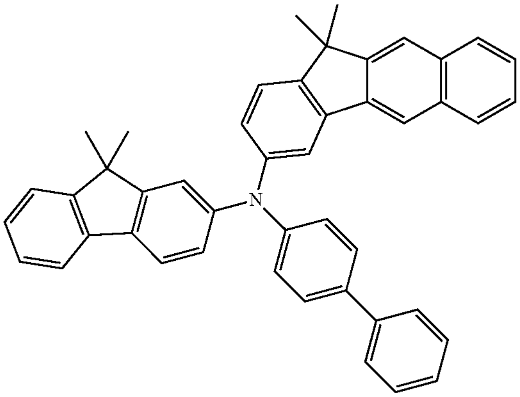
-continued
C-1-130
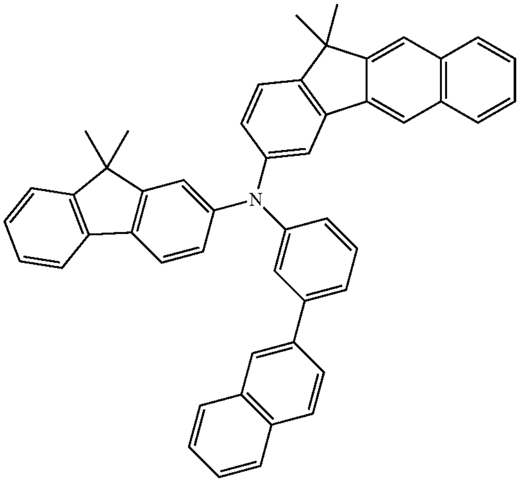
C-1-131
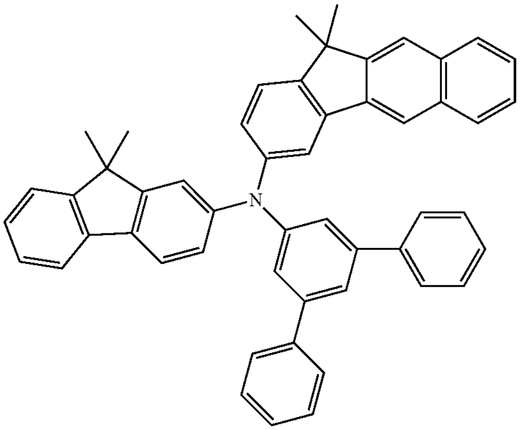
C-1-132
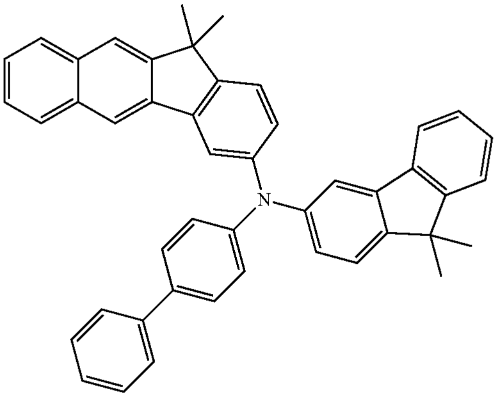

-continued
C-1-133
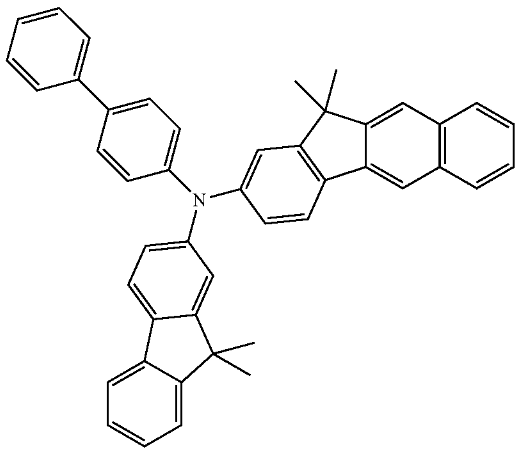
C-1-134
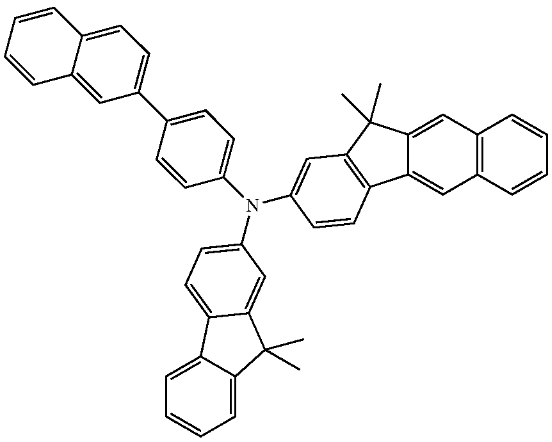
C-1-135
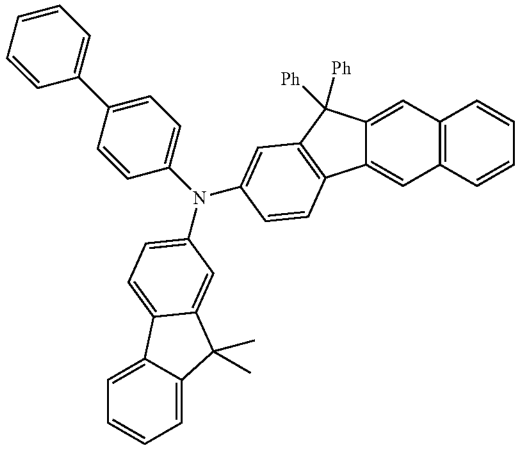
-continued
C-1-136
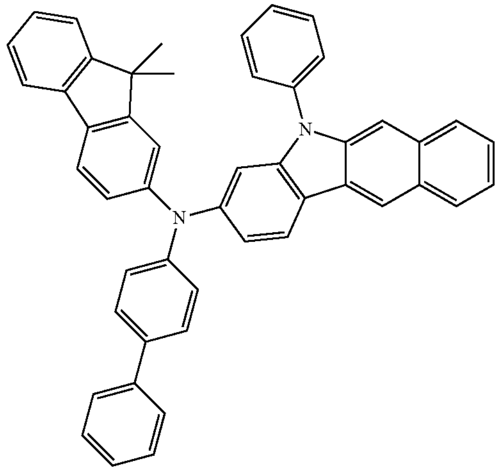
C-1-137
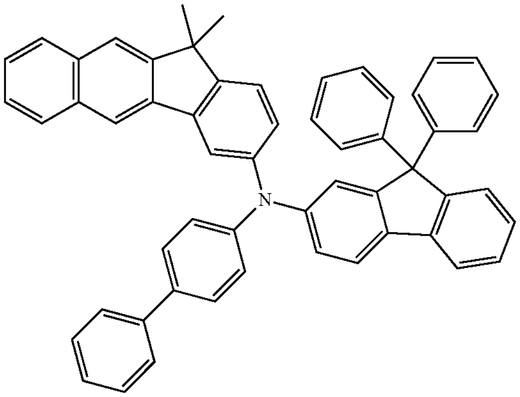
C-1-138
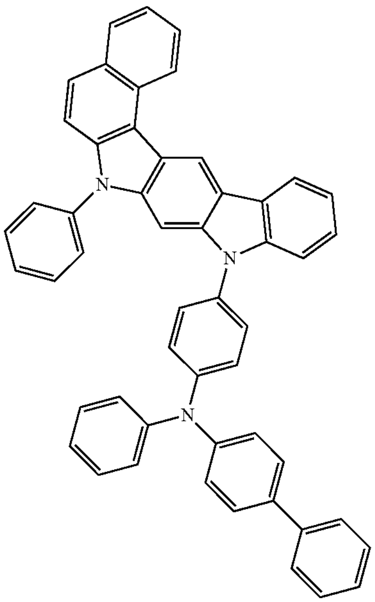

-continued

C-1-139

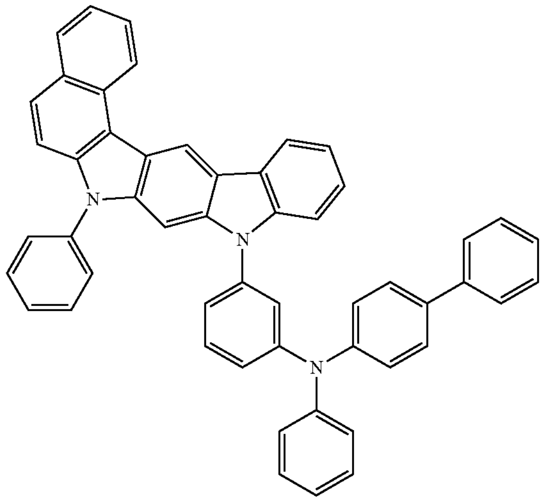

C-1-140

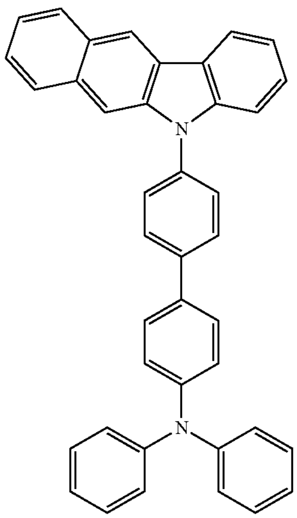

The compound of formula 1 according to the present disclosure may be produced by a synthetic method known to a person skilled in the art, for example, may be synthesized by the methods disclosed in KR 2013-0106255 A (2013.9.27), KR 2012-0042633 A (2012.5.3), and KR 2015-0066202 A (2015.6.16), but are not limited thereto.

The second host compound as another host material according to one embodiment may be represented by the following formula 2.

$$HAr—(L—Ar)_{a'} \quad (2)$$

In formula 2,

HAr represents a substituted or unsubstituted nitrogen-containing (3- to 10-membered)heteroaryl;

L represents a single bond, a substituted or unsubstituted (C6-C30)arylene, or a substituted or unsubstituted (3- to 30-membered)heteroarylene;

Ar represents a substituted or unsubstituted (C6-C30)aryl or a substituted or unsubstituted (3- to 30-membered) heteroaryl; and a' represents an integer of 1 to 3, when a' is 2 or more, each of (L-Ar) may be the same or different.

In one embodiment, HAr may be a substituted or unsubstituted nitrogen-containing (5- to 10-membered)heteroaryl, preferably, an unsubstituted nitrogen-containing (6- to 10-membered)heteroaryl. For example, HAr may be pyridinyl, pyrimidinyl, triazinyl, quinolinyl, quinoxalinyl, or quinazolinyl.

In one embodiment, L may be a single bond, a substituted or unsubstituted (C6-C25)arylene, or a substituted or unsubstituted (5- to 25-membered)heteroarylene, preferably, a single bond, an unsubstituted (C6-C20)arylene, or a substituted or unsubstituted (5- to 18-membered)heteroarylene. For example, L may be a single bond, naphthyl-substituted or unsubstituted phenylene, a substituted or unsubstituted m-biphenylene, a substituted or unsubstituted p-biphenylene, a substituted or unsubstituted naphthylene, a substituted or unsubstituted fluorenylene, or a substituted or unsubstituted pyridinylene.

In one embodiment, Ar may be a substituted or unsubstituted (C6-C25)aryl or a substituted or unsubstituted (5- to 25-membered)heteroaryl, preferably, (C6-C18)aryl or a substituted or unsubstituted (5- to 18-membered)heteroaryl. For example, Ar may be a naphthyl- or fluorenyl-substituted or unsubstituted phenyl, a substituted or unsubstituted m-biphenyl, a substituted or unsubstituted p-biphenyl, a substituted or unsubstituted naphthyl, a substituted or unsubstituted m-terphenyl, a substituted or unsubstituted p-terphenyl, a substituted or unsubstituted triphenylenyl, a substituted or unsubstituted phenanthrenyl, at least one phenyl- or at least one methyl-substituted fluorenyl, a substituted or unsubstituted dibenzothiophenyl, a substituted or unsubstituted dibenzofuranyl, phenyl-substituted or unsubstituted carbazolyl, or at least one of methyl-, phenyl-, biphenyl-, naphthyl-, and pyridinyl-substituted or unsubstituted benzofluorenyl.

In one embodiment, a' may be an integer of 2 or 3, wherein each of (L-Ar) may be the same or different.

The compound represented by the formula 2 may be represented by the following formula 2-1 or 2-2.

(2-1)

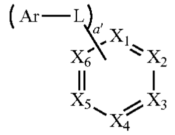

(2-2)

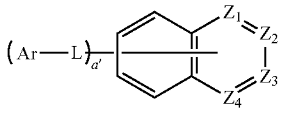

In formulae 2-1 and 2-2, $X_1$ to $X_6$ and $Z_1$ to $Z_4$ each independently represent $CR_a$ or N, wherein at least one of $X_1$ to $X_6$ is N, and at least one of $Z_1$ to $Z_4$ is N;

$R_a$ represents each independently represent hydrogen, a substituted or unsubstituted (C1-C30)alkyl, a substituted or unsubstituted (C2-C30)alkenyl, or a substituted or unsubstituted (C6-C30)aryl; and L, Ar, and a' are as defined in formula 2.

In one embodiment, in formula 2-1, at least one of $X_1$ to $X_6$ is N, preferably, at least two of $X_1$ to $X_6$ may be N, more preferably, at least three of $X_1$ to $X_6$ may be N. For example, the compound represented by the formula 2-1 may be $(L\text{-}Ar)_{a'}$-substituted, pyridine, pyrimidine, or triazine.

In one embodiment, in formula 2-2, at least one of $Z_1$ to $Z_4$ is N, preferably, at least two of $Z_1$ to $Z_4$ may be N. For example, the compound represented by the formula 2-2 may be $(L\text{-}Ar)_{a}$-substituted, quinoline, quinoxaline, or quinazoline.

In one embodiment, $R_a$ may be all hydrogen.

According to one embodiment, the second host compound represented by formula 2 may be more specifically illustrated by the following compounds, but is not limited thereto.

C-2-1

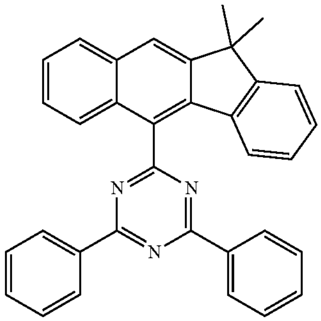

C-2-2

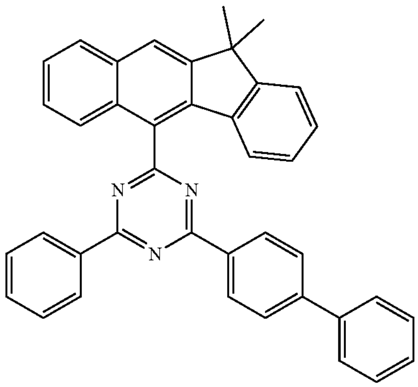

C-2-3

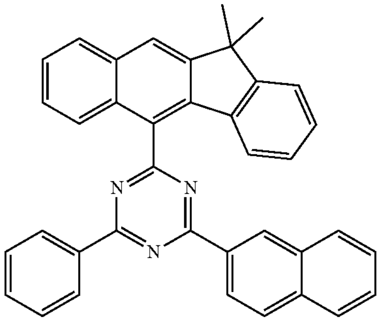

-continued

C-2-4

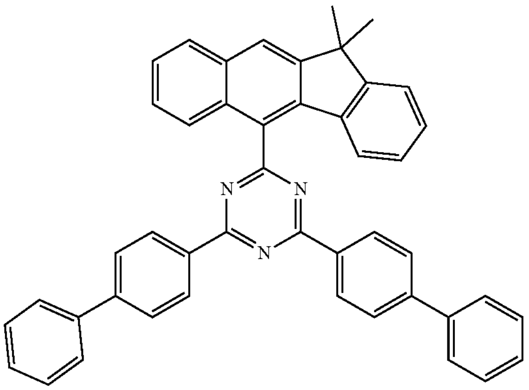

C-2-5

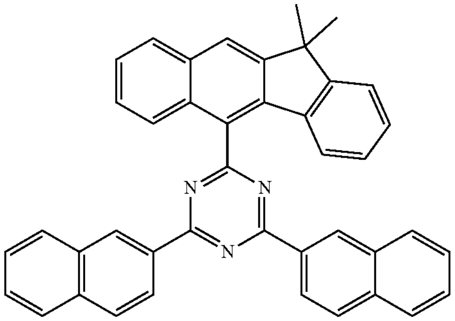

C-2-6

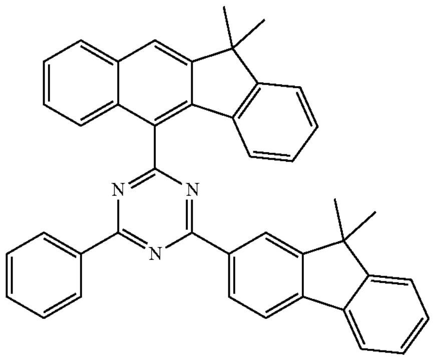

C-2-7

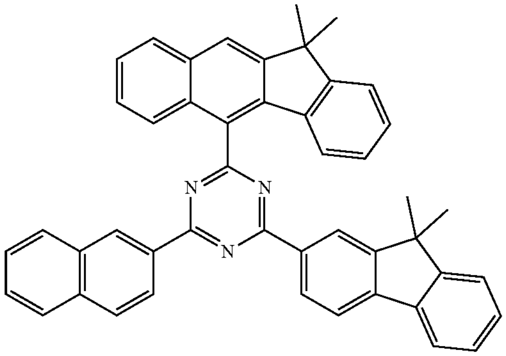

-continued
C-2-8
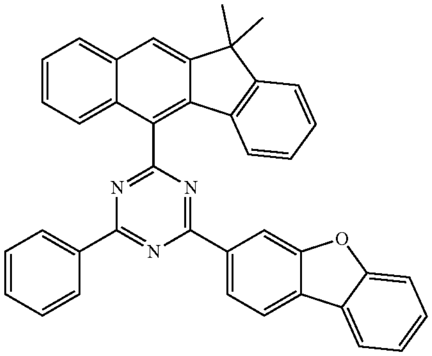
C-2-9
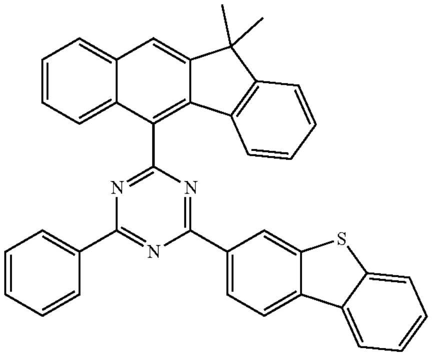
C-2-10
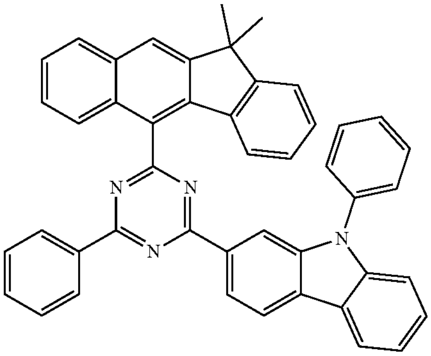
C-2-11
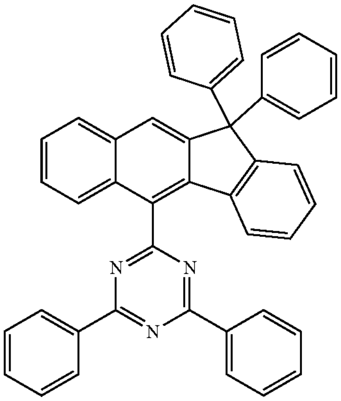
-continued
C-2-12
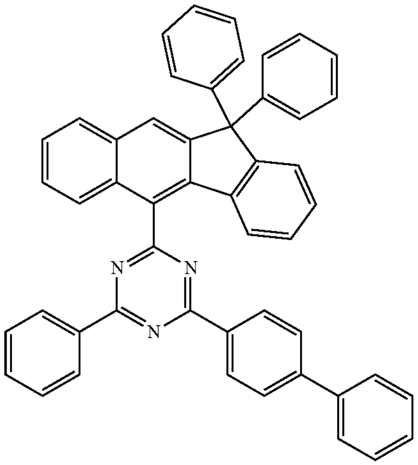
C-2-13
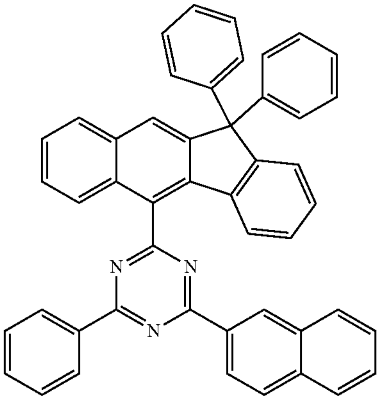
C-2-14
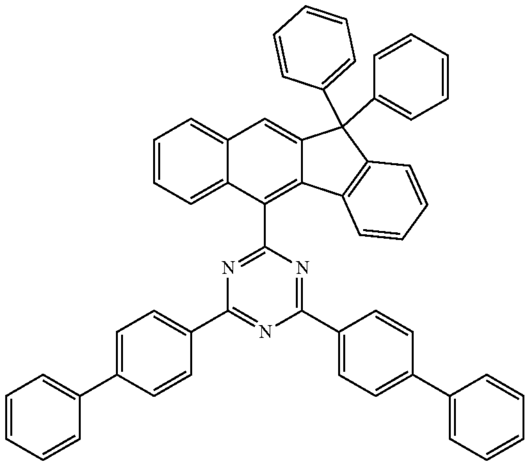

-continued
C-2-15
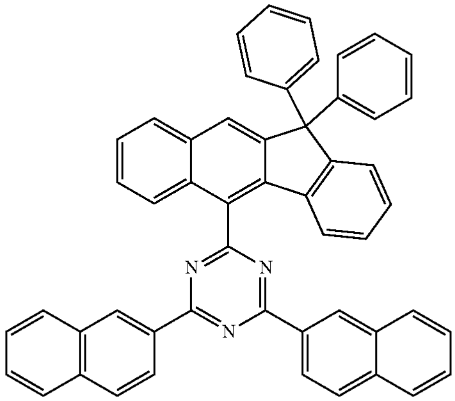
C-2-16
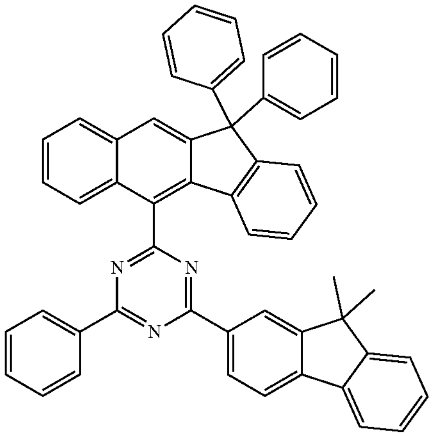
C-2-17
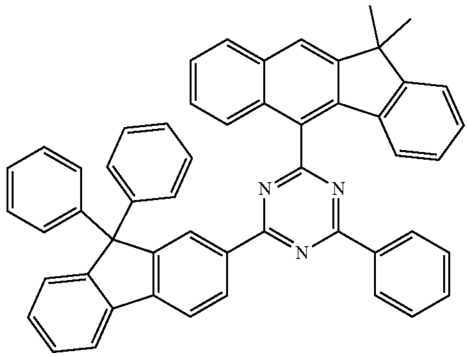
C-2-18
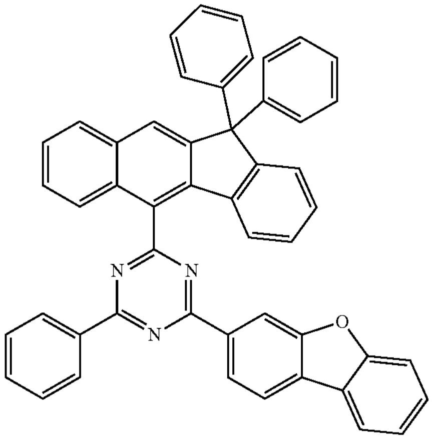
-continued
C-2-19
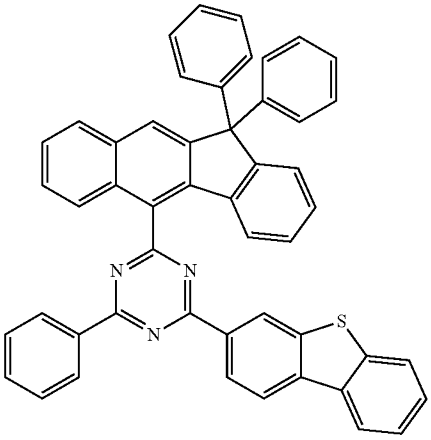
C-2-20
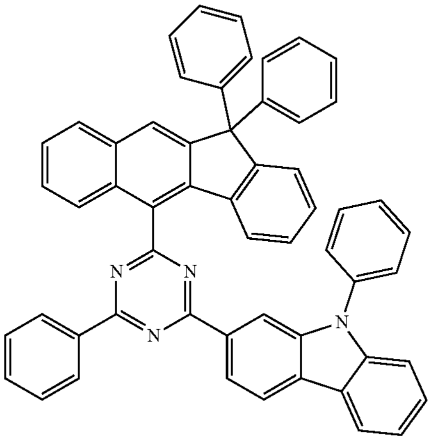
C-2-21
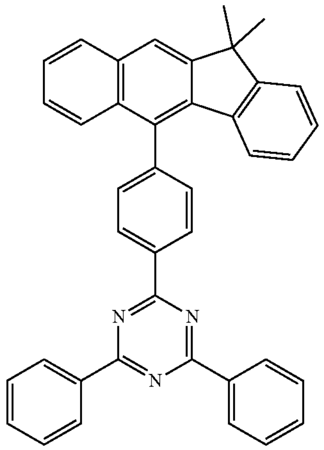

-continued
C-2-22
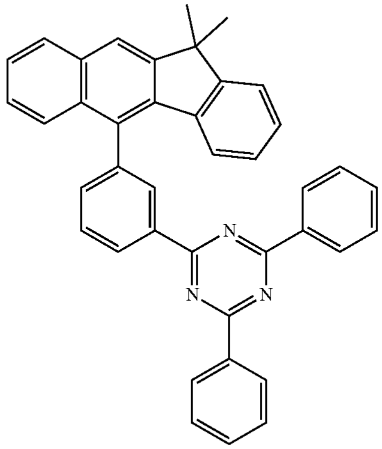
C-2-23
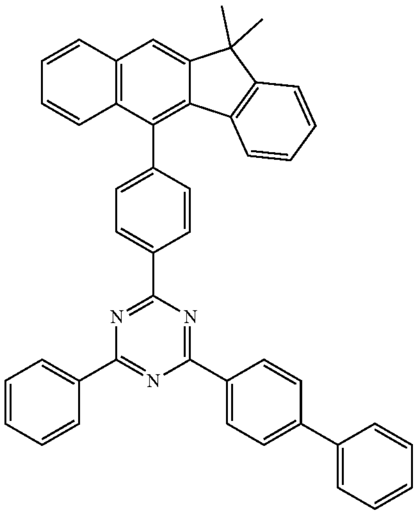
C-2-24
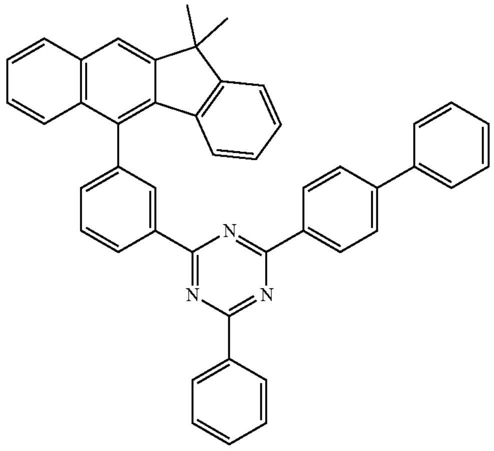
-continued
C-2-25
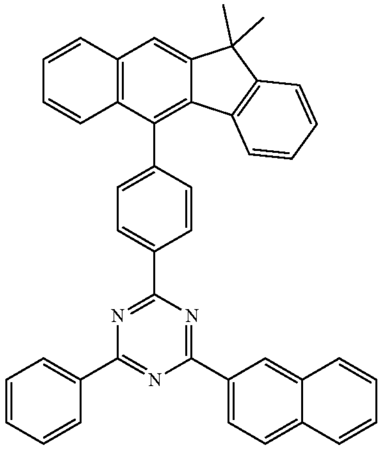
C-2-26
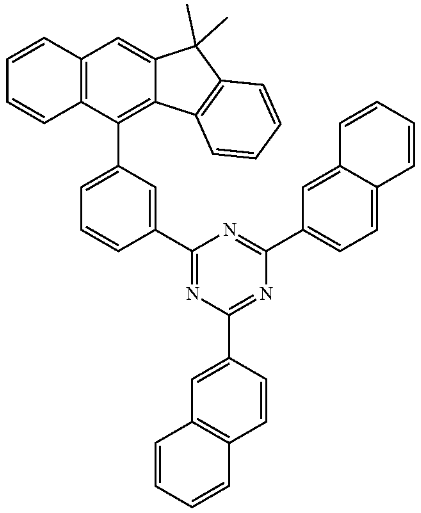
C-2-27
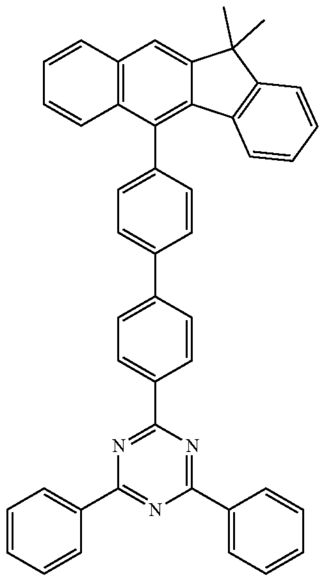

-continued
C-2-28
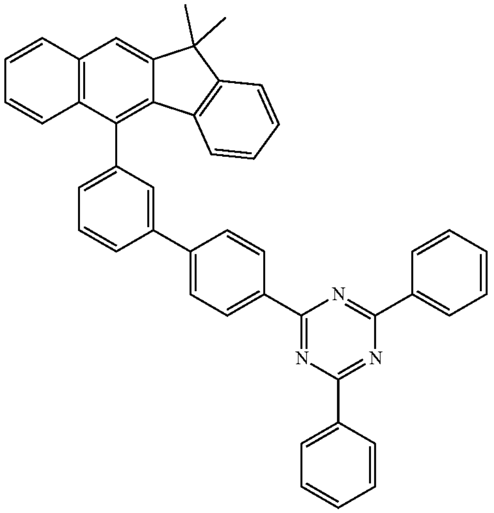
C-2-29
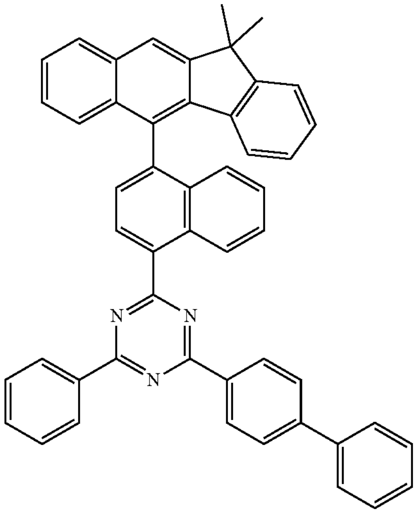
C-2-30
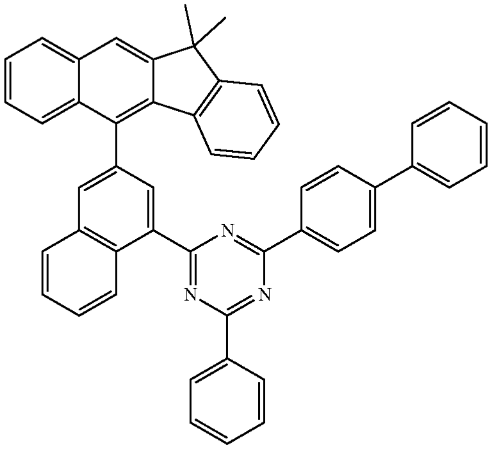
-continued
C-2-31
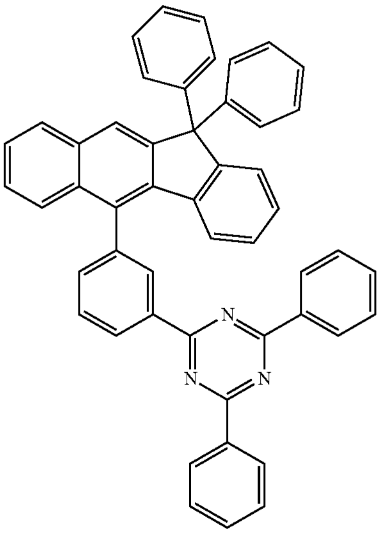
C-2-32
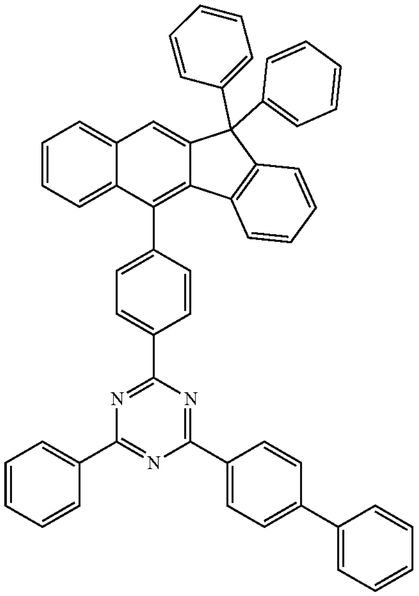
C-2-33
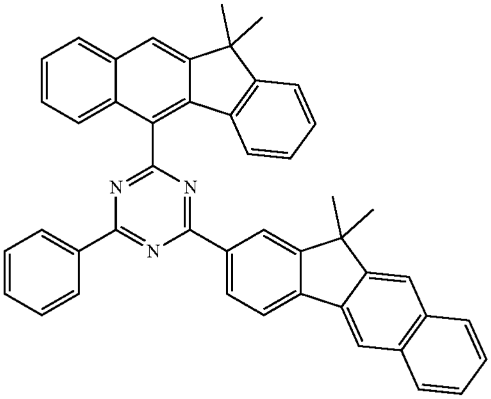

-continued
C-2-34
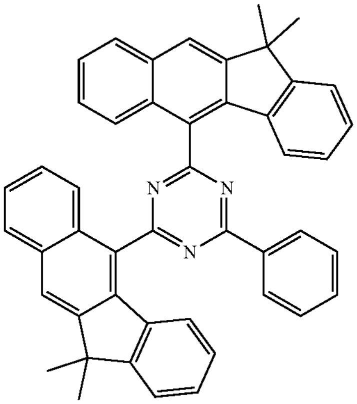
C-2-35
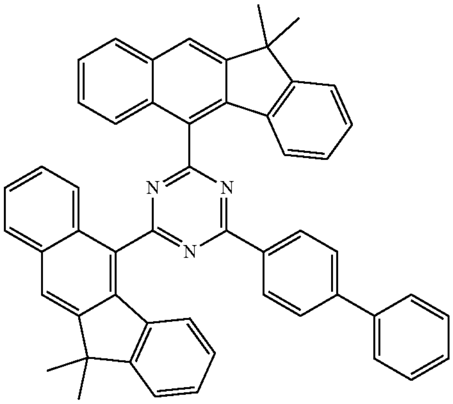
C-2-36
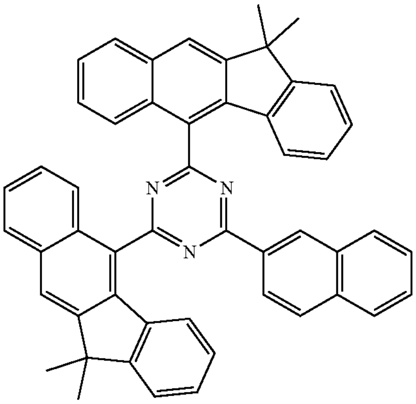
C-2-37
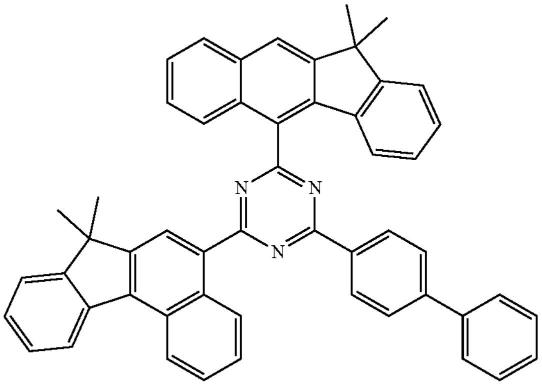
-continued
C-2-38
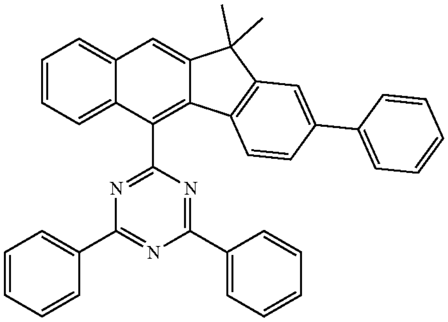
C-2-39
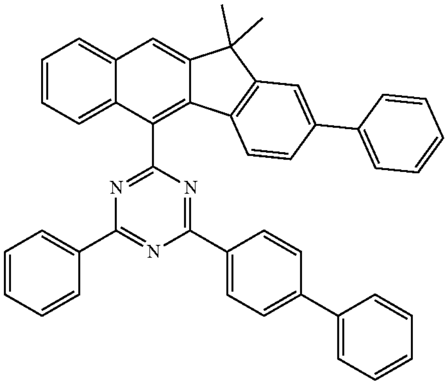
C-2-40
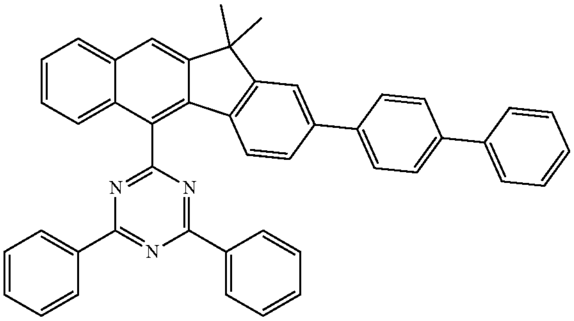
C-2-41
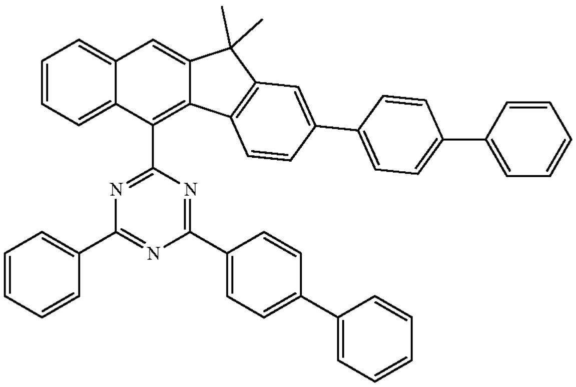

-continued
C-2-42
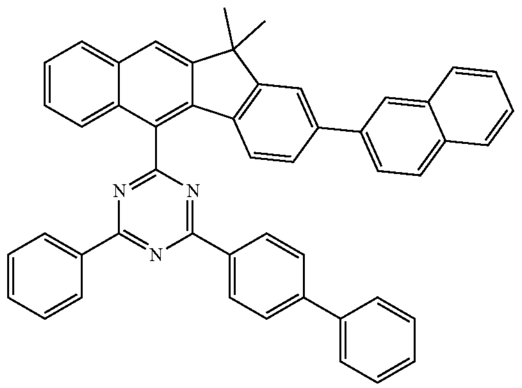
C-2-43
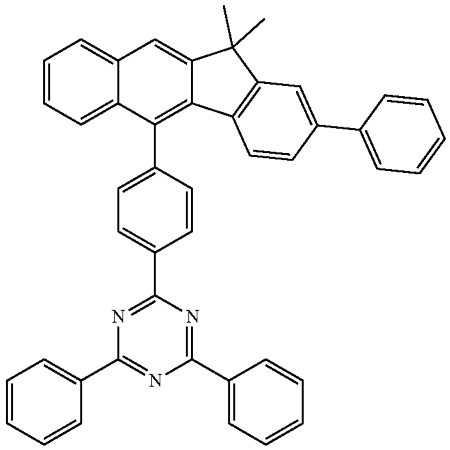
C-2-44
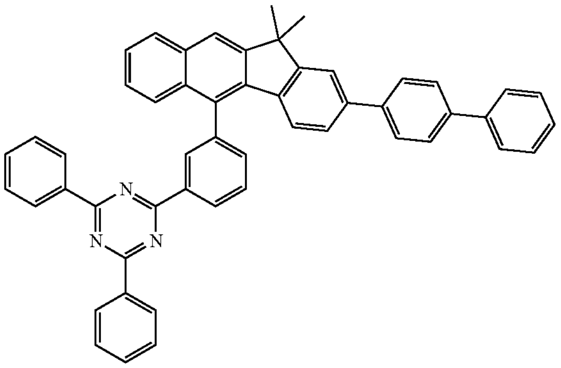
-continued
C-2-45
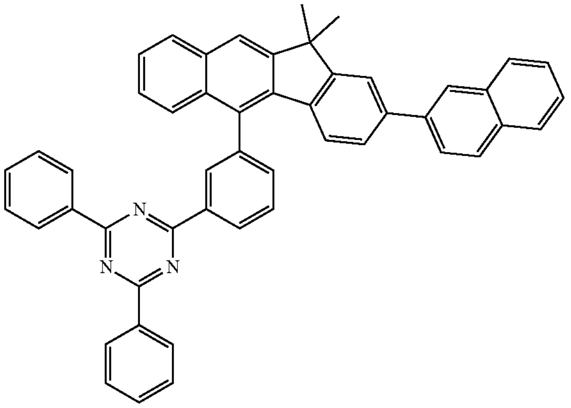
C-2-46
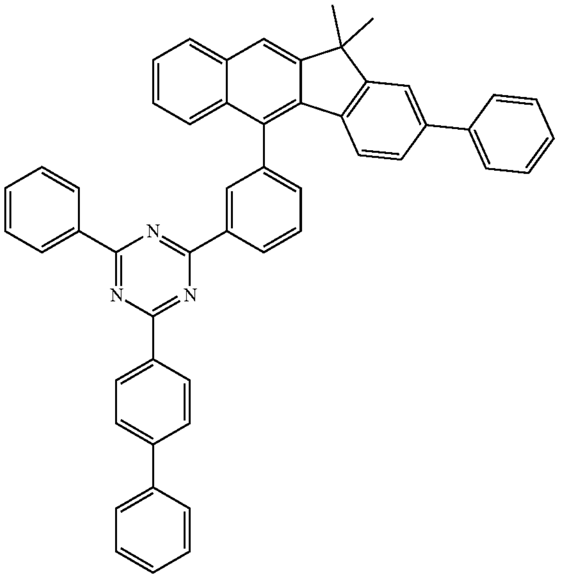
C-2-47
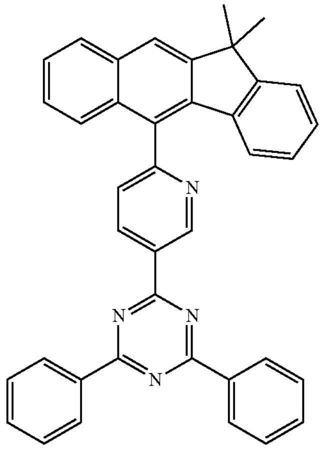

-continued
C-2-48
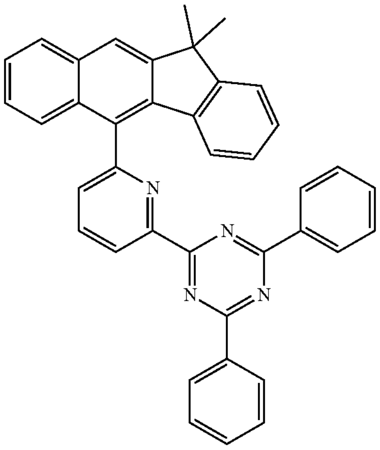
C-2-49
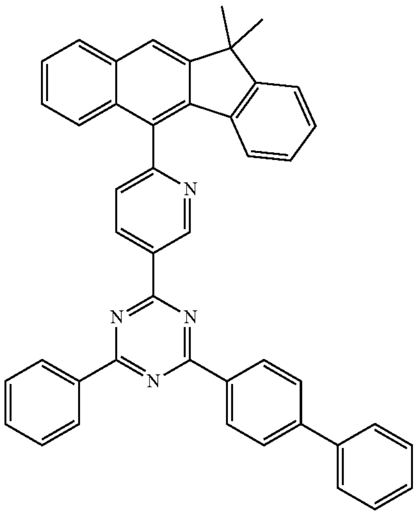
C-2-50
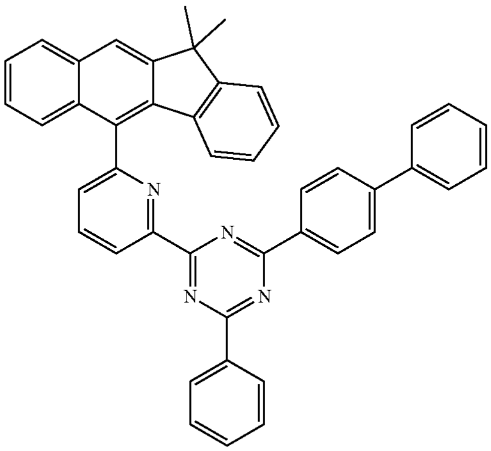
-continued
C-2-51
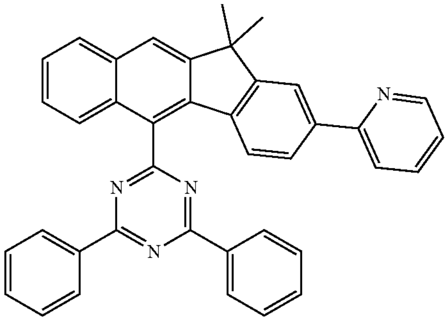
C-2-52
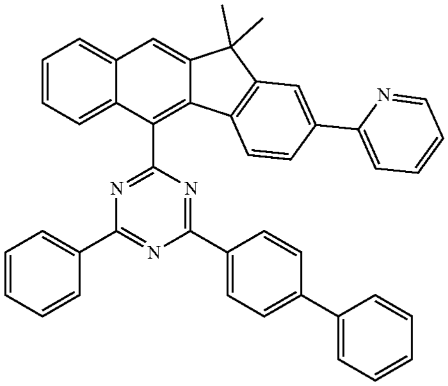
C-2-53
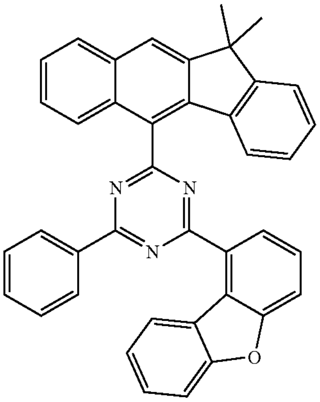
C-2-54
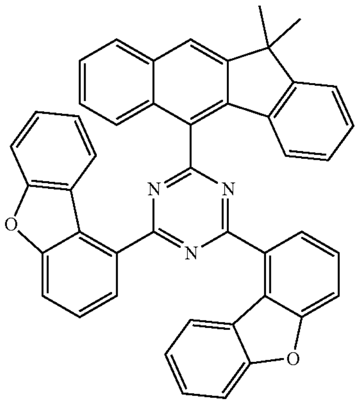

-continued
C-2-55
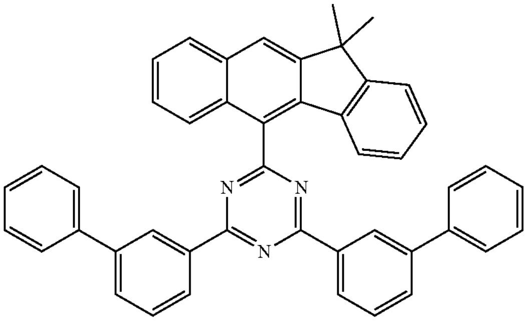
C-2-56
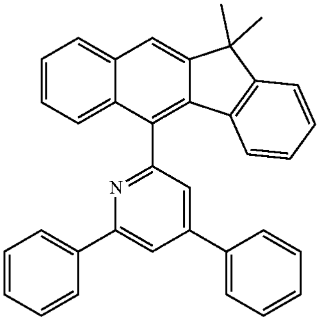
C-2-57
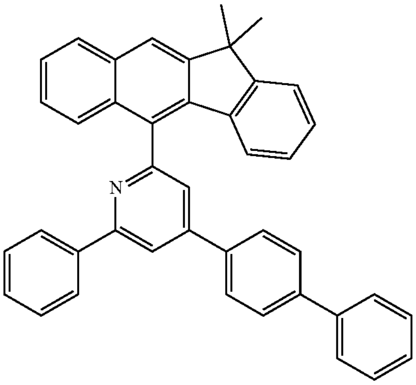
C-2-58
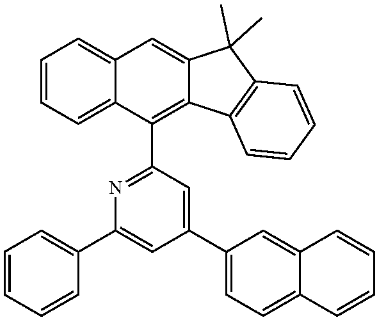
-continued
C-2-59
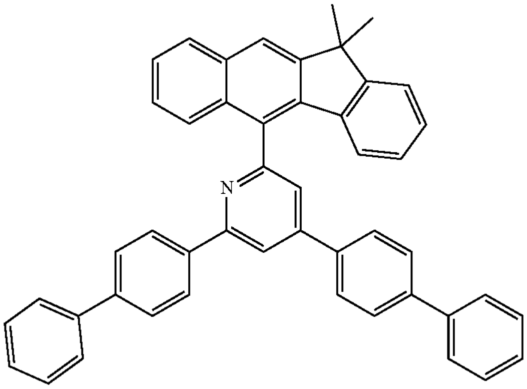
C-2-60
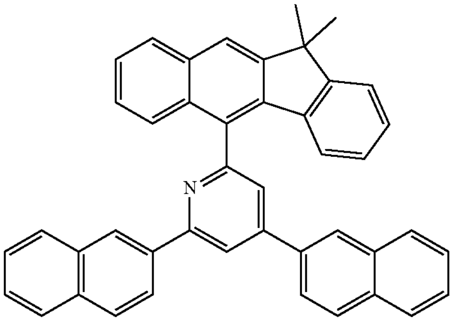
C-2-61
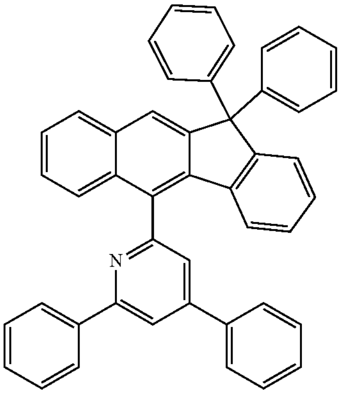
C-2-62
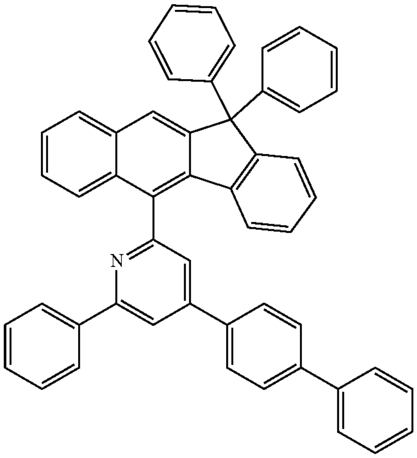

-continued
C-2-63
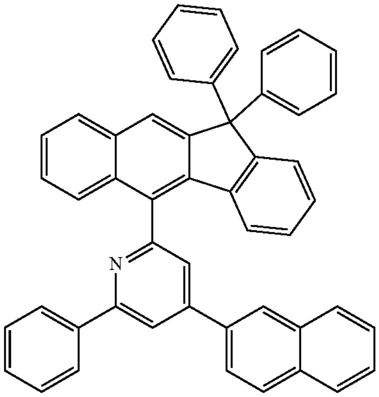
C-2-64
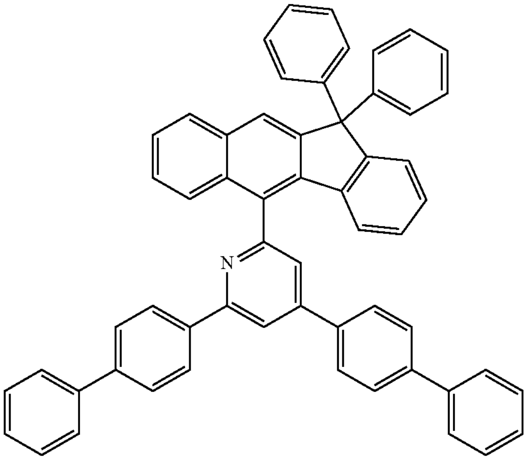
C-2-65
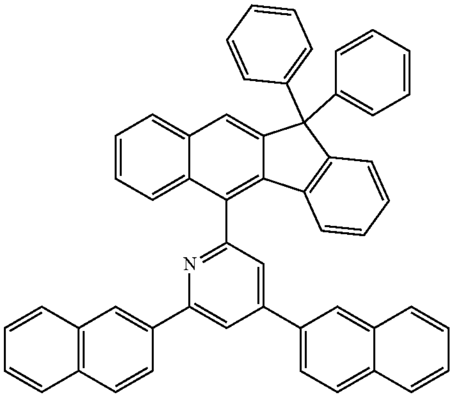
-continued
C-2-66
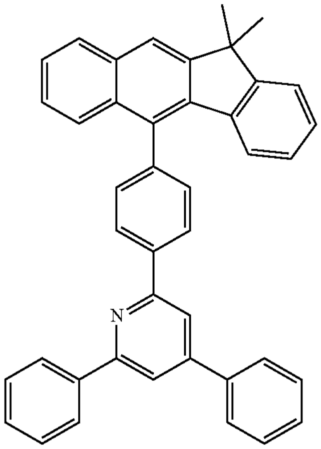
C-2-67
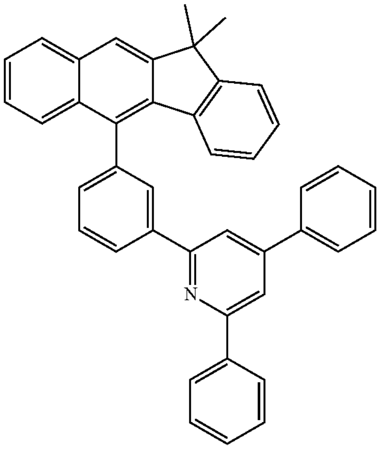
C-2-68
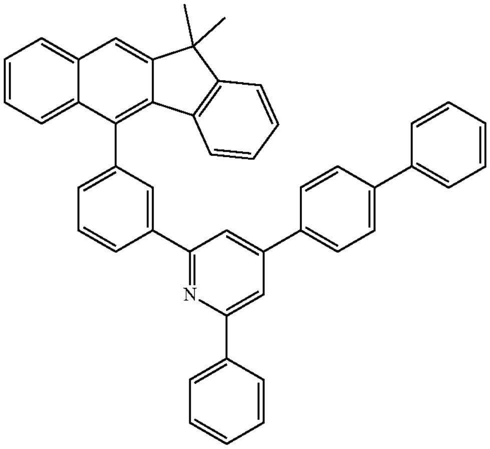

C-2-69
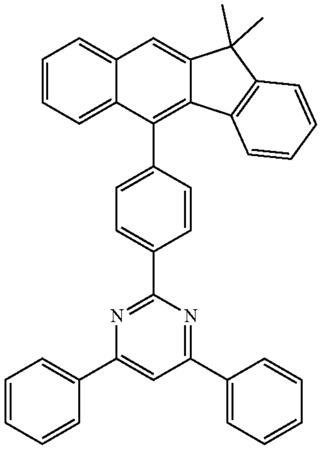
C-2-70
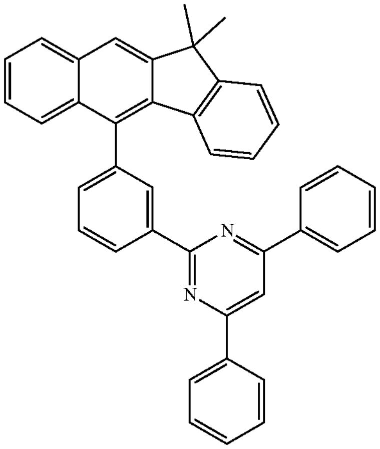
C-2-71
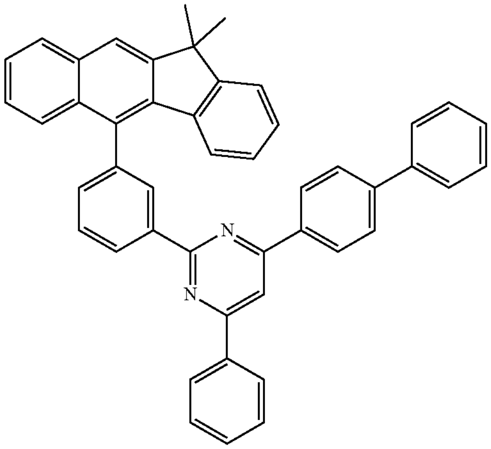
C-2-72
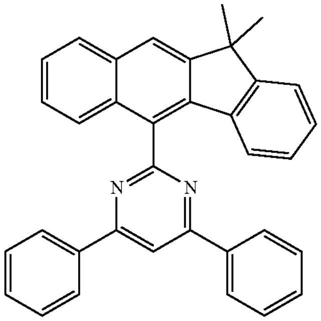
C-2-73
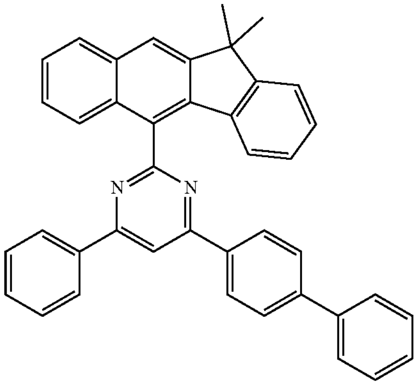
C-2-74
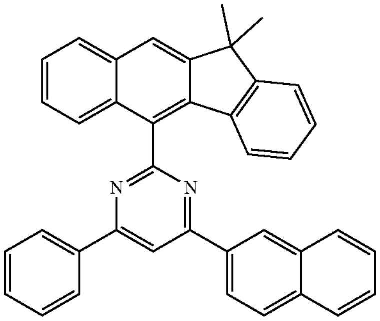
C-2-75
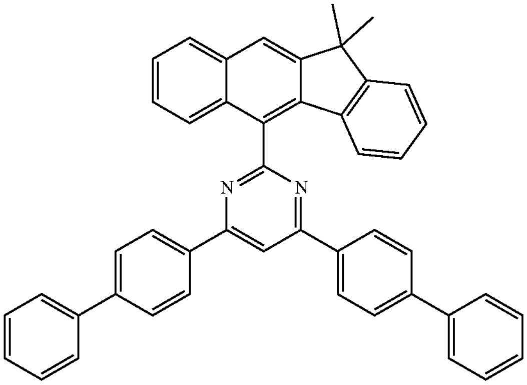

-continued
C-2-76
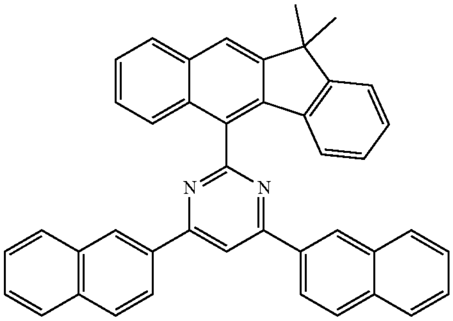
C-2-77
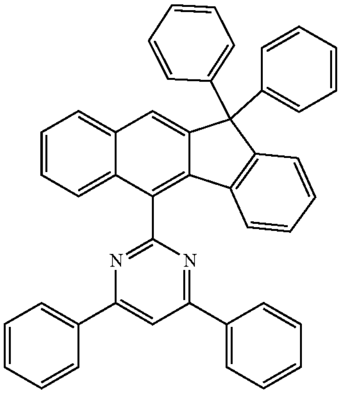
C-2-78
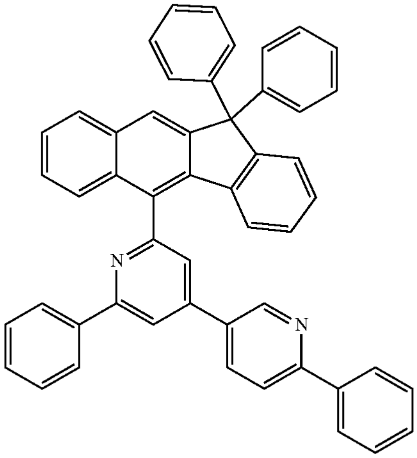
C-2-79
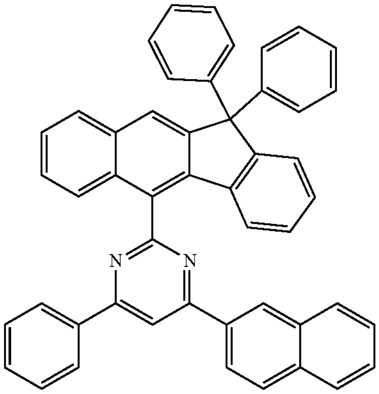
-continued
C-2-80
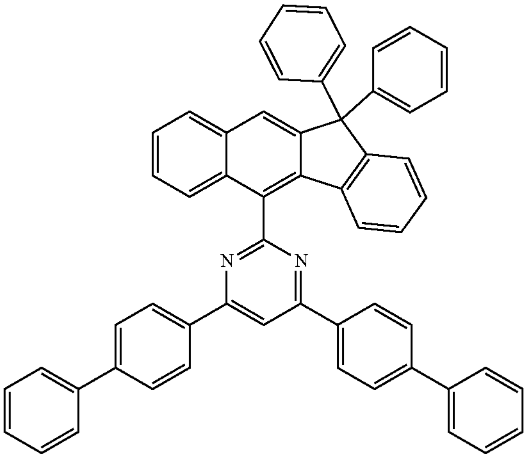
C-2-81
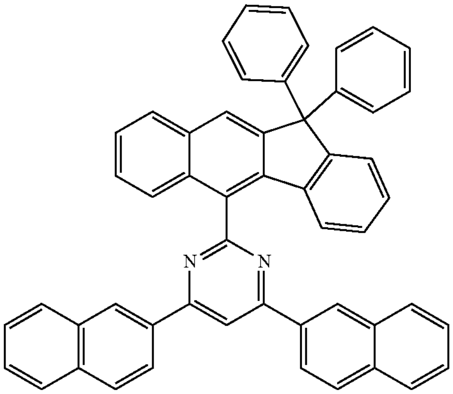
C-2-82
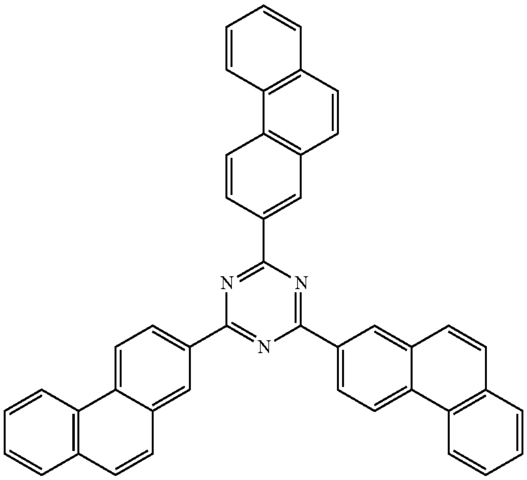

-continued
C-2-83
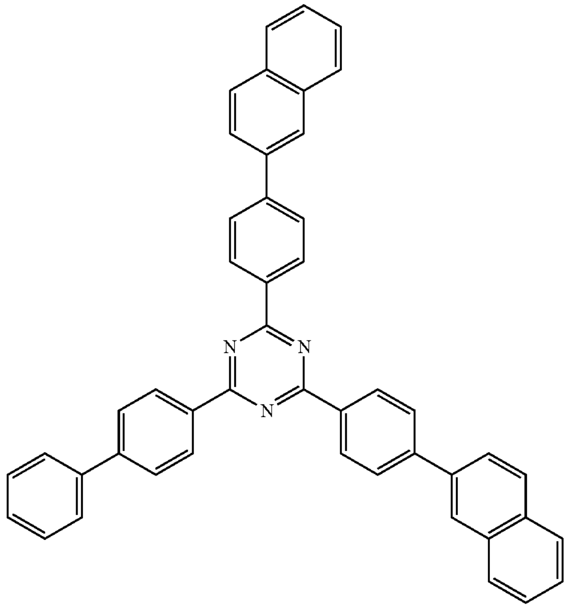
C-2-84
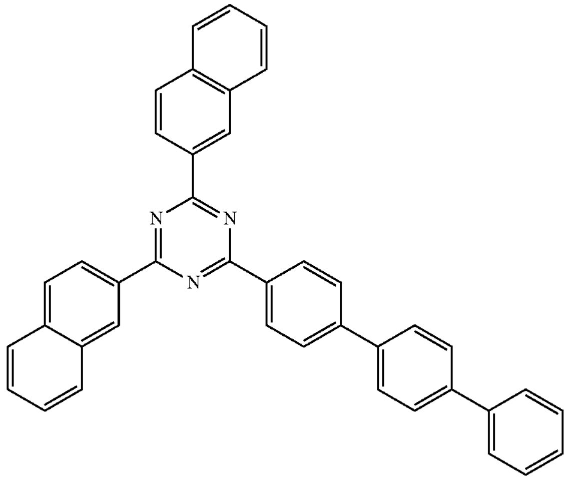
C-2-85
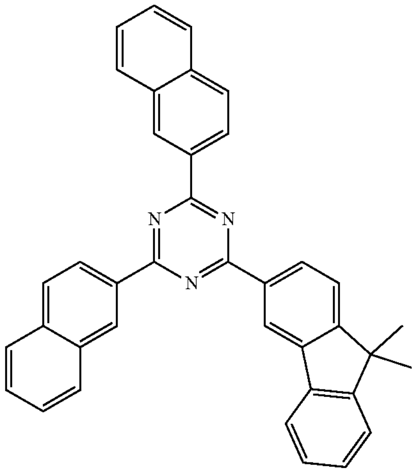
-continued
C-2-86
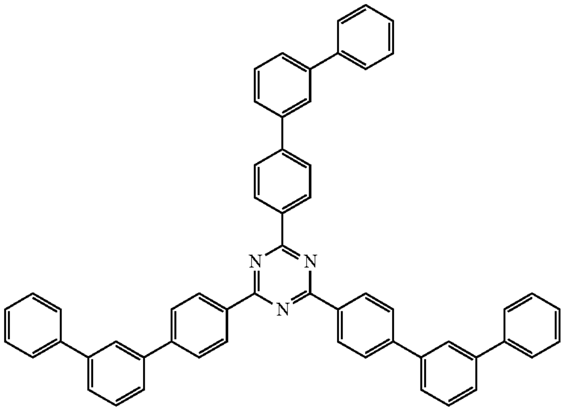
C-2-87
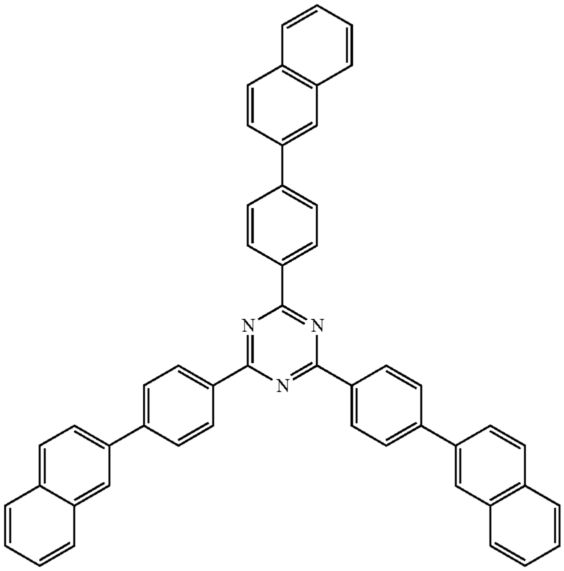
C-2-88
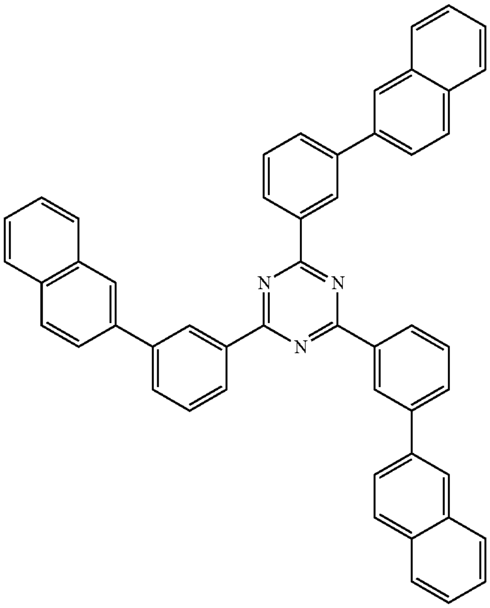

-continued
C-2-89
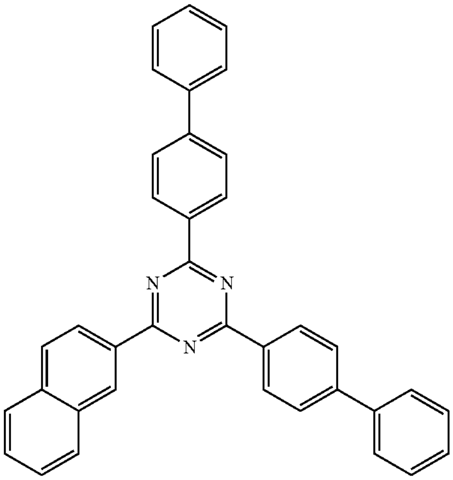
C-2-90
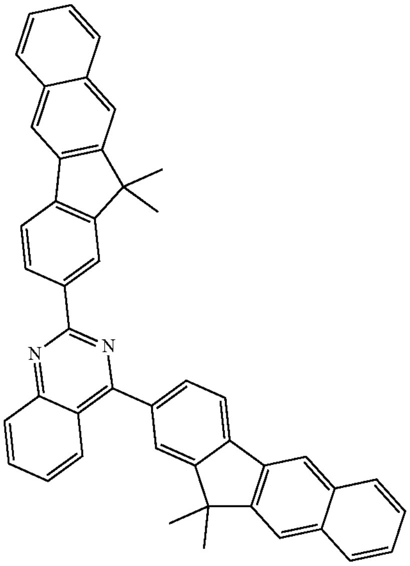
C-2-91
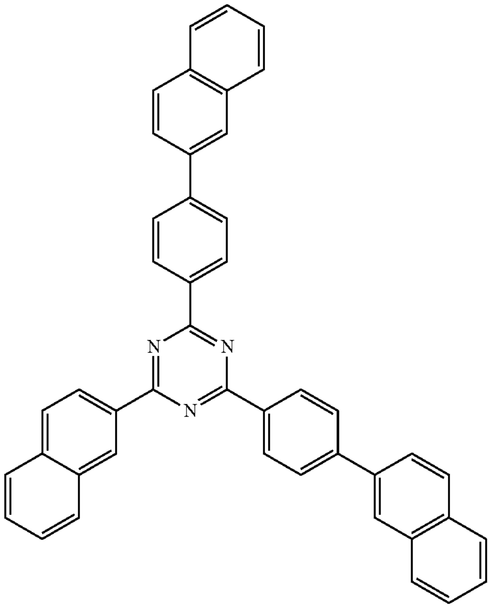
-continued
C-2-92
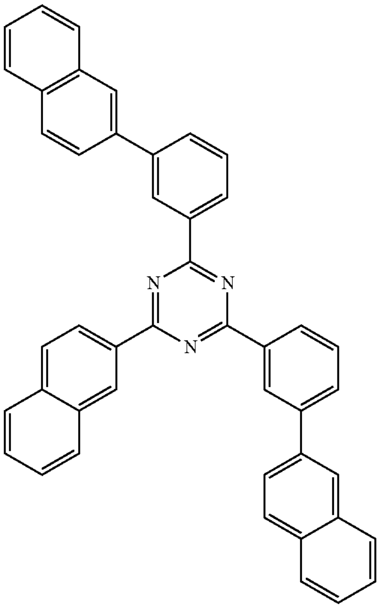
C-2-93
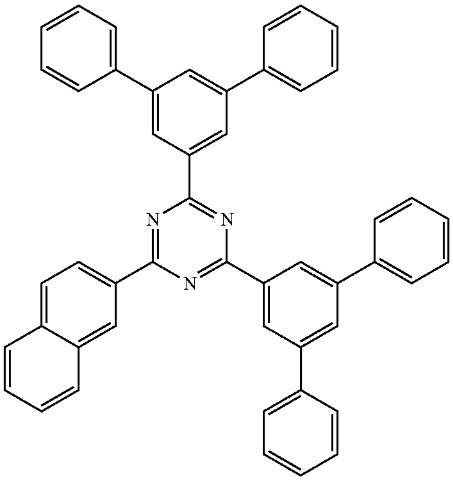
C-2-94
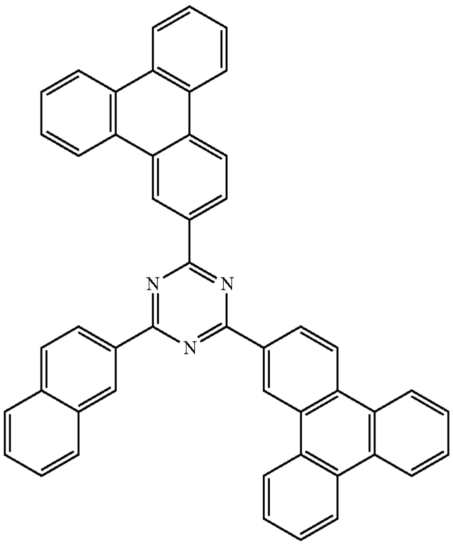

-continued
C-2-95
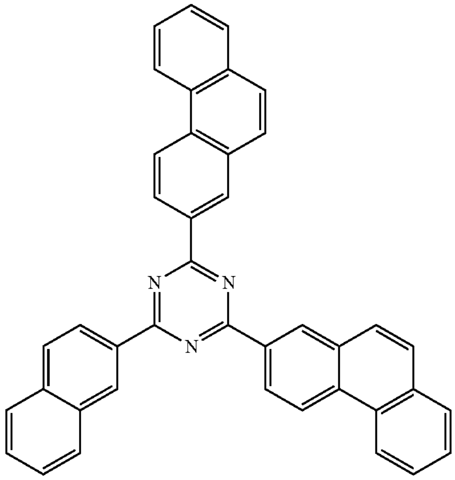
C-2-96
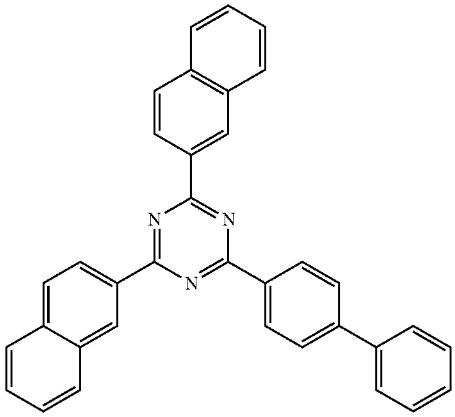
C-2-97
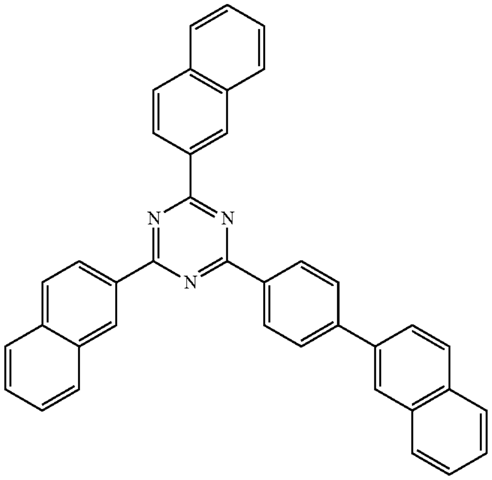
-continued
C-2-98
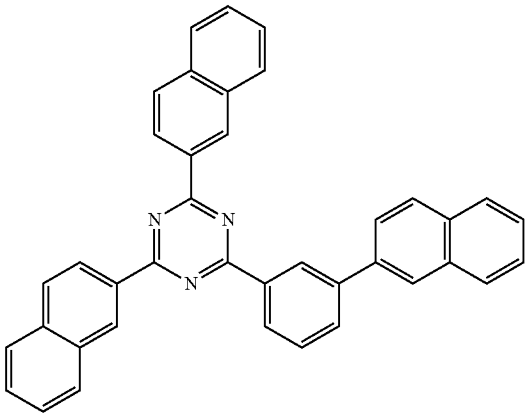
C-2-99
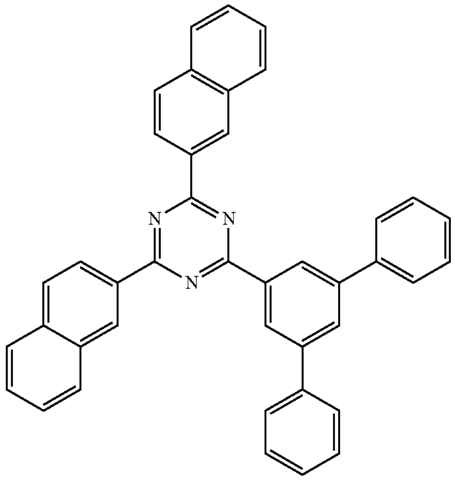
C-2-100
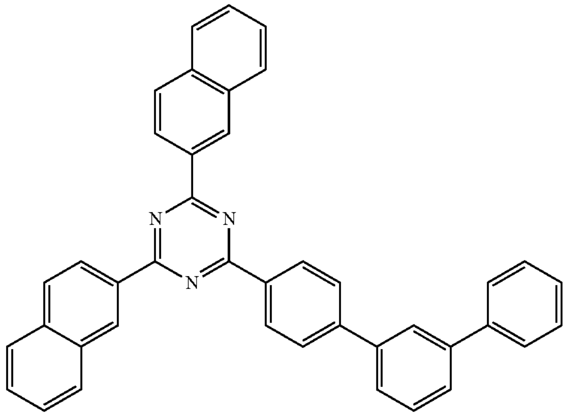

-continued
C-2-101
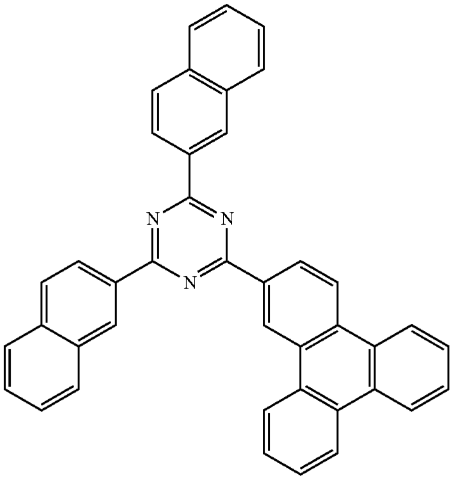
C-2-102
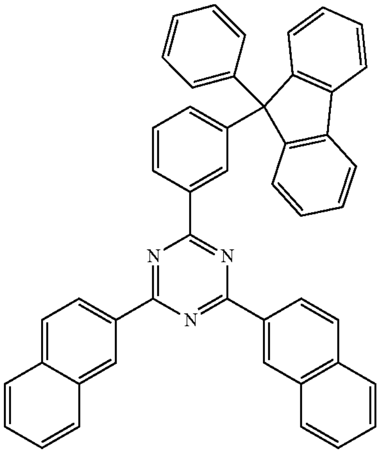
C-2-103
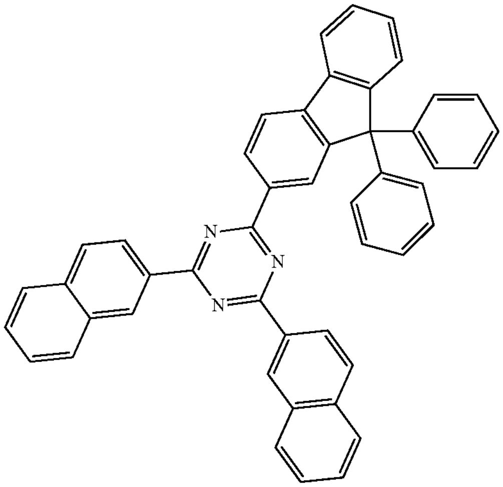
-continued
C-2-104
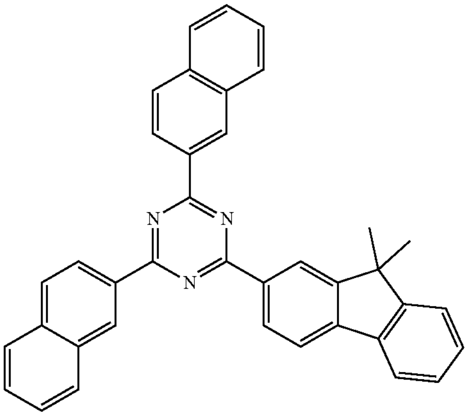
C-2-105
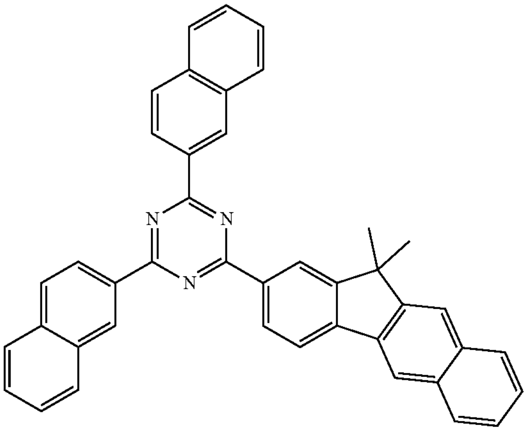
C-2-106
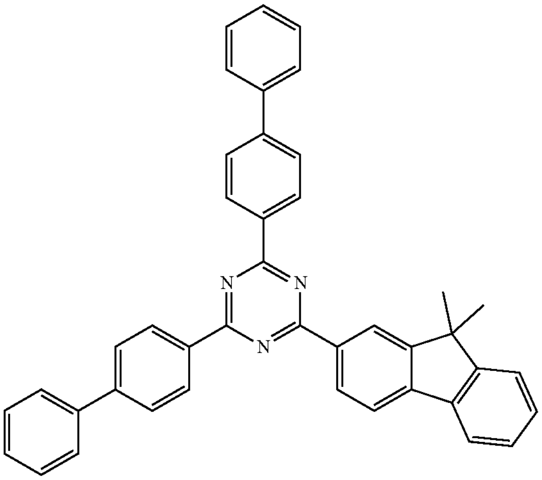

-continued
C-2-107
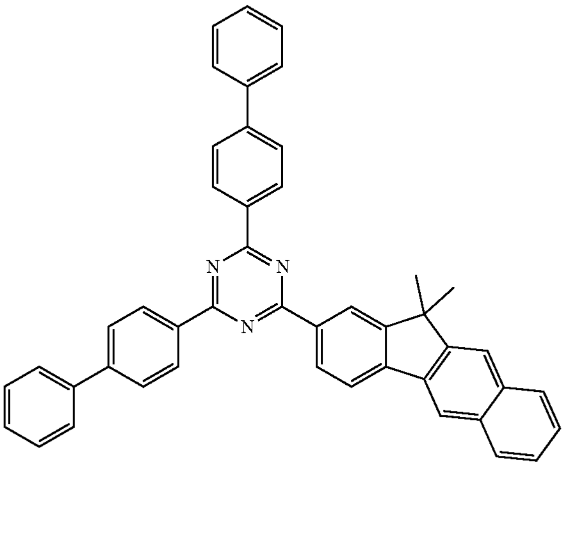
C-2-108
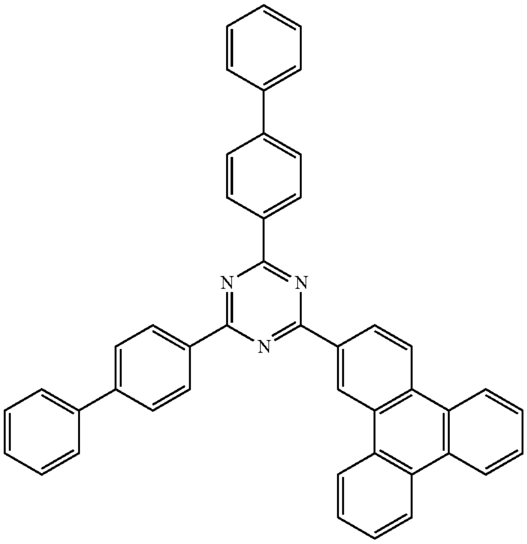
C-2-109
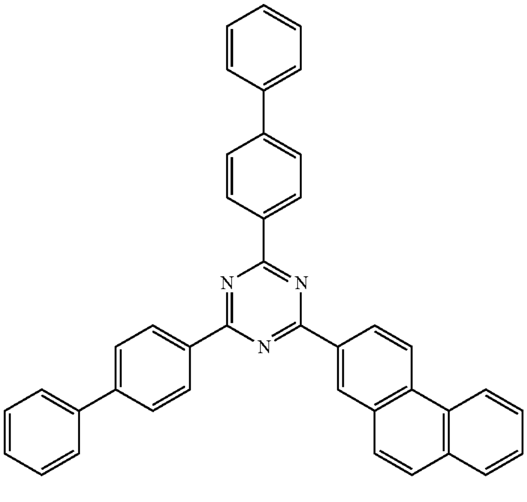
-continued
C-2-110
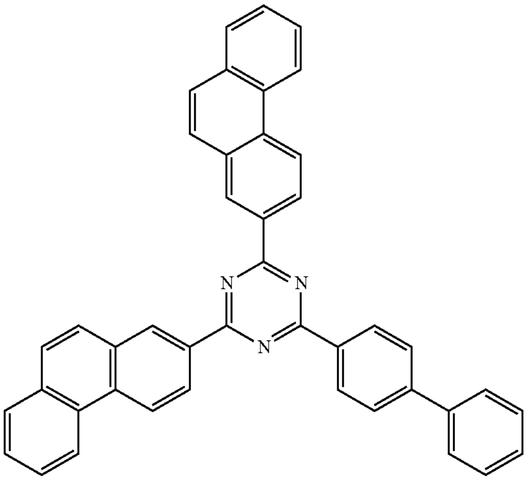
C-2-111
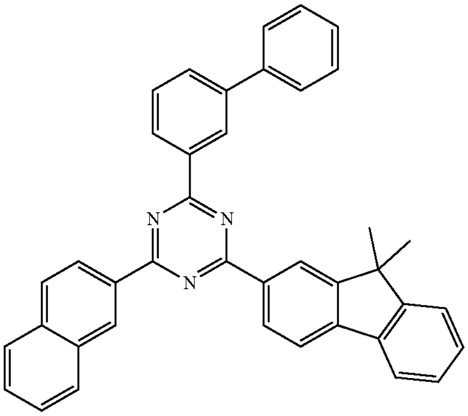
C-2-112
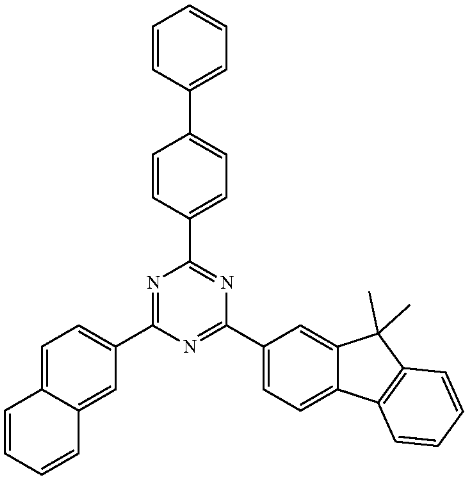

-continued
C-2-113
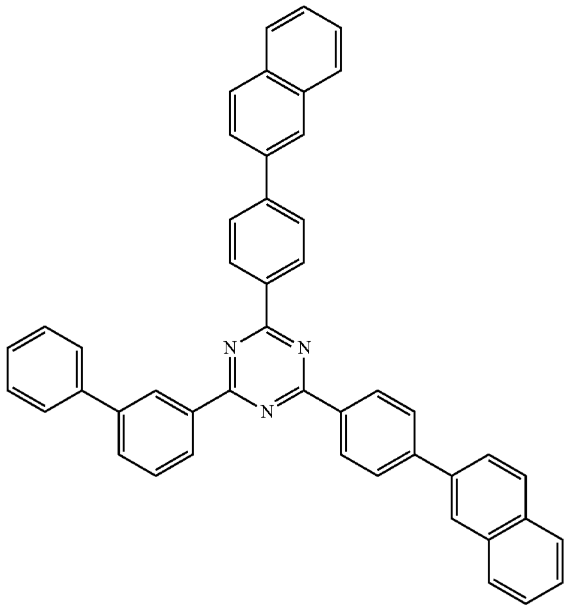
C-2-114
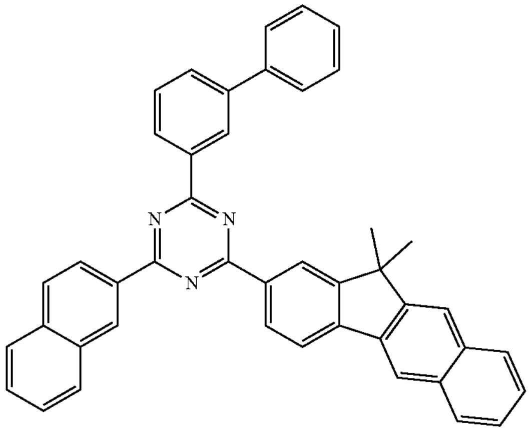
-continued
C-2-115
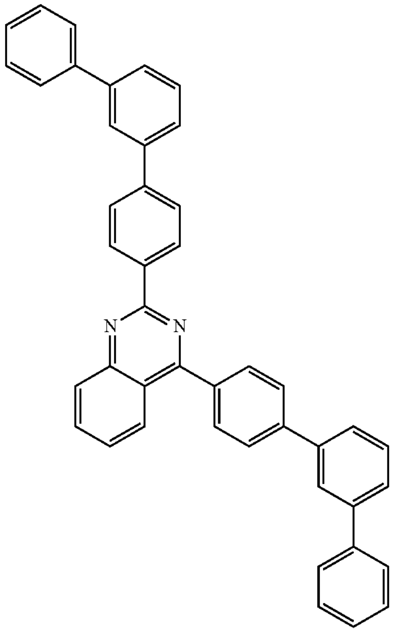
C-2-116
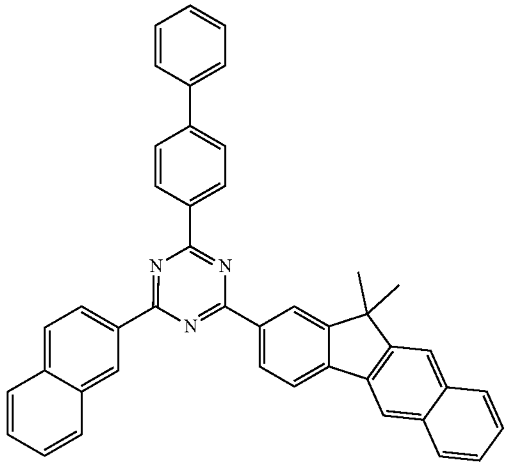
C-2-117
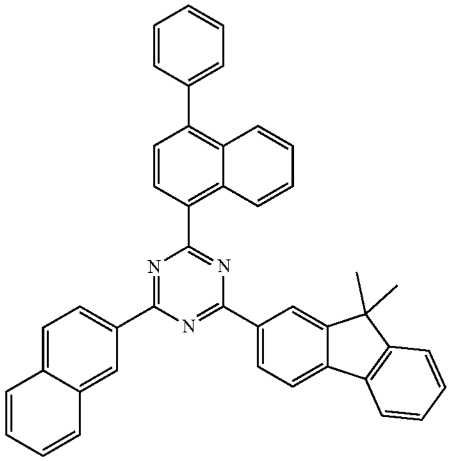

-continued
C-2-118
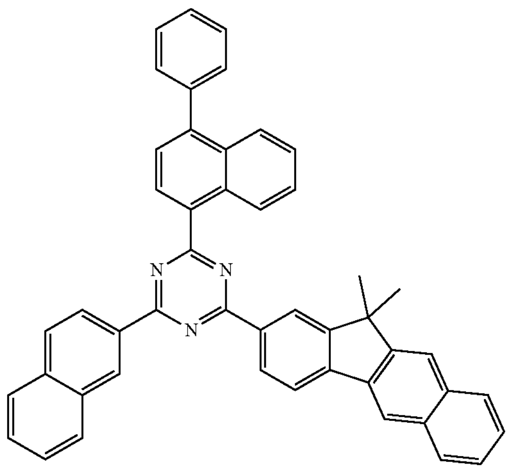
C-2-119
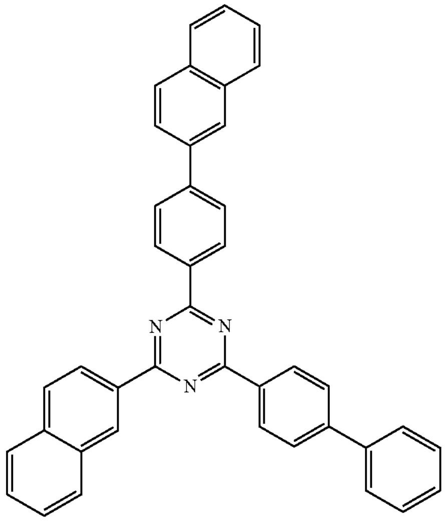
C-2-120
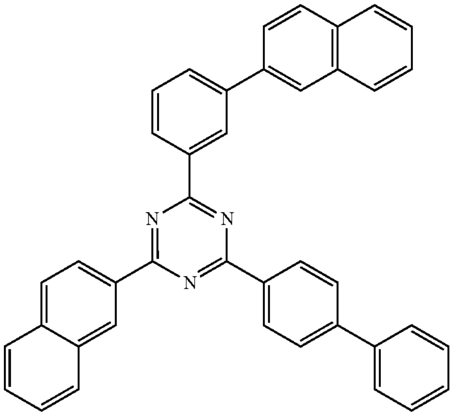
-continued
C-2-121
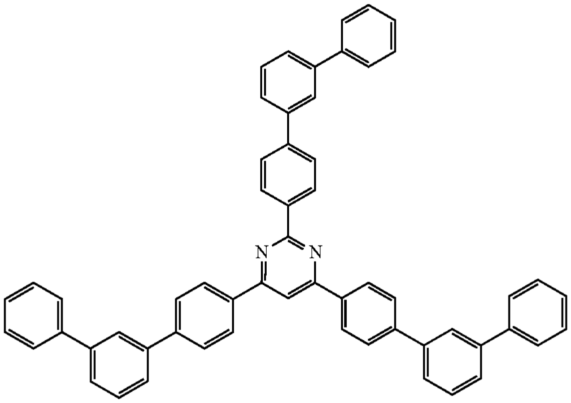
C-2-122
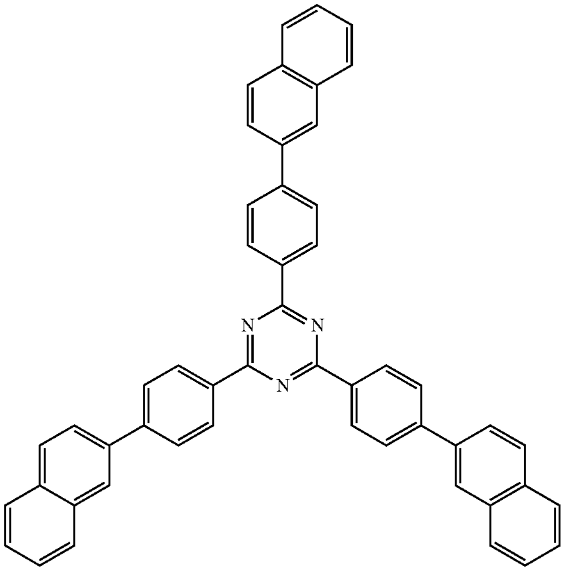
C-2-123
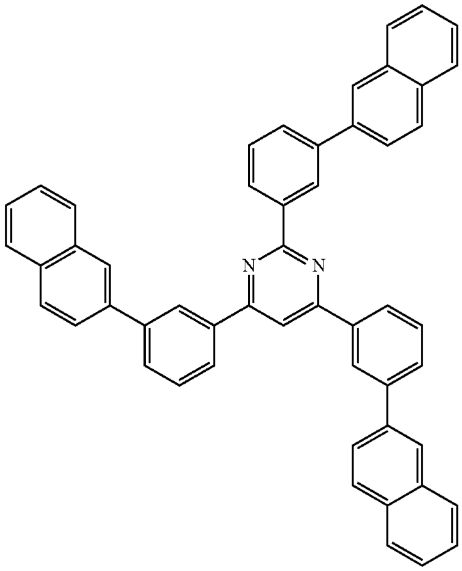

C-2-124
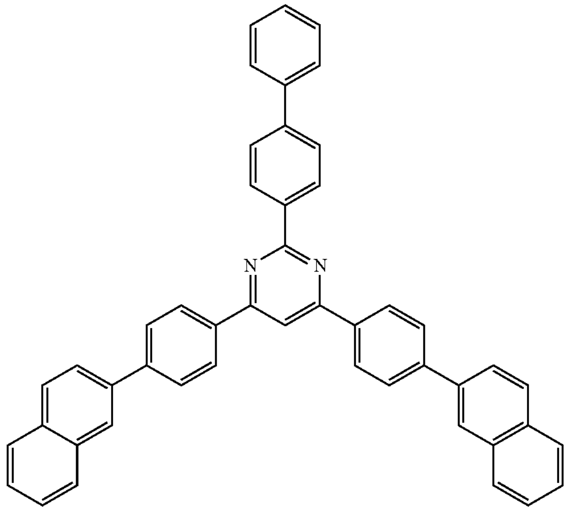
C-2-125
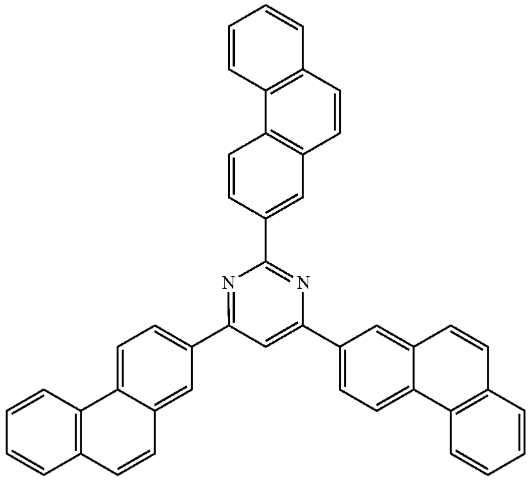
C-2-126
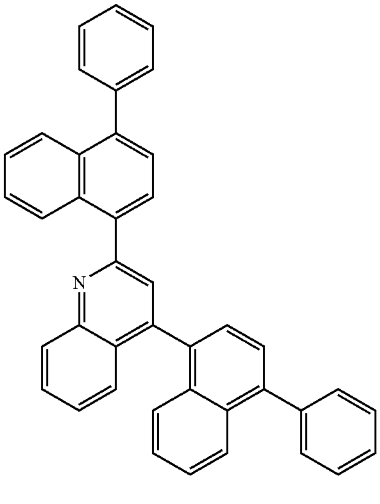
C-2-127
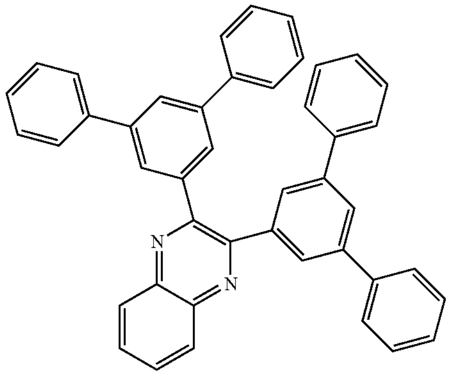
C-2-128
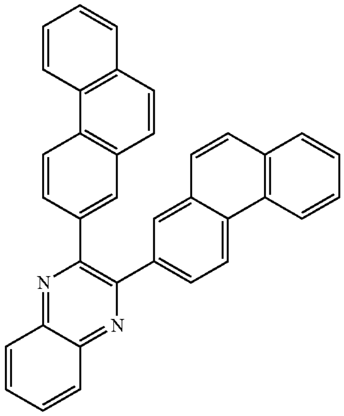
C-2-129
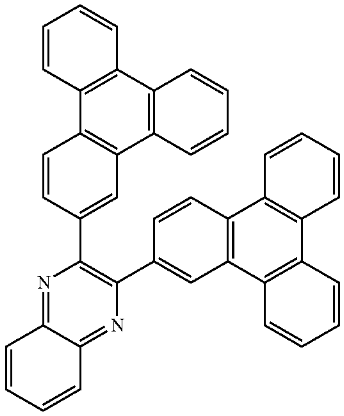

-continued
C-2-130
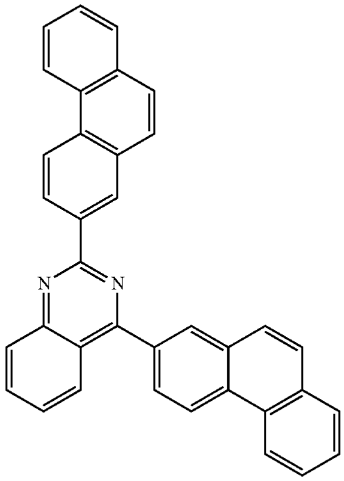
C-2-131
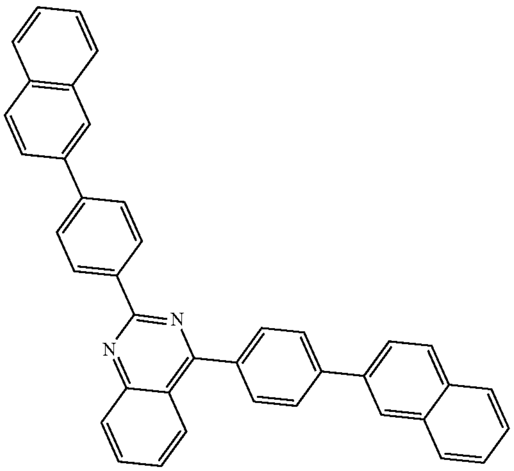
C-2-132
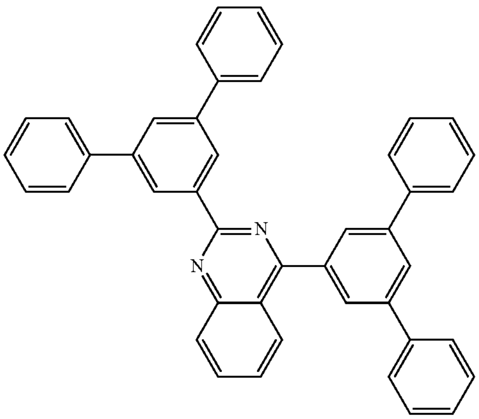
-continued
C-2-133
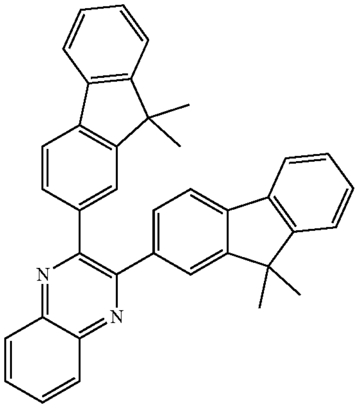
C-2-134
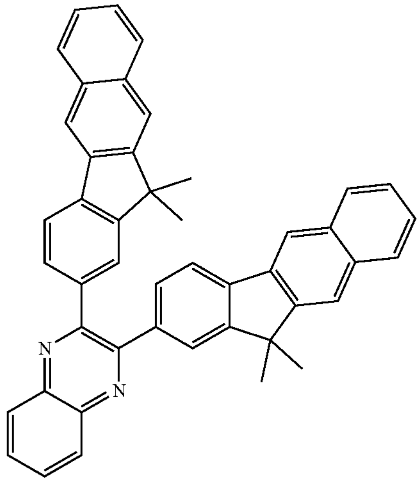
C-2-135
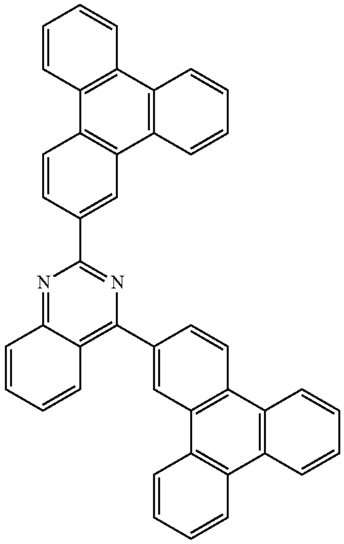

-continued
C-2-136
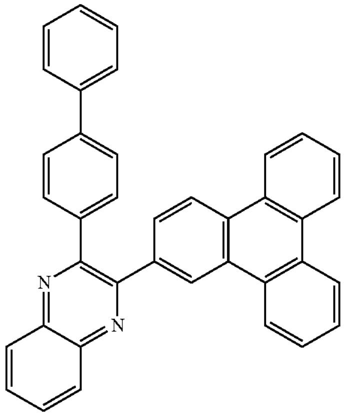
C-2-137
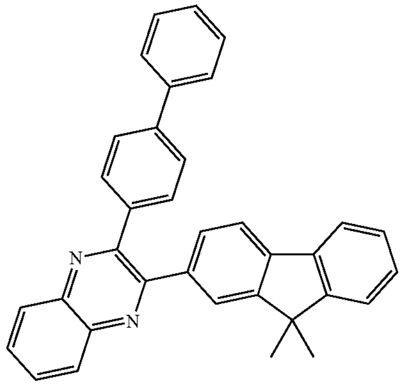
C-2-138
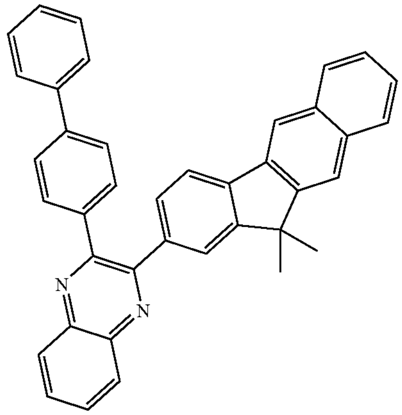
-continued
C-2-139
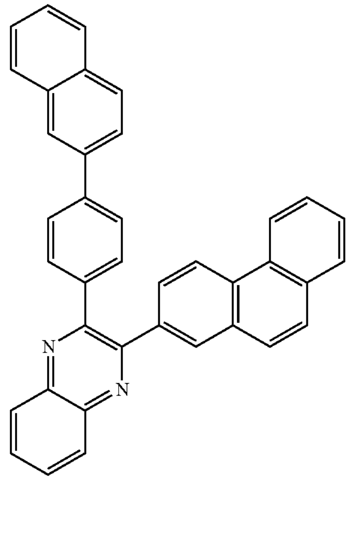
C-2-140
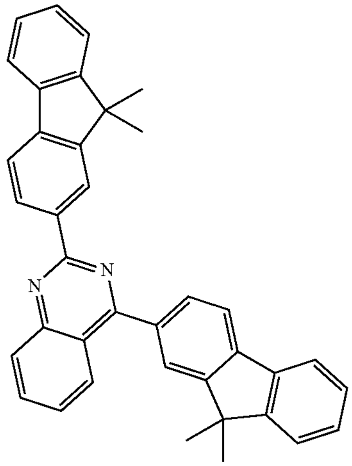
C-2-141
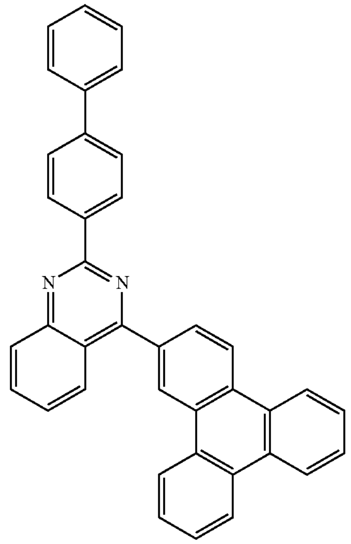

-continued
C-2-142
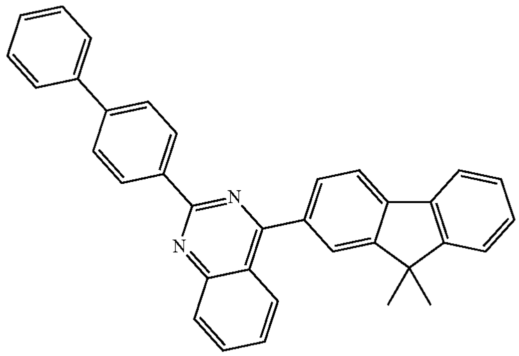
C-2-143
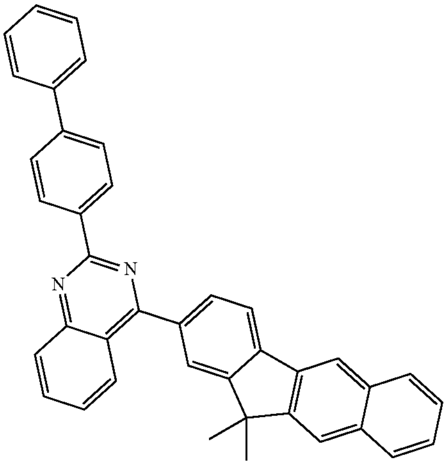
C-2-144
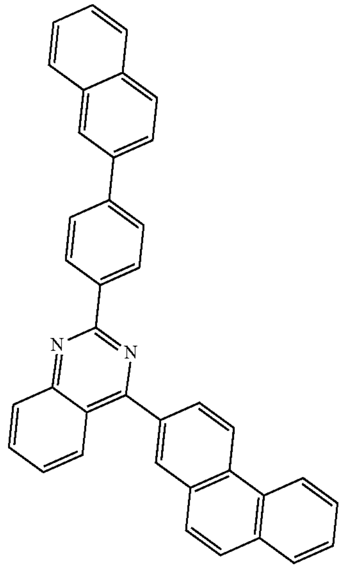
-continued
C-2-145
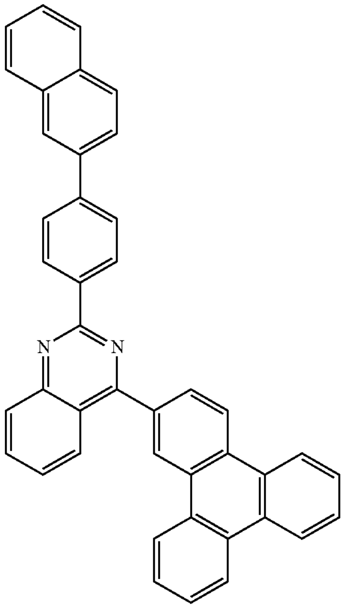
C-2-146
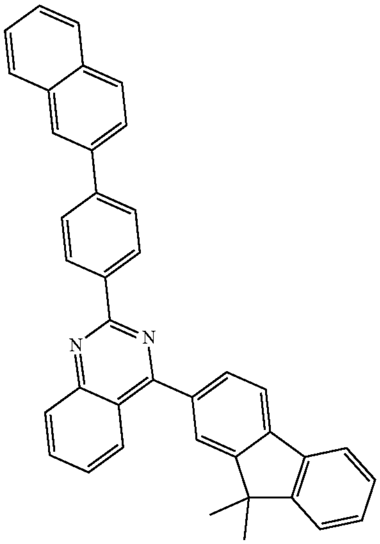
C-2-147
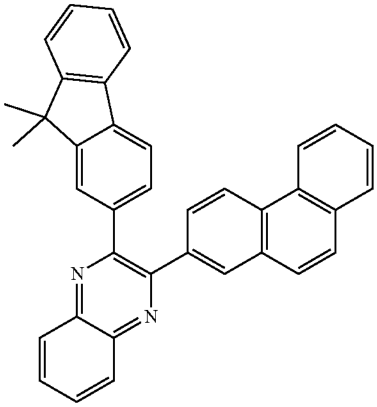

-continued
C-2-148
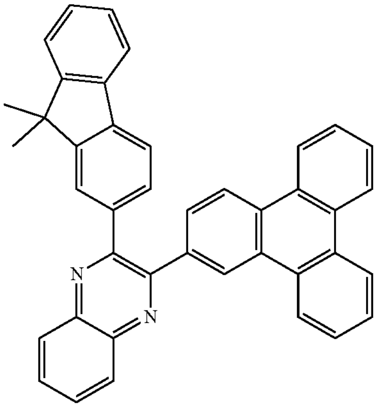
C-2-149
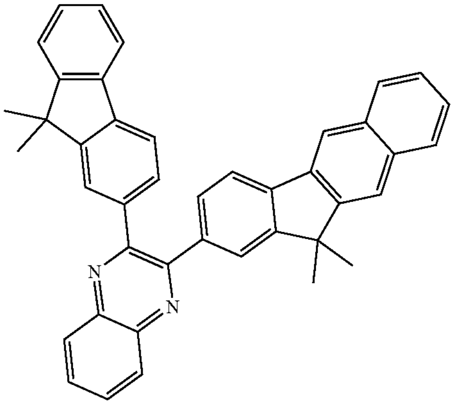
C-2-150
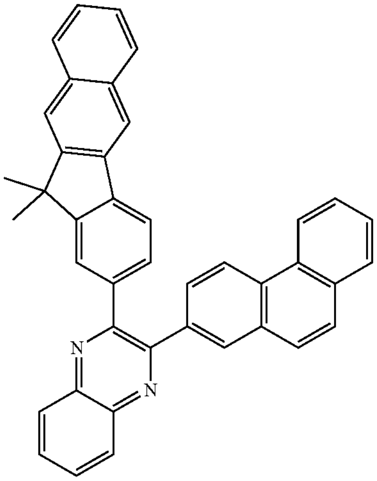
-continued
C-2-151
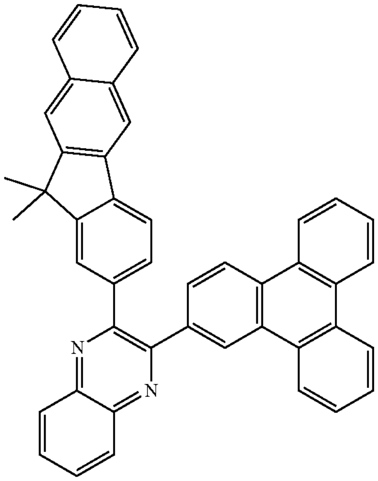
C-2-152
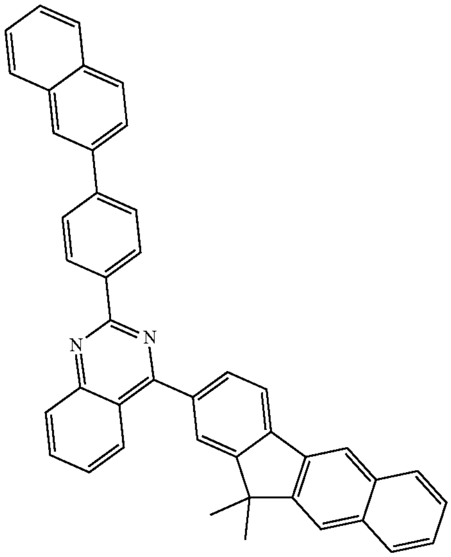
C-2-153
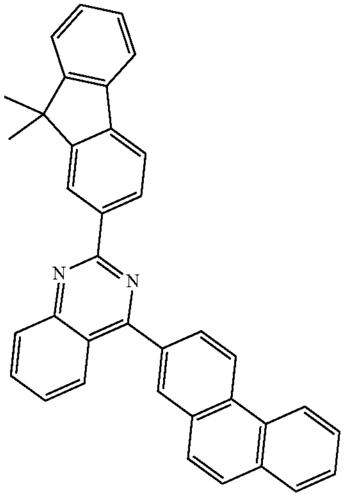

-continued
C-2-154
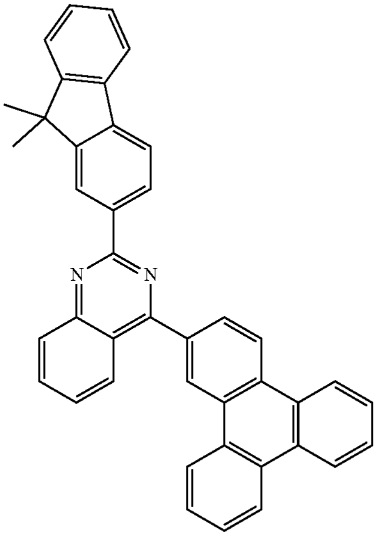
C-2-155
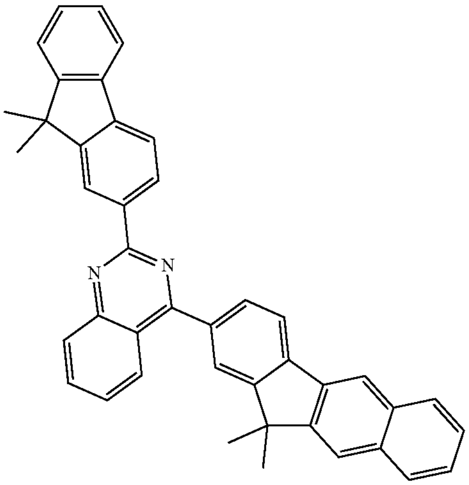
C-2-156
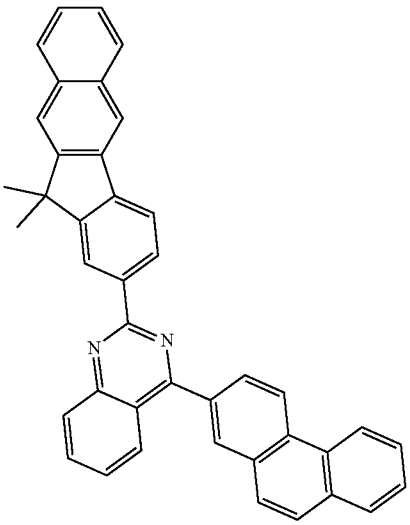
-continued
C-2-157
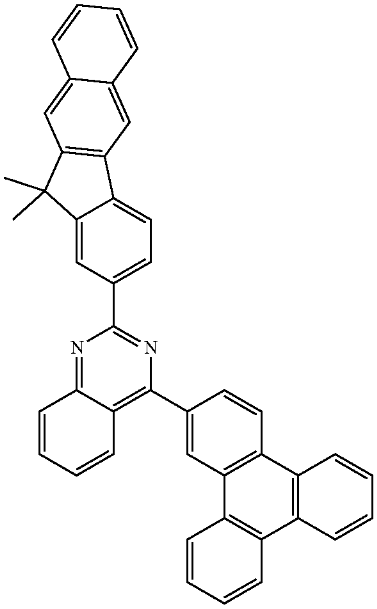
C-2-158
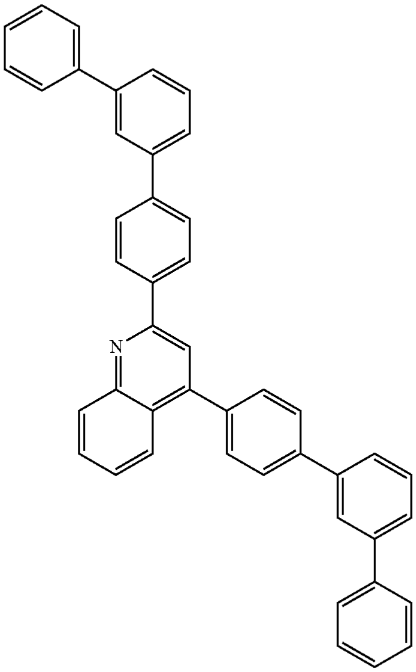

-continued
C-2-159
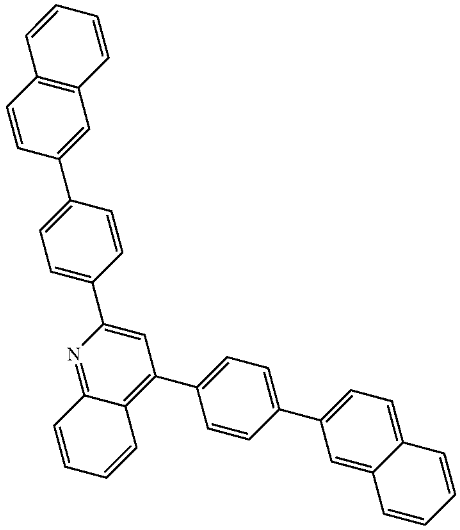
C-2-160
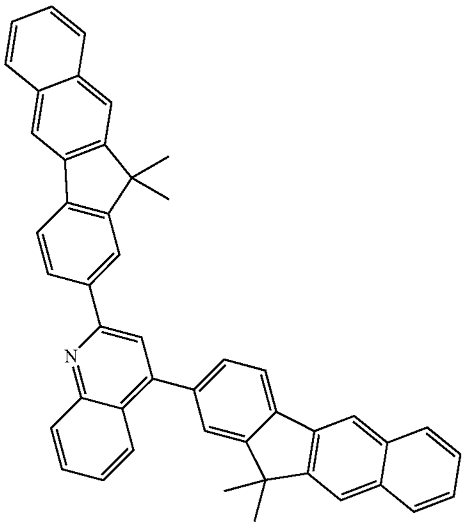
C-2-161
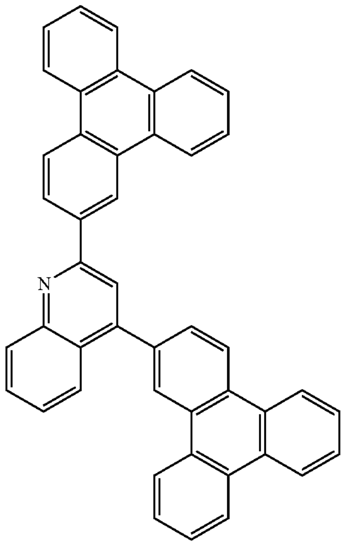
C-2-162
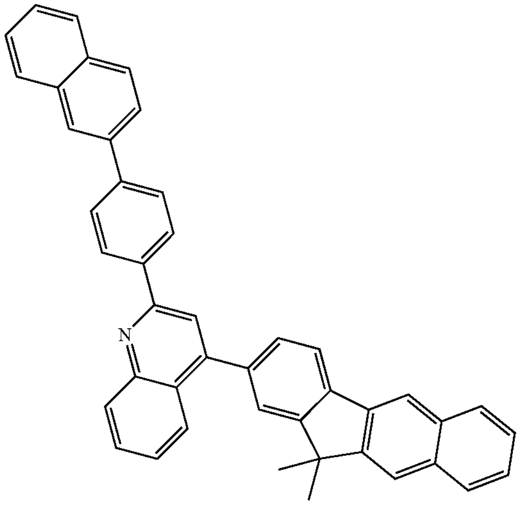
C-2-163
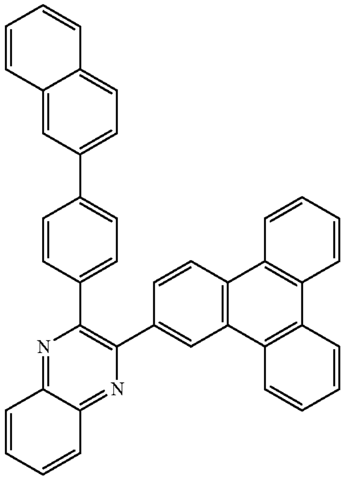
C-2-164
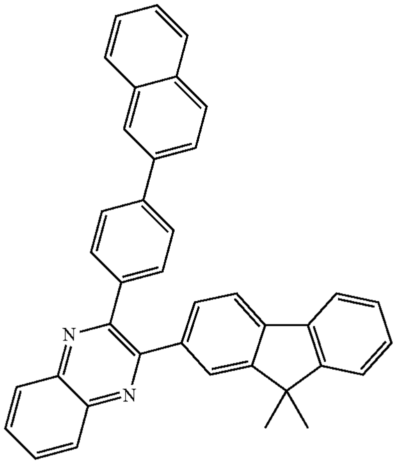

-continued
C-2-165
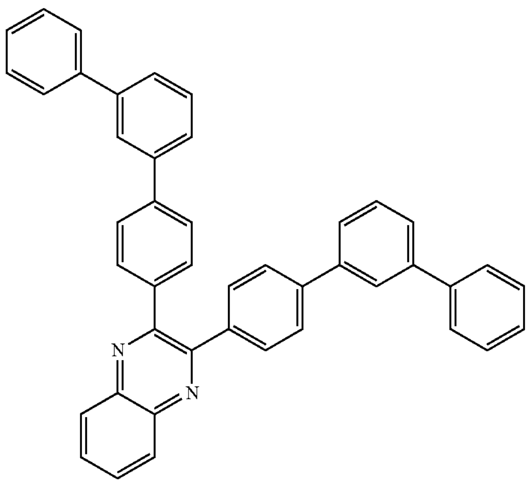
C-2-166
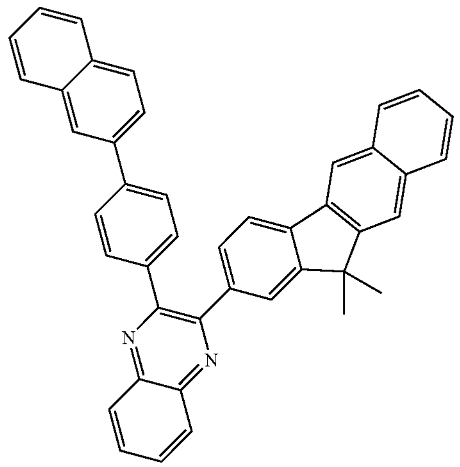
C-2-167
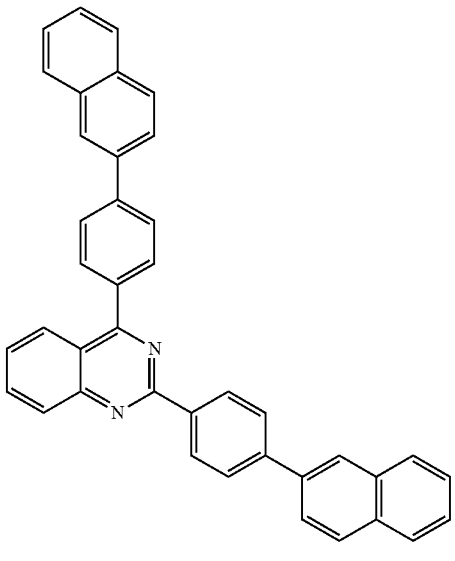
-continued
C-2-168
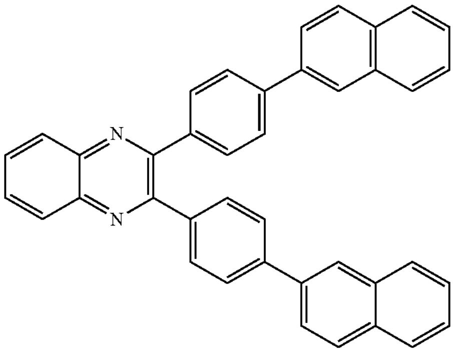
C-2-169
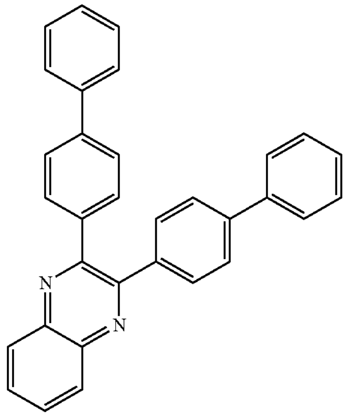
C-2-170
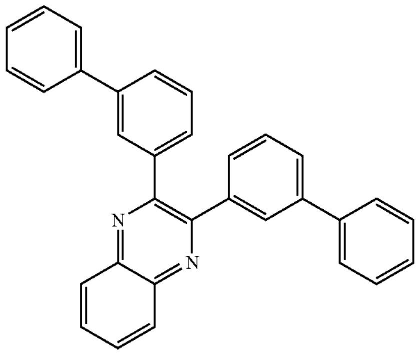
C-2-171
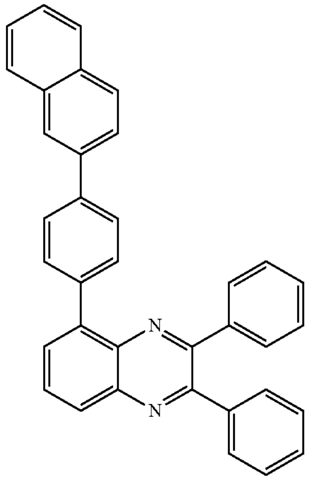

-continued
C-2-172
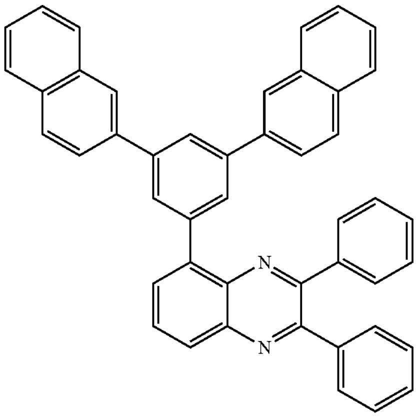
C-2-173
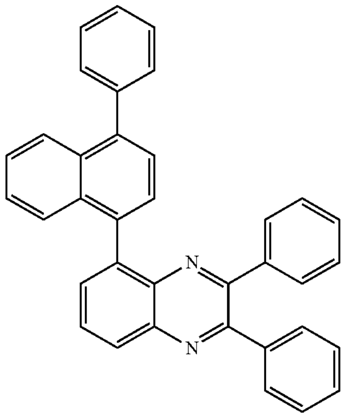
C-2-174
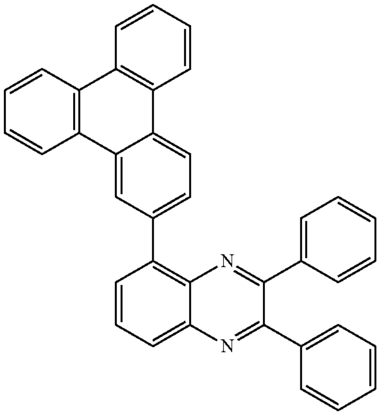
-continued
C-2-175
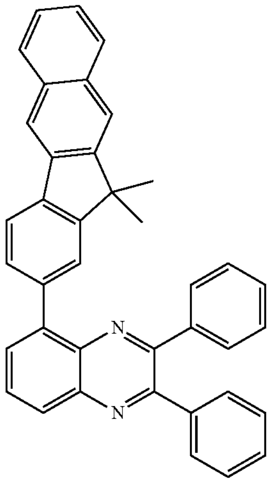
C-2-176
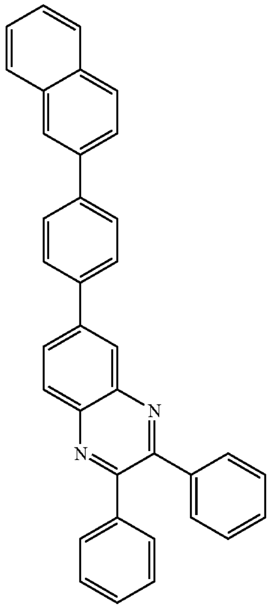
C-2-177
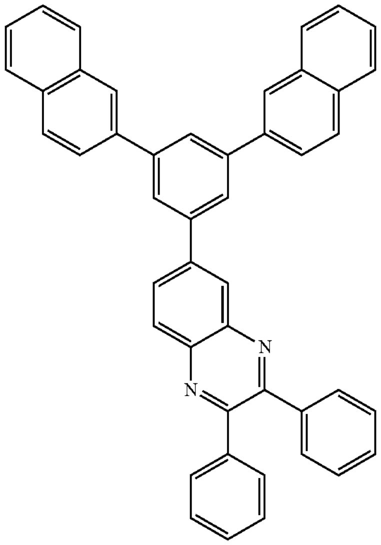

-continued
C-2-178
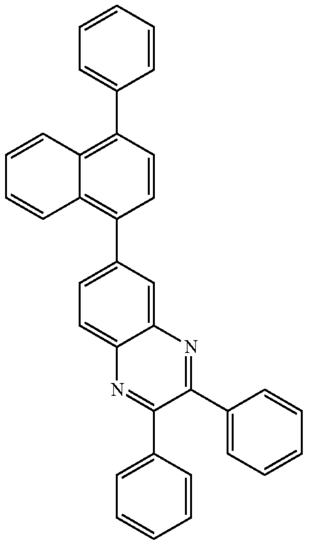
C-2-179
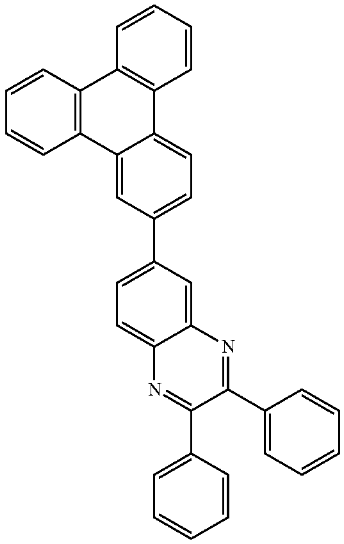
-continued
C-2-180
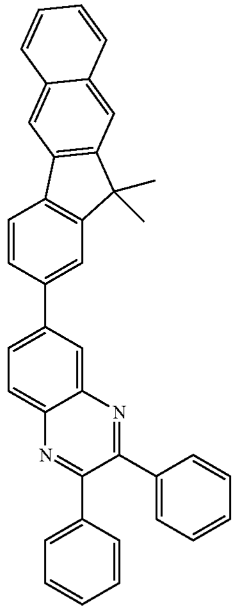
C-2-181
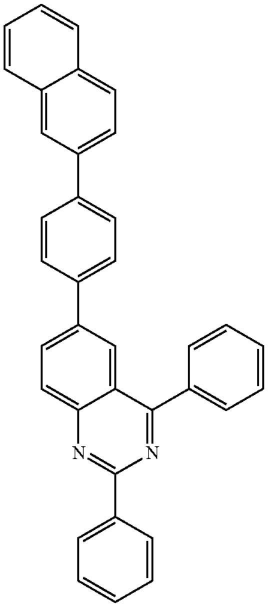

-continued
C-2-182
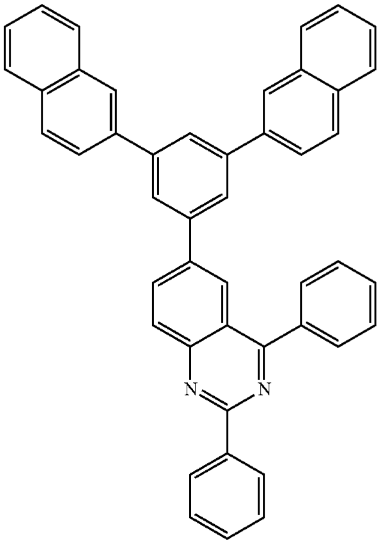
C-2-183
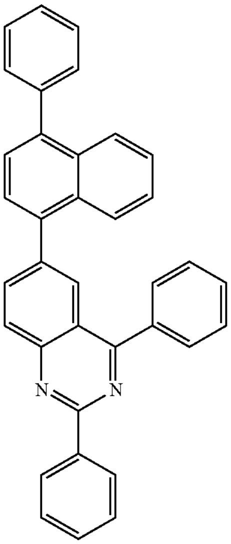
C-2-184
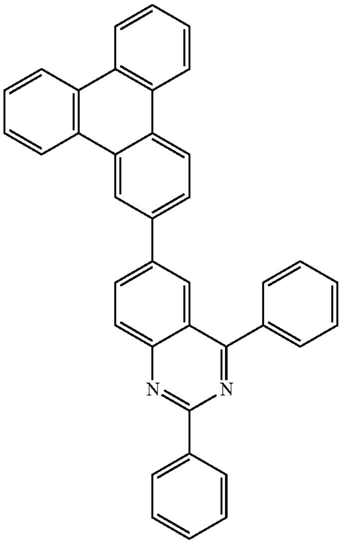
-continued
C-2-185
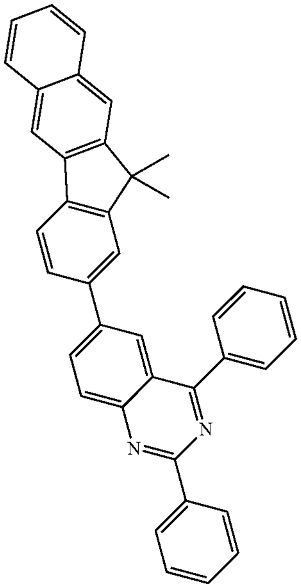
C-2-186
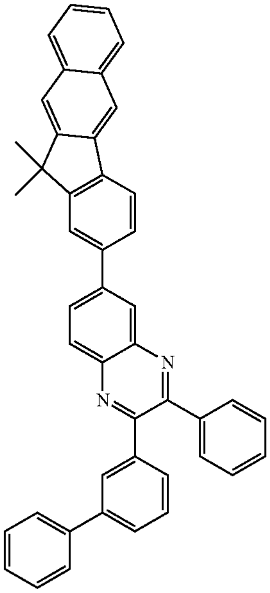
C-2-187
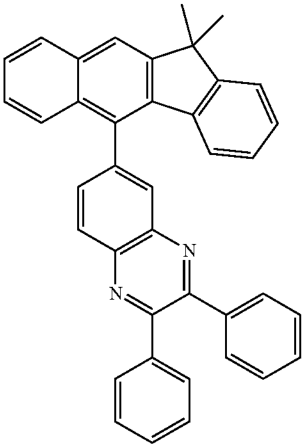

-continued

C-2-188

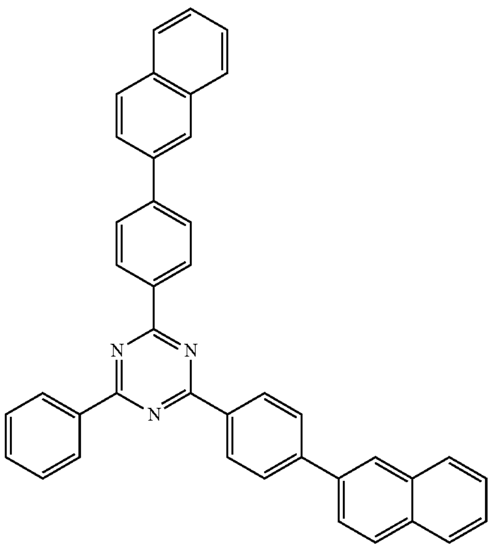

The compound of formula 2 according to the present disclosure may be produced by a synthetic method known to a person skilled in the art, for example, the compound represented by formula 2-1 or 2-2 may be synthesized by referring to the following reaction scheme 1 or 2, but is not limited thereto:

[Reaction Scheme 1]

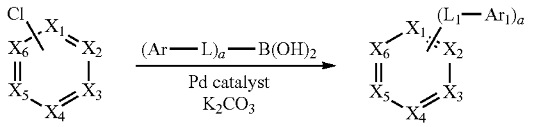

[Reaction Scheme 2]

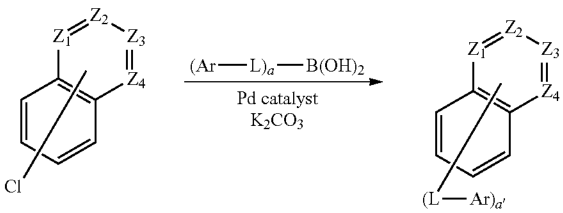

In reaction schemes 1 and 2, L, Ar, and a' are as defined in formula 2, $X_1$ to $X_6$ and $Z_1$ to $Z_4$ are as defined in formulae 2-1 and 2-2.

As described above, exemplary synthesis examples of the compounds represented by formula 2-1 or 2-2 according to one embodiment are described, it will be understood by one skilled in the art that the above reaction proceeds even if other substituents defined in the formula 2-1 or 2-2 other than the substituents described in the specific synthesis examples, are bonded.

Hereinafter, an organic electroluminescent device being applied to the aforementioned plurality of host materials will be described.

The organic electroluminescent device according to the present disclosure includes a first electrode; a second electrode; and at least one organic layer interposed between the first electrode and the second electrode. The organic layer may include a light-emitting layer, and the light-emitting layer may comprise host materials comprising at least one first host compound represented by formula 1 and at least one second host compound represented by formula 2.

According to one embodiment, the first host compound represented by formula 1 and the second host compound represented by formula 2 may be included in the same organic layer or may be included in the different organic layers, respectively.

The light-emitting layer is a layer from which light is emitted, and can be a single layer or a multi-layer of which two or more layers are stacked. In the light-emitting layer, it is preferable that the doping concentration of the dopant compound based on the host compound may be less than 20 wt %, preferably, 17 wt %.

One of the first electrode and the second electrode may be an anode and the other may be a cathode; wherein, the first electrode and the second electrode may each be formed as a transmissive conductive material, a transflective conductive material, or a reflective conductive material. The organic electroluminescent device may be a top emission type, a bottom emission type, or a both-sides emission type according to the kinds of the material forming the first electrode and the second electrode. The organic layer may comprise a light-emitting layer, and may further comprise at least one layer selected from a hole injection layer, a hole transport layer, a hole auxiliary layer, a light-emitting auxiliary layer, an electron transport layer, an electron injection layer, an interlayer, a hole blocking layer, an electron blocking layer, and an electron buffer layer.

The organic layer may further comprise an amine-based compound and/or an azine-based compound other than the light-emitting material of the present disclosure. Specifically, the hole injection layer, the hole transport layer, the hole auxiliary layer, the light-emitting layer, the light-emitting auxiliary layer, or the electron blocking layer may contain the amine-based compound, e.g., an arylamine-based compound and a styrylarylamine-based compound, etc., as a hole injection material, a hole transport material, a hole auxiliary material, a light-emitting material, a light-emitting auxiliary material, or an electron blocking material. Also, the electron transport layer, the electron injection layer, the electron buffer layer, or the hole blocking layer may contain the azine-based compound as an electron transport material, an electron injection material, an electron buffer material, or a hole blocking material.

Also, the organic layer may further comprise at least one metal selected from the group consisting of metals of Group 1, metals of Group 2, transition metals of the $4^{th}$ period, transition metals of the $5^{th}$ period, lanthanides, and organic metals of the d-transition elements of the Periodic Table, or at least one complex compound comprising such a metal.

An organic electroluminescent material according to one embodiment may be used as light-emitting materials for a white organic light-emitting device. The white organic light-emitting device has suggested various structures such as a parallel side-by-side arrangement method, a stacking arrangement method, or CCM (color conversion material) method, etc., according to the arrangement of R (Red), G (Green), B (blue), or YG (yellowish green) light-emitting units. In addition, the organic electroluminescent material according to one embodiment may also be applied to the organic electroluminescent device comprising a QD (quantum dot).

A hole injection layer, a hole transport layer, an electron blocking layer, or a combination thereof can be used between the anode and the light-emitting layer. The hole injection layer may be multi-layers in order to lower the hole injection barrier (or hole injection voltage) from the anode to the hole transport layer or the electron blocking layer, wherein each of the multi-layers may use two compounds simultaneously. Also, the hole injection layer may be doped as a p-dopant. The electron blocking layer may be placed between the hole transport layer (or hole injection layer) and the light-emitting layer, and can confine the excitons within the light-emitting layer by blocking the overflow of electrons from the light-emitting layer to prevent a light-emitting leakage. The hole transport layer or the electron blocking layer may be multi-layers, and wherein each layer may use a plurality of compounds.

An electron buffer layer, a hole blocking layer, an electron transport layer, an electron injection layer, or a combination thereof can be used between the light-emitting layer and the cathode. The electron buffer layer may be multi-layers in order to control the injection of the electron and improve the interfacial properties between the light-emitting layer and the electron injection layer, wherein each of the multi-layers may use two compounds simultaneously. The hole blocking layer or the electron transport layer may also be multi-layers, wherein each layer may use a plurality of compounds. Also, the electron injection layer may be doped as an n-dopant.

The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or the hole transport, or for preventing the overflow of electrons. When the light-emitting auxiliary layer is placed between the cathode and the light-emitting layer, it can be used for promoting the electron injection and/or the electron transport, or for preventing the overflow of holes. In addition, the hole auxiliary layer may be placed between the hole transport layer (or hole injection layer) and the light-emitting layer, and may be effective to promote or block the hole transport rate (or the hole injection rate), thereby enabling the charge balance to be controlled. When an organic electroluminescent device includes two or more hole transport layers, the hole transport layer, which is further included, may be used as the hole auxiliary layer or the electron blocking layer. The light-emitting auxiliary layer, the hole auxiliary layer, or the electron blocking layer may have an effect of improving the efficiency and/or the lifespan of the organic electroluminescent device.

In the organic electroluminescent device of the present disclosure, preferably, at least one layer (hereinafter, "a surface layer") selected from a chalcogenide layer, a halogenated metal layer, and a metal oxide layer may be placed on an inner surface(s) of one or both electrode(s). Specifically, a chalcogenide (including oxides) layer of silicon and aluminum is preferably placed on an anode surface of an electroluminescent medium layer, and a halogenated metal layer or a metal oxide layer is preferably placed on a cathode surface of an electroluminescent medium layer. The operation stability for the organic electroluminescent device may be obtained by the surface layer. Preferably, the chalcogenide includes $SiO_X(1 \leq X \leq 2)$, $AlO_X(1 \leq X \leq 1.5)$, SiON, SiAlON, etc.; the halogenated metal includes LiF, $MgF_2$, $CaF_2$, a rare earth metal fluoride, etc.; and the metal oxide includes $Cs_2O$, $Li_2O$, MgO, SrO, BaO, CaO, etc.

In addition, in the organic electroluminescent device of the present disclosure, a mixed region of an electron transport compound and a reductive dopant, or a mixed region of a hole transport compound and an oxidative dopant may be placed on at least one surface of a pair of electrodes. In this case, the electron transport compound is reduced to an anion, and thus it becomes easier to inject and transport electrons from the mixed region to an electroluminescent medium. Furthermore, the hole transport compound is oxidized to a cation, and thus it becomes easier to inject and transport holes from the mixed region to the electroluminescent medium. Preferably, the oxidative dopant includes various Lewis acids and acceptor compounds, and the reductive dopant includes alkali metals, alkali metal compounds, alkaline earth metals, rare-earth metals, and mixtures thereof. Also, a reductive dopant layer may be employed as a charge generating layer to prepare an organic electroluminescent device having two or more light-emitting layers and emitting white light.

An organic electroluminescent device according to one embodiment may further comprise at least one dopant in the light-emitting layer.

The dopant comprised in the organic electroluminescent material of the present disclosure may be at least one phosphorescent or fluorescent dopant, preferably a phosphorescent dopant. The phosphorescent dopant material applied to the organic electroluminescent device of the present disclosure is not particularly limited, but may be preferably a metallated complex compound(s) of a metal atom(s) selected from iridium (Ir), osmium (Os), copper (Cu), and platinum (Pt), more preferably an ortho-metallated complex compound(s) of a metal atom(s) selected from iridium (Ir), osmium (Os), copper (Cu), and platinum (Pt), and even more preferably ortho-metallated iridium complex compound(s).

The dopant comprised in the organic electroluminescent device may use the compound represented by the following formula 101, but is not limited thereto:

(101)

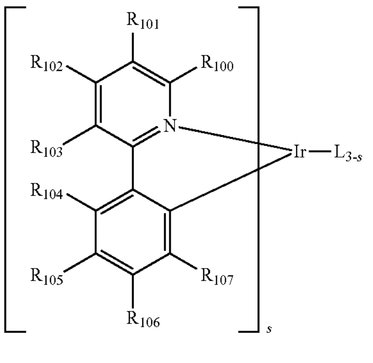

In formula 101, wherein, L is selected from the following structure 1 or 2:

structure (1)

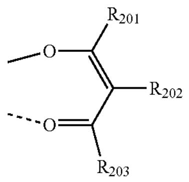

structure (2)

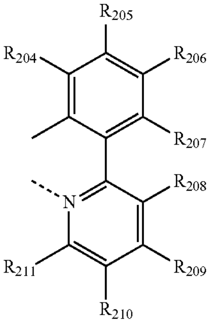

$R_{100}$ to $R_{103}$ each independently represent hydrogen, deuterium, halogen, halogen-substituted or unsubstituted (C1-C30)alkyl, a substituted or unsubstituted (C3-C30) cycloalkyl, a substituted or unsubstituted (C6-C30)aryl, cyano, a substituted or unsubstituted (3- to 30-membered)heteroaryl, or a substituted or unsubstituted (C1-C30)alkoxy; or may be linked to an adjacent substituent(s) to form a substituted or unsubstituted fused ring, e.g., a substituted or unsubstituted quinoline, a substituted or unsubstituted benzofuropyridine, a substituted or unsubstituted benzothienopyridine, a substituted or unsubstituted indenopyridine, a substituted or unsubstituted benzofuroquinoline, a substituted or unsubstituted benzothienoquinoline, or a substituted or unsubstituted indenoquinoline;

$R_{104}$ to $R_{107}$ each independently represent hydrogen, deuterium, halogen, halogen-substituted or unsubstituted (C1-C30)alkyl, a substituted or unsubstituted (C3-C30) cycloalkyl, a substituted or unsubstituted (C6-C30)aryl, a substituted or unsubstituted (3- to 30-membered) heteroaryl, cyano, or a substituted or unsubstituted (C1-C30)alkoxy; or may be linked to an adjacent substituent(s) to form a substituted or unsubstituted fused ring, e.g., a substituted or unsubstituted naphthyl, a substituted or unsubstituted fluorene, a substituted or unsubstituted dibenzothiophene, a substituted or unsubstituted dibenzofuran, a substituted or unsubstituted indenopyridine, a substituted or unsubstituted benzofuropyridine, or a substituted or unsubstituted benzothienopyridine;

$R_{201}$ to $R_{211}$ each independently represent hydrogen, deuterium, halogen, halogen-substituted or unsubstituted (C1-C30)alkyl, a substituted or unsubstituted (C3-C30) cycloalkyl, or a substituted or unsubstituted (C6-C30) aryl; or may be linked to an adjacent substituent(s) to form a substituted or unsubstituted fused ring; and s represents an integer of 1 to 3.

The specific examples of the dopant compound include the following, but are not limited thereto.

D-1

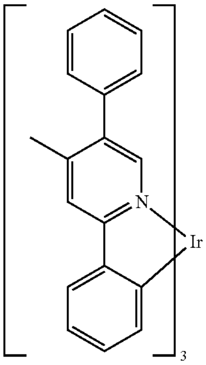

D-2

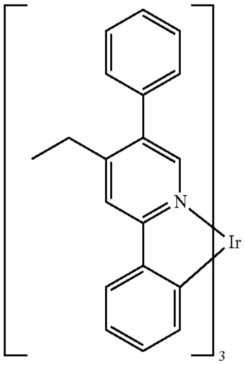

D-3

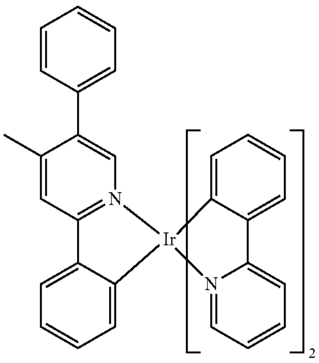

D-4

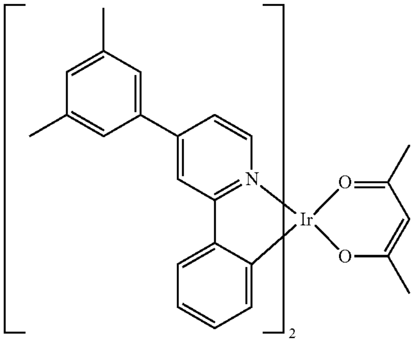

-continued
D-5
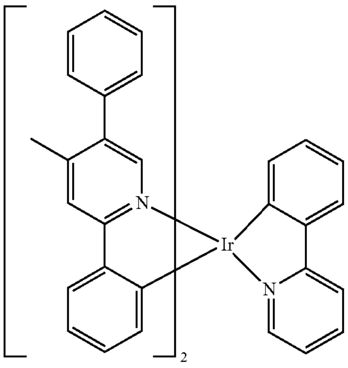
D-6
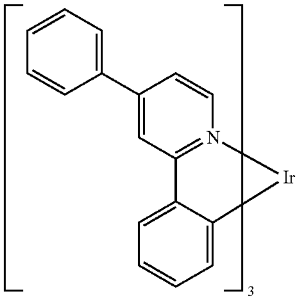
D-7
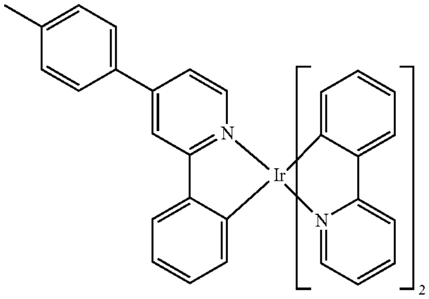
D-8
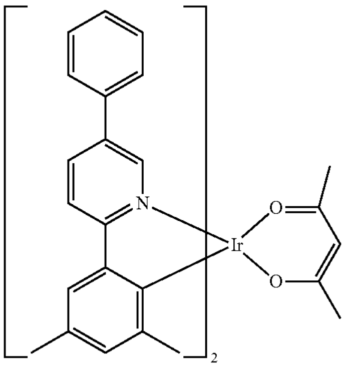
-continued
D-9
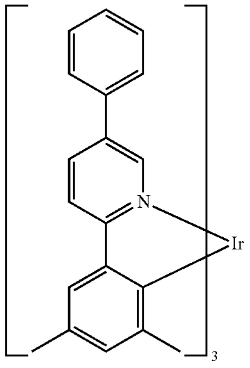
D-10
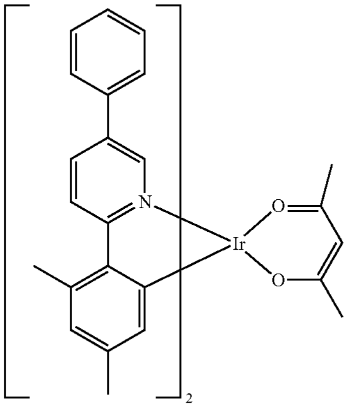
D-11
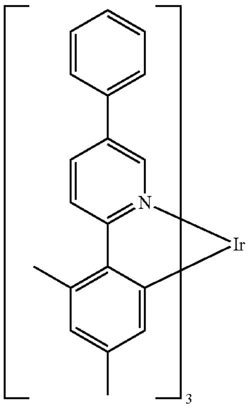
D-12
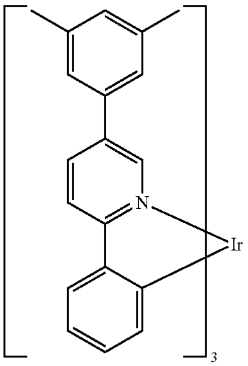

-continued
D-13
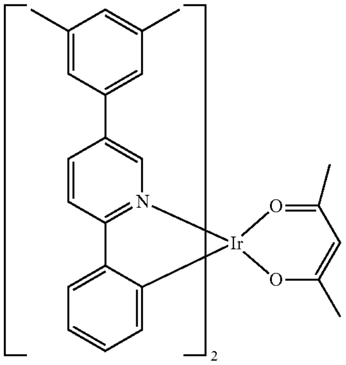
D-14
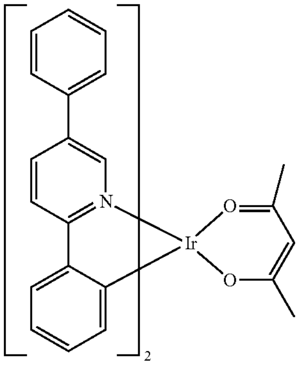
D-15
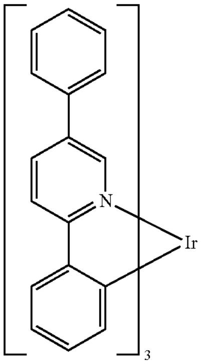
D-16
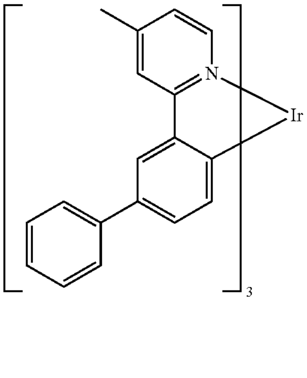
-continued
D-17
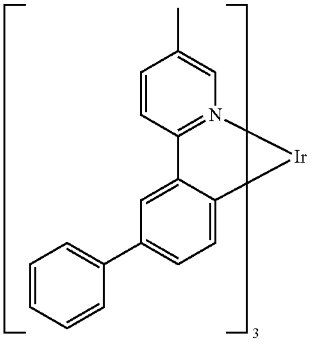
D-18
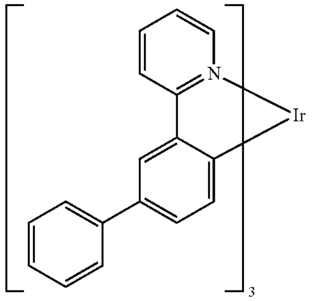
D-19
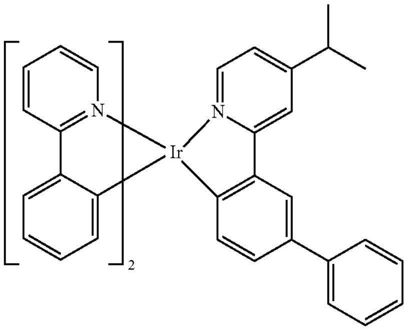
D-20
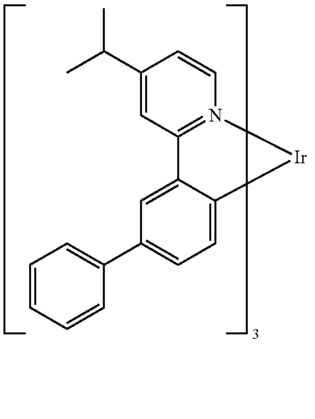

-continued
D-21
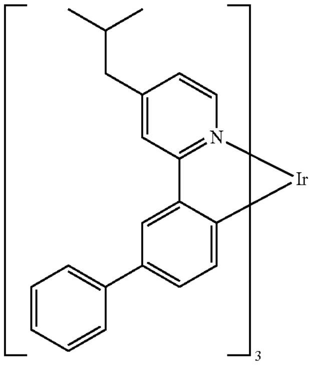
D-22
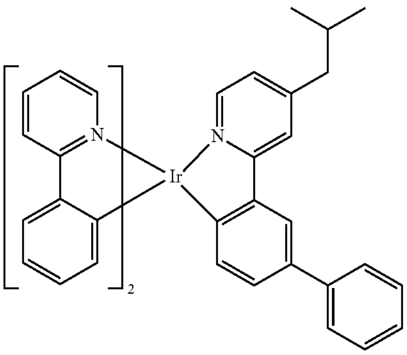
D-23
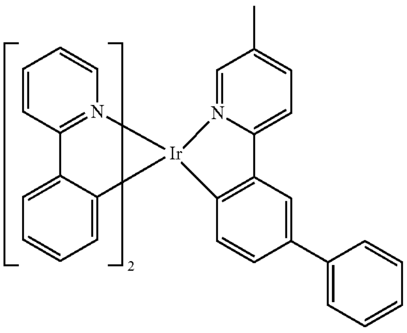
D-24
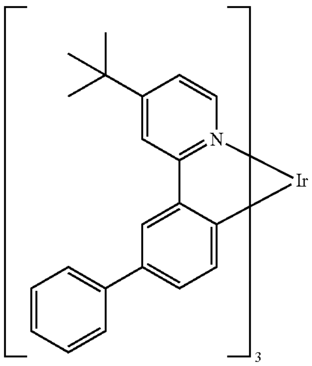
-continued
D-25
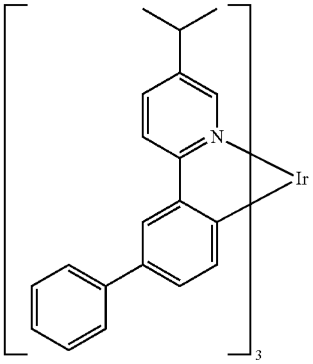
D-26
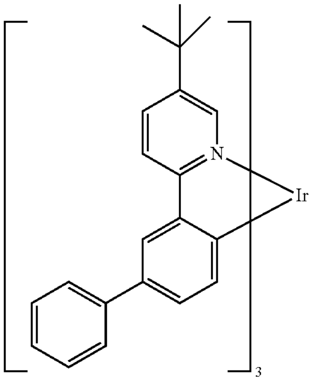
D-27
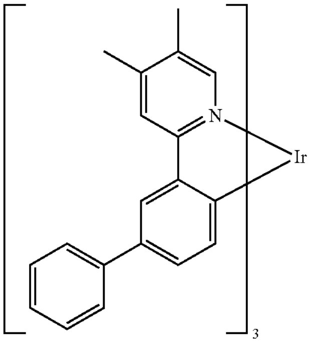
D-28
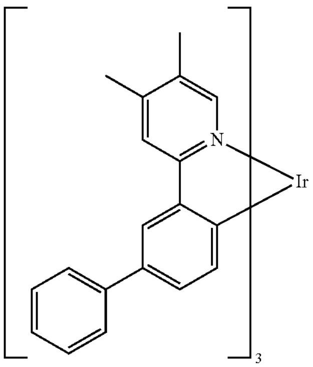

-continued
D-28
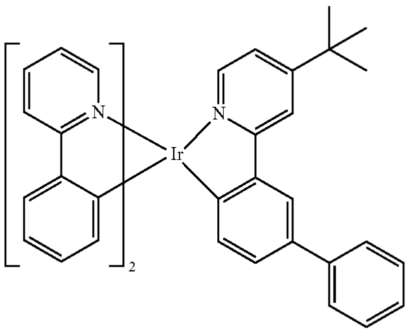
D-29
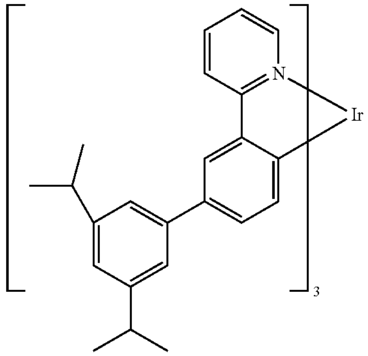
D-30
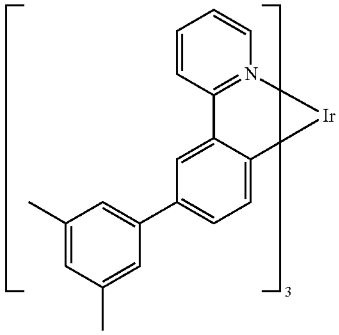
D-31
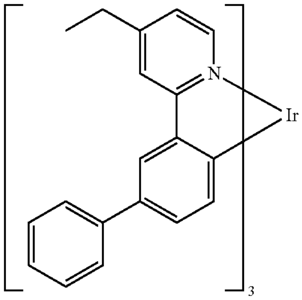
D-32
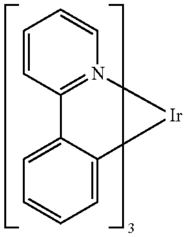
-continued
D-33
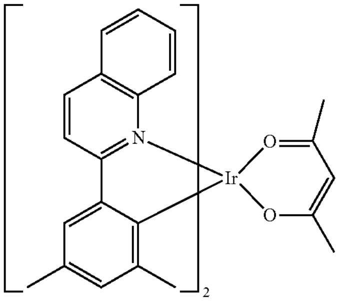
D-34
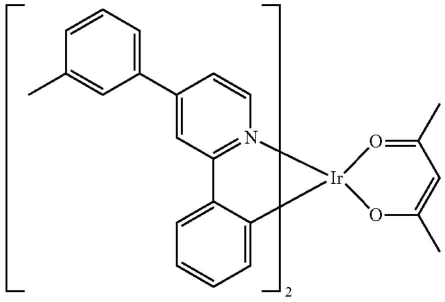
D-35
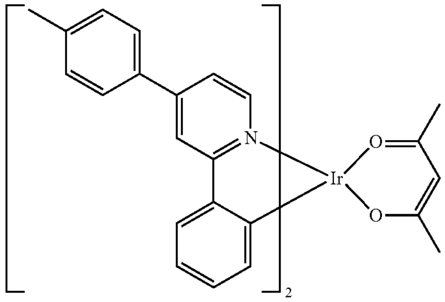
D-36
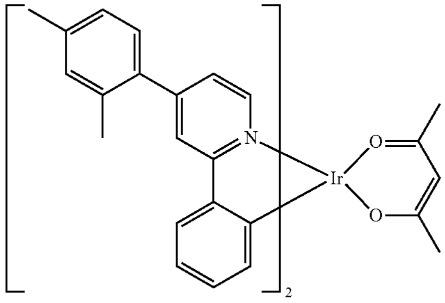
D-37
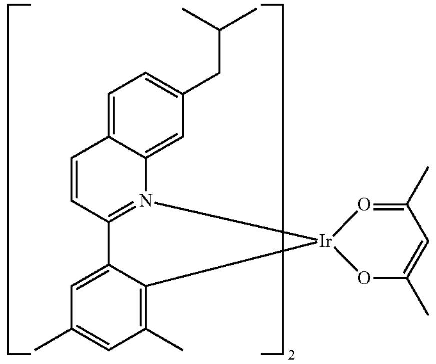

-continued
D-38
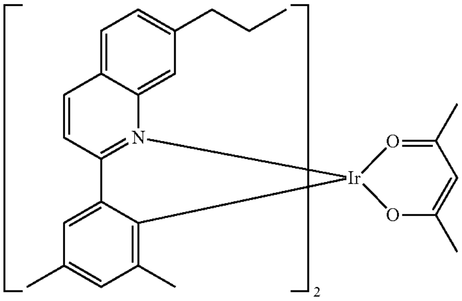
D-39
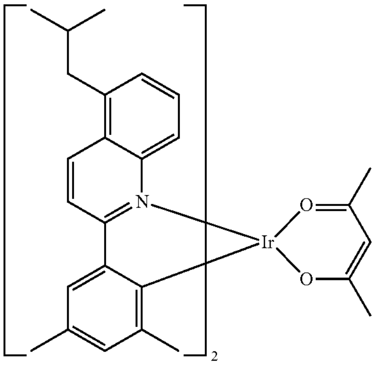
D-40
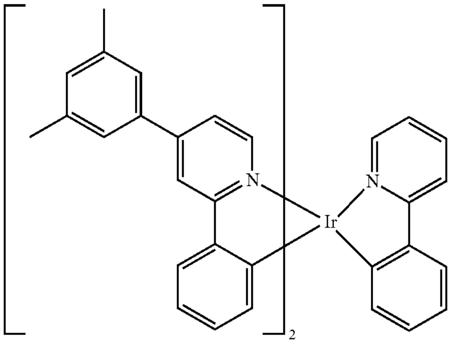
D-41
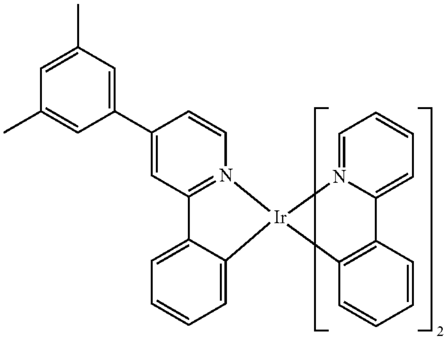
-continued
D-42
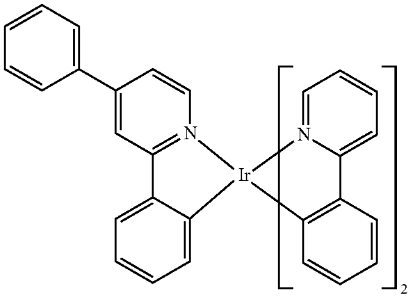
D-43
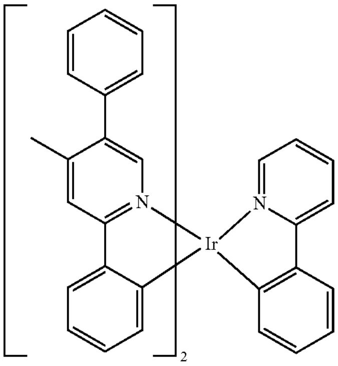
D-44
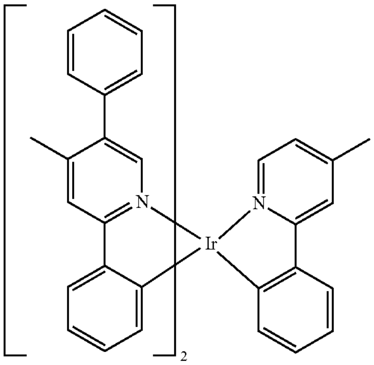
D-45
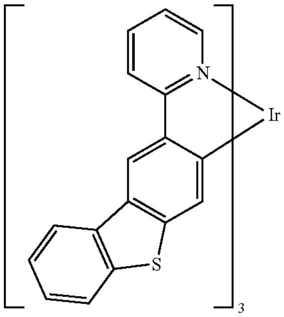

-continued
D-46
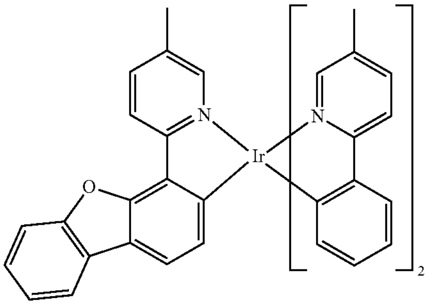
D-47
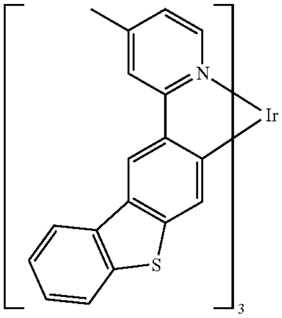
D-48
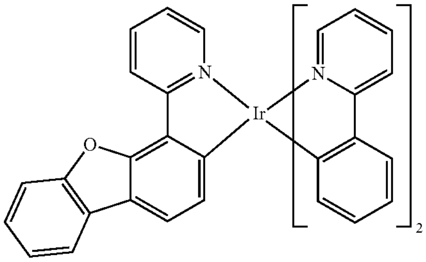
D-49
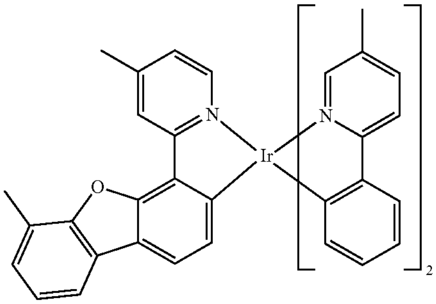
D-50
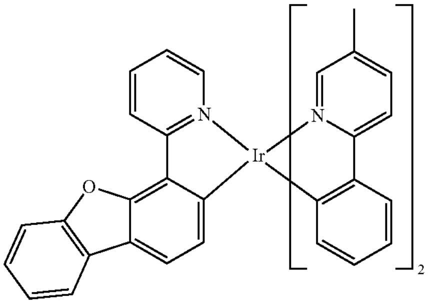
-continued
D-51
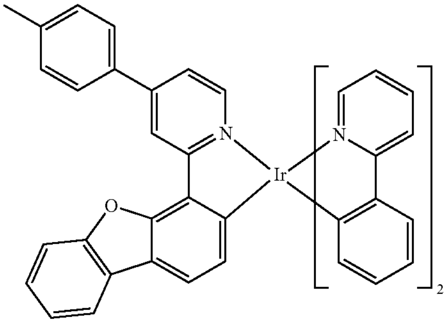
D-52
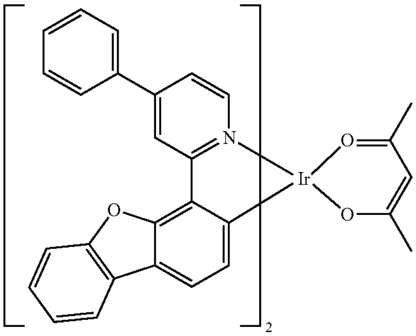
D-53
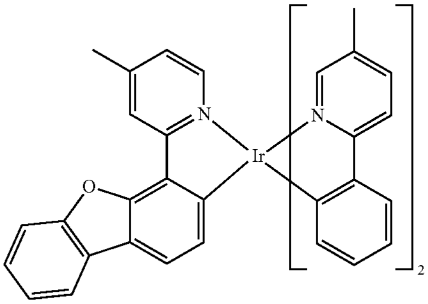
D-54
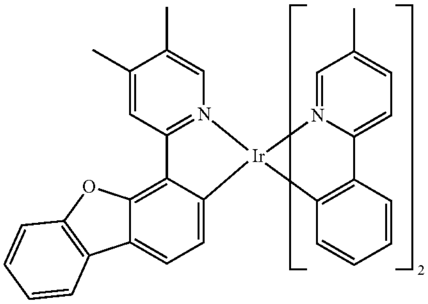
D-55
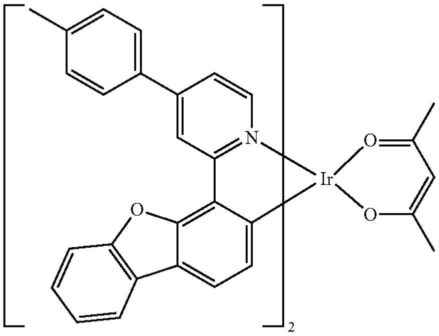

-continued
D-56
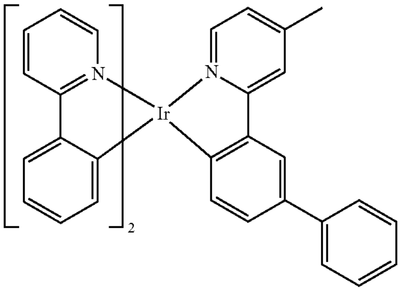
D-57
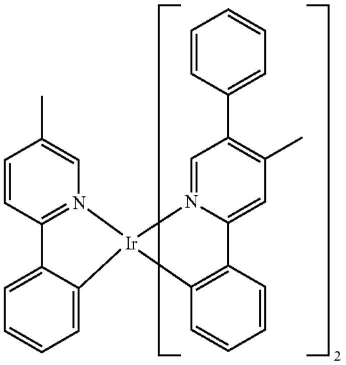
D-58
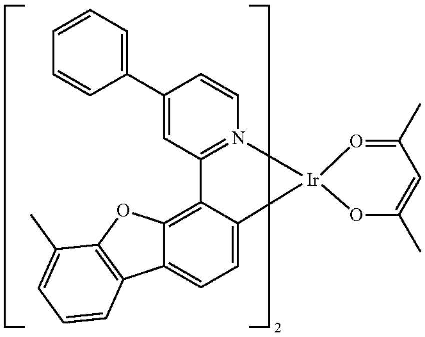
D-59
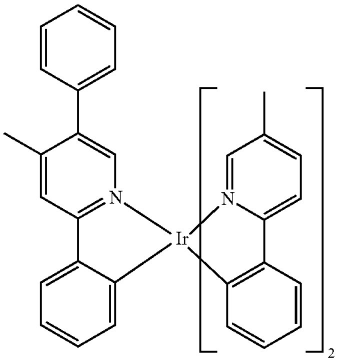
-continued
D-60
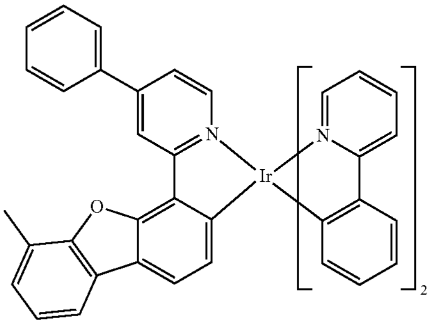
D-61
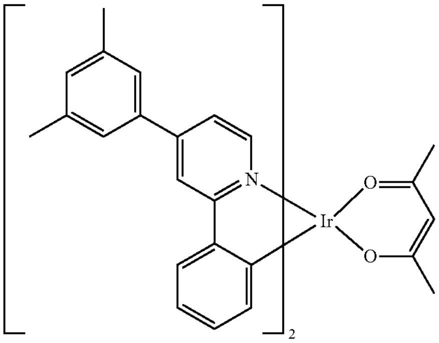
D-62
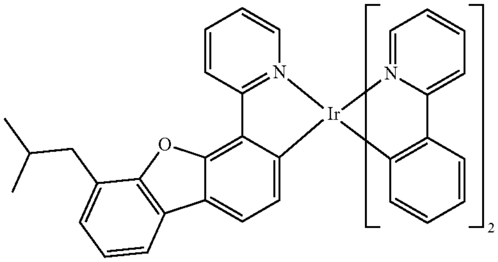
D-63
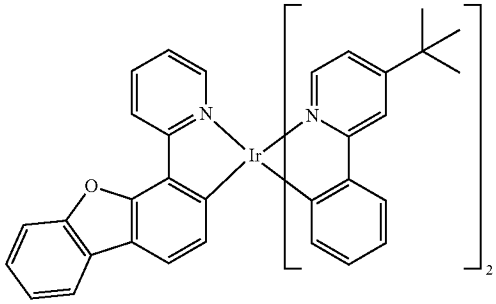
D-64
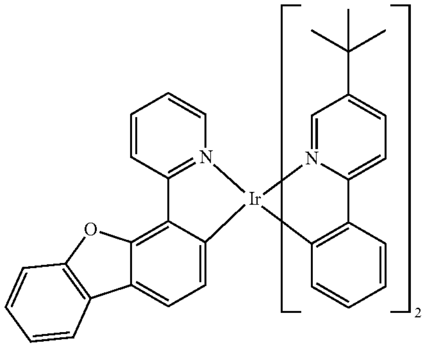

-continued
D-65
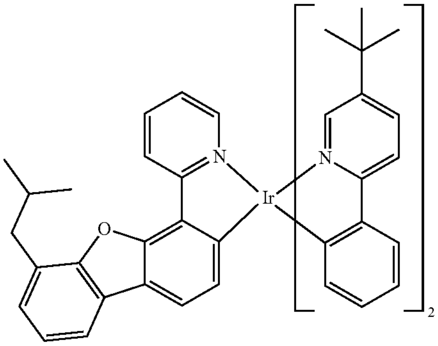
D-66
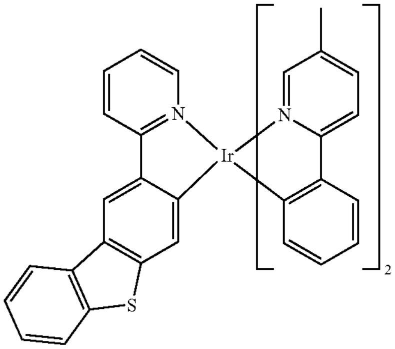
D-67
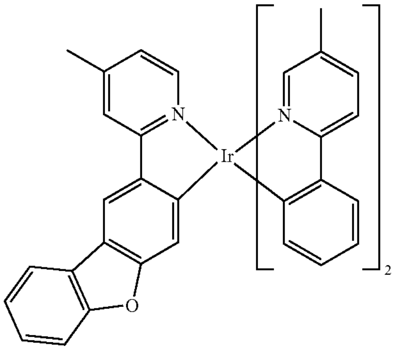
D-68
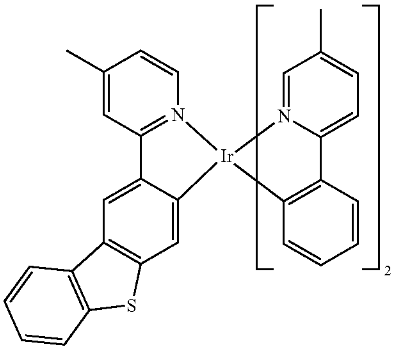
-continued
D-69
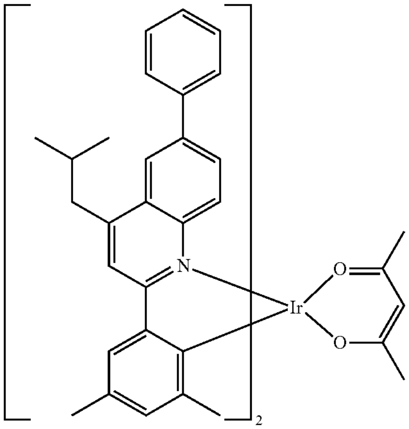
D-70
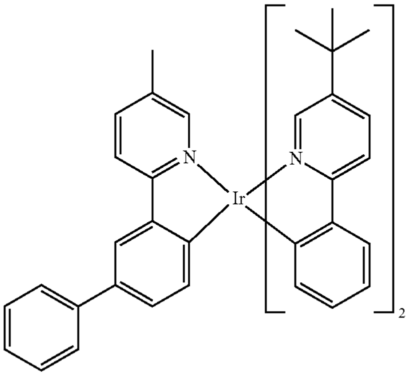
D-71
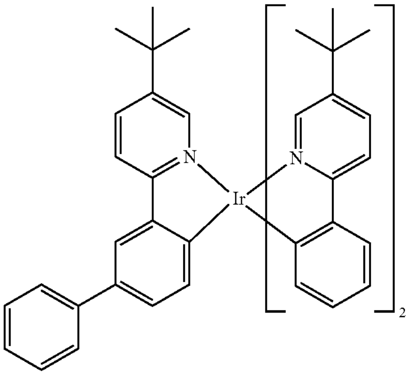
D-72
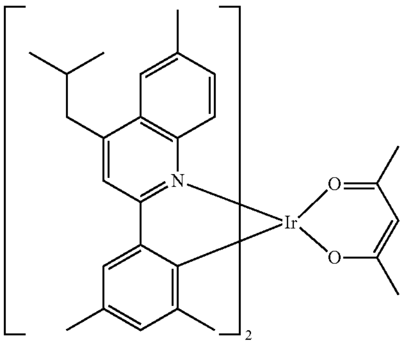

-continued
D-73
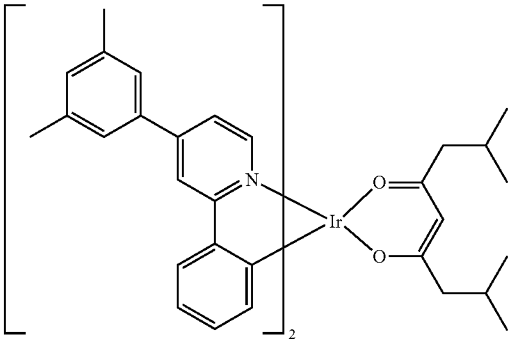
D-74
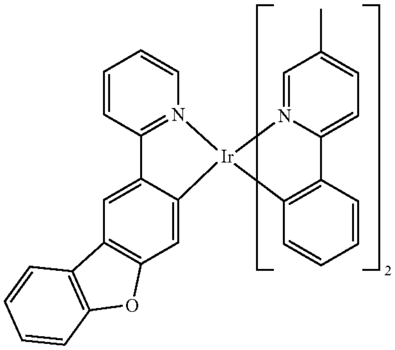
D-75
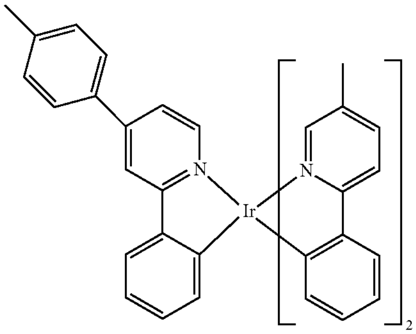
D-76
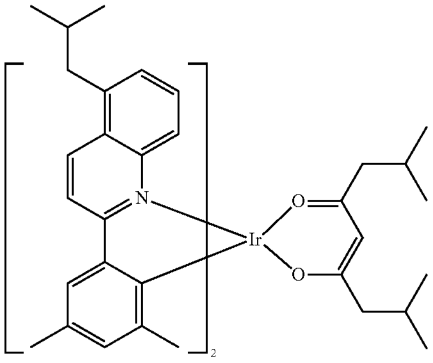
-continued
D-77
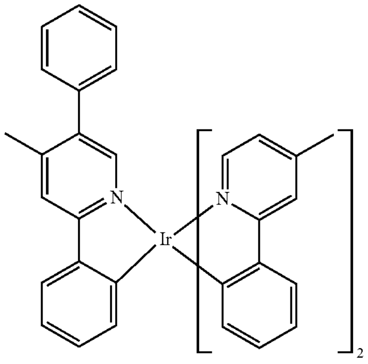
D-78
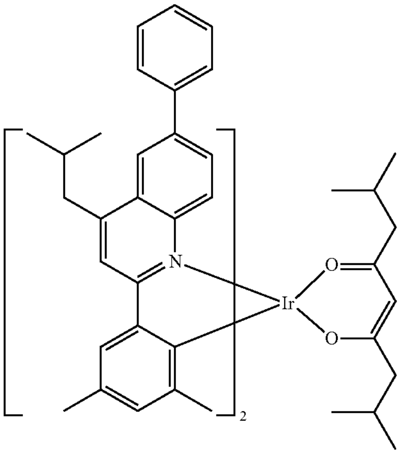
D-79
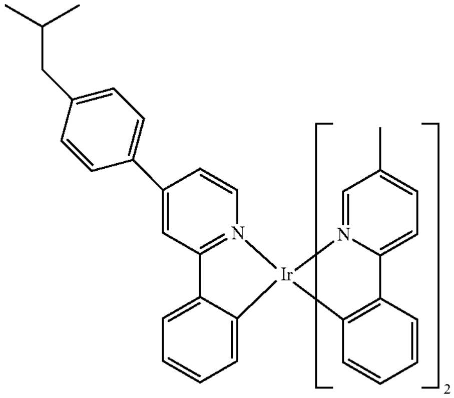
D-80
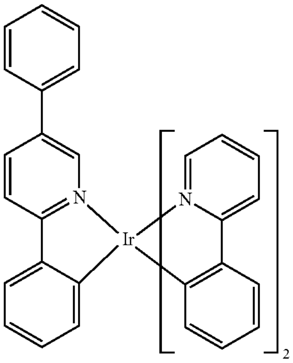

-continued
D-81
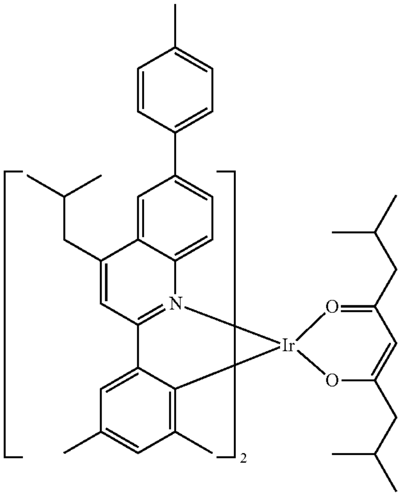
D-82
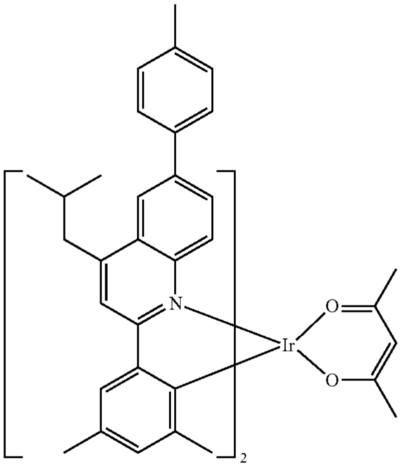
D-83
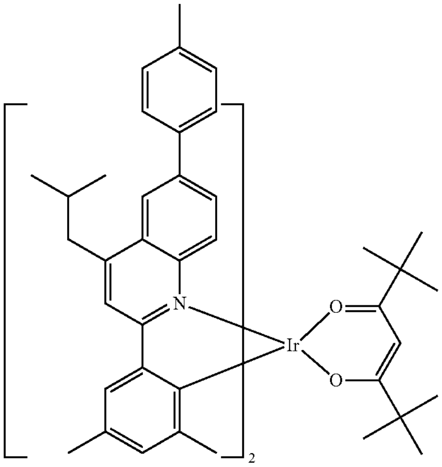
-continued
D-84
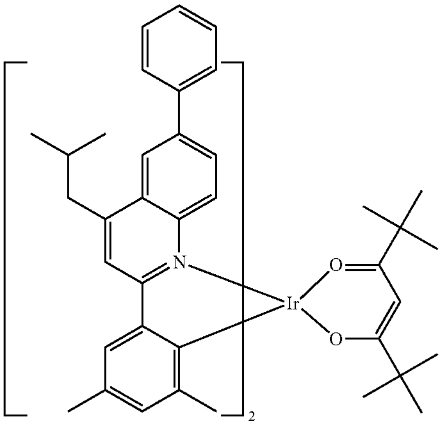
D-85
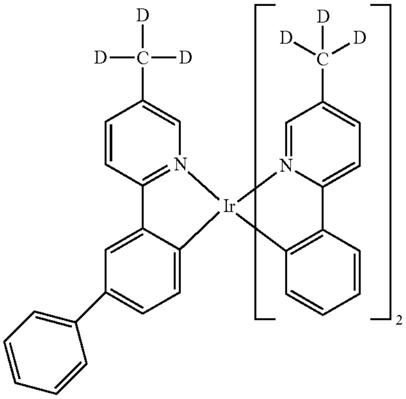
D-86
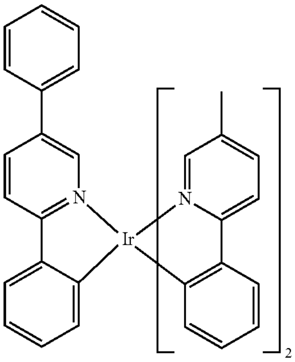
D-87
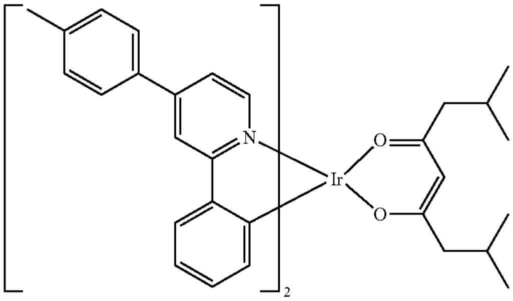

-continued
D-88
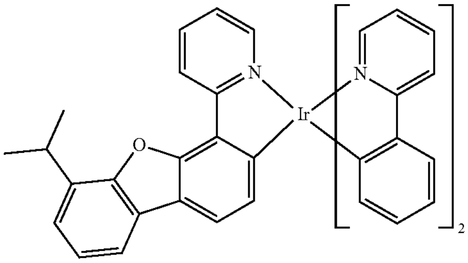
D-89
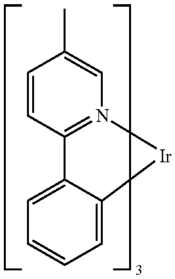
D-90
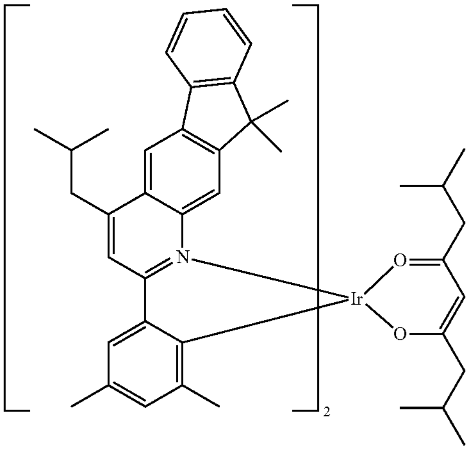
D-91
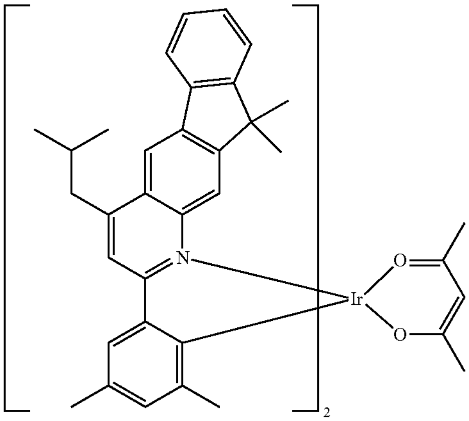
-continued
D-92
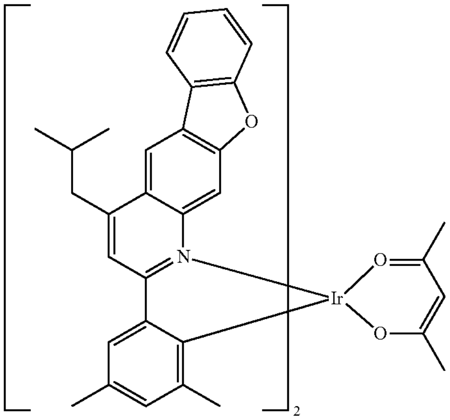
D-93
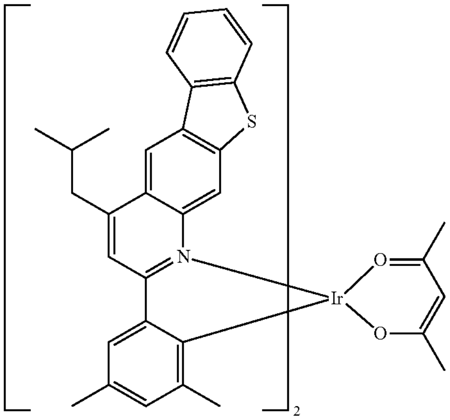
D-94
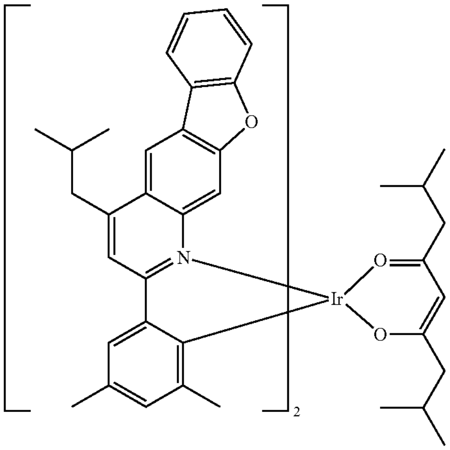

-continued
D-95
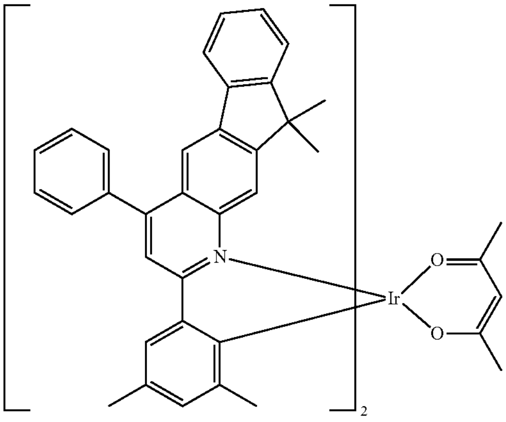
D-96
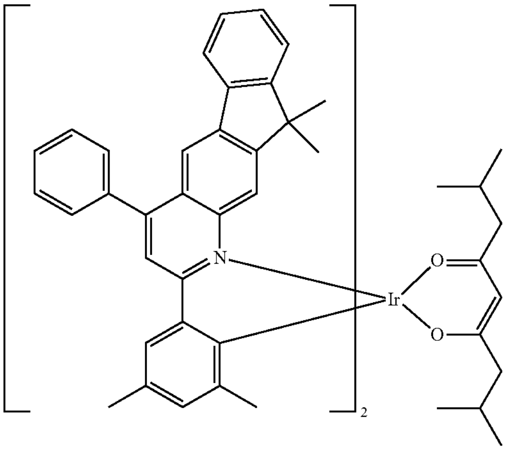
D-97
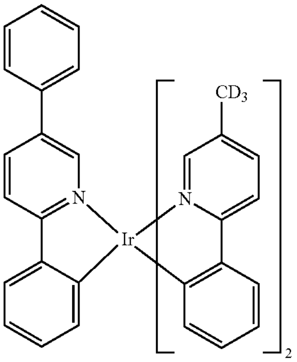
D-98
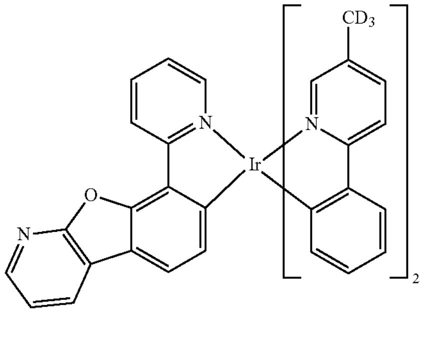
-continued
D-99
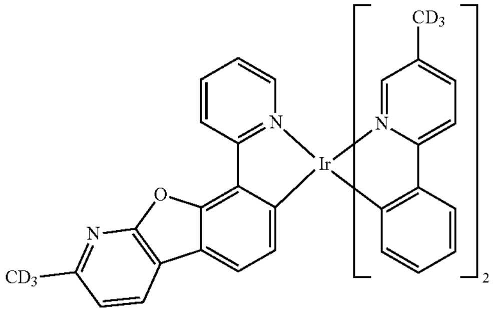
D-100
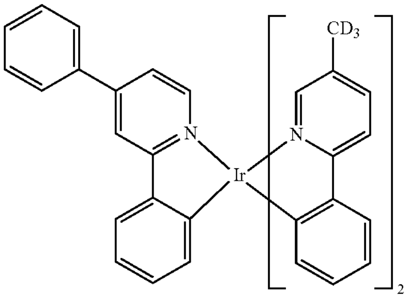
D-101
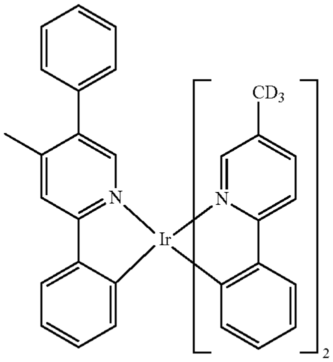
D-102
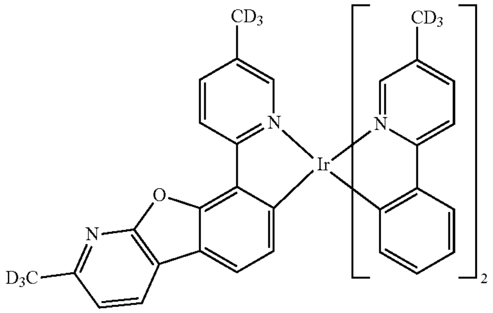
D-103
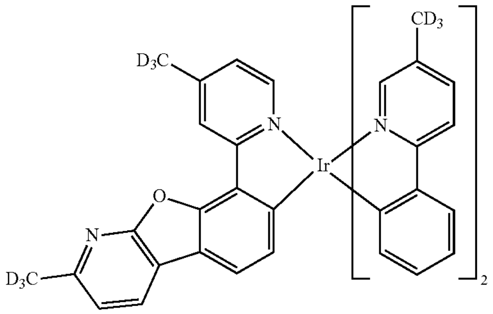

-continued
D-104
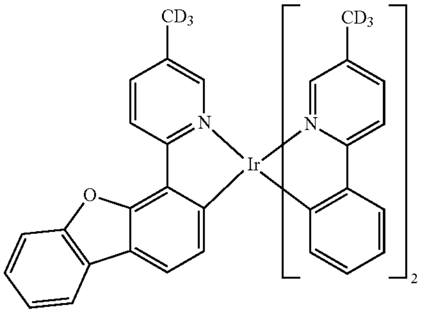
D-105
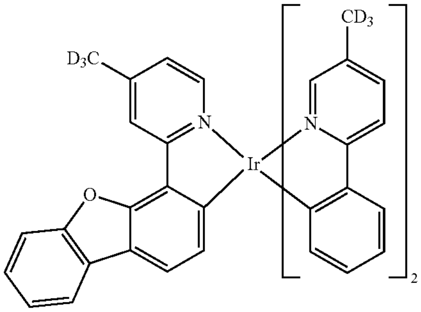
D-106
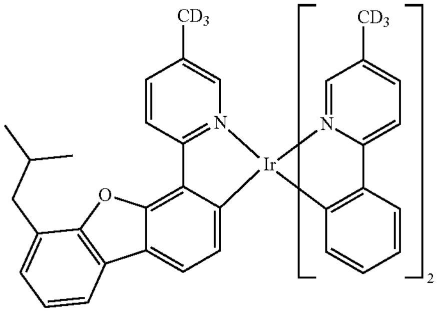
D-107
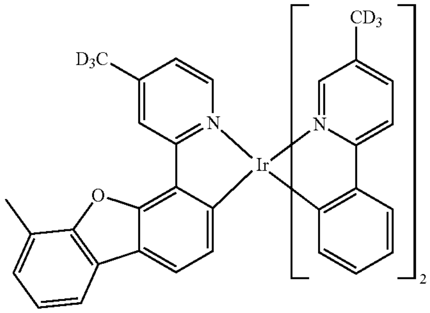
D-108
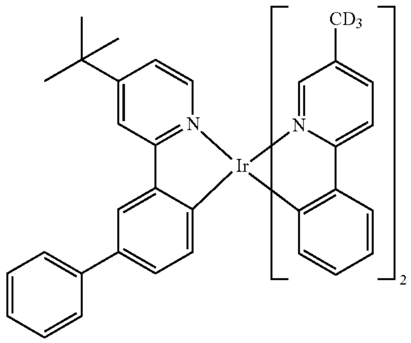
-continued
D-109
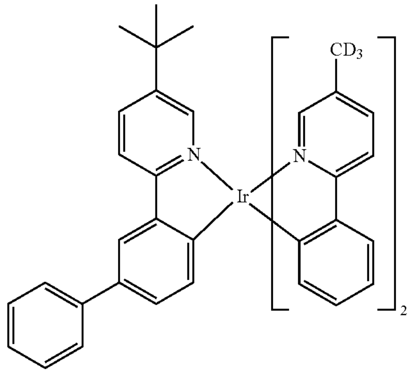
D-110
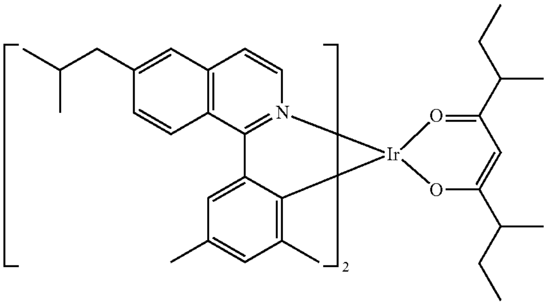
D-111
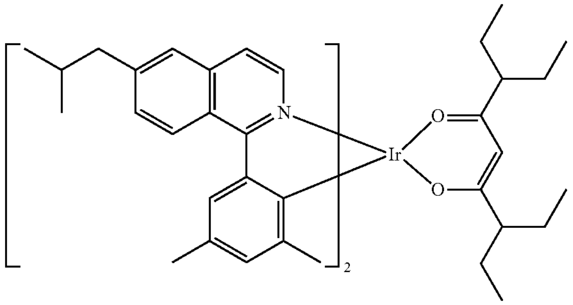
D-112
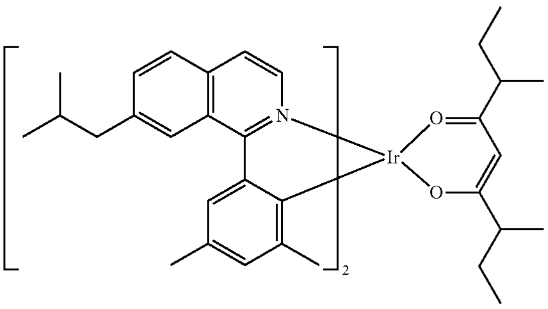

-continued

D-113

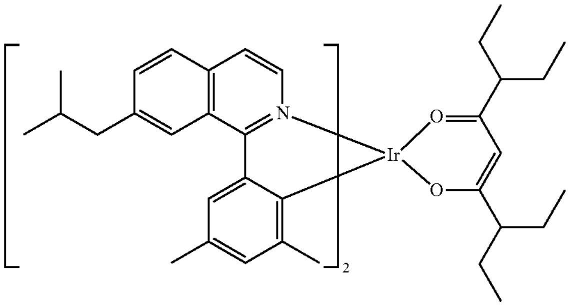

D-114

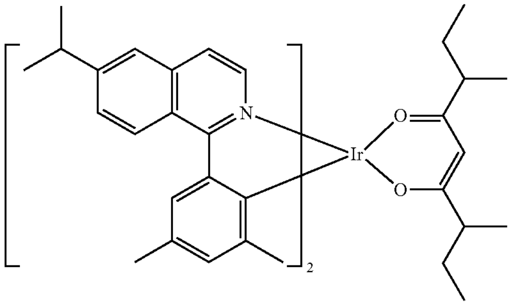

D-115

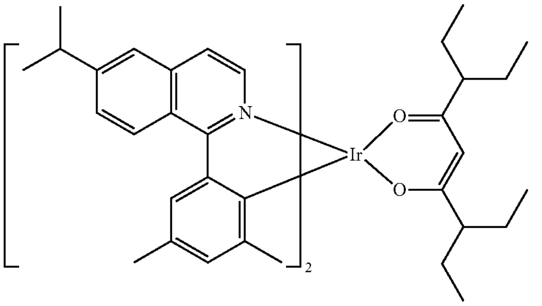

D-116

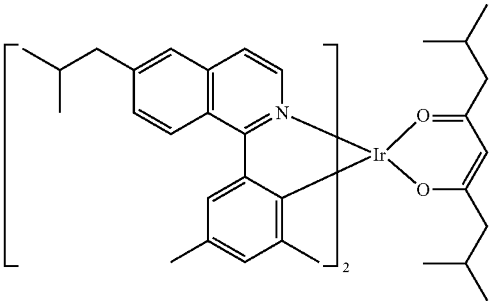

-continued

D-117

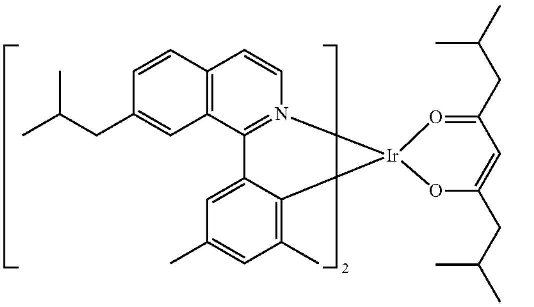

D-118

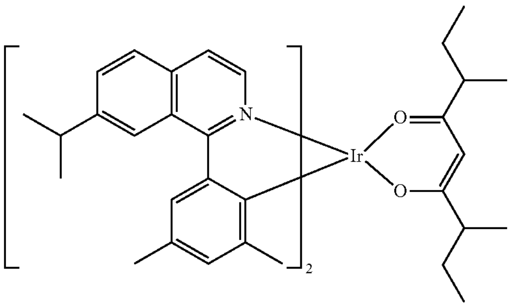

D-119

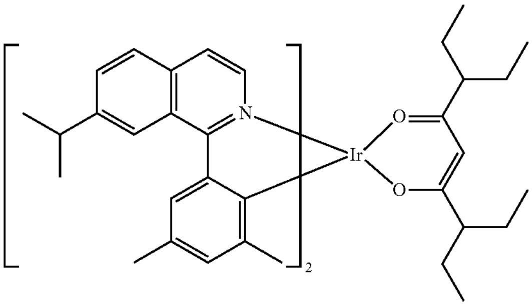

In order to form each layer of the organic electroluminescent device of the present disclosure, dry film-forming methods such as vacuum evaporation, sputtering, plasma, ion plating methods, etc., or wet film-forming methods such as ink jet printing, nozzle printing, slot coating, spin coating, dip coating, flow coating methods, etc., can be used. When using a wet film-forming method, a thin film may be formed by dissolving or diffusing materials forming each layer into any suitable solvent such as ethanol, chloroform, tetrahydrofuran, dioxane, etc. The solvent may be any solvent where the materials forming each layer can be dissolved or diffused, and where there are no problems in film-formation capability.

When forming a layer by the first host compound and the second host compound according to one embodiment, the above methods may be used, preferably, co-evaporation or mixture-evaporation may be used. The co-deposition is a mixed deposition method in which two or more isomer materials are put into respective individual crucible sources and a current is applied to both cells simultaneously to evaporate the materials and to perform mixed deposition; and the mixed deposition is a mixed deposition method in which two or more isomer materials are mixed in one crucible source before deposition, and then a current is applied to one cell to evaporate the materials.

When the first host compound and the second host compound according to one embodiment are present in the same layer or another layer in the organic electroluminescent device, two host compounds may be individually deposited. For example, the first host compound is deposited, thereafter the second host compound may be deposited.

According to one embodiment, the present disclosure can provide display devices such as smartphones, tablets, notebooks, PCs, TVs, or display devices for vehicles, or lighting devices such as outdoor or indoor lighting, by using a plurality of host materials comprising the compound represented by the formula 1 and the compound represented by the formula 2.

Hereinafter, the preparation method of an organic electroluminescent device comprising a plurality of host materials according to the present disclosure and the properties thereof will be explained in order to understand the present disclosure in detail.

[Device Examples 1-1, 1-2, 2-1 to 2-7, 3-1 to 3-4, 4-1 to 4-6, 5-1, and 5-2] Producing OLEDs in which the First Host Compound and the Second Compound According to the Present Disclosure are Deposited as a Host OLEDs comprising the compound of the present disclosure were produced. First, a transparent electrode indium tin oxide (ITO) thin film (10 Ω/sq) on a glass substrate for an OLED device (GEOMATEC CO., LTD., Japan) was subject to an ultrasonic washing with acetone, trichloroethylene, acetone, ethanol, and distilled water, sequentially, and then was stored in isopropanol. The ITO substrate was then mounted on a substrate holder of a vacuum vapor deposition apparatus. Compound HI-1 was introduced into a cell of the vacuum vapor deposition apparatus, and then the pressure in the chamber of the apparatus was controlled to $10^{-8}$ torr. Thereafter, an electric current was applied to the cell to evaporate the above-introduced material, thereby forming a first hole injection layer having a thickness of 80 nm on the ITO substrate. Next, compound HI-2 was introduced into another cell of the vacuum vapor deposition apparatus, and was evaporated by applying an electric current to the cell, thereby forming a second hole injection layer having a thickness of 5 nm on the first hole injection layer. Compound HT-1 was then introduced into another cell of the vacuum vapor deposition apparatus, and was evaporated by applying an electric current to the cell, thereby forming a first hole transport layer having a thickness of 10 nm on the second hole injection layer. Compound HT-2 was then introduced into another cell of the vacuum vapor deposition apparatus, and was evaporated by applying an electric current to the cell, thereby forming a second hole transport layer having a thickness of 60 nm on the first hole transport layer. After forming the hole injection layers and the hole transport layers, a light-emitting layer was formed thereon as follows: The first host compound and the second host compound of the following Table 1 were introduced into one cell of the vacuum vapor depositing apparatus as a host, and compound D-39 was introduced into another cell as a dopant. The two host materials were evaporated at a rate of 1:1 and simultaneously, the dopant was deposited in a doping amount of 3 wt % to form a light-emitting layer having a thickness of 40 nm on the hole transport layer. Next, compounds ET-1 and EI-1 were evaporated at a rate of 1:1, and were deposited to form an electron transport layer having a thickness of 35 nm on the light-emitting layer. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, OLEDs were produced.

[Comparative Examples 1 to 5] Producing OLEDs Comprising the Comparative Compound as a Host OLEDs were produced in the same manner as in Device Example 1-1, except that the compounds of the following Table 1 were used as the host of the light-emitting layer.

The results of the driving voltage, the luminous efficiency, increasing rate of efficiency compared to a single host, and the power efficiency at a luminance of 5,000 nits, and the time taken to reduce from 100% to 96% at a luminance of 5.000 nits (lifespan: T96), of the organic electroluminescent device of Device Examples 1-1, 1-2, 2-1 to 2-7, 3-1 to 3-4, 4-1 to 4-6, 5-1, and 5-2 and Comparative Examples 1 to 5 produced as described above, are shown in the following Table 1.

TABLE 1

| | First Host Compound | Second Host Compound | Driving Voltage (V) | Luminous Efficiency (cd/A) | Increasing Rate of Efficiency (%) | Power Efficiency (lm/W) | Lifespan (T96, hr) |
|---|---|---|---|---|---|---|---|
| Comparative Example 1 | — | C-2-2 | 4.5 | 21.4 | — | 15.1 | 12 |
| Device Example 1-1 | C-1-7 | C-2-2 | 4.2 | 26.2 | 44.4 | 19.5 | 156 |
| Device Example 1-2 | C-1-131 | C-2-2 | 3.9 | 23.8 | 43.0 | 19.3 | 131 |
| Comparative Example 2 | — | C-2-5 | 4.4 | 18.7 | — | 13.5 | 12 |
| Device Example 2-1 | C-1-7 | C-2-4 | 4.1 | 24.6 | — | 19.0 | 72 |
| Device Example 2-2 | C-1-7 | C-2-5 | 4.1 | 26.3 | 50.4 | 20.3 | 215 |
| Device Example 2-3 | C-1-1 | C-2-5 | 4.1 | 26.8 | 53.3 | 20.7 | 339 |
| Device Example 2-4 | C-1-7 | C-2-59 | 4.2 | 26.4 | — | 21.6 | 137 |
| Device Example 2-5 | C-1-1 | C-2-59 | 4.0 | 29.3 | — | 23.1 | 166 |
| Device Example 2-6 | C-1-7 | C-2-55 | 4.0 | 26.2 | — | 20.5 | 185 |

TABLE 1-continued

| | First Host Compound | Second Host Compound | Driving Voltage (V) | Luminous Efficiency (cd/A) | Increasing Rate of Efficiency (%) | Power Efficiency (lm/W) | Lifespan (T96, hr) |
|---|---|---|---|---|---|---|---|
| Device Example 2-7 | C-1-1 | C-2-55 | 4.1 | 27.7 | — | 21.2 | 167 |
| Comparative Example 3 | — | C-2-97 | 5.3 | 21.8 | — | 12.9 | 19 |
| Device Example 3-1 | C-1-7 | C-2-97 | 4.3 | 24.0 | 37.2 | 17.7 | 175 |
| Device Example 3-2 | C-1-6 | C-2-97 | 4.3 | 24.5 | 38.0 | 17.8 | 230 |
| Device Example 3-3 | C-1-125 | C-2-97 | 3.6 | 22.5 | 53.5 | 19.8 | 236 |
| Device Example 3-4 | C-1-59 | C-2-97 | 4.1 | 22.6 | 34.9 | 17.4 | 170 |
| Comparative Example 4 | — | C-2-91 | 5.1 | 19.8 | — | 12.2 | 20 |
| Device Example 4-1 | C-1-7 | C-2-91 | 4.5 | 24.7 | 24.7 | 17.2 | 241 |
| Device Example 4-2 | C-1-125 | C-2-91 | 3.6 | 21.0 | 6.1 | 18.4 | 182 |
| Device Example 4-3 | C-1-127 | C-2-91 | 3.8 | 17.7 | — | 14.5 | 161 |
| Device Example 4-4 | C-1-138 | C-2-91 | 3.8 | 22.4 | 13.1 | 18.7 | 190 |
| Device Example 4-5 | C-1-139 | C-2-91 | 3.8 | 22.6 | 14.1 | 18.8 | 204 |
| Device Example 4-6 | C-1-7 | C-2-188 | 4.5 | 24.8 | — | 17.2 | 297 |
| Comparative Example 5 | — | C-2-96 | 5.0 | 20.8 | — | 13.1 | 15 |
| Device Example 5-1 | C-1-140 | C-2-96 | 4.0 | 22.8 | 9.6 | 18.1 | 172 |
| Device Example 5-2 | C-1-1 | C-2-96 | 4.6 | 24.9 | 19.7 | 17.1 | 153 |

[Device Examples 6 to 8] Producing OLEDs in which the First Host Compound and the Second Compound According to the Present Disclosure are Deposited as a Host OLEDs were produced in the same manner as in Device Example 1-1, except that the compounds of the following Table 2 were used as the host of the light-emitting layer.

[Comparative Example 6] Producing an OLED Comprising the Comparative Compound as a Host An OLED was produced in the same manner as in Device Example 1-1, except that the compounds of the following Table 2 were used as the host of the light-emitting layer.

The results of the luminous efficiency, the power efficiency at a luminance of 1,000 nits, and the time taken to reduce from 100% to 70% at a luminance of 1,000 nits (lifespan; T70), of the organic electroluminescent device of Device Examples 6 to 8 and Comparative Example 6 produced as described above, are shown in the following Table 2.

TABLE 2

| | First Host Compound | Second Host Compound | Luminous Efficiency (cd/A) | Power Efficiency (lm/W) | Lifespan (T70, hr) |
|---|---|---|---|---|---|
| Comparative Example 6 | — | C-2-166 | 14.3 | 14.2 | 50 |
| Device Example 6 | C-1-7 | C-2-166 | 25.5 | 26.3 | 393 |
| Device Example 7 | C-1-7 | C-2-180 | 25.9 | 26.9 | 224 |
| Device Example 8 | C-1-7 | C-2-187 | 29.0 | 27.9 | 79 |

Referring to Tables 1 and 2 above, it is confirmed that the organic electroluminescent device comprising the specific combination compounds according to one embodiment as host materials can significantly lower the driving voltage and has improved characteristics in view of efficiency and lifespan than the conventional organic electroluminescent device.

The compounds used in the Device Examples and Comparative Examples are shown in Table 3 below.

TABLE 3
| | |
|---|---|
| Hole Injection Layer/ Hole Transport Layer | 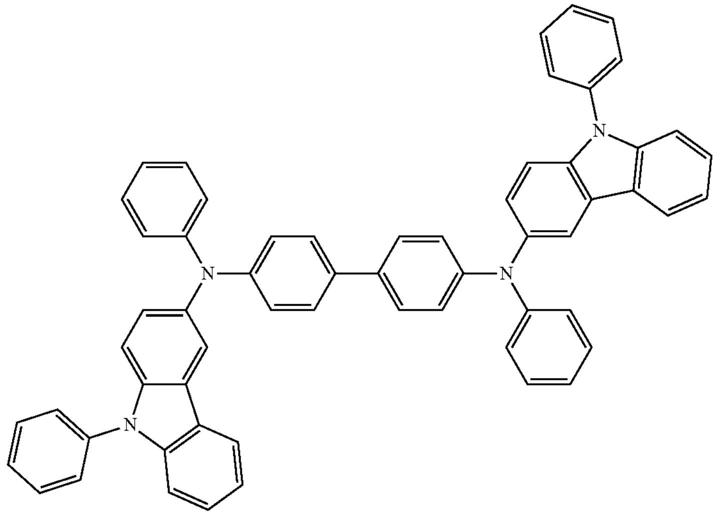 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1] HI-1 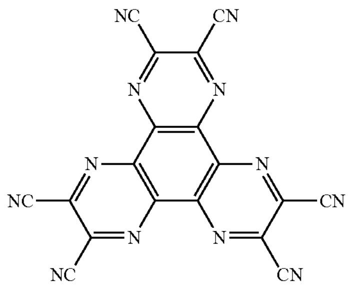 [SMILES: N#Cc1nc2c3nc(C#N)c(C#N)nc3c3nc(C#N)c(C#N)nc3c2nc1C#N] HI-2 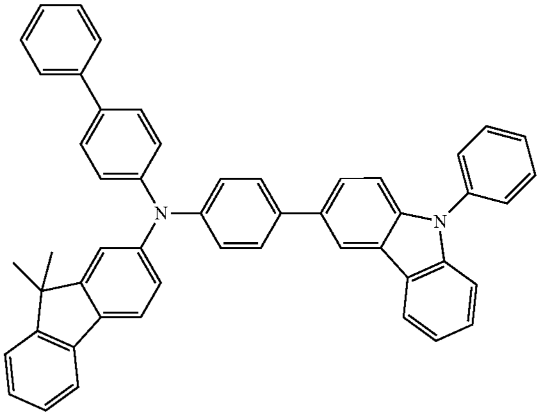 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] HT-1 |

TABLE 3-continued
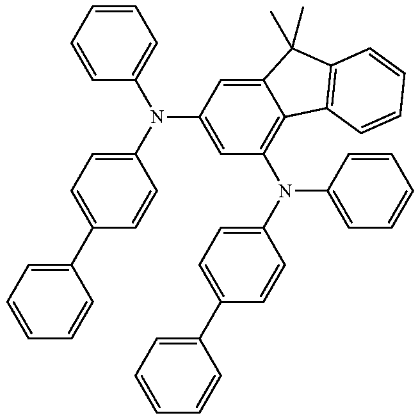 [SMILES: CC1(C)c2ccccc2-c2c(N(c3ccccc3)c3ccc(-c4ccccc4)cc3)cc(N(c3ccccc3)c3ccc(-c4ccccc4)cc3)cc21]
HT-2
Light-Emitting Layer
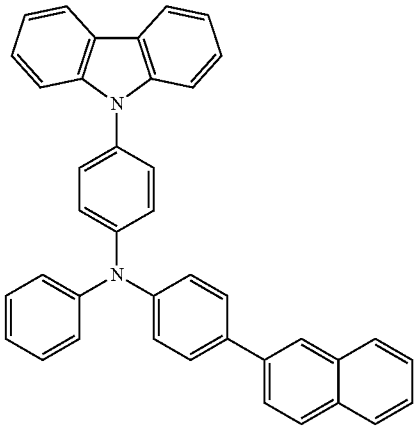 [SMILES: c1ccc(N(c2ccc(-c3ccc4ccccc4c3)cc2)c2ccc(-n3c4ccccc4c4ccccc43)cc2)cc1]
C-1-1
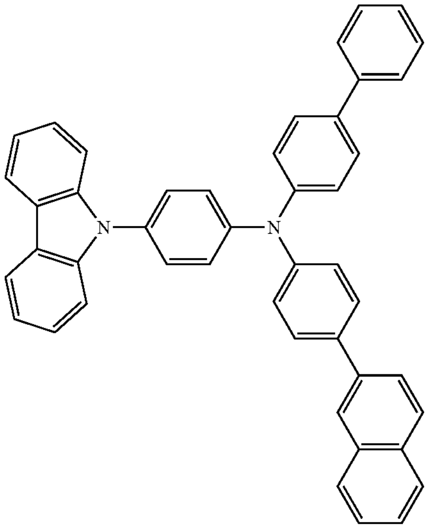 [SMILES: c1ccc(-c2ccc(N(c3ccc(-c4ccc5ccccc5c4)cc3)c3ccc(-n4c5ccccc5c5ccccc54)cc3)cc2)cc1]
C-1-6

TABLE 3-continued
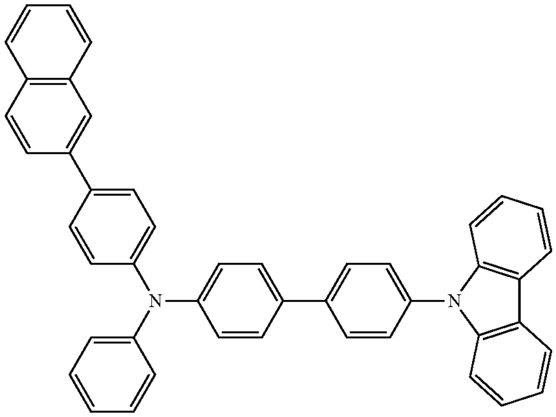 [SMILES: c1ccc(N(c2ccc(-c3ccc(-n4c5ccccc5c5ccccc54)cc3)cc2)c2ccc(-c3ccc4ccccc4c3)cc2)cc1]
C-1-7
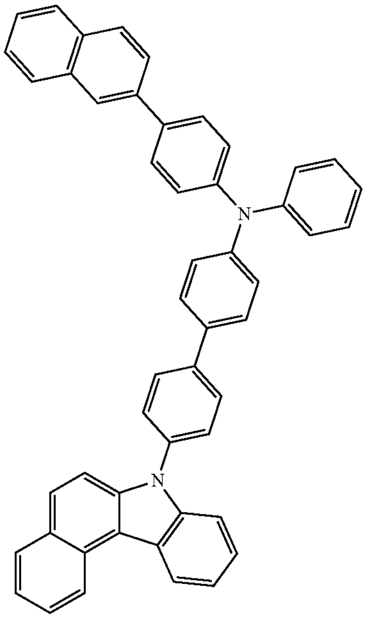 [SMILES: c1ccc(N(c2ccc(-c3ccc(-n4c5ccccc5c5c6ccccc6ccc54)cc3)cc2)c2ccc(-c3ccc4ccccc4c3)cc2)cc1]
C-1-33
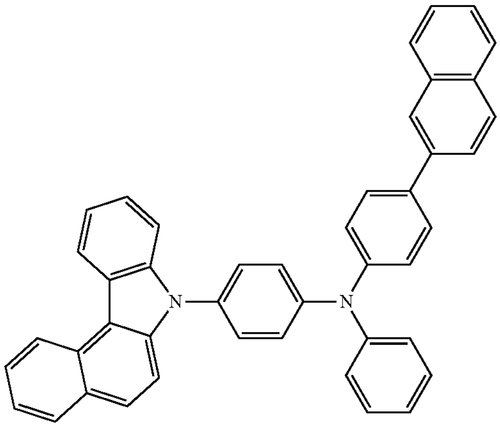 [SMILES: c1ccc(N(c2ccc(-c3ccc4ccccc4c3)cc2)c2ccc(-n3c4ccccc4c4c5ccccc5ccc43)cc2)cc1]
C-1-59

TABLE 3-continued
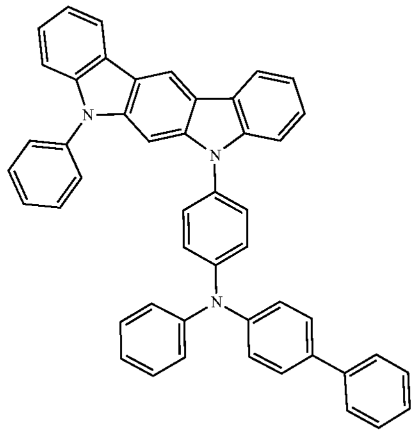 [SMILES: c1ccc(-c2ccc(N(c3ccccc3)c3ccc(-n4c5ccccc5c5cc6c7ccccc7n(-c7ccccc7)c6cc54)cc3)cc2)cc1]
C-1-125
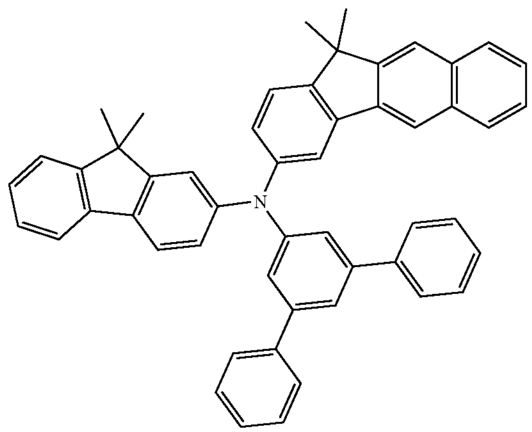 [SMILES: CC1(C)c2ccccc2-c2ccc(N(c3cc(-c4ccccc4)cc(-c4ccccc4)c3)c3ccc4c(c3)-c3cc5ccccc5cc3C4(C)C)cc21]
C-1-131
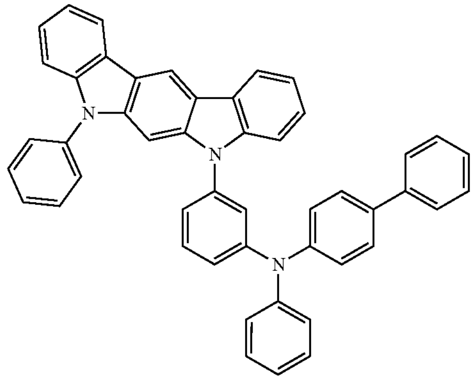 [SMILES: c1ccc(-c2ccc(N(c3ccccc3)c3cccc(-n4c5ccccc5c5cc6c7ccccc7n(-c7ccccc7)c6cc54)c3)cc2)cc1]
C-1-127

TABLE 3-continued
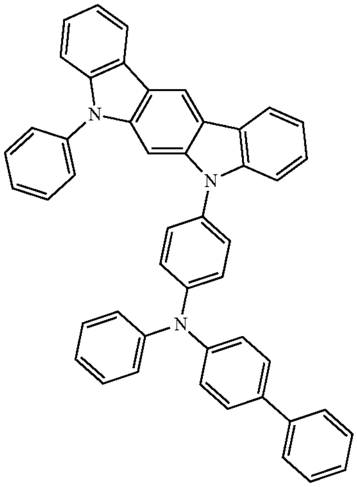 [SMILES: c1ccc(-c2ccc(N(c3ccccc3)c3ccc(-n4c5ccccc5c5cc6c7ccccc7n(-c7ccccc7)c6cc54)cc3)cc2)cc1]
C-1-138
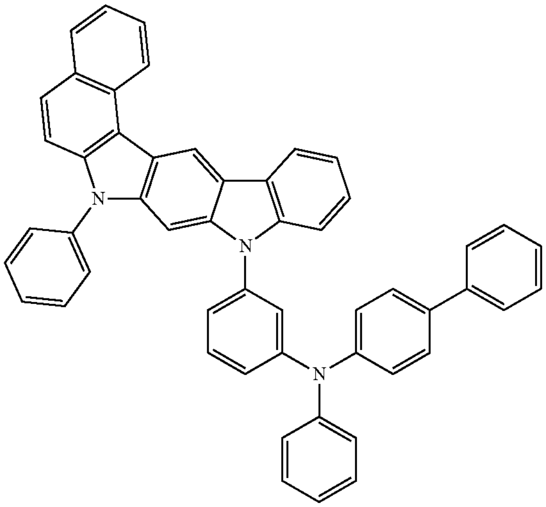 [SMILES: c1ccc(-c2ccc(N(c3ccccc3)c3cccc(-n4c5ccccc5c5cc6c7c8ccccc8ccc7n(-c7ccccc7)c6cc54)c3)cc2)cc1]
C-1-139
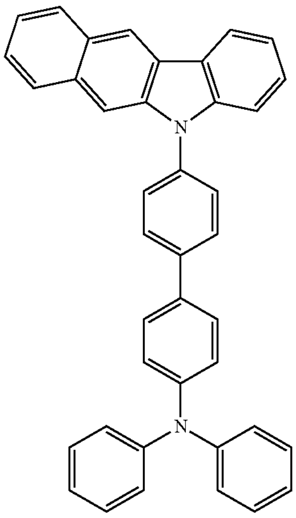 [SMILES: c1ccc(N(c2ccccc2)c2ccc(-c3ccc(-n4c5ccccc5c5cc6ccccc6cc54)cc3)cc2)cc1]
C-1-140

TABLE 3-continued
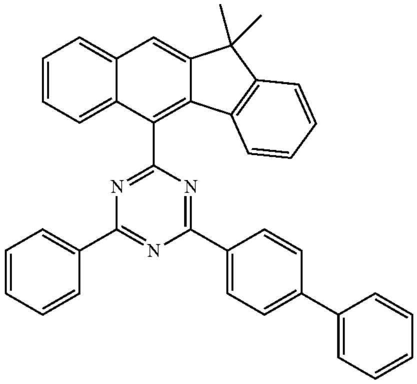 [SMILES: CC1(C)c2ccccc2-c2c1cc1ccccc1c2-c1nc(-c2ccccc2)nc(-c2ccc(-c3ccccc3)cc2)n1]
C-2-2
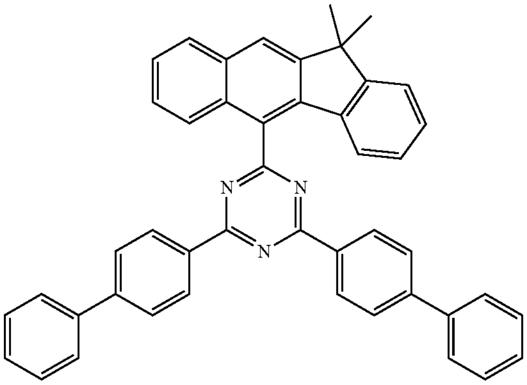 [SMILES: CC1(C)c2ccccc2-c2c1cc1ccccc1c2-c1nc(-c2ccc(-c3ccccc3)cc2)nc(-c2ccc(-c3ccccc3)cc2)n1]
C-2-4
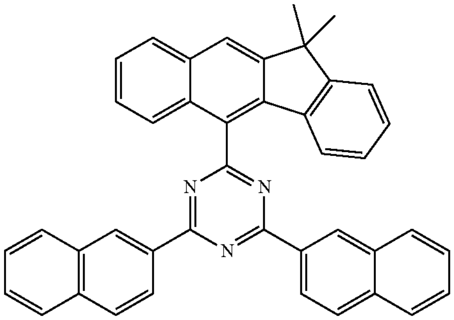 [SMILES: CC1(C)c2ccccc2-c2c1cc1ccccc1c2-c1nc(-c2ccc3ccccc3c2)nc(-c2ccc3ccccc3c2)n1]
C-2-5
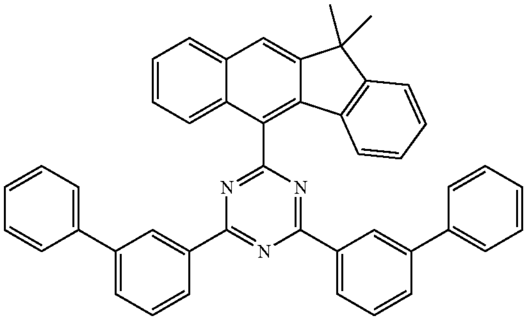 [SMILES: CC1(C)c2ccccc2-c2c1cc1ccccc1c2-c1nc(-c2cccc(-c3ccccc3)c2)nc(-c2cccc(-c3ccccc3)c2)n1]
C-2-55

TABLE 3-continued
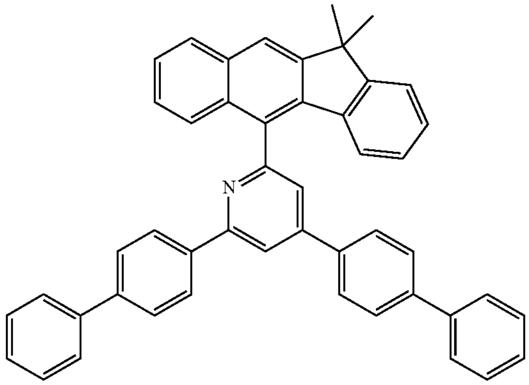 [SMILES: CC1(C)c2ccccc2-c2c1cc1ccccc1c2-c1cc(-c2ccc(-c3ccccc3)cc2)cc(-c2ccc(-c3ccccc3)cc2)n1]
C-2-59
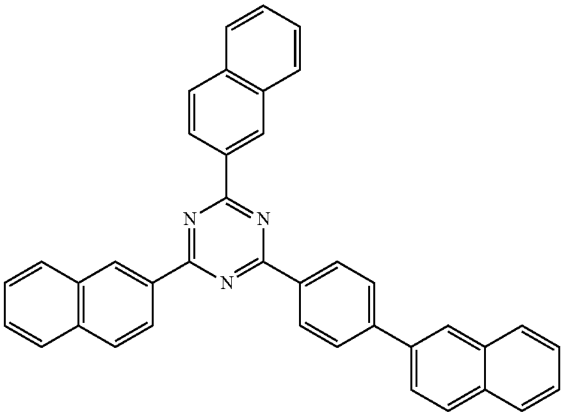 [SMILES: c1ccc2cc(-c3ccc(-c4nc(-c5ccc6ccccc6c5)nc(-c5ccc6ccccc6c5)n4)cc3)ccc2c1]
C-2-97
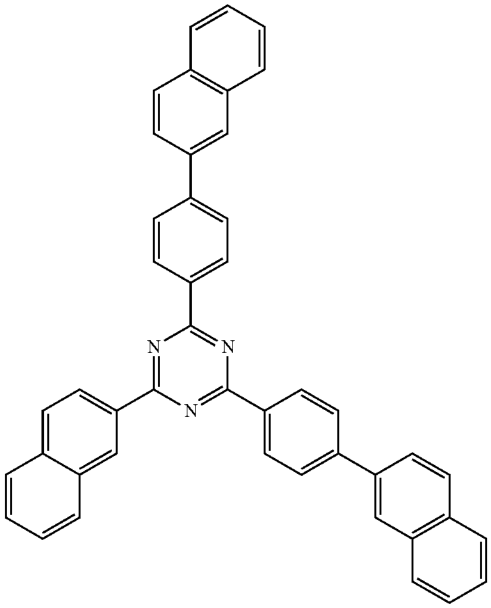 [SMILES: c1ccc2cc(-c3ccc(-c4nc(-c5ccc(-c6ccc7ccccc7c6)cc5)nc(-c5ccc6ccccc6c5)n4)cc3)ccc2c1]
C-2-91

TABLE 3-continued
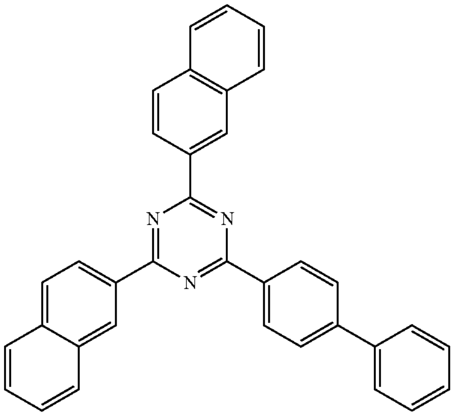 [SMILES: c1ccc(-c2ccc(-c3nc(-c4ccc5ccccc5c4)nc(-c4ccc5ccccc5c4)n3)cc2)cc1]
C-2-96
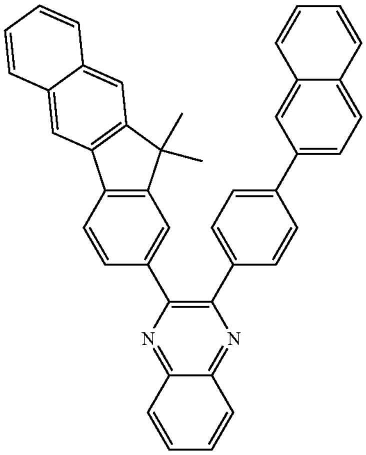 [SMILES: CC1(C)c2cc(-c3nc4ccccc4nc3-c3ccc(-c4ccc5ccccc5c4)cc3)ccc2-c2cc3ccccc3cc21]
C-2-166
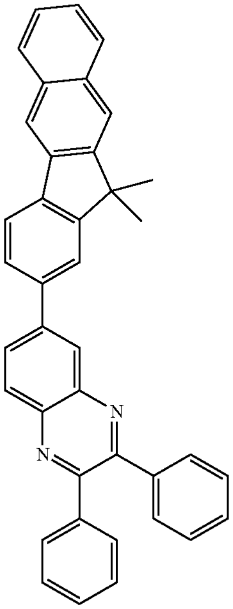 [SMILES: CC1(C)c2cc(-c3ccc4nc(-c5ccccc5)c(-c5ccccc5)nc4c3)ccc2-c2cc3ccccc3cc21]
C-2-180

TABLE 3-continued
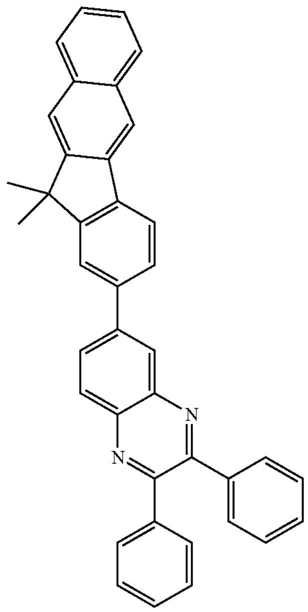 [SMILES: CC1(C)c2cc(-c3ccc4nc(-c5ccccc5)c(-c5ccccc5)nc4c3)ccc2-c2cc3ccccc3cc21]
C-2-186
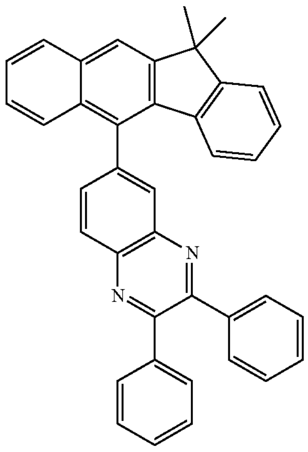 [SMILES: CC1(C)c2ccccc2-c2c1cc1ccccc1c2-c1ccc2nc(-c3ccccc3)c(-c3ccccc3)nc2c1]
C-2-187

TABLE 3-continued
| | |
|---|---|
| | 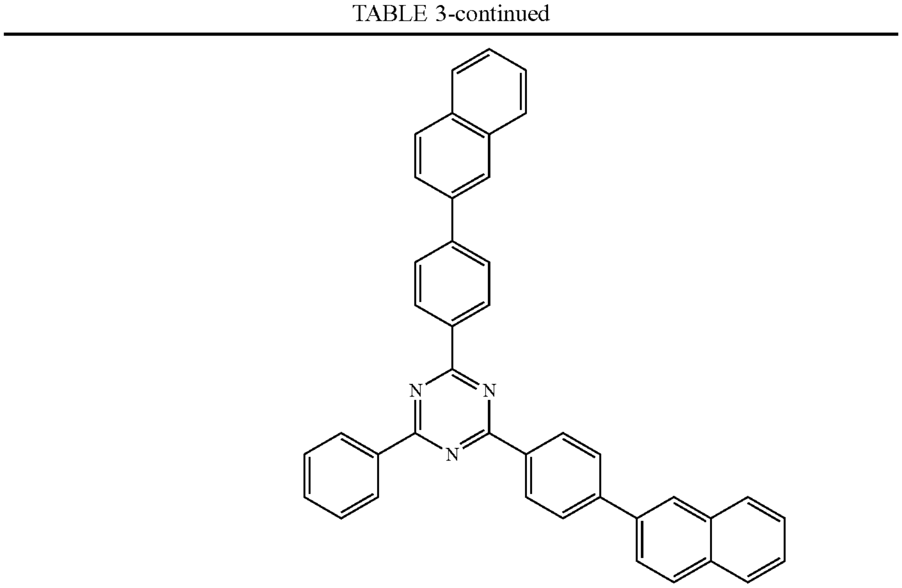<br>C-2-188 |
| | 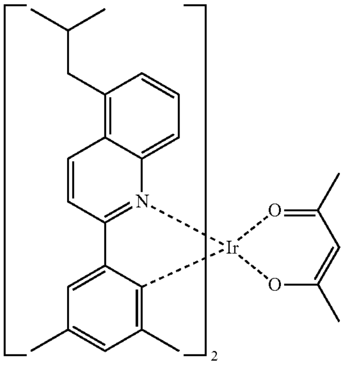<br>D-39 |
| Electron Transport Layer/ Electron Injection Layer | 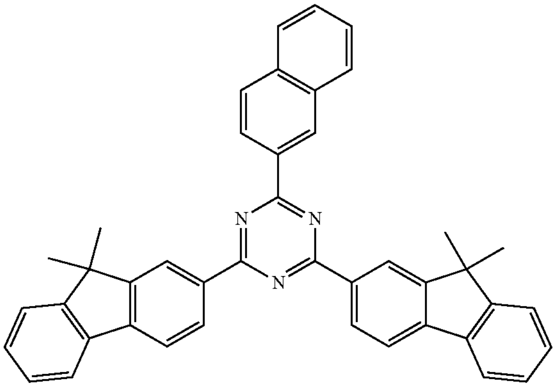 [SMILES: CC1(C)c2ccccc2-c2ccc(-c3nc(-c4ccc5c(c4)C(C)(C)c4ccccc4-5)nc(-c4ccc5ccccc5c4)n3)cc21]<br>ET-1 |
| | 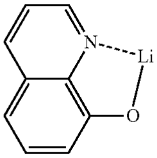<br>EI-1 |

The invention claimed is:

1. A plurality of host materials comprising at least one first host compound and at least one second host compound, wherein the first host compound is represented by any one of the following formulae 1-1, 1-2, and 1-4 to 1-6 and the second host compound is represented by the following formula 2:

(1-1)

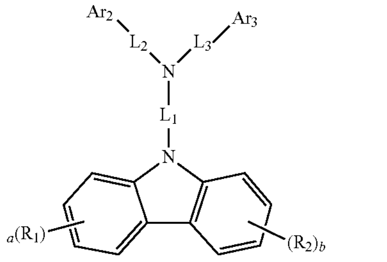

(1-2)

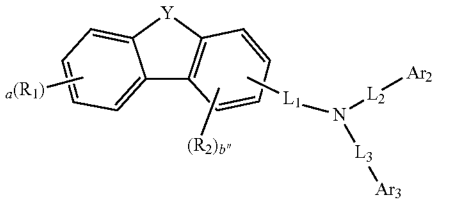

(1-4)

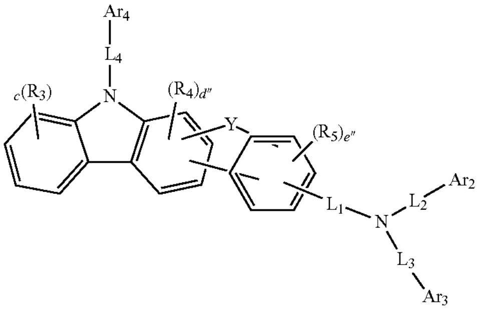

(1-5)

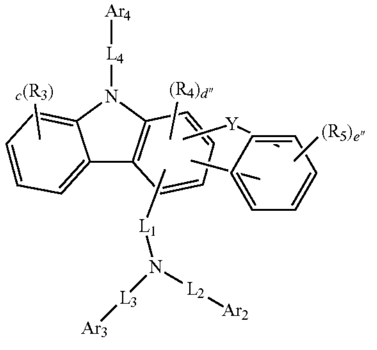

-continued (1-6)

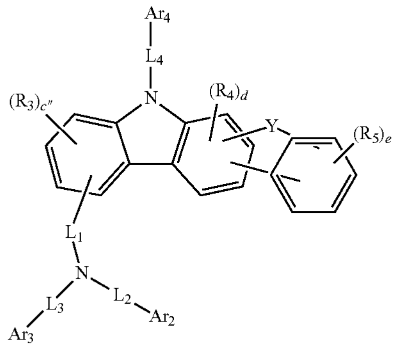

wherein, $L_1$ in formula 1-2 represents a single band;

$L_2$ and $L_3$ in formula 1-2 and $L_1$ to $L_3$ in formula 1-1 and 1-4 to 1-6 each independently represent a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene; and $Ar_2$ and $Ar_3$ in formula 1-1 each independently represent halogen, cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; wherein the (3- to 30-membered) heteroaryl is selected from the group consisting of furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, benzofuranyl, benzothiophenyl, isobenzofuranyl, dibenzofuranyl, dibenzothiophenyl, benzoimidazolyl, benzothiazolyl, benzoisothiazolyl, benzoisoxazolyl, benzoxazolyl, imidazopyridinyl, isoindolyl, indolyl, benzoindolyl, indazolyl, benzothiadiazolyl, quinolyl, isoquinolyl, cinnolinyl, quinazolinyl, quinoxalinyl, azacarbazolyl, benzocarbazolyl, dibenzocarbazolyl, phenoxazinyl, phenanthridinyl, benzodioxolyl, indolizidinyl, acrylidinyl, silafluorenyl, and germafluorenyl;

wherein the substituents of the substituted (C6-C30)aryl are selected from the group consisting of deuterium and a (C1-C30)alkyl;

$Ar_2$ and $Ar_3$ in formula 1-2 and 1-4 to 1-6 each independently represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

Y in formulas 1-1, 1-2, 1-4, 1-5 and 1-6 represents $CR_6R_7$, $NR_8$, O, or S;

$R_1$ and $R_2$ in formula 1-1 each independently represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; or may be linked to adjacent substituents to form a benzene ring;

$R_1$, $R_2$ and $R_6$ to $R_8$ in formula 1-2 and $R_3$ to $R_8$ in formula 1-4, 1-5, and 1-6 each independently represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; or may be linked to adjacent substituents to form a ring;

$L_4$ represents a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene;

$Ar_4$ represents hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, or a substituted or unsubstituted (C3-C30)cycloalkyl;

a, b, c, and e each independently represent an integer of 1 to 4, b", c", and e" each independently represent an integer of 1 to 3, d represents an integer of 1 or 2, d" represents 1, when a to e, b", c", and e" are 2 or more, each of $R_1$ to $R_5$ may be the same or different;

$$HAr—(L—Ar)_{a'} \quad (2)$$

wherein,

HAr represents a substituted or unsubstituted nitrogen-containing (3- to 10-membered)heteroaryl, wherein the substituents of the substituted nitrogen-containing (3- to 10-membered)heteroaryl are selected from the group consisting of deuterium, cyano, (C1-C30)alkyl, (C3-C30)cycloalkyl, tri(C1-C30)alkylsilyl, tri(C6-C30)arylsilyl, di(C1-C30)alkyl(C6-C30)arylsilyl, (C1-C30)alkyldi(C6-C30)arylsilyl, amino, mono- or di-(C1-C30)alkylamino, (C1-C30)alkyl-substituted or unsubstituted mono- or di-(C6-C30)arylamino, (C1-C30)alkyl(C6-C30)arylamino, (C6-C30)ar(C1-C30)alkyl, and (C1-C30)alkyl(C6-C30)aryl;

L represents a single bond, a substituted or unsubstituted (C6-C30)arylene, wherein the substituents of the substituted (C6-30)arylene are selected from the group consisting of deuterium, cyano, (C1-C30)alkyl, (C3-C30)cycloalkyl, tri(C1-C30)alkylsilyl, tri(C6-C30)arylsilyl, di(C1-C30)alkyl(C6-C30)arylsilyl, (C1-C30)alkyldi(C6-C30)arylsilyl, amino, mono- or di-(C1-C30)alkylamino, (C1-C30)alkyl-substituted or unsubstituted mono- or di-(C6-C30)arylamino, (C1-C30)alkyl(C6-C30)arylamino, (C6-C30)ar(C1-C30)alkyl, and (C1-C30)alkyl(C6-C30)aryl;

Ar represents a substituted or unsubstituted (C6-C30)aryl selected from the group consisting of phenyl, biphenyl, terphenyl, quaterphenyl, naphthyl, binaphthyl, phenylnaphthyl, naphthylphenyl, benzofluorenyl, diphenylbenzofluorenyl, dibenzofluorenyl, phenanthrenyl, benzophenanthrenyl, phenylphenanthrenyl, anthracenyl, benzanthracenyl, indenyl, pyrenyl, tetracenyl, perylenyl, chrysenyl, benzochrysenyl, naphthacenyl, fluoranthenyl, benzofluoranthenyl, tolyl, xylyl, mesityl, cumenyl, spiro[fluorene-benzofluorene]yl, and azulenyl; wherein the substituents of the substituted (C6-C30)aryl are selected from the group consisting of deuterium, cyano, (C1-C30)alkyl, (C3-C30)cycloalkyl, tri(C1-C30)alkylsilyl, tri(C6-C30)arylsilyl, di(C1-C30)alkyl(C6-C30)arylsilyl, (C1-C30)alkyldi(C6-C30)arylsilyl, amino, mono- or di-(C1-C30)alkylamino, (C1-C30)alkyl-substituted or unsubstituted mono- or di-(C6-C30)arylamino, (C1-C30)alkyl(C6-C30)arylamino, (C6-C30)ar(C1-C30)alkyl, and (C1-C30)alkyl(C6-C30)aryl; and a' represents an integer of 1 to 3, when a' is 2 or more, each of (L-Ar) may be the same or different.

2. The host materials according to claim 1, wherein the formula 2 is represented by the following formula 2-1 or 2-2:

(2-1)

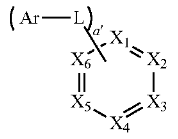

(2-2)

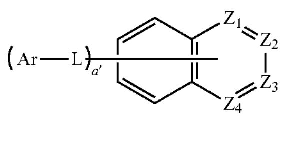

wherein, $X_1$ to $X_6$ and $Z_1$ to $Z_4$ each independently represent $CR_a$ or N, wherein at least one of $X_1$ to $X_6$ is N, and at least one of $Z_1$ to $Z_4$ is N;

$R_a$ each independently represents hydrogen, a substituted or unsubstituted (C1-C30)alkyl, a substituted or unsubstituted (C2-C30)alkenyl, a substituted or unsubstituted (C6-C30)aryl, or Ar-L-; and L, Ar, and a' are as defined in claim 1.

3. The host materials according to claim 1, wherein the substituents of the substituted (C1-C30)alkyl(ene), the substituted (C6-C30)aryl(ene), the substituted (3- to 30-membered)heteroaryl(ene), the substituted (C3-C30)cycloalkyl (ene), the substituted (C1-C30)alkoxy, the substituted tri (C1-C30)alkylsilyl, the substituted di(C1-C30)alkyl(C6-C30)arylsilyl, the substituted (C1-C30)alkyldi(C6-C30) arylsilyl, the substituted tri(C6-C30)arylsilyl, the substituted mono- or di-(C1-C30)alkylamino, the substituted mono- or di-(C6-C30)arylamino, or the substituted (C1-C30)alkyl (C6-C30)arylamino, in $L_1$ to $L_3$, $Ar_2$ and $Ar_3$ in formulae 1-2 and 1-4 to 1-6, and L each independently represent at least one selected from the group consisting of deuterium, halogen, cyano, carboxyl, nitro, hydroxyl, (C1-C30)alkyl, halo (C1-C30)alkyl, (C2-C30)alkenyl, (C2-C30)alkynyl, (C1-C30)alkoxy, (C1-C30)alkylthio, (C3-C30)cycloalkyl, (C3-C30)cycloalkenyl, (3- to 7-membered)heterocycloalkyl, (C6-C30)aryloxy, (C6-C30)arylthio, (C6-C30)aryl-substituted or unsubstituted (5- to 30-membered)heteroaryl, (5- to 30-membered)heteroaryl-substituted or unsubstituted (C6-C30)aryl, tri(C1-C30)alkylsilyl, tri(C6-C30)arylsilyl, di(C1-C30)alkyl(C6-C30)arylsilyl, (C1-C30)alkyldi(C6-C30)arylsilyl, amino, mono- or di-(C1-C30)alkylamino, (C1-C30) alkyl-substituted or unsubstituted mono- or di-(C6-C30) arylamino, (C1-C30)alkyl(C6-C30)arylamino, (C1-C30) alkylcarbonyl, (C1-C30)alkoxycarbonyl, (C6-C30) arylcarbonyl, di(C6-C30)arylboronyl, di(C1-C30) alkylboronyl, (C1-C30)alkyl(C6-C30)arylboronyl, (C6-C30)ar(C1-C30)alkyl, and (C1-C30)alkyl(C6-C30)aryl.

4. The host materials according to claim 1, wherein the compound represented by any one of the formulae 1-1, 1-2, and 1-4 to 1-6 is selected from the group consisting of:

C-1-1

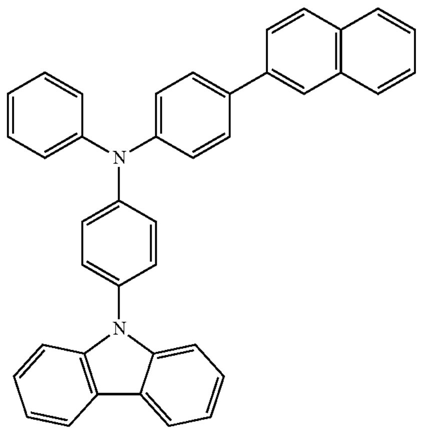

-continued

C-1-2

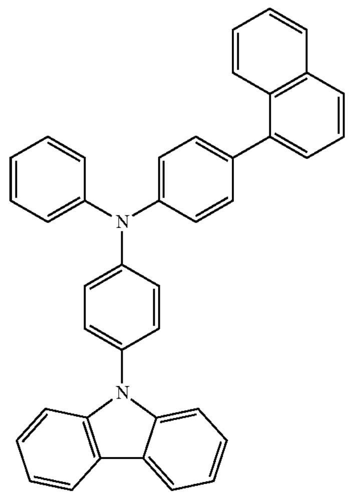

C-1-3

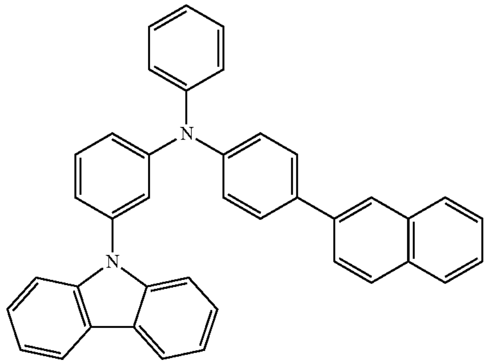

C-1-4

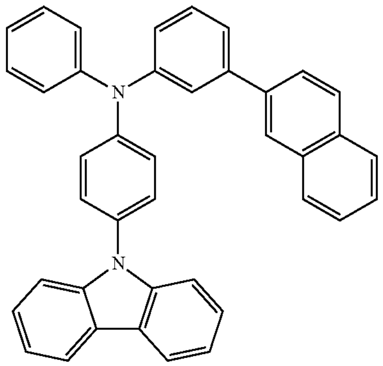

C-1-5

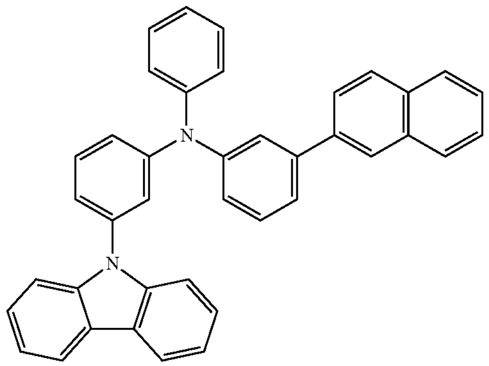

-continued
C-1-6
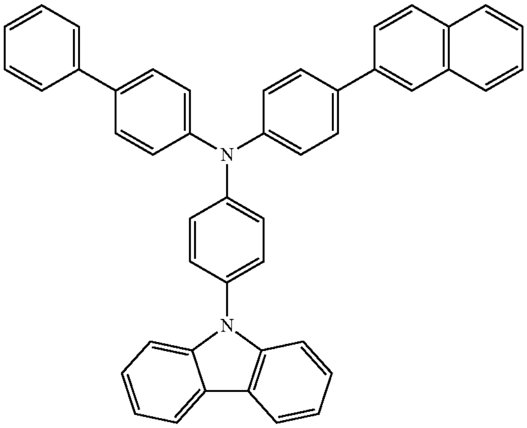
C-1-7
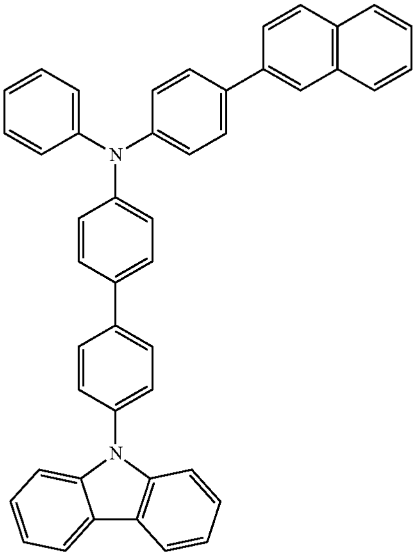
C-1-8
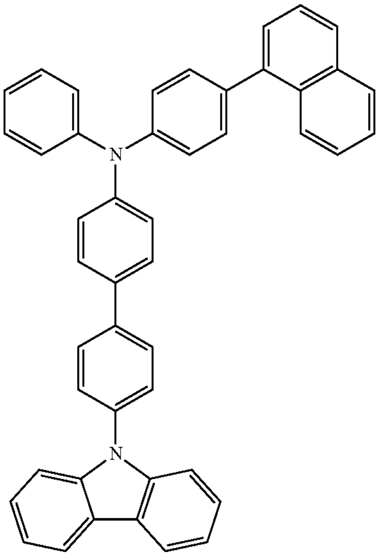
-continued
C-1-9
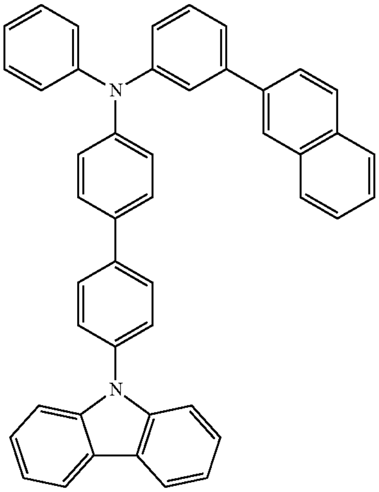
C-1-10
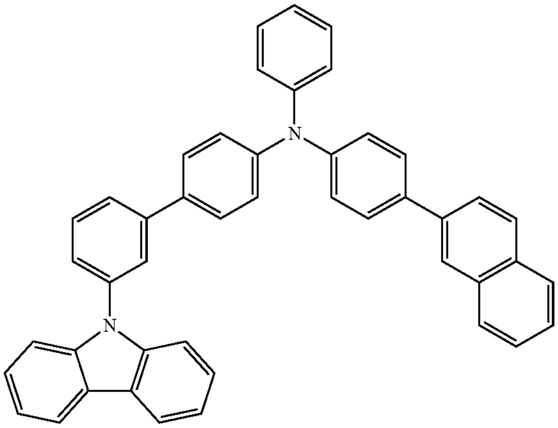
C-1-11
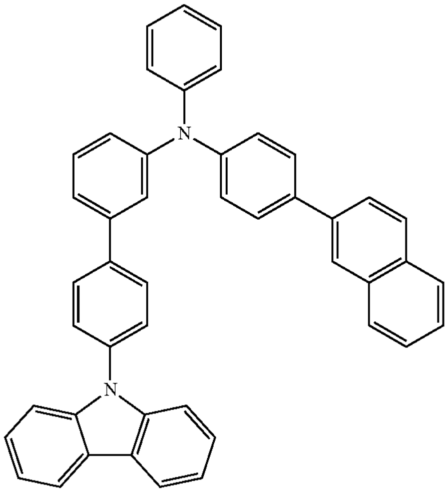

-continued
C-1-12
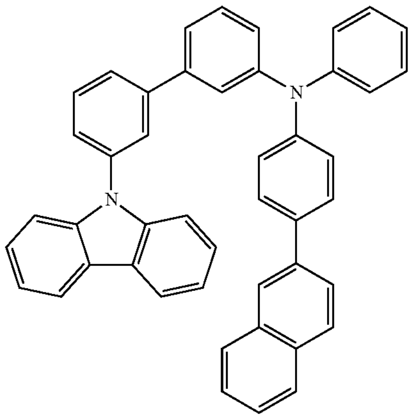
C-1-13
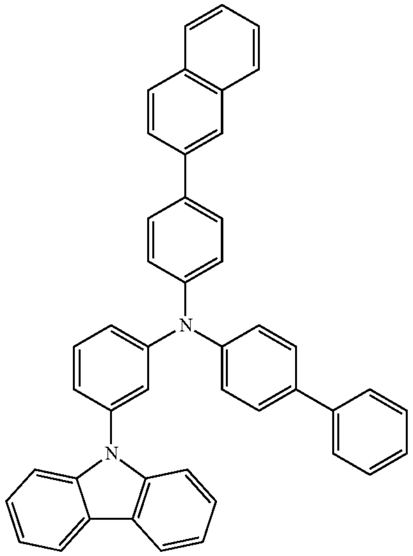
C-1-14
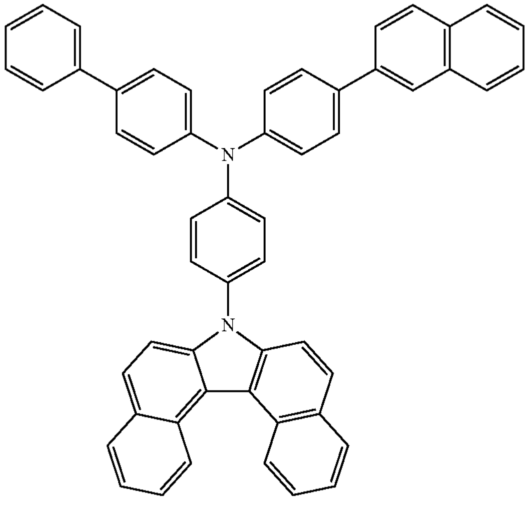
-continued
C-1-15
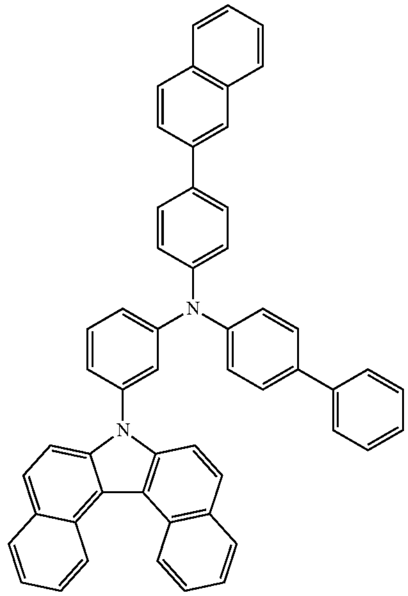
C-1-16
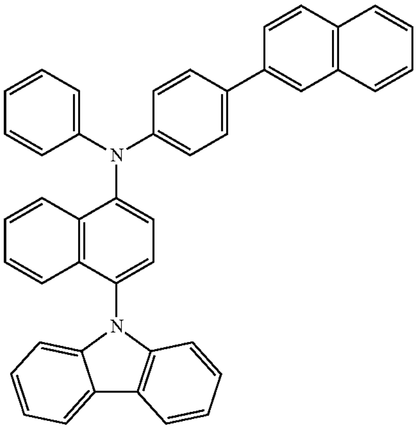
C-1-17
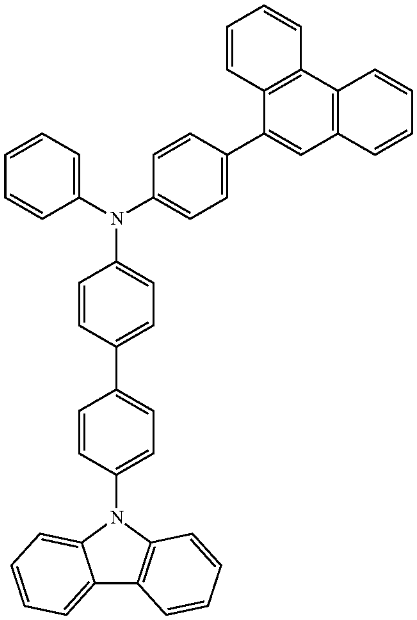

-continued
C-1-18
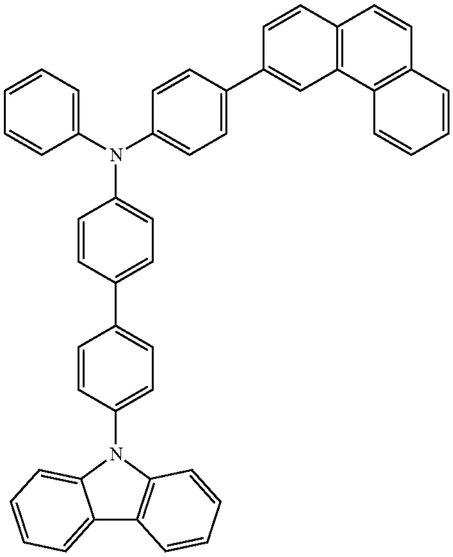
C-1-19
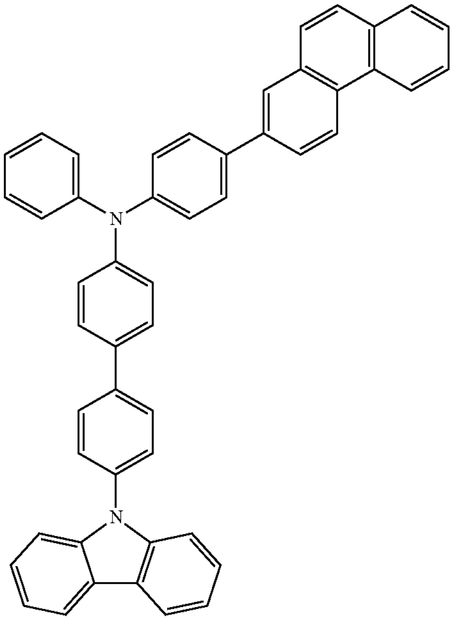
C-1-20
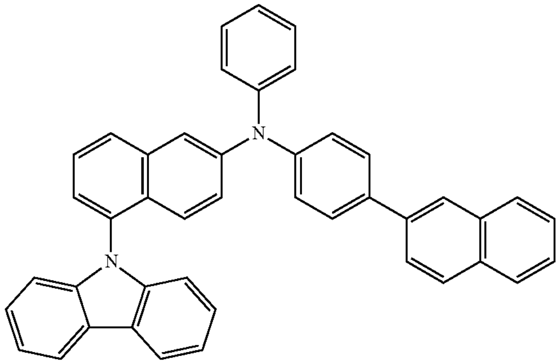
-continued
C-1-21
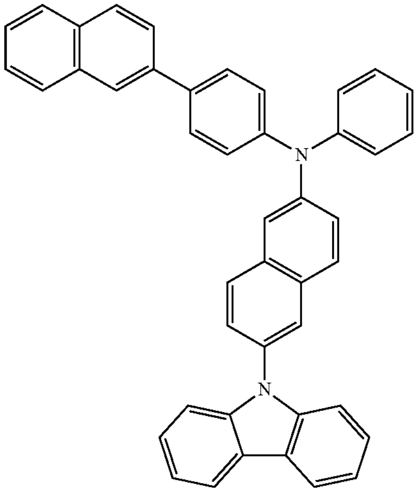
C-1-22
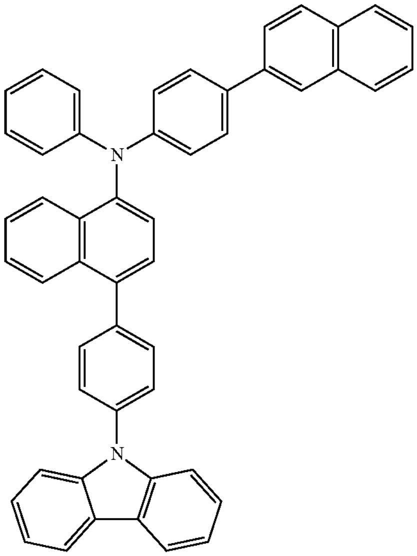
C-1-23
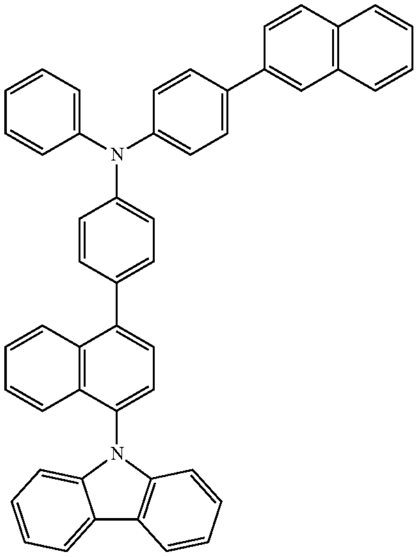

-continued
C-1-24
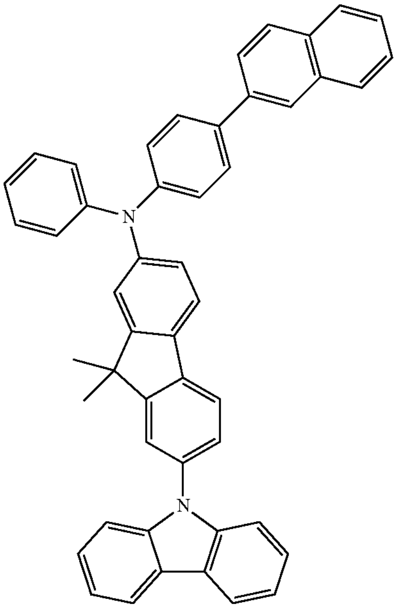
C-1-25
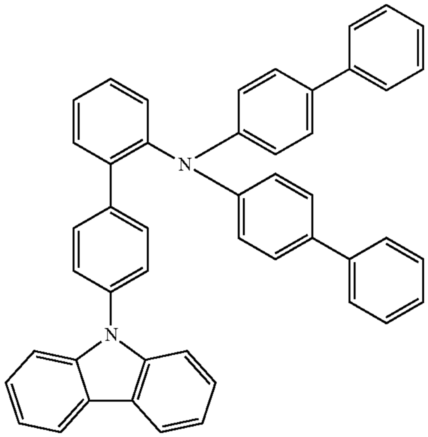
C-1-26
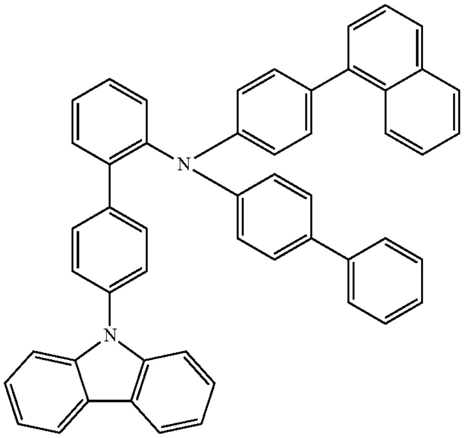
-continued
C-1-27
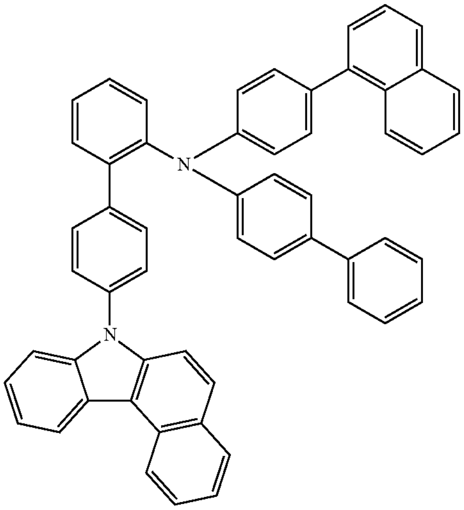
C-1-28
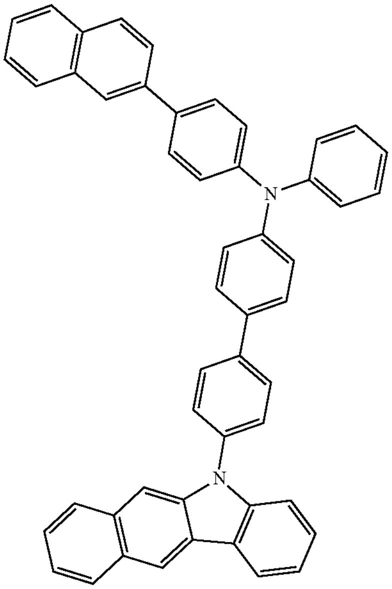
C-1-29
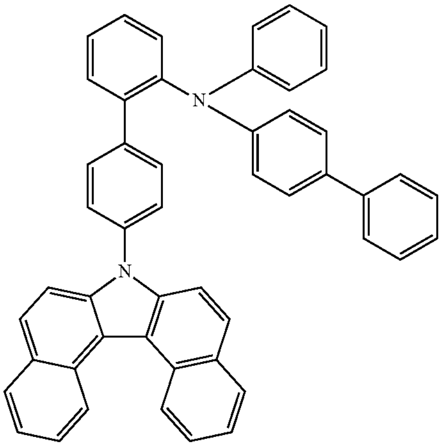

-continued
C-1-30
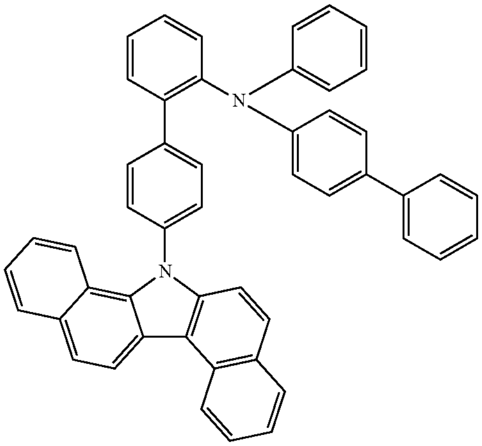
C-1-31
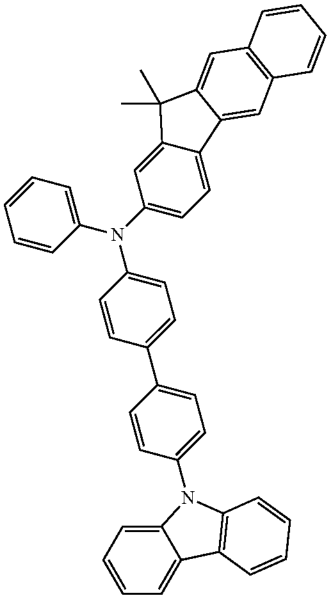
C-1-32
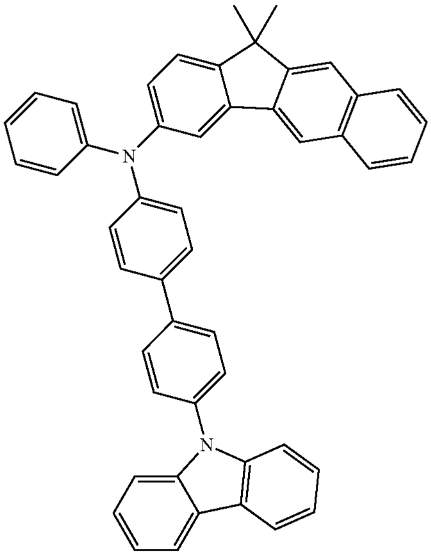
-continued
C-1-33
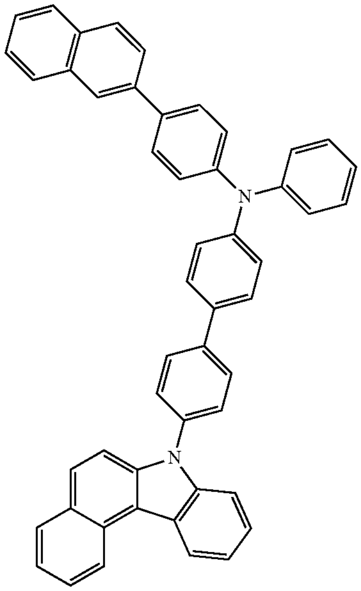
C-1-38
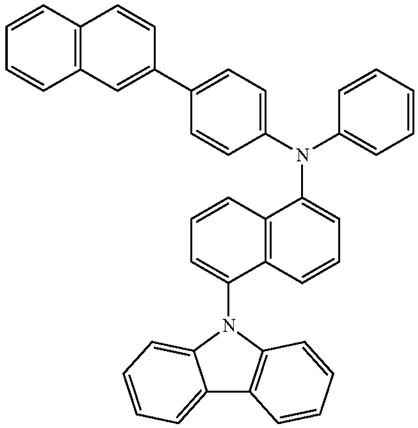
C-1-59
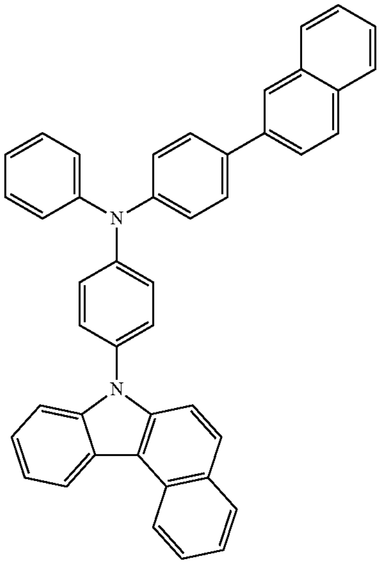

-continued
C-1-85
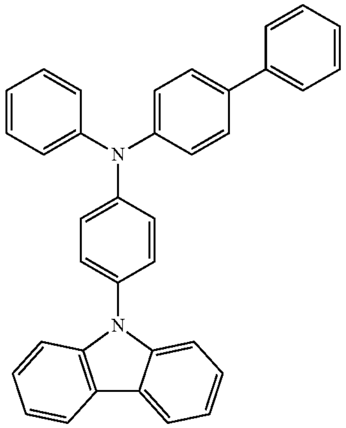
C-1-86
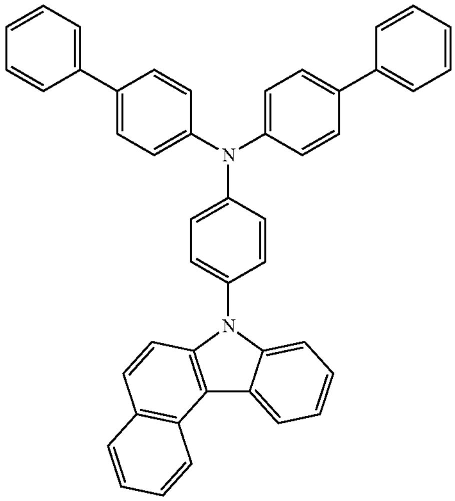
C-1-87
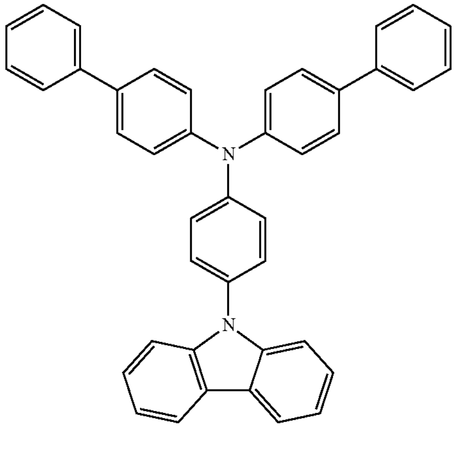
-continued
C-1-88
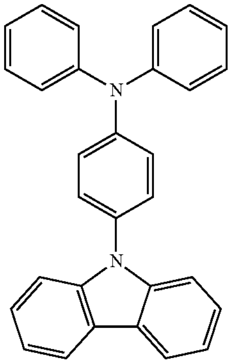
C-1-89
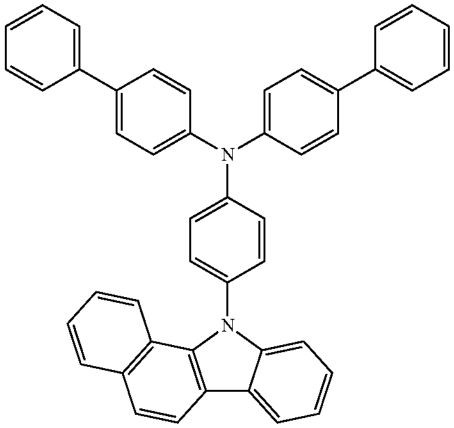
C-1-90
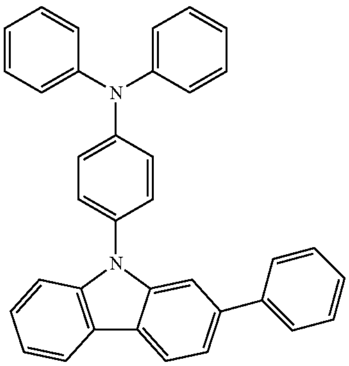
C-1-91
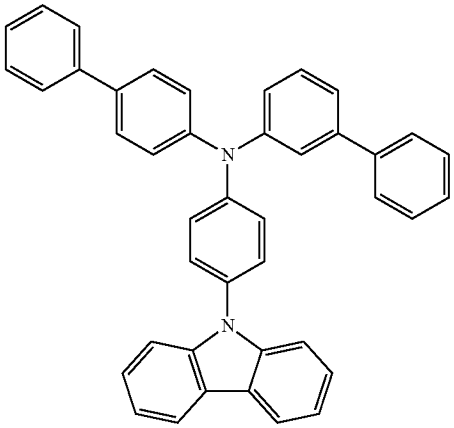

-continued
C-1-92
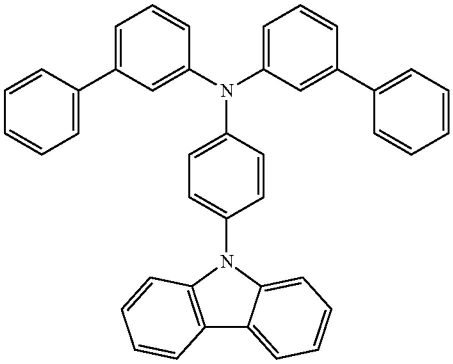
C-1-93
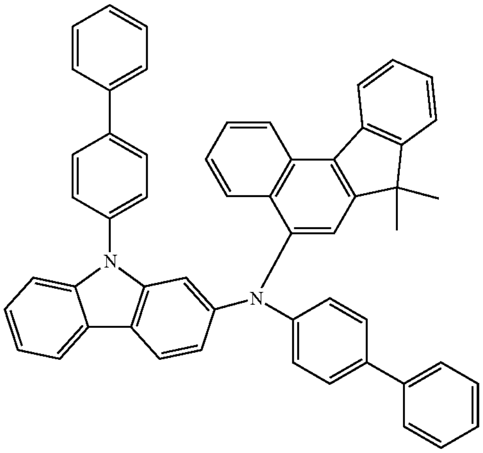
C-1-94
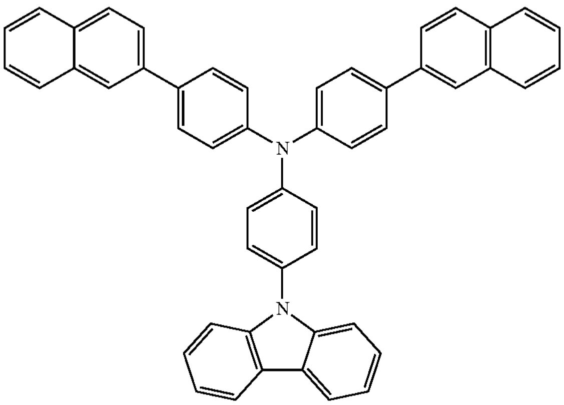
-continued
C-1-95
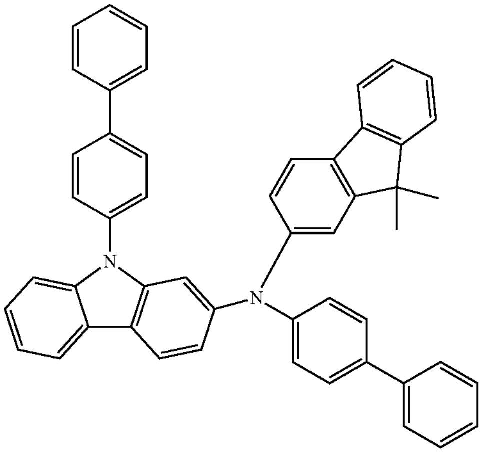
C-1-96
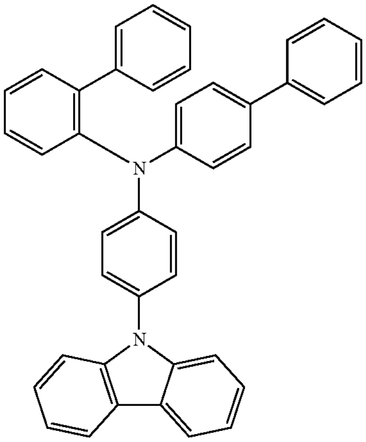
C-1-100
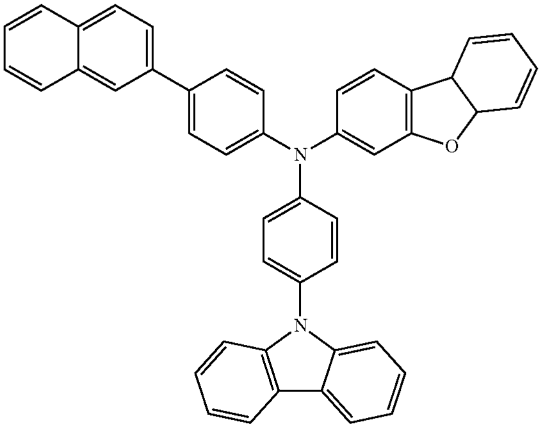

-continued
C-1-101
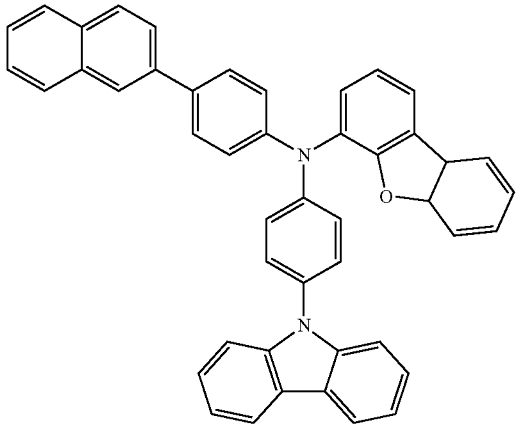
C-1-102
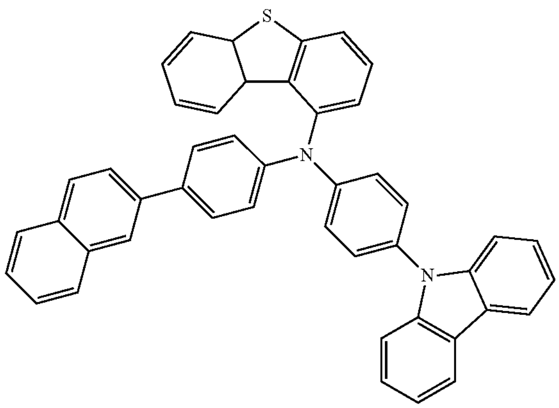
C-1-103
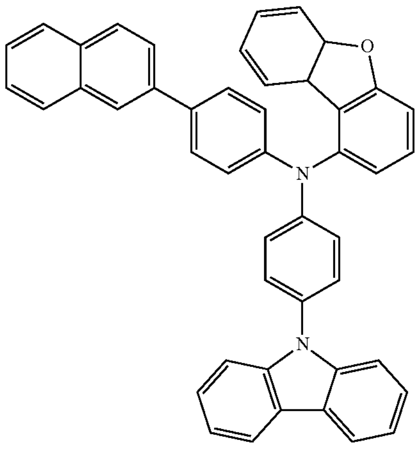
-continued
C-1-104
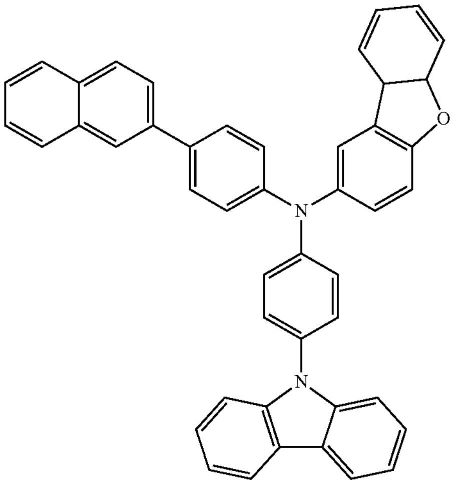
C-1-105
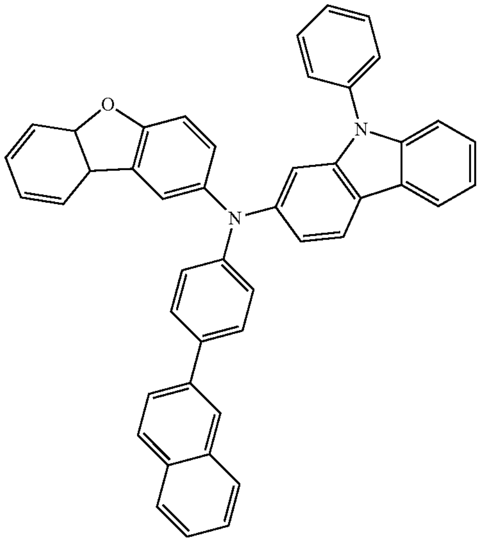
C-1-106
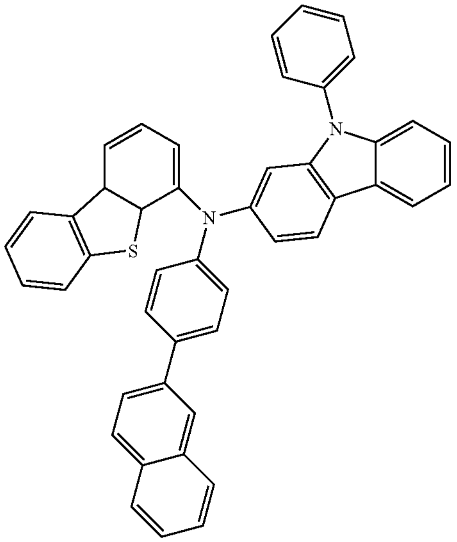

-continued
C-1-107
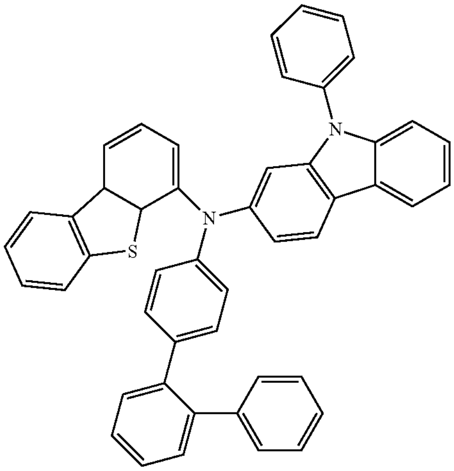
C-1-108
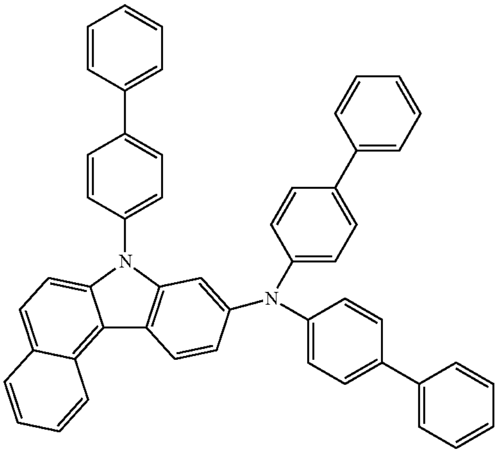
C-1-109
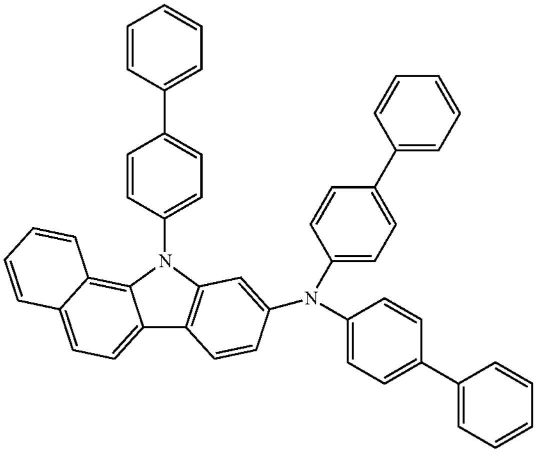
-continued
C-1-110
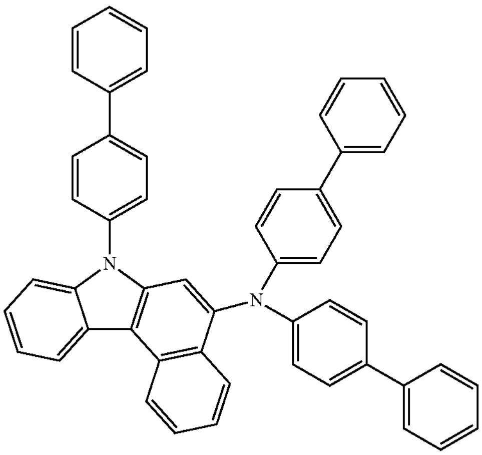
C-1-111
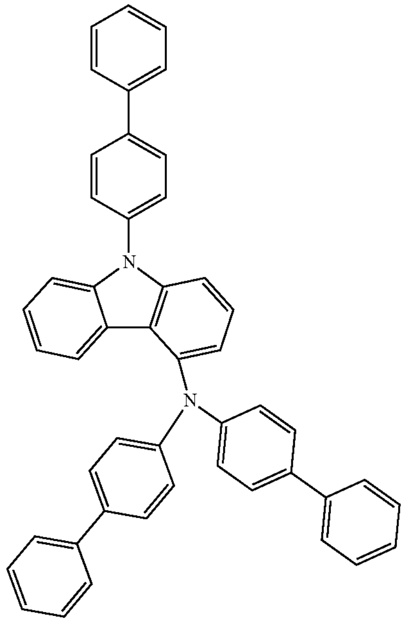
C-1-112
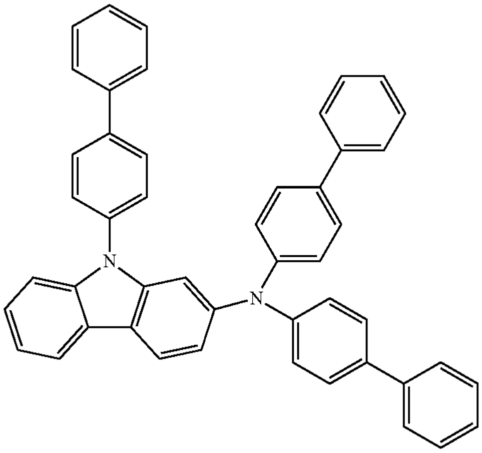

-continued
C-1-113
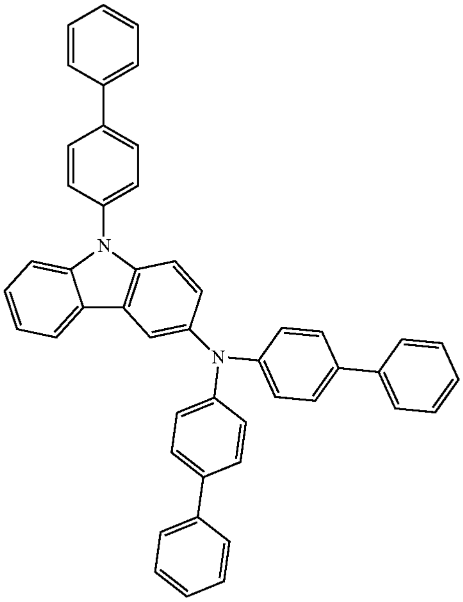
C-1-114
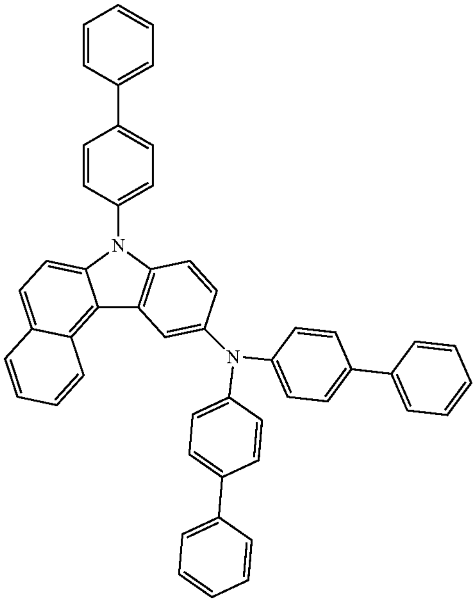
-continued
C-1-115
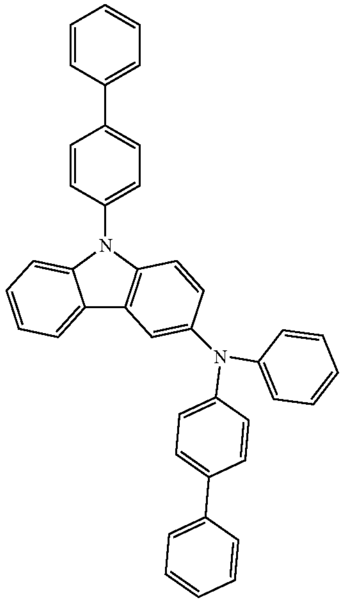
C-1-116
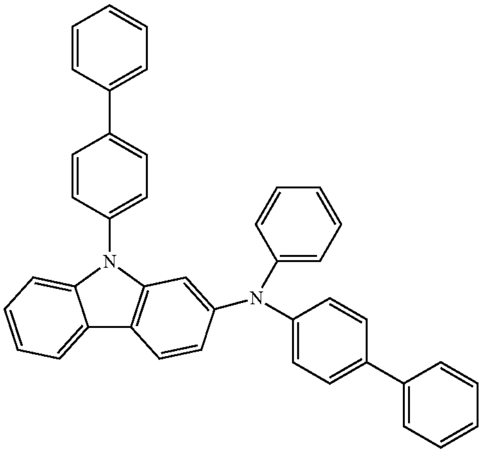
C-1-117
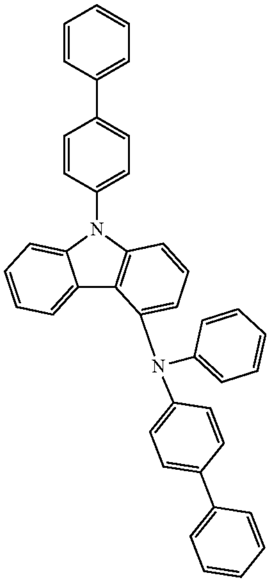

-continued
C-1-118
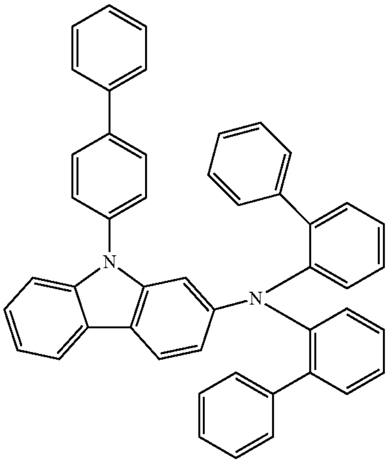
C-1-119
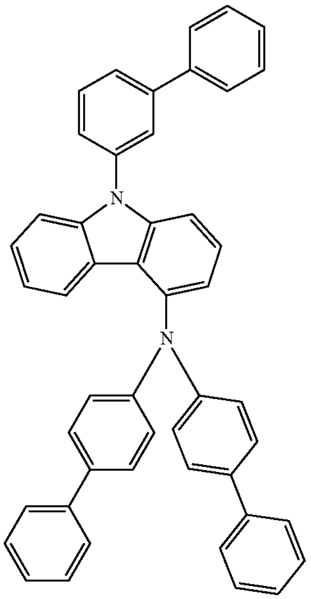
C-1-120
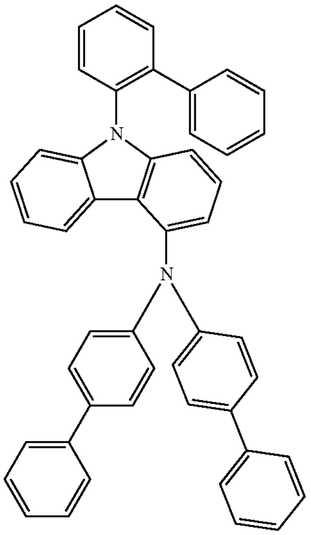
-continued
C-1-121
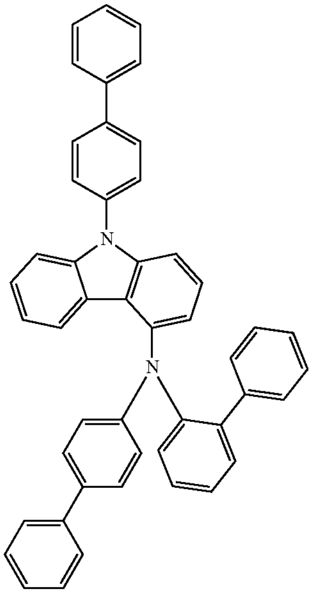
C-1-122
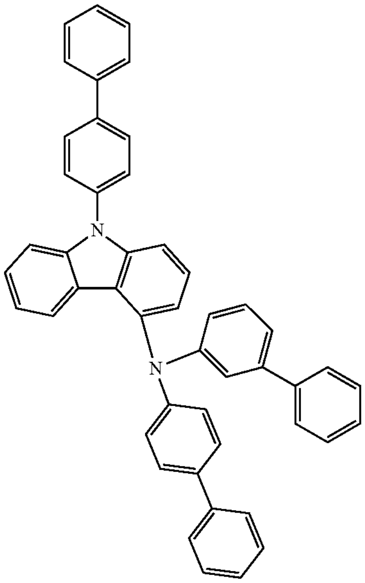
C-1-123
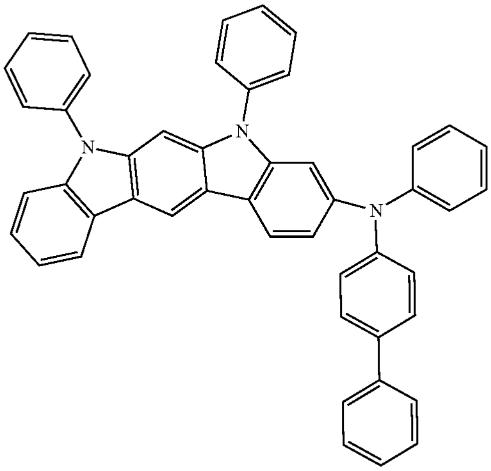

-continued
C-1-124
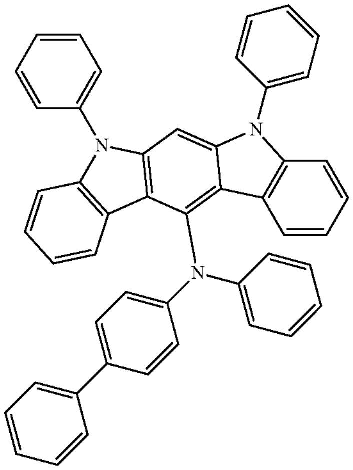
C-1-126
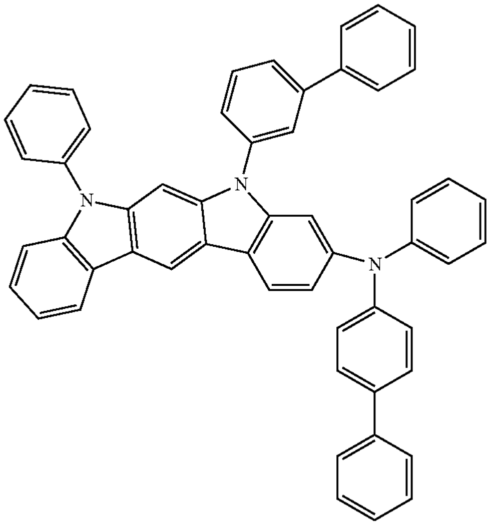
C-1-128
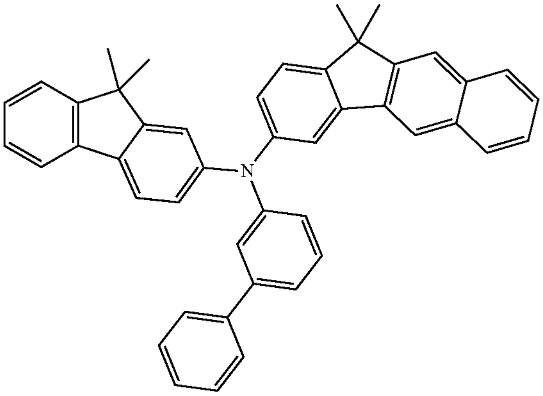
-continued
C-1-129
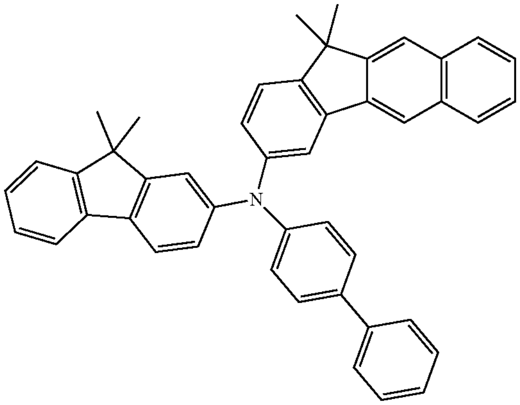
C-1-130
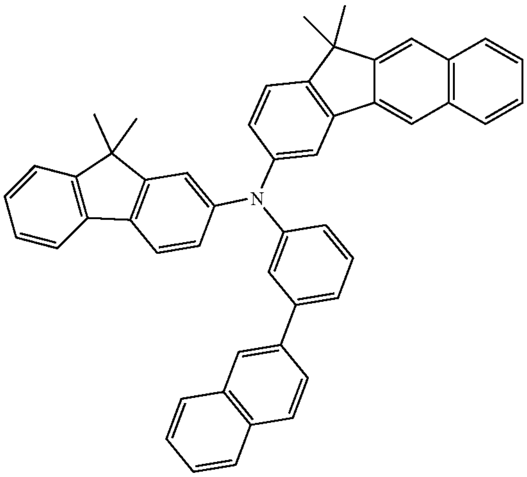
C-1-131
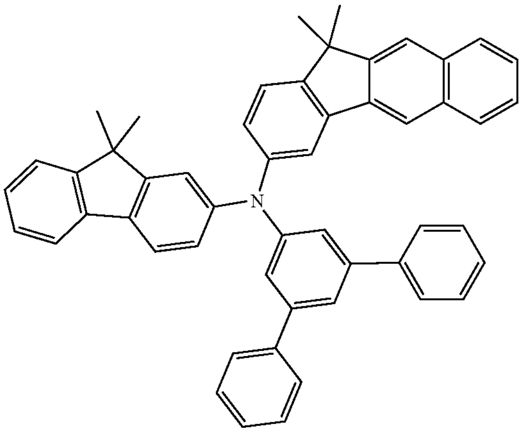

-continued
C-1-132
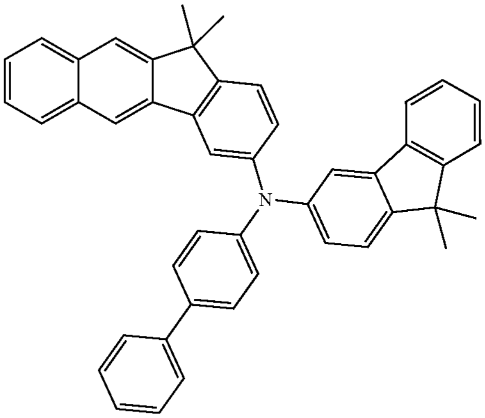
C-1-133
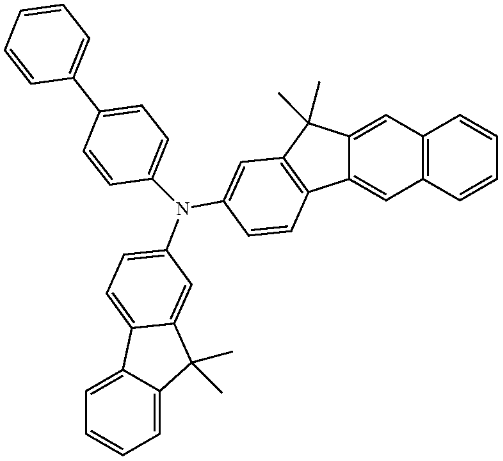
C-1-134
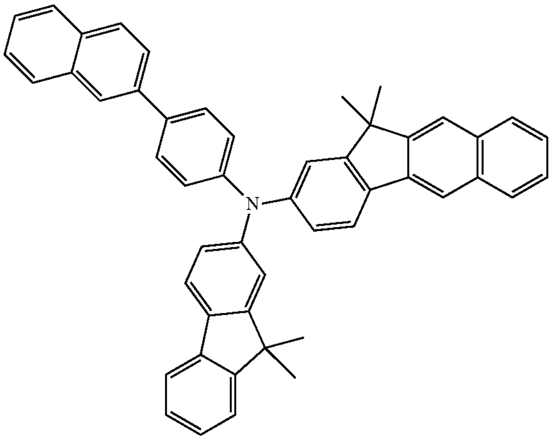
-continued
C-1-135
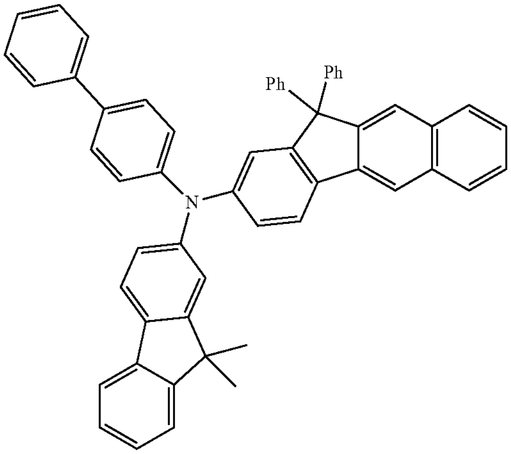
C-1-136
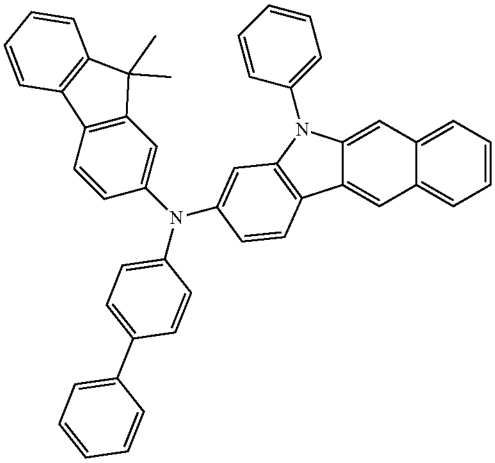
C-1-137
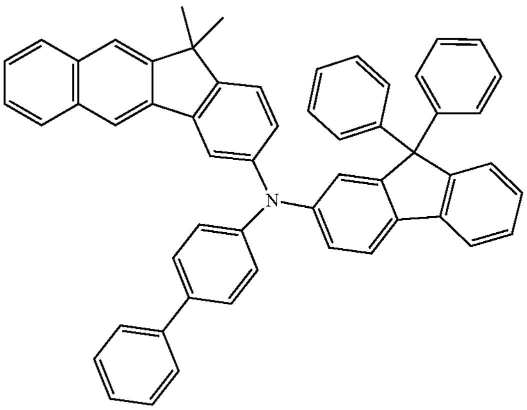
and -continued
C-1-140
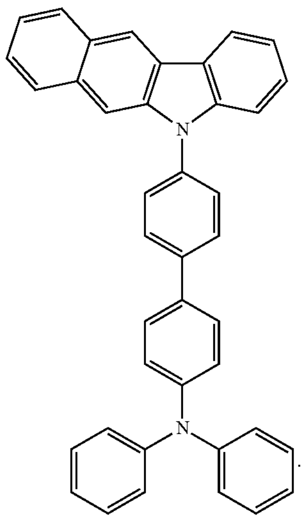
5. The host materials according to claim 1, wherein the compound represented by formula 2 is selected from the group consisting of:
C-2-1
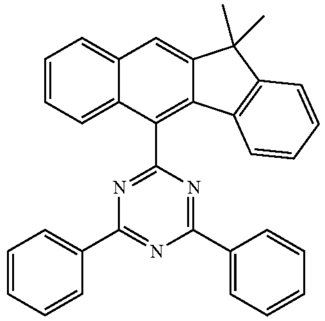
C-2-2
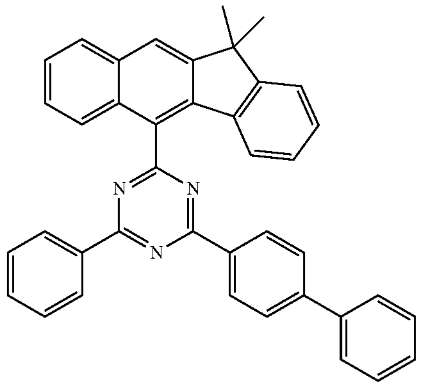
-continued
C-2-3
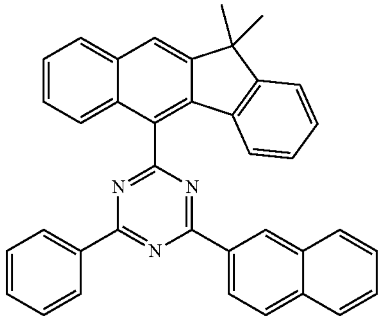
C-2-4
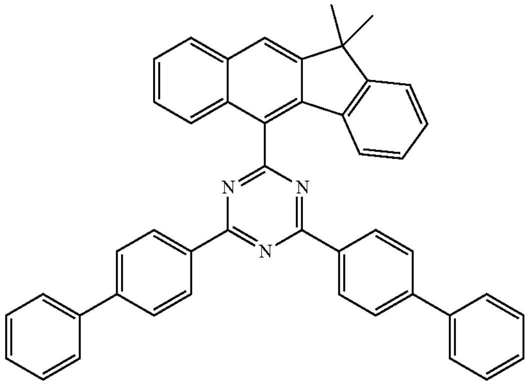
C-2-5
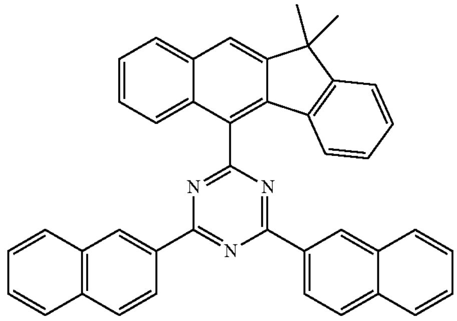
C-2-6
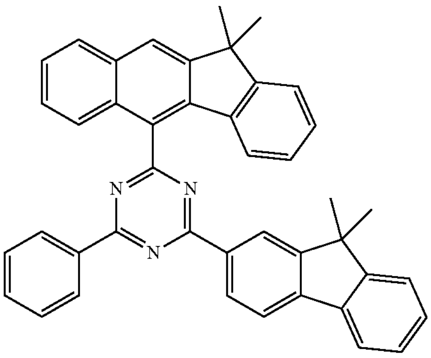

-continued
C-2-7
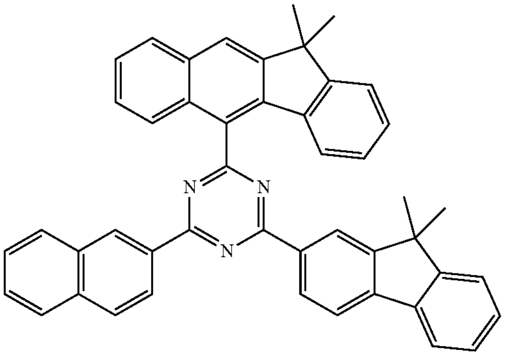
C-2-11
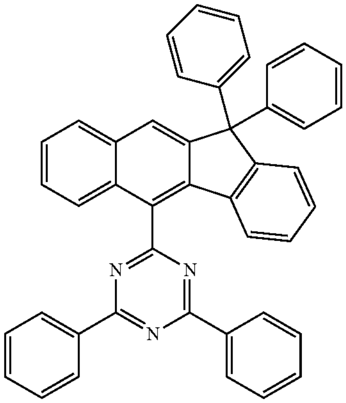
C-2-12
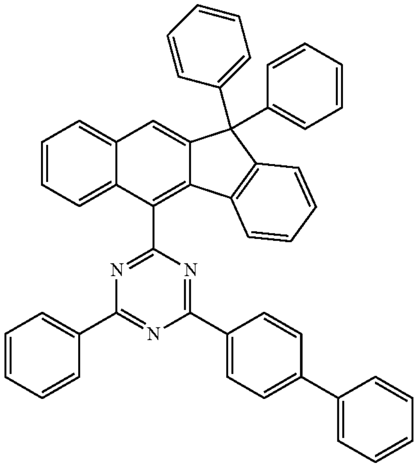
C-2-13
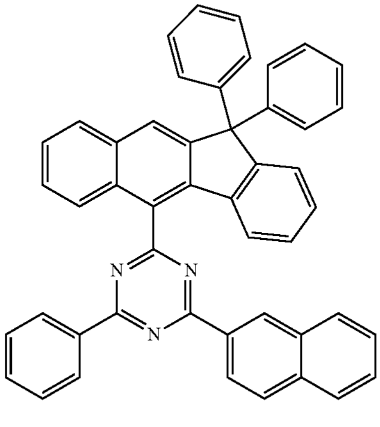
-continued
C-2-14
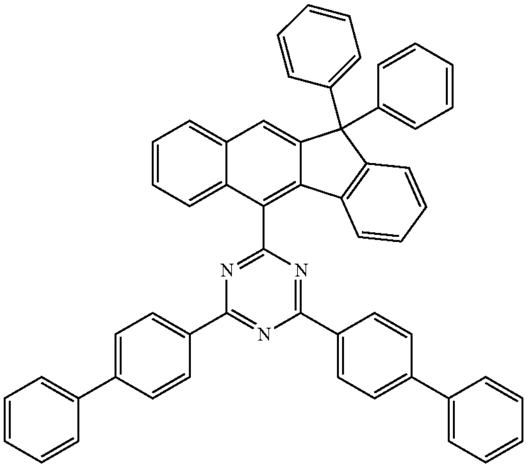
C-2-15
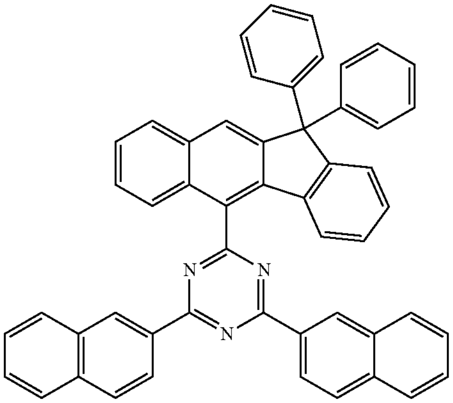
C-2-16
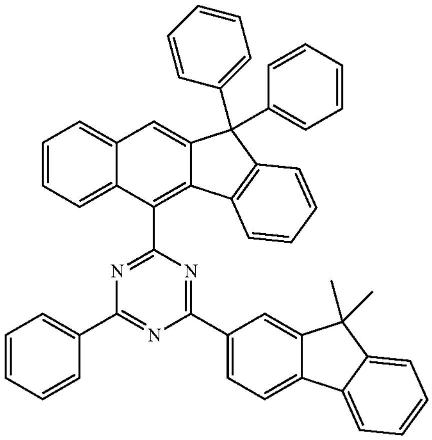

-continued
C-2-17
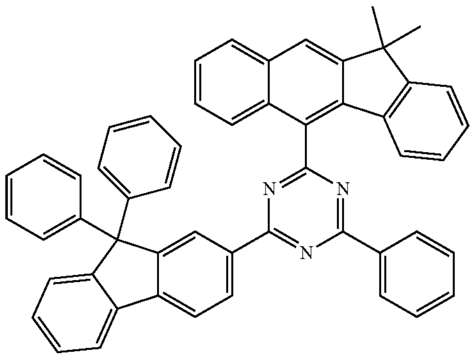
C-2-21
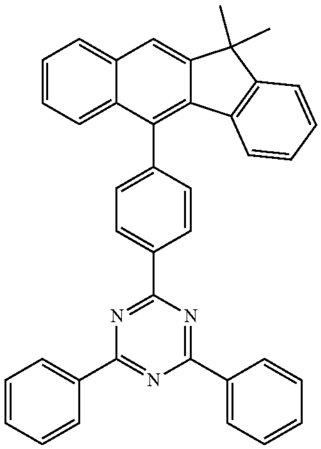
C-2-22
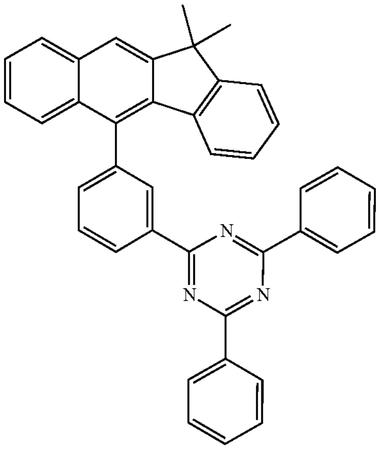
-continued
C-2-23
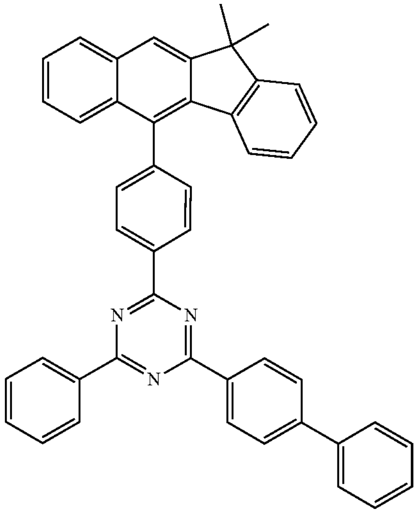
C-2-24
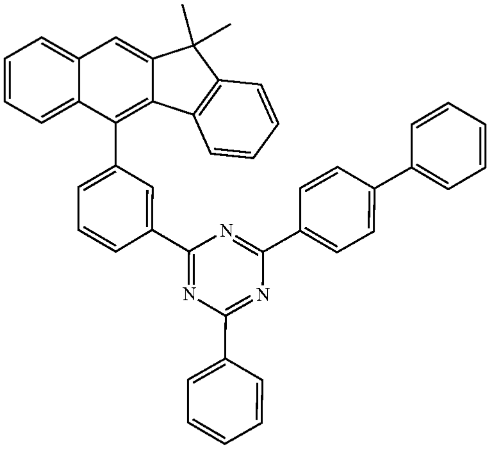
C-2-25
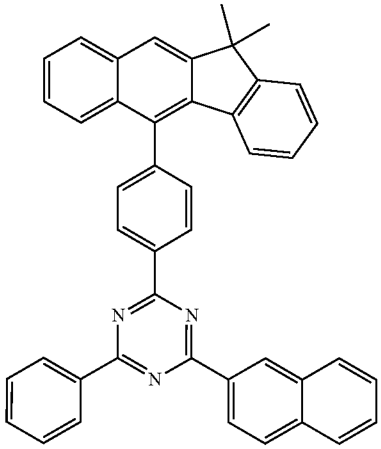

-continued
C-2-26
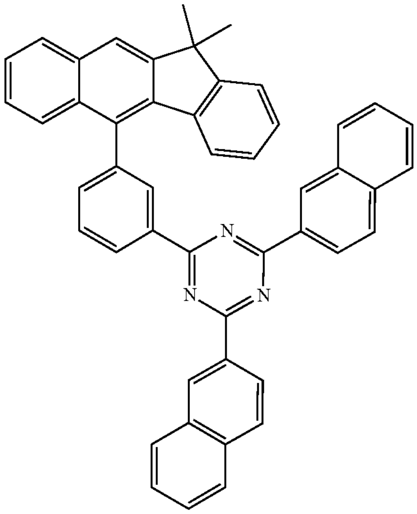
C-2-27
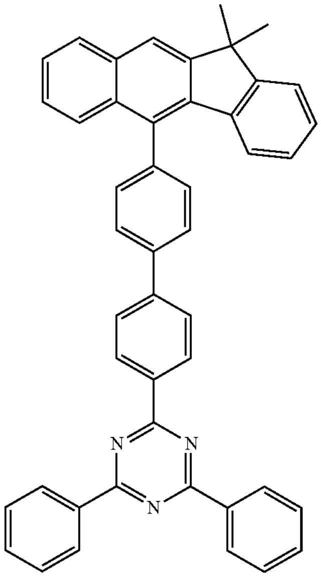
C-2-28
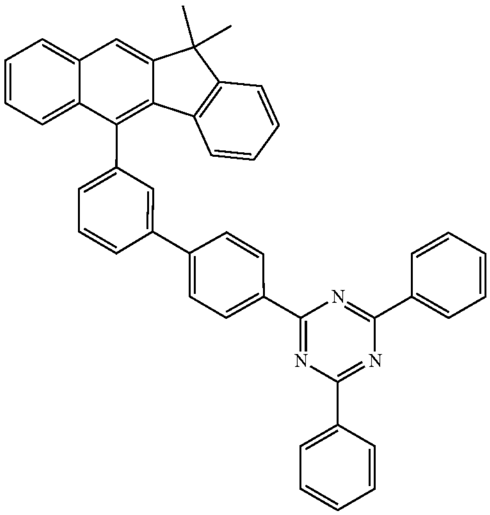
-continued
C-2-29
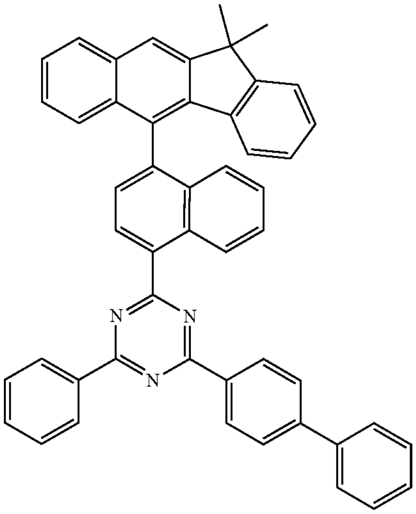
C-2-30
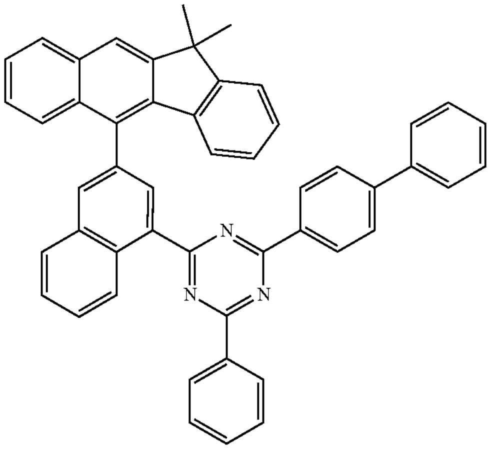
C-2-31
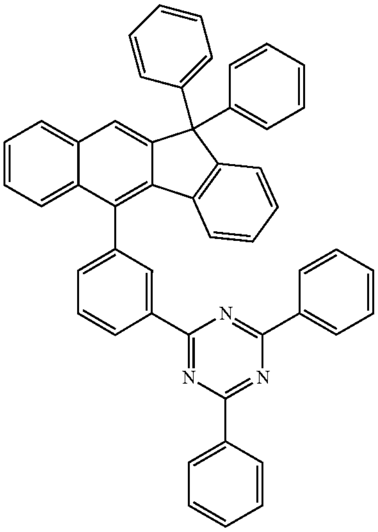

-continued
C-2-32
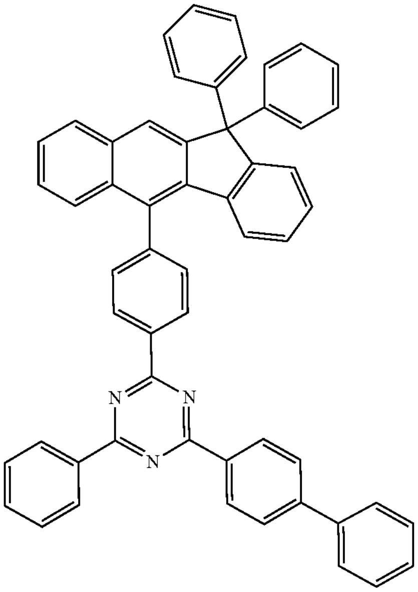
C-2-33
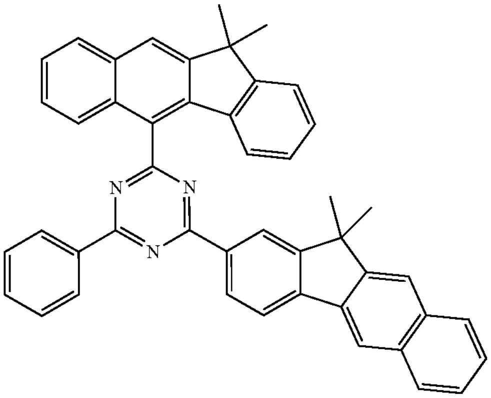
C-2-34
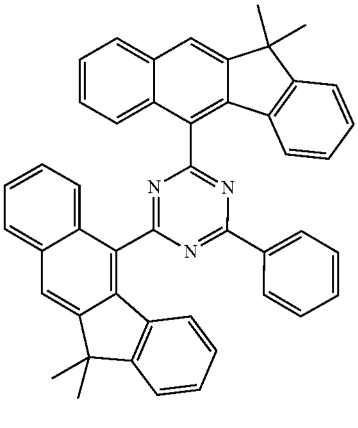
-continued
C-2-35
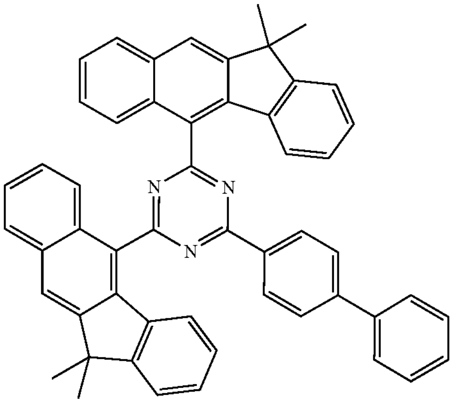
C-2-36
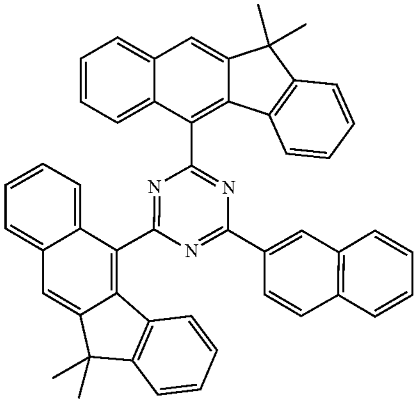
C-2-37
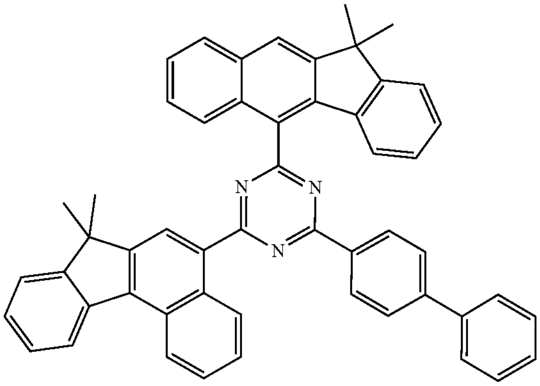
C-2-38
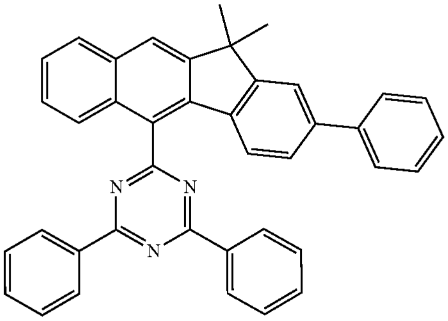

-continued
C-2-39
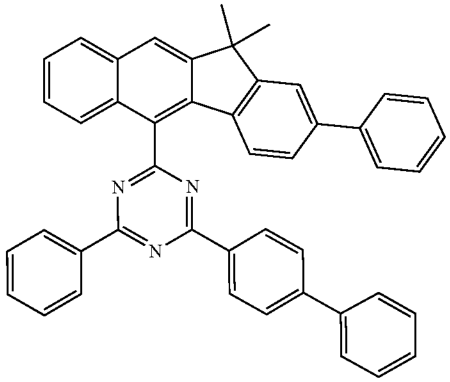
C-2-40
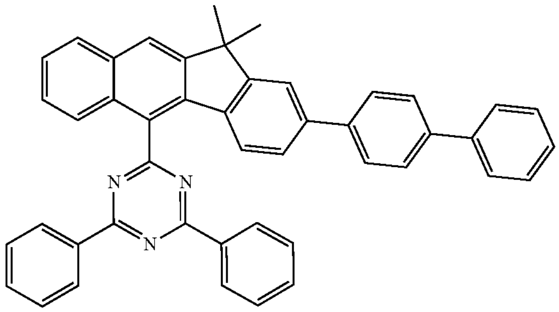
C-2-41
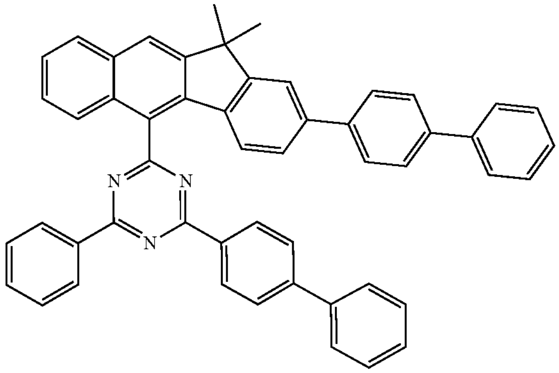
C-2-42
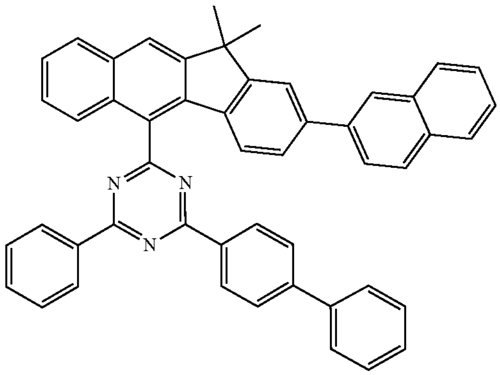
-continued
C-2-43
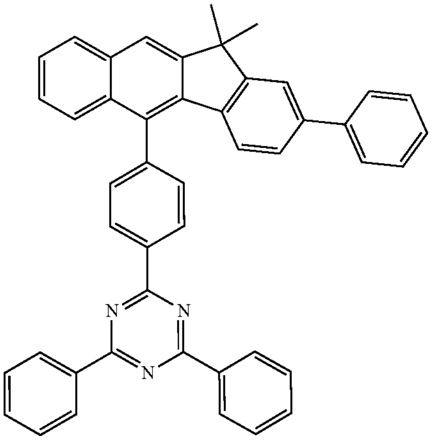
C-2-44
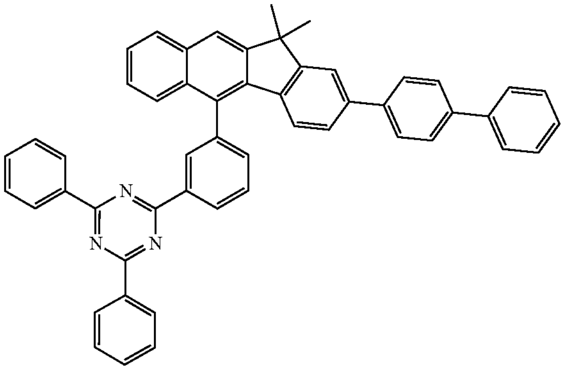
C-2-45
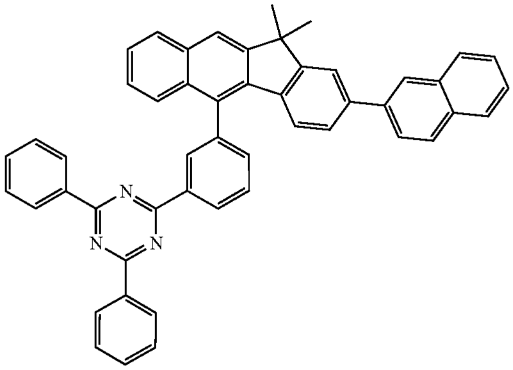

-continued
C-2-46
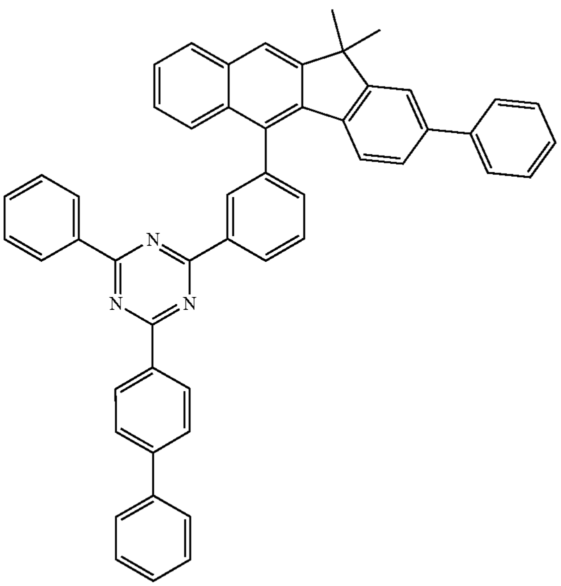
C-2-55
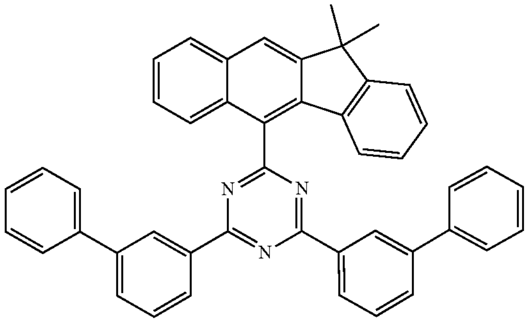
C-2-56
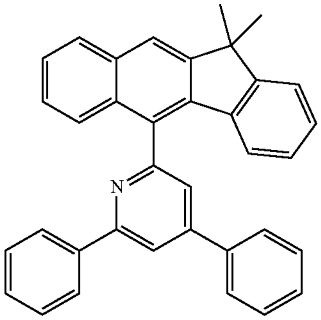
C-2-57
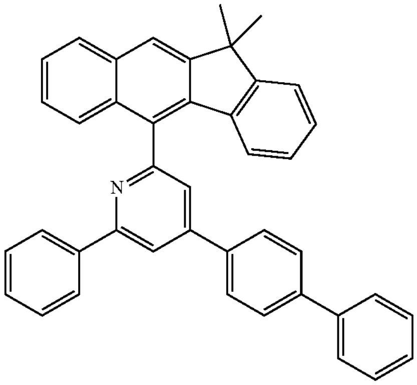
-continued
C-2-58
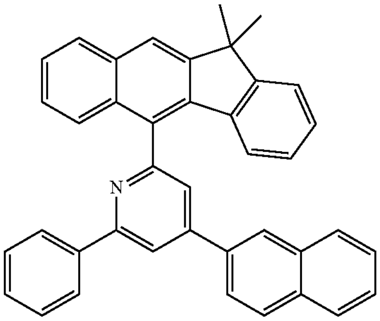
C-2-59
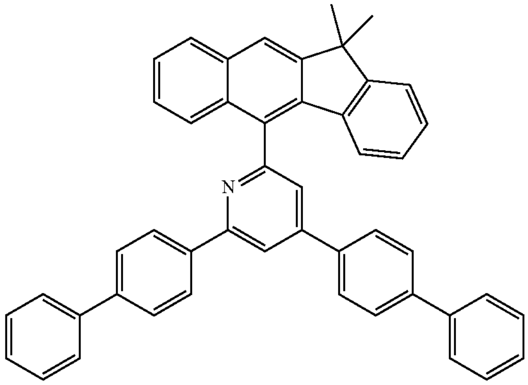
C-2-60
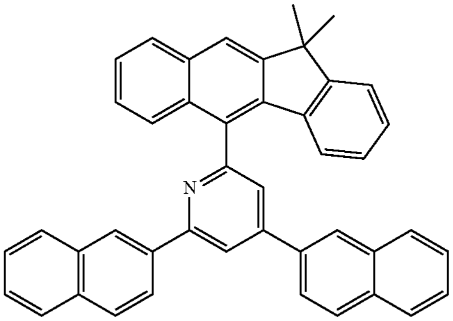
C-2-61
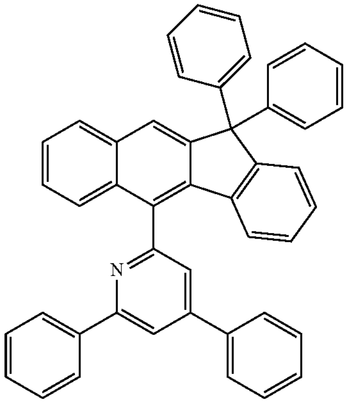

-continued
C-2-62
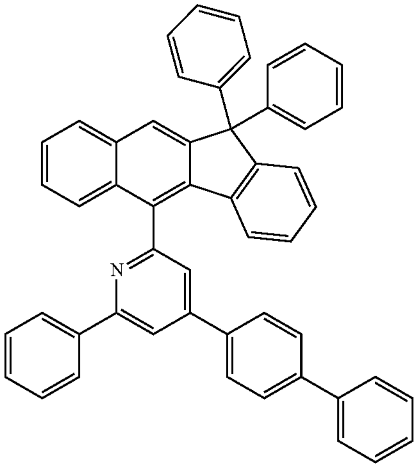
C-2-63
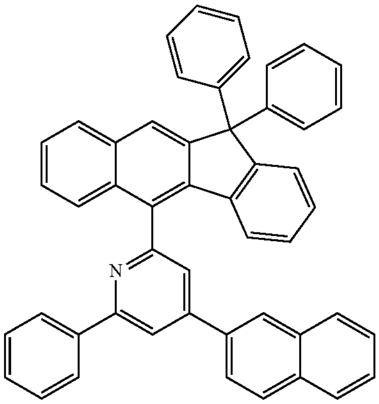
C-2-64
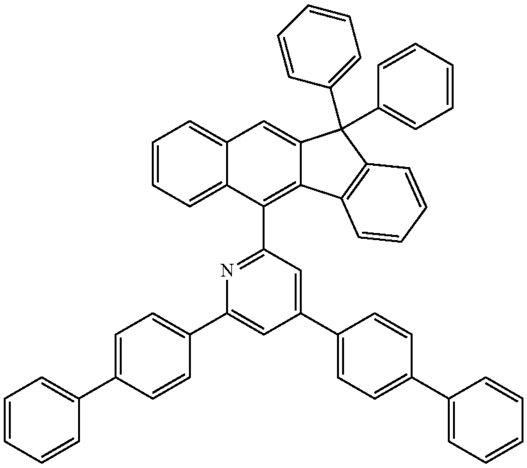
-continued
C-2-65
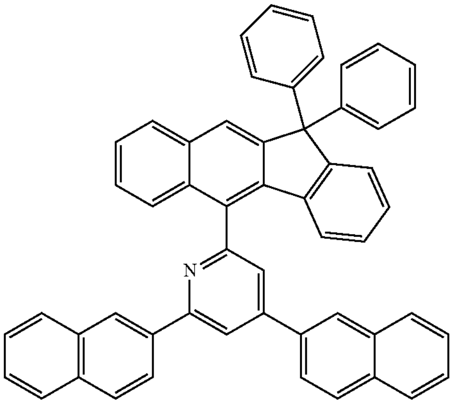
C-2-66
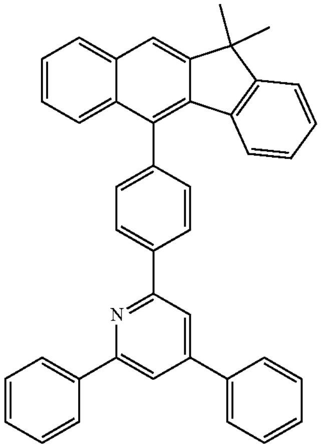
C-2-67
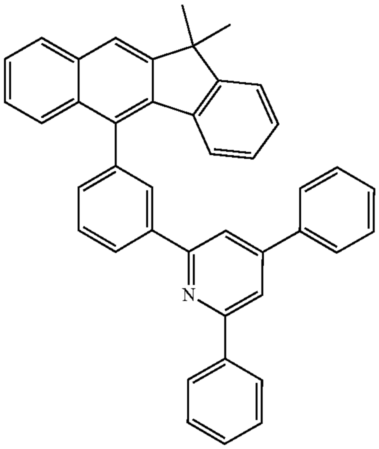

-continued
C-2-68
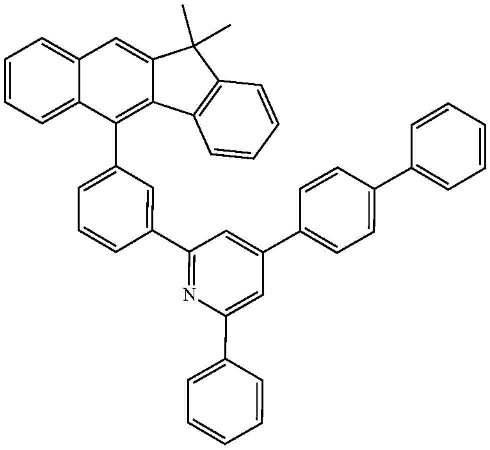
C-2-69
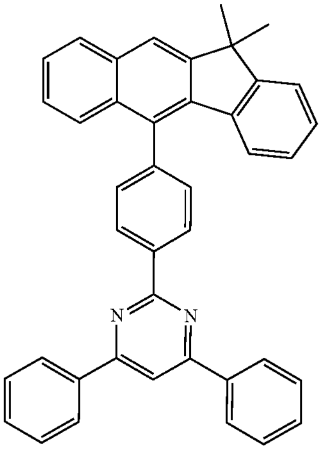
C-2-70
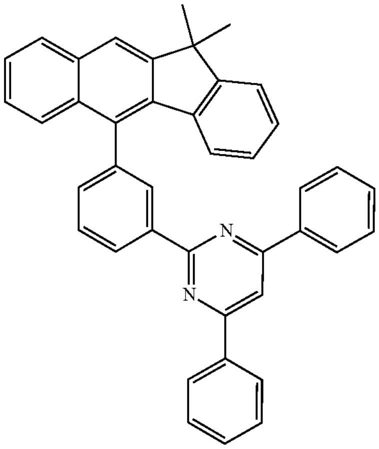
-continued
C-2-71
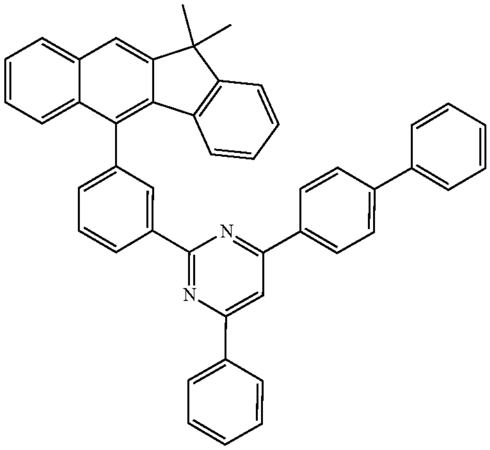
C-2-72
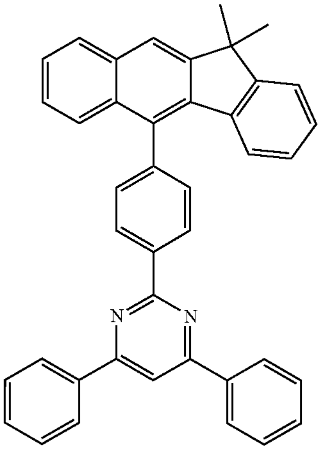
C-2-73
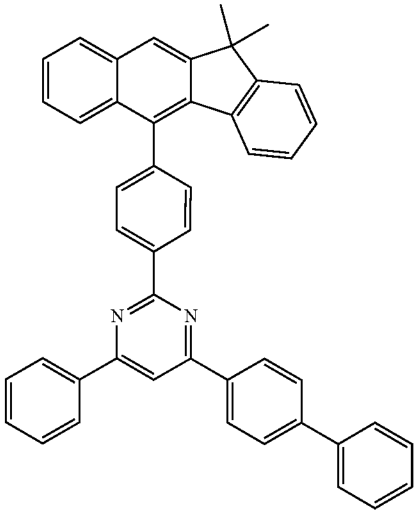

-continued
C-2-74
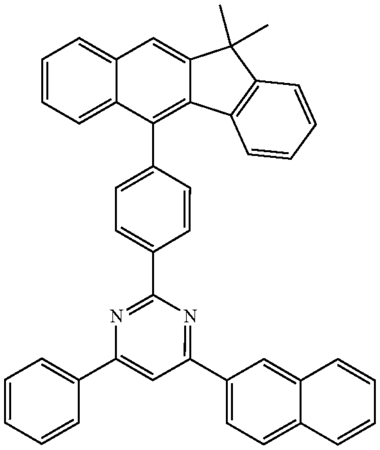
C-2-75
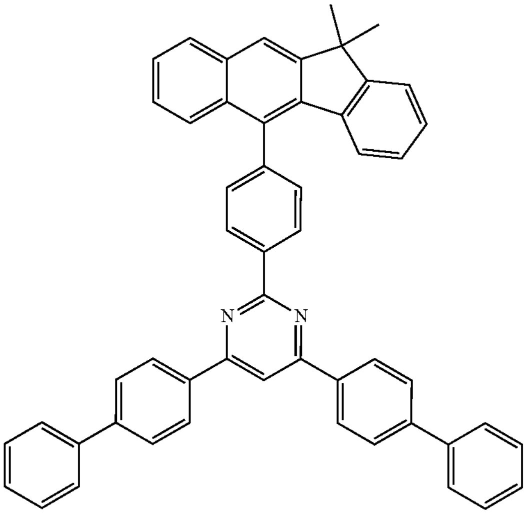
C-2-76
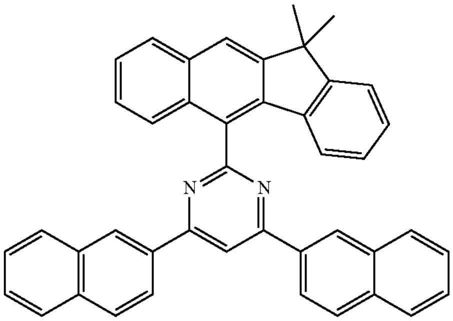
-continued
C-2-77
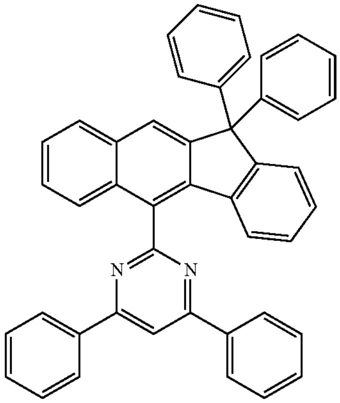
C-2-79
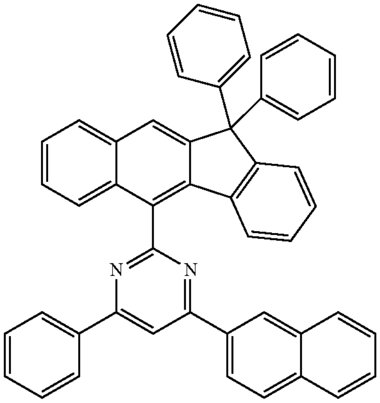
C-2-80
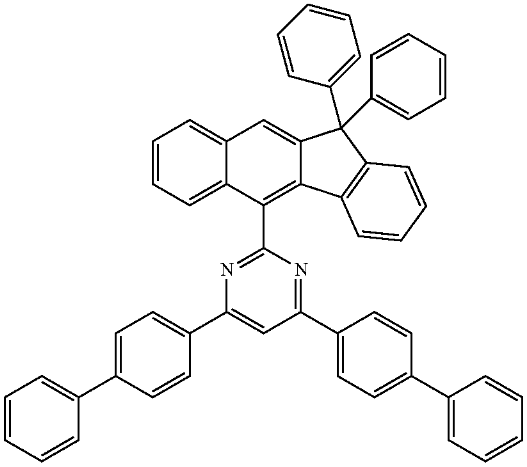

-continued
C-2-81
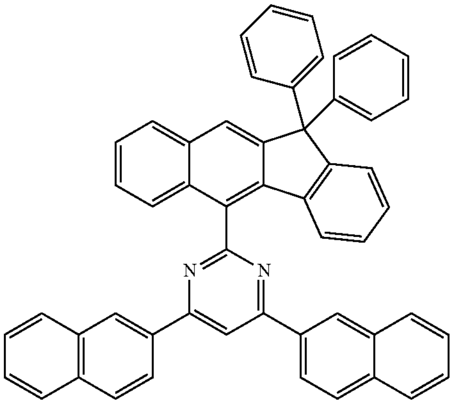
C-2-82
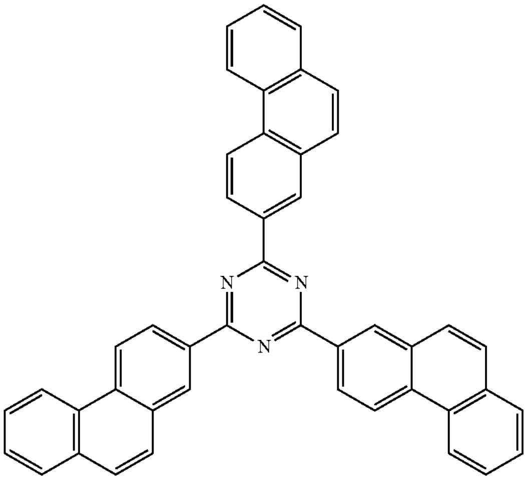
C-2-83
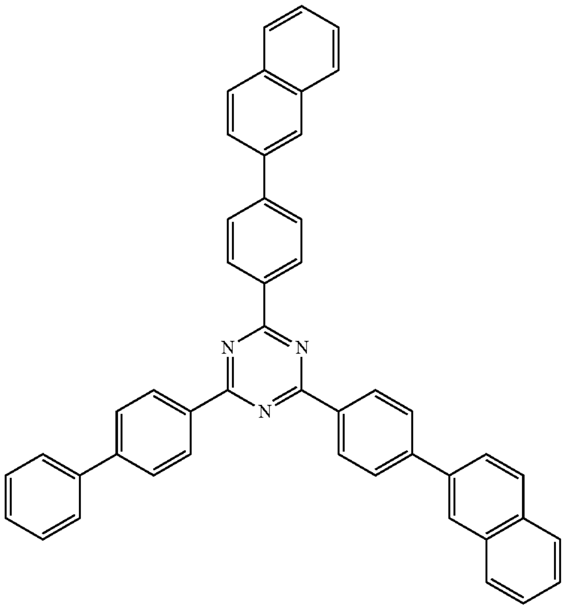
-continued
C-2-84
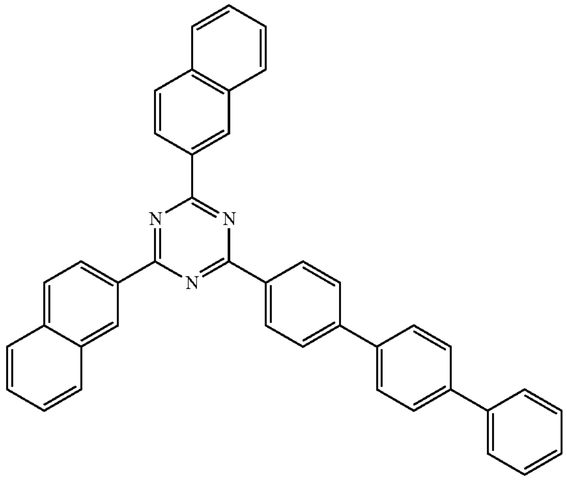
C-2-86
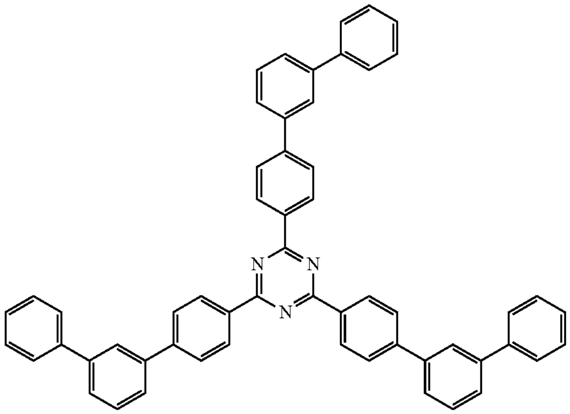
C-2-87
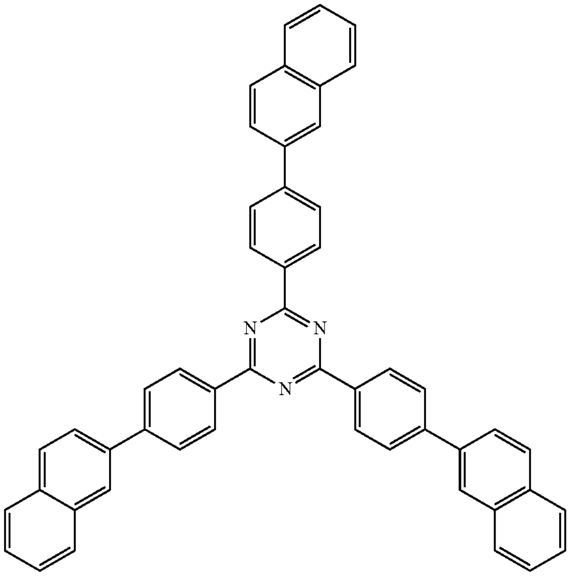

-continued
C-2-88
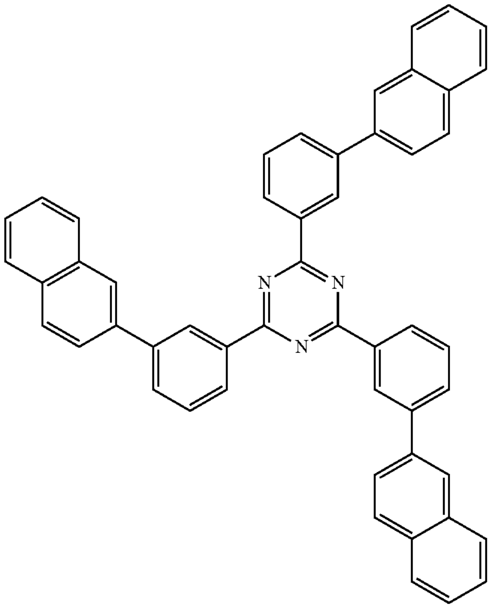
C-2-89
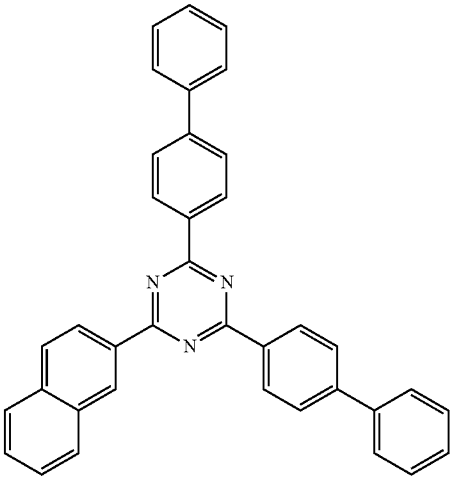
C-2-90
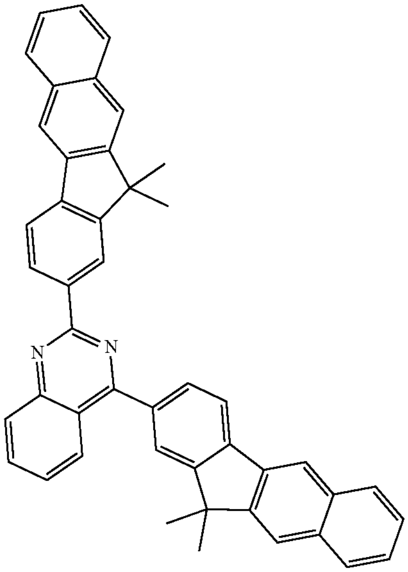
-continued
C-2-91
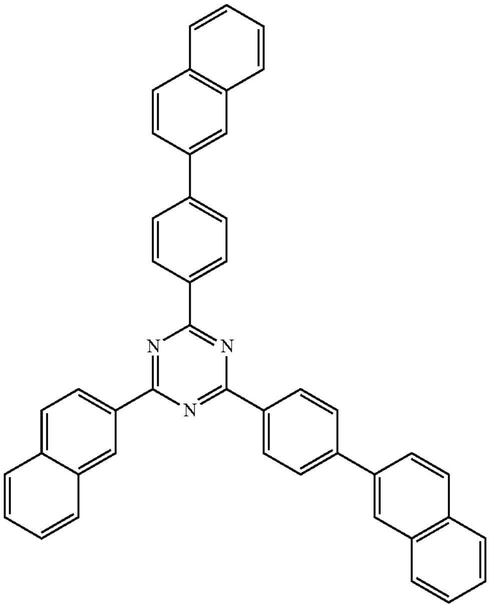
C-2-92
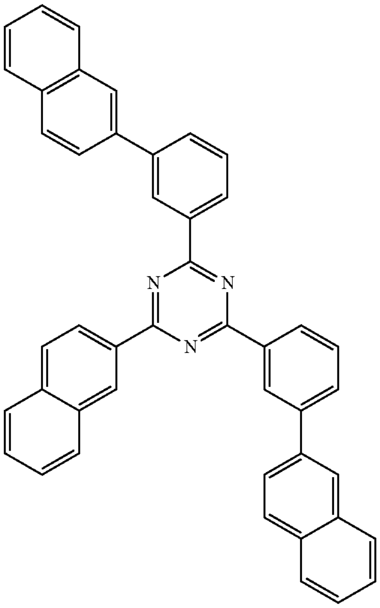

-continued
C-2-93
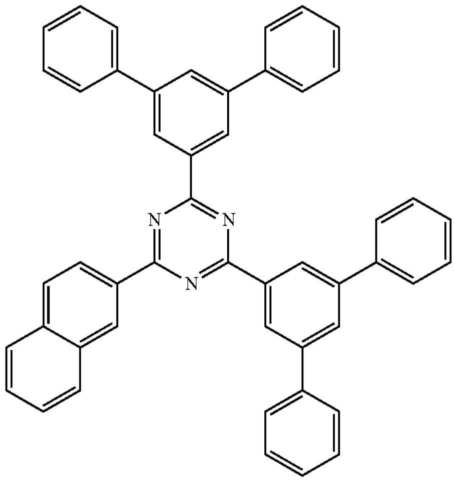
C-2-95
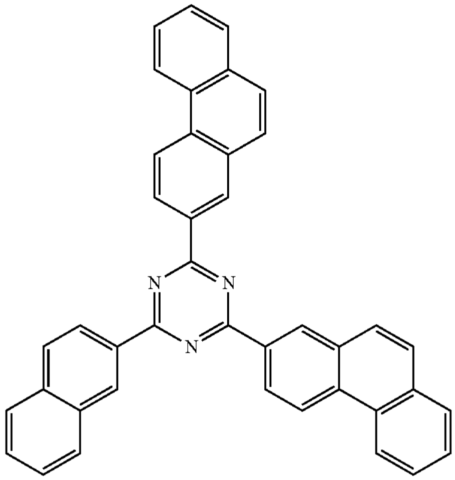
C-2-96
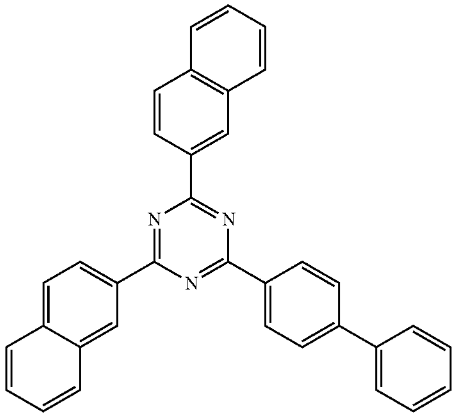
-continued
C-2-97
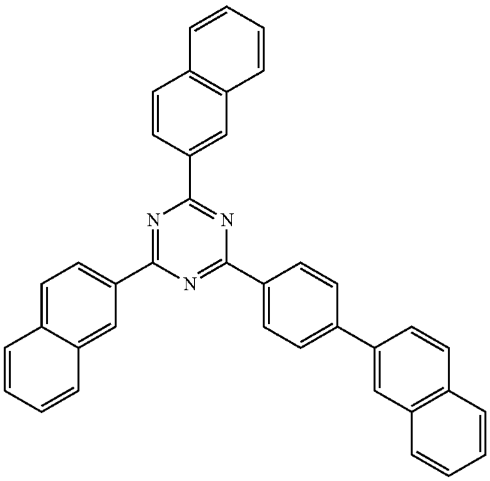
C-2-98
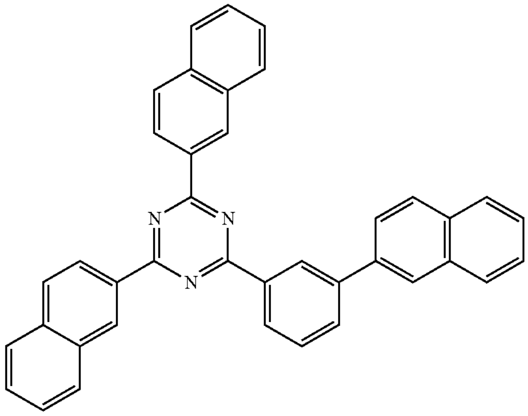
C-2-99
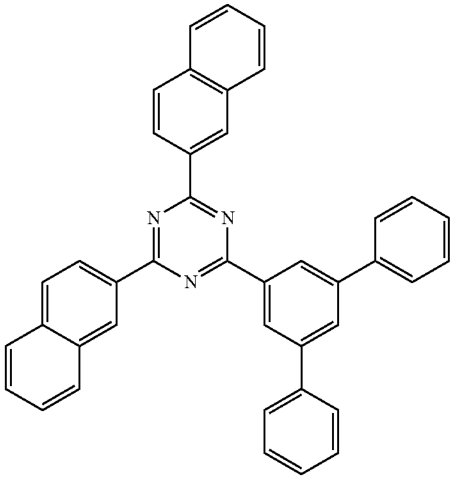

C-2-100
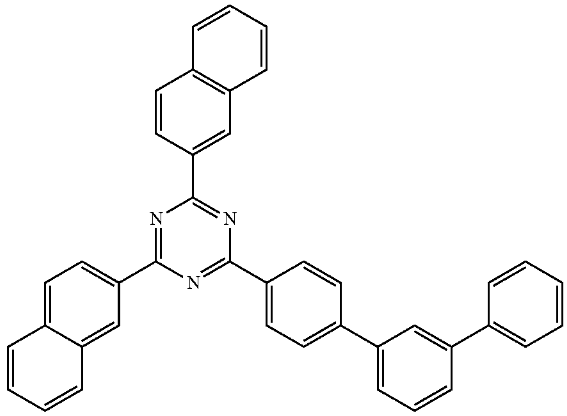
C-2-105
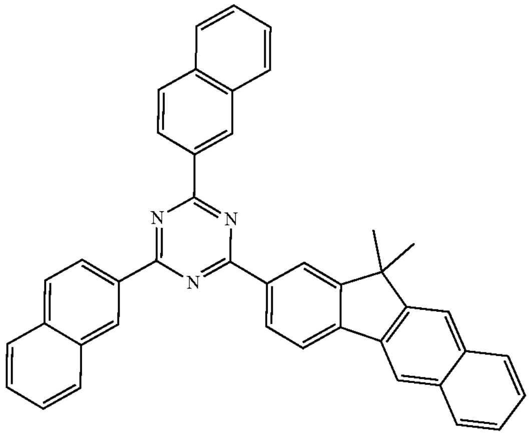
C-2-107
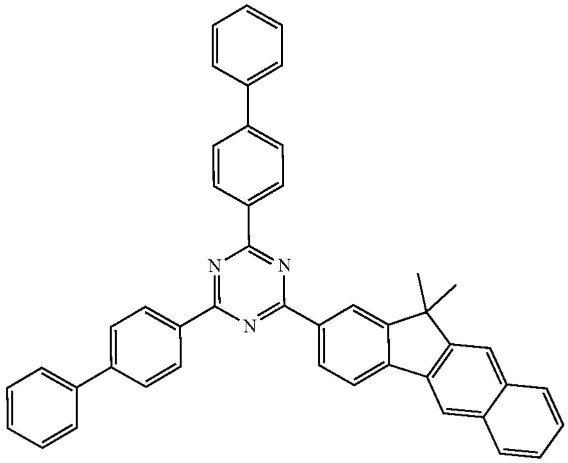
C-2-109
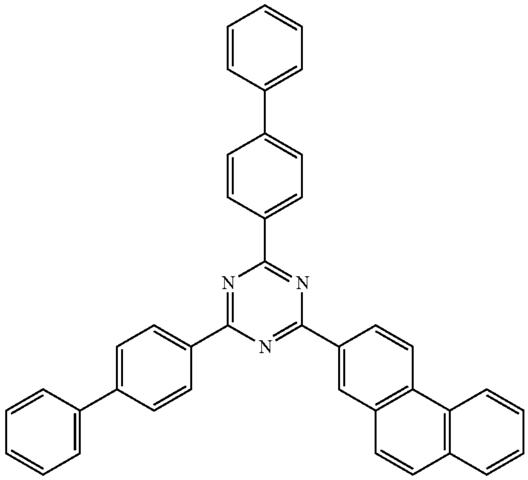
C-2-110
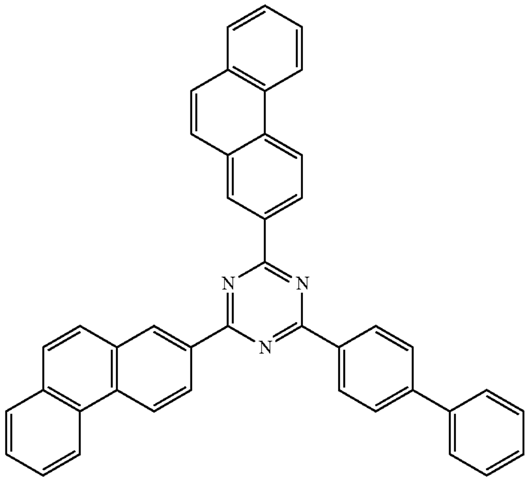
C-2-113
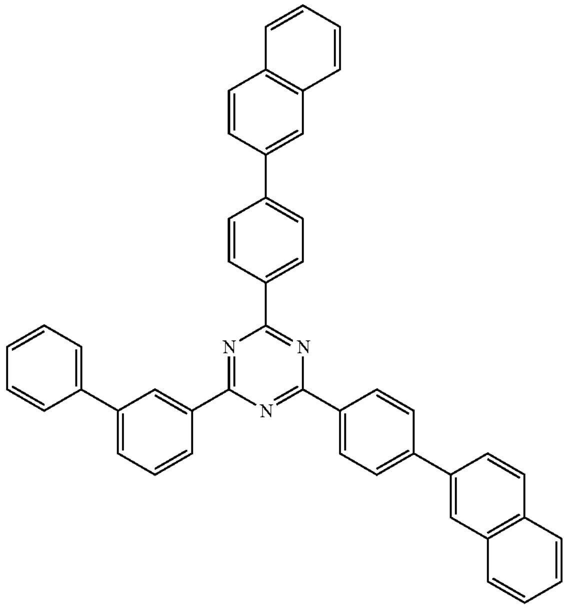

-continued
C-2-114
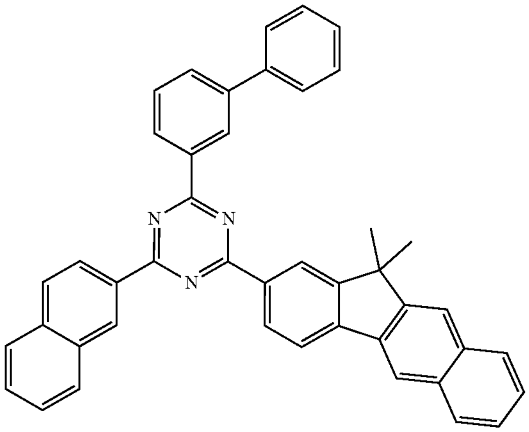
C-2-115
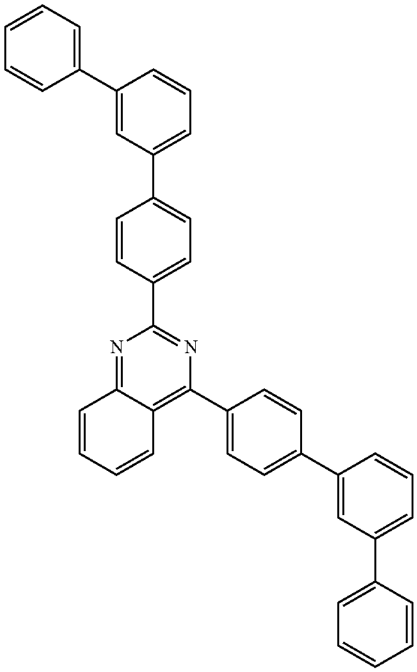
C-2-116
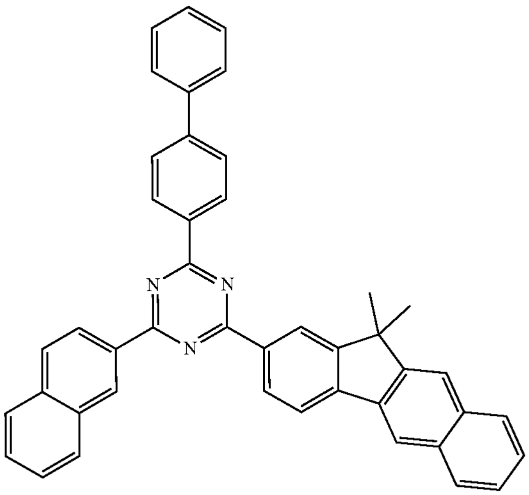
-continued
C-2-118
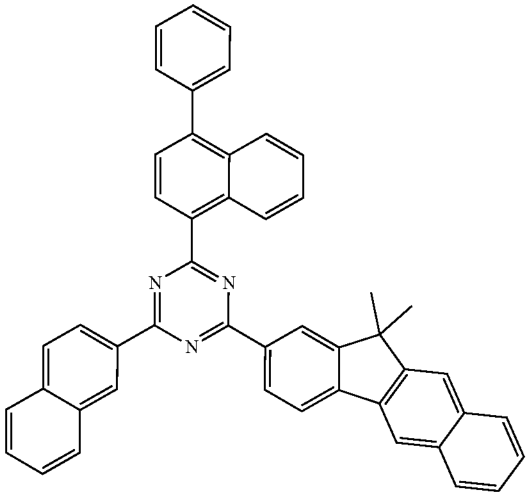
C-2-119
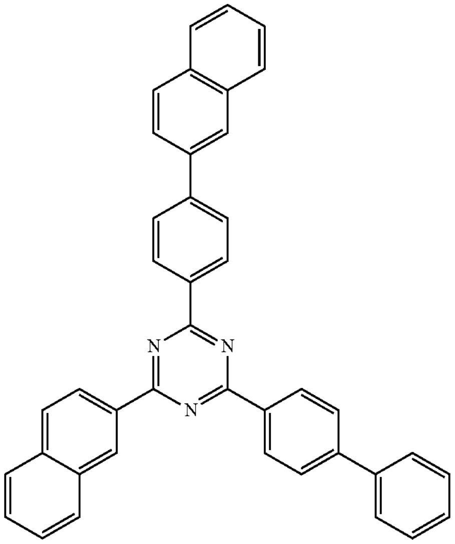
C-2-120
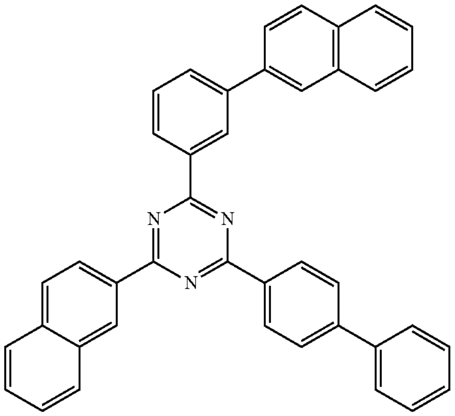

-continued
C-2-121
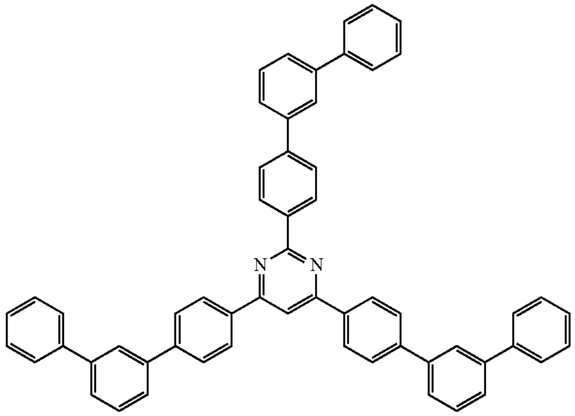
C-2-122
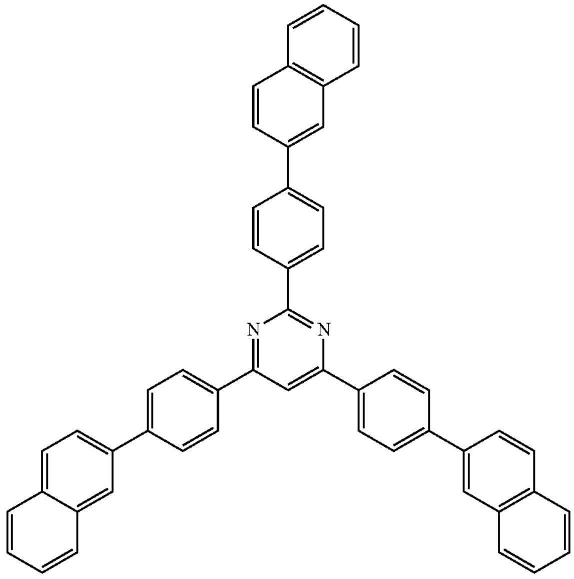
C-2-123
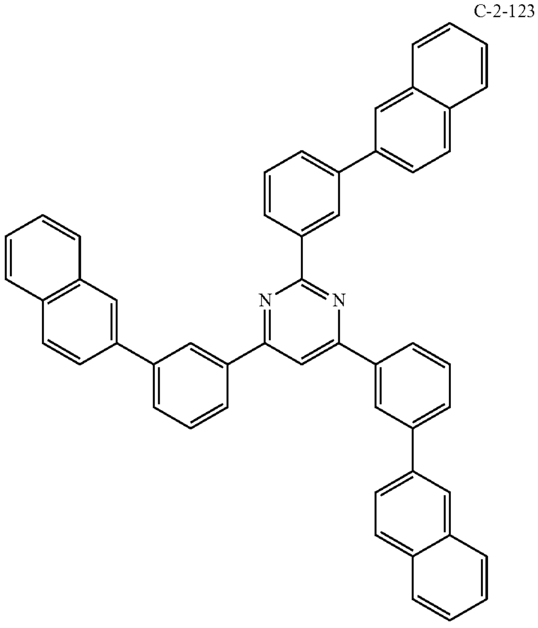
-continued
C-2-124
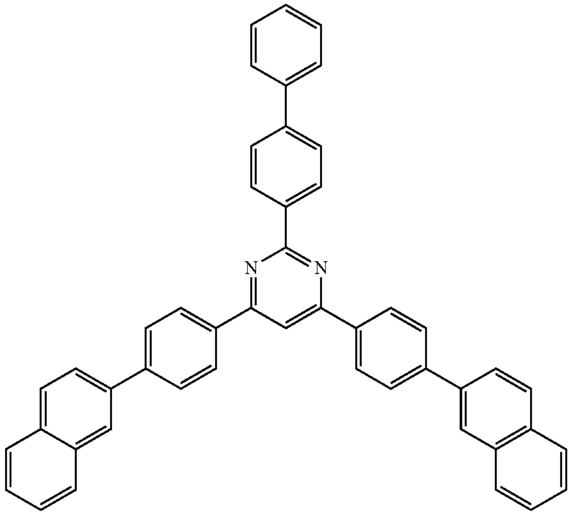
C-2-125
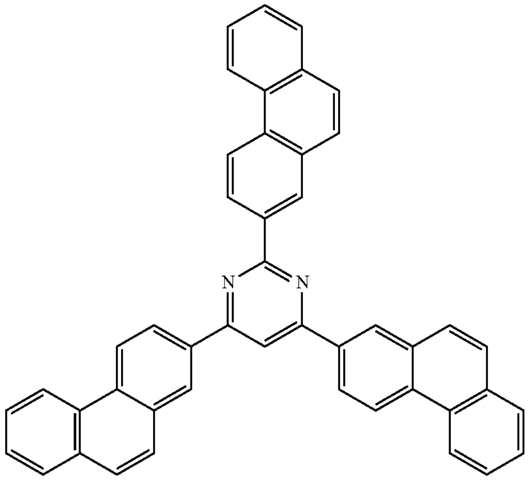
C-2-216
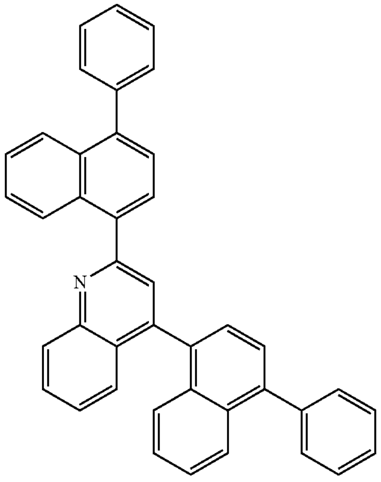

-continued
C-2-127
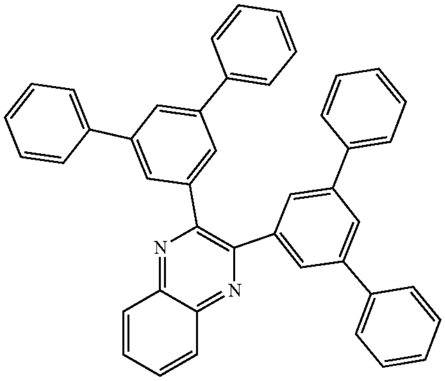
C-2-128
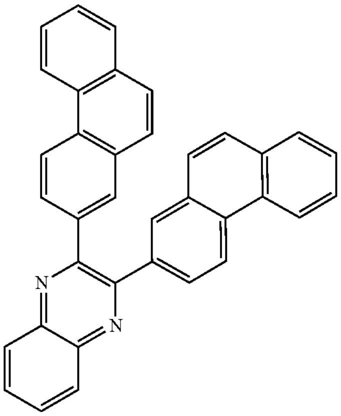
C-2-130
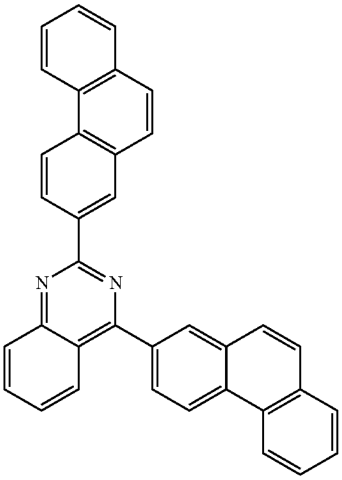
-continued
C-2-131
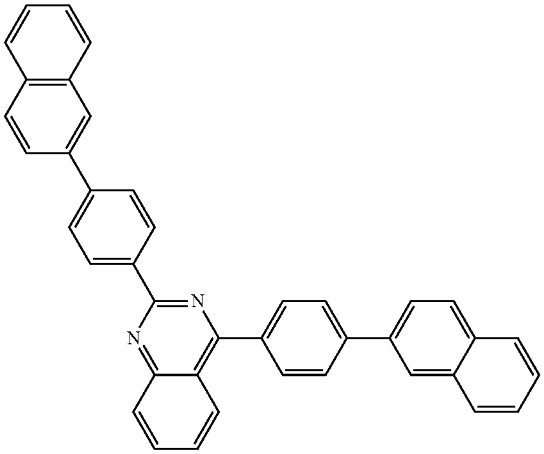
C-2-132
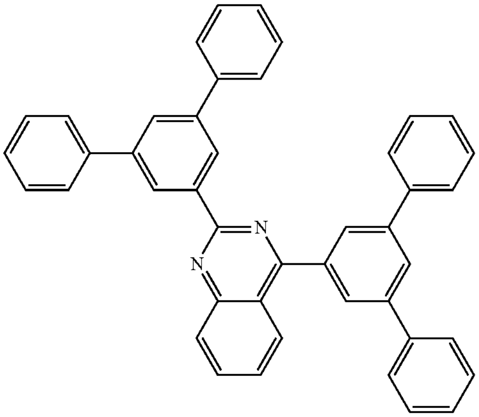
C-2-134
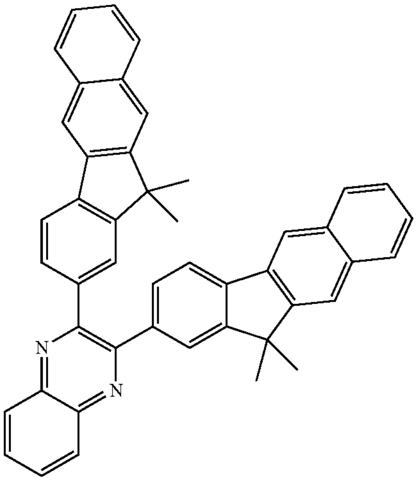

C-2-138
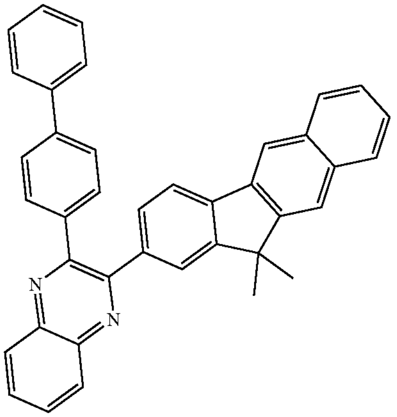
C-2-139
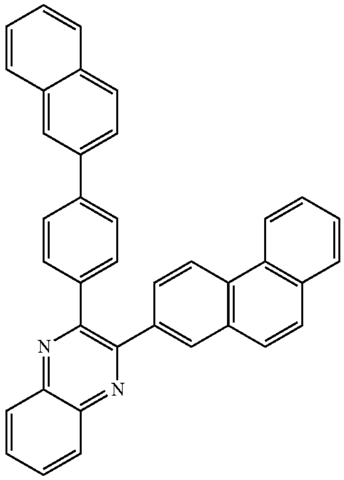
C-2-143
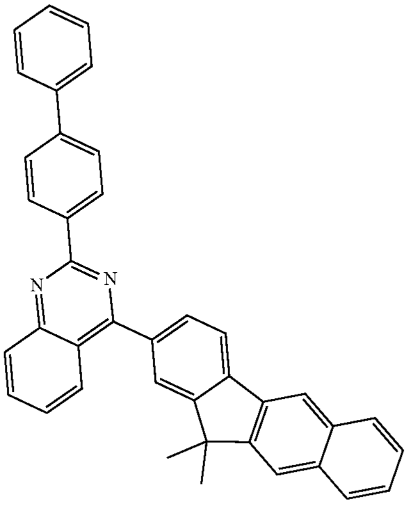
C-2-144
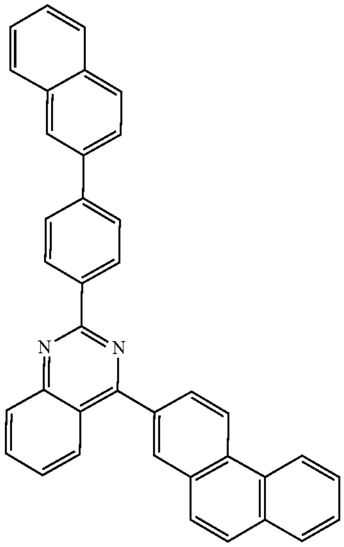
C-2-150
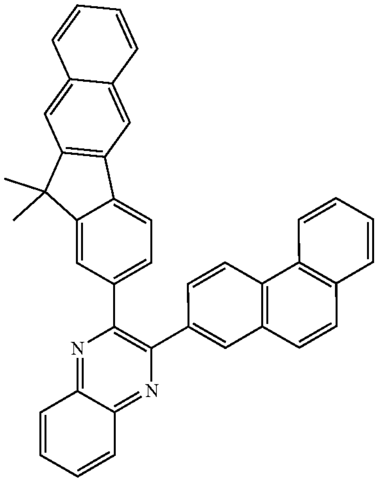
C-2-152
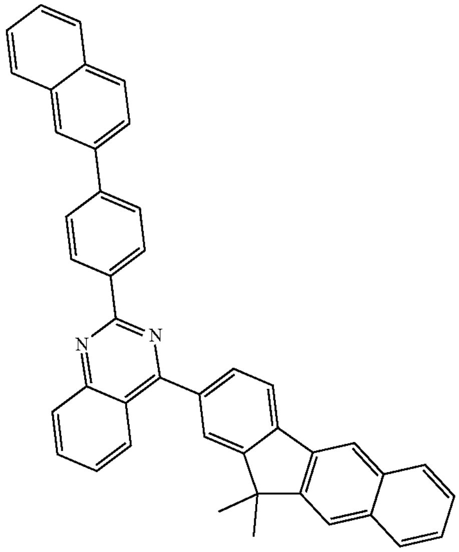

-continued
C-2-156
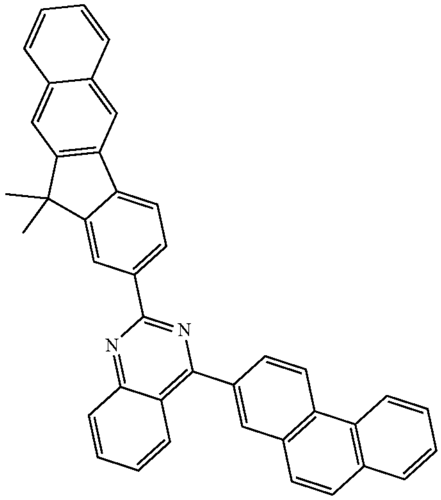
C-2-158
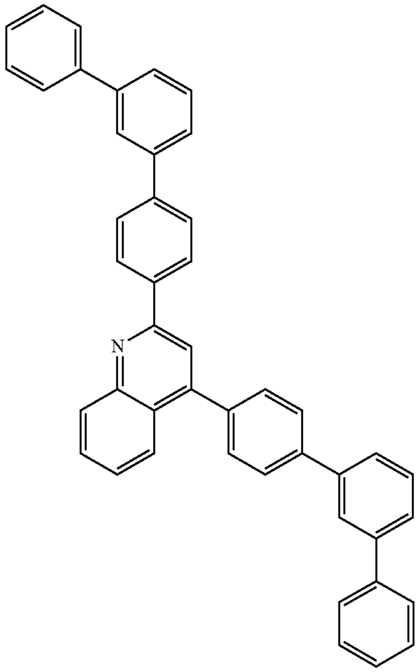
-continued
C-2-159
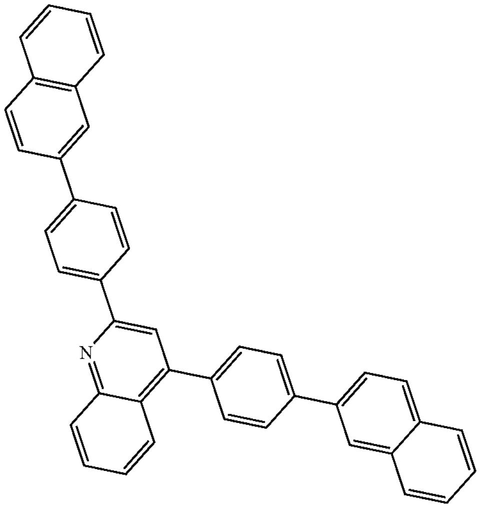
C-2-160
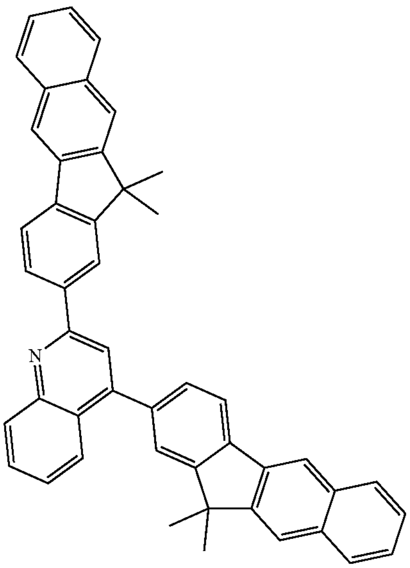

-continued
C-2-162
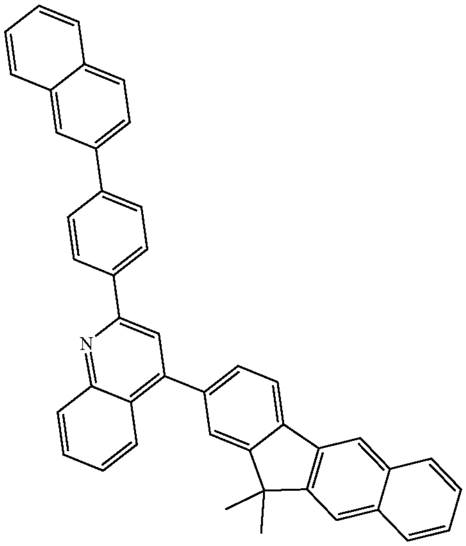
C-2-165
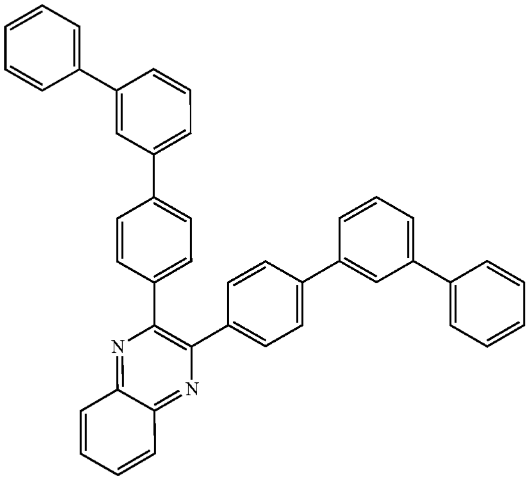
C-2-166
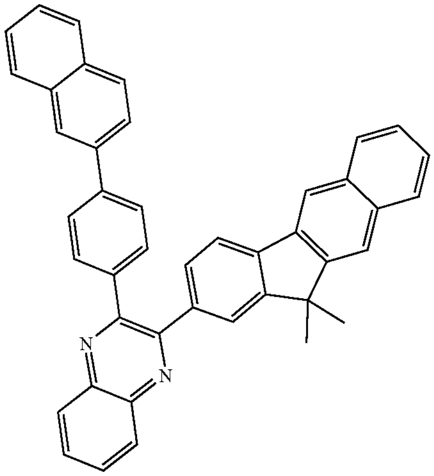
-continued
C-2-167
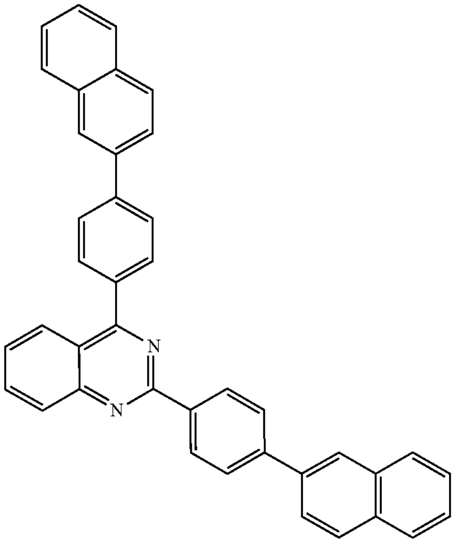
C-2-168
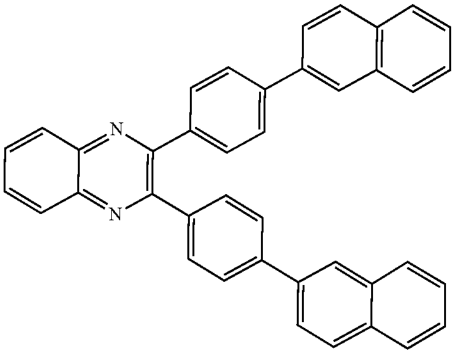
C-2-169
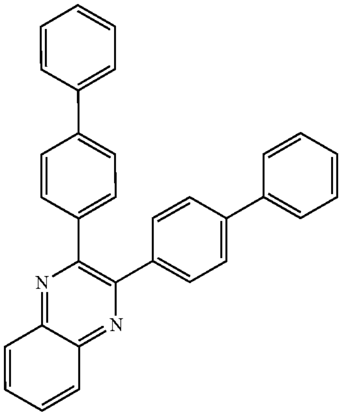

-continued
C-2-170
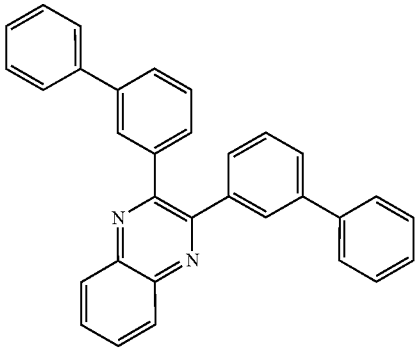
C-2-171
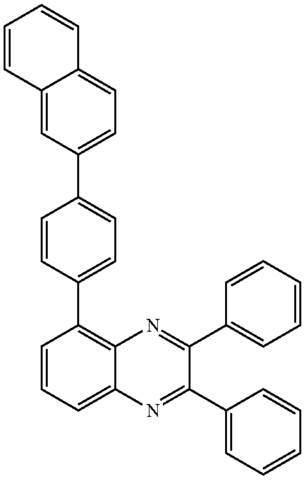
C-2-172
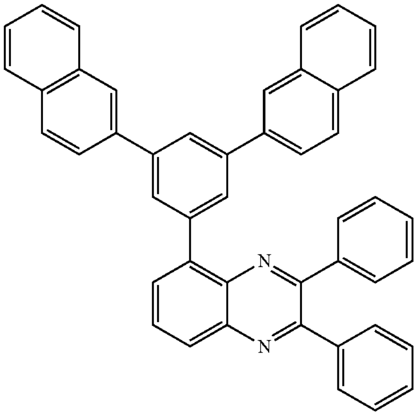
-continued
C-2-173
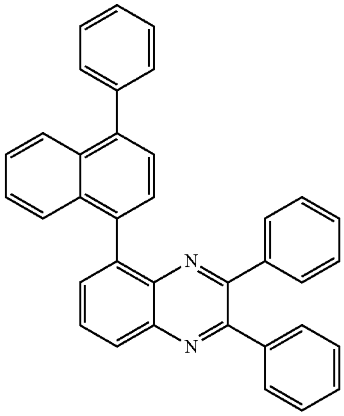
C-2-175
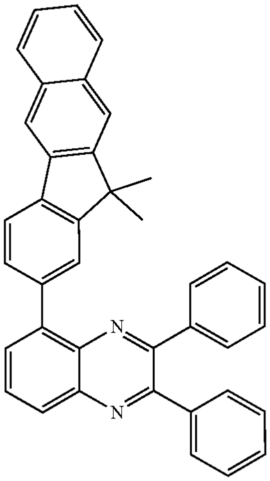
C-2-176
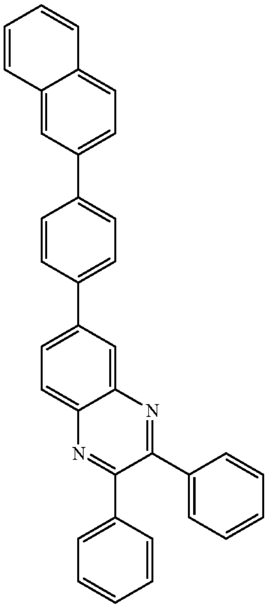

-continued
C-2-177
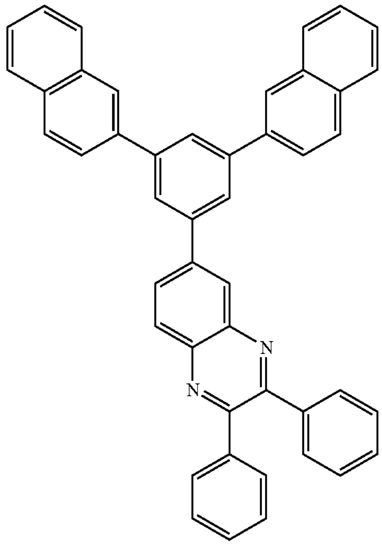
C-2-178
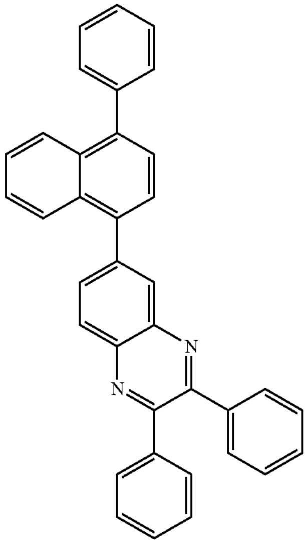
-continued
C-2-180
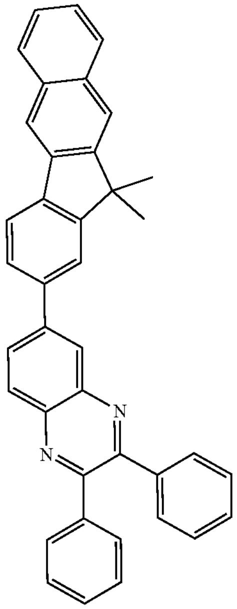
C-2-181
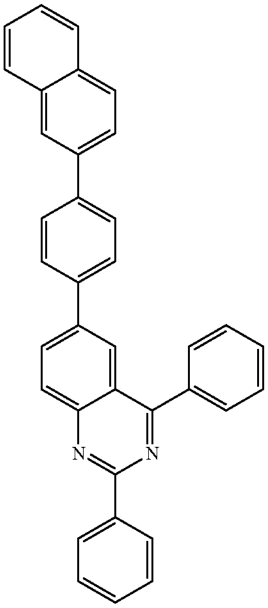

-continued
C-2-182
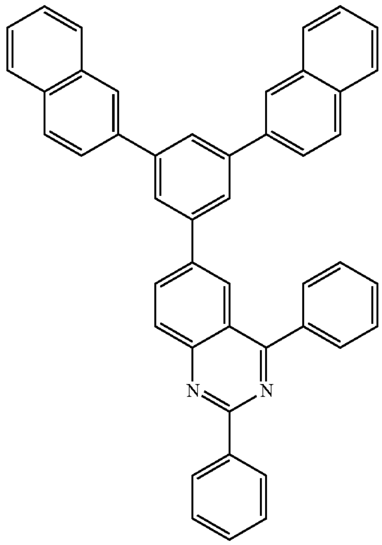
6. An organic electroluminescent device comprising: an anode, a cathode, and at least one light-emitting layer between the anode and the cathode, wherein the at least one light-emitting layer comprises the plurality of host materials according to claim 1.
* * * * *